(12) United States Patent
Sugita et al.

(10) Patent No.: US 6,534,242 B2
(45) Date of Patent: Mar. 18, 2003

(54) MULTIPLE EXPOSURE DEVICE FORMATION

(75) Inventors: Mitsuro Sugita, Utsunomiya; Akiyoshi Suzuki, Tokyo; Miyoko Kawashima, Tochigi-ken; Kenji Saitoh; Yuichi Iwasaki, both of Utsunomiya, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/783,600

(22) Filed: Feb. 15, 2001

(65) Prior Publication Data

US 2002/0031725 A1 Mar. 14, 2002

Related U.S. Application Data

(63) Continuation-in-part of application No. 09/255,330, filed on Feb. 23, 1999, now abandoned, which is a continuation-in-part of application No. 09/244,844, filed on Feb. 4, 1999, and a continuation-in-part of application No. 09/184,958, filed on Nov. 3, 1998, now abandoned.

(30) Foreign Application Priority Data

| Nov. 6, 1997 | (JP) | 9-304232 |
| Feb. 26, 1998 | (JP) | 10-045415 |
| May 2, 1998 | (JP) | 10-137473 |
| May 2, 1998 | (JP) | 10-137474 |
| Jul. 21, 1998 | (JP) | 10-221097 |
| Sep. 9, 1998 | (JP) | 10-255143 |

(51) Int. Cl.$^7$ ............................. G03C 5/00; G03F 9/00
(52) U.S. Cl. ........................ 430/312; 430/30; 430/328; 430/394
(58) Field of Search .................. 430/30, 296, 311, 430/312, 327, 328, 394, 942, 945; 250/492.1

(56) References Cited

U.S. PATENT DOCUMENTS

| 4,456,371 A | 6/1984 | Lin ............................. 355/71 |
| 4,644,170 A | 2/1987 | Komatsu ................. 250/492.2 |
| 4,680,084 A | 7/1987 | Heimann et al. ........... 156/626 |
| 4,869,999 A | 9/1989 | Fukuda et al. ............. 430/311 |
| 4,902,899 A | 2/1990 | Lin et al. ................. 250/492.1 |
| 4,947,413 A | 8/1990 | Jewell et al. ................. 378/34 |
| 5,415,835 A | 5/1995 | Brueck et al. .............. 430/311 |
| 5,532,090 A | 7/1996 | Borodovsky .................... 430/5 |
| 5,563,012 A | 10/1996 | Neisser ......................... 430/22 |
| 5,595,843 A | 1/1997 | Dao ............................. 430/5 |
| 5,702,868 A | 12/1997 | Kellam et al. ............. 430/312 |
| 5,705,321 A | 1/1998 | Brueck et al. ............. 430/316 |
| 5,726,739 A | 3/1998 | Hayata ........................ 355/67 |
| 5,851,703 A | 12/1998 | Hasegawa et al. ............. 430/5 |
| 5,851,707 A | 12/1998 | Shibuya et al. ................ 430/5 |
| 6,087,074 A | 7/2000 | Hasegawa et al. .......... 430/311 |
| 6,128,068 A | 10/2000 | Suzuki et al. ................. 355/53 |

FOREIGN PATENT DOCUMENTS

| EP | 0 366 367 | 5/1990 |
| EP | 0 534 463 | 3/1993 |
| JP | 6-333795 | 12/1994 |
| JP | 7-253649 | 10/1995 |
| JP | 2636700 | 4/1997 |
| JP | 2650962 | 5/1997 |
| JP | 9-199390 | 7/1997 |
| WO | WO 94/24610 | 10/1994 |
| WO | WO 96/26468 | 8/1996 |

OTHER PUBLICATIONS

IBM Technical Disclosure Bulletin, vol. 32, No. 3A, Aug. 1989, p. 431.

*Primary Examiner*—Christopher G. Young
(74) *Attorney, Agent, or Firm*—Fitzpatrick, Cella, Harper & Scinto

(57) ABSTRACT

An exposure method for transferring a device pattern to a resist, wherein the device pattern includes a first element and a second element having a linewidth narrower than the first element. The method includes a first exposure step for exposing the resist by use of an interference fringe, produced by interference of two light beams, through an exposure amount substantially not greater than a threshold of the resist, and a second exposure step for exposing the resist with a light pattern related to the first and second elements. A light component, of the light pattern, related to the first element bears an exposure amount greater than the threshold, a light component, of the light pattern, related to the second element bears an exposure amount not greater than the threshold and is to be combined with light in a portion of the interference fringe, and a sum of the exposure amount of the light component related to the second element and an exposure amount provided by the light in the portion of the interference fringe is greater than the threshold.

104 Claims, 96 Drawing Sheets

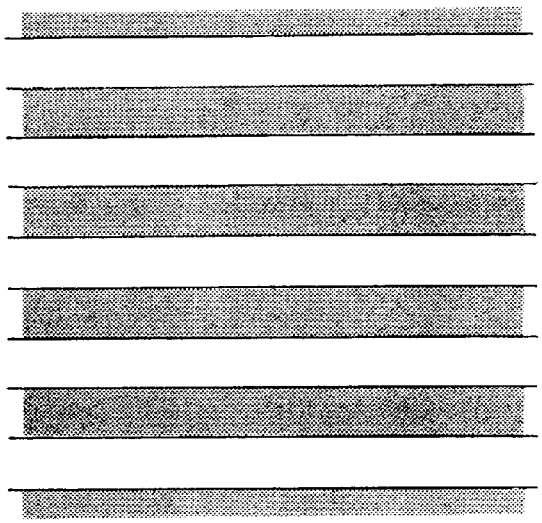
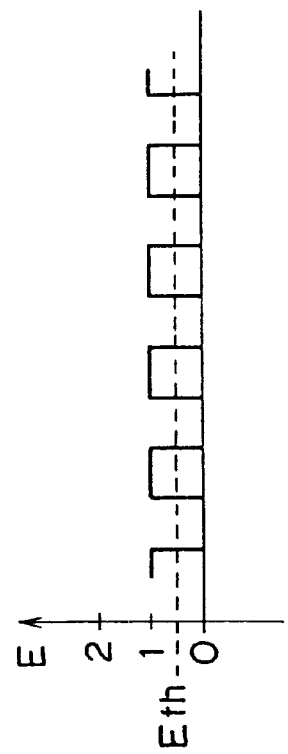
FIG. 2B
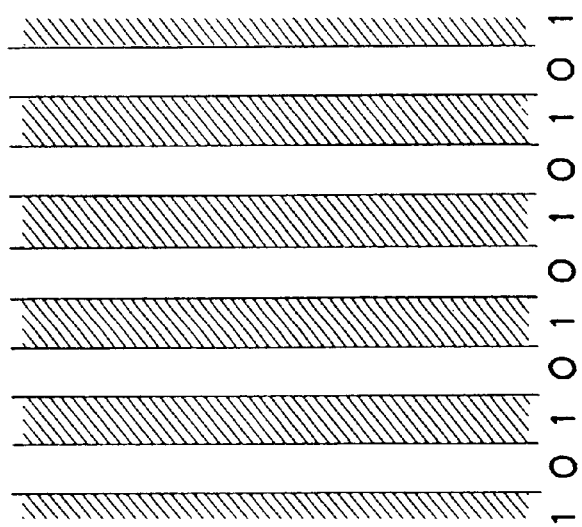
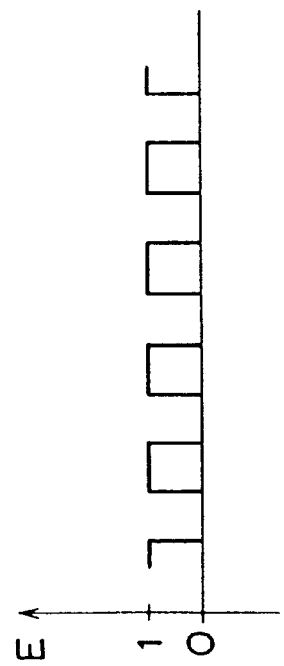
FIG. 2A

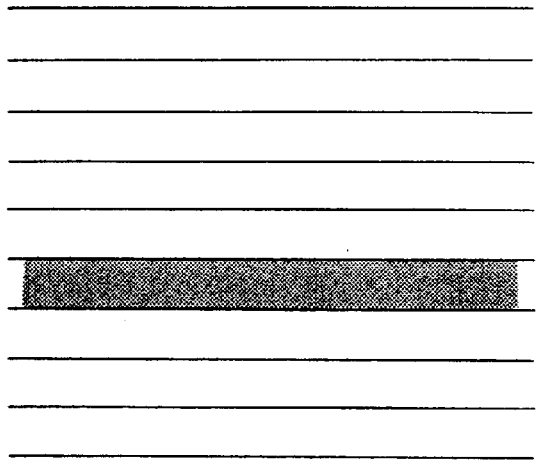
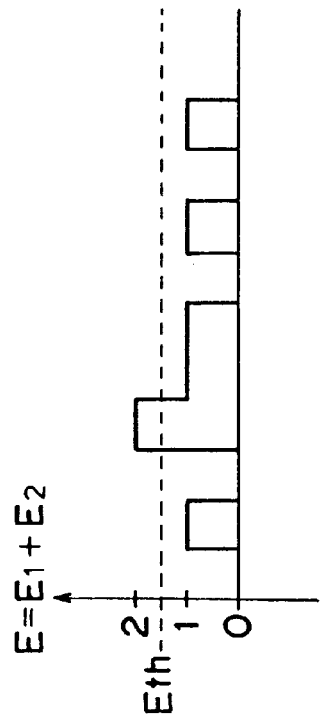
FIG. 7B
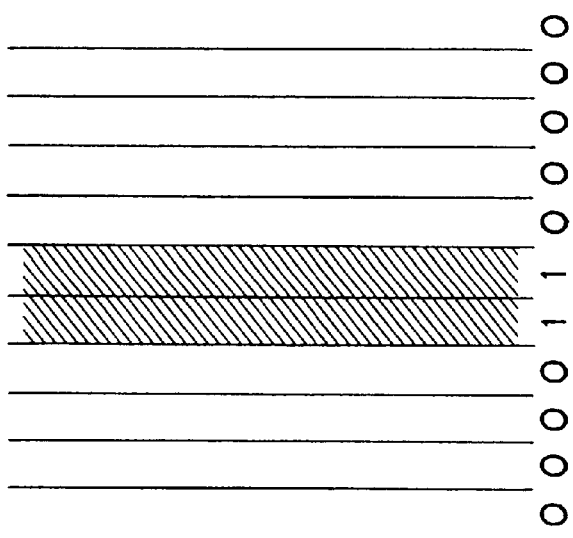
FIG. 7A

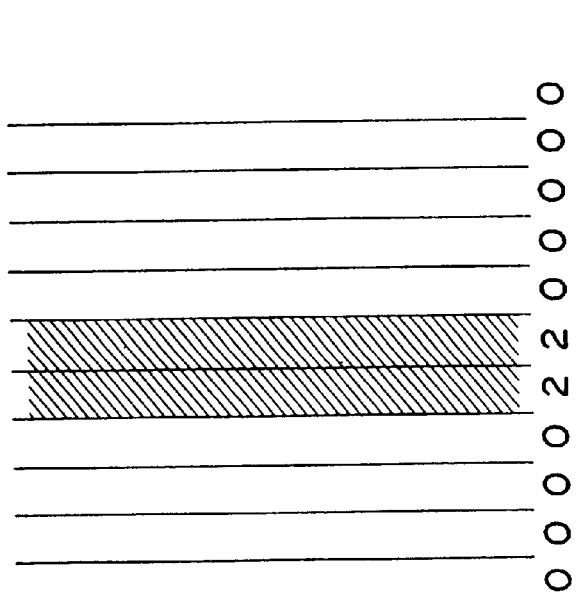
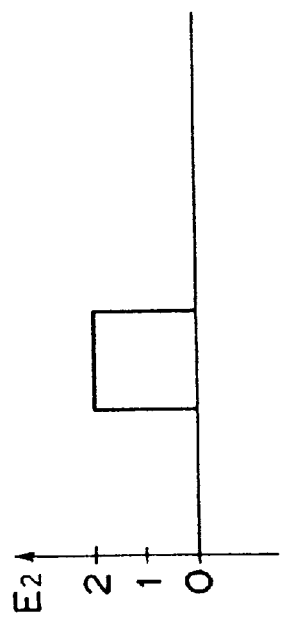
FIG. 8A
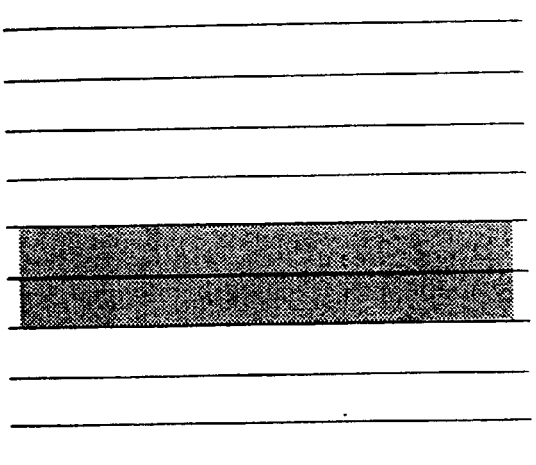
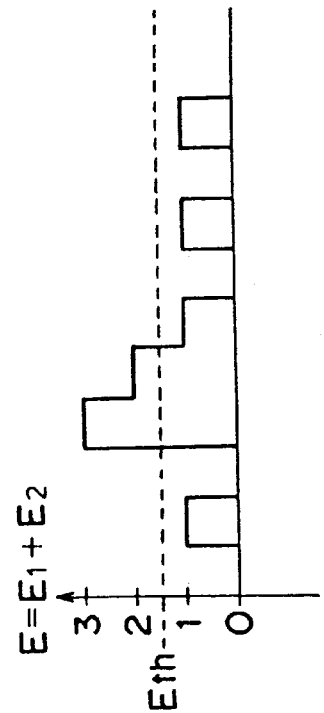
FIG. 8B

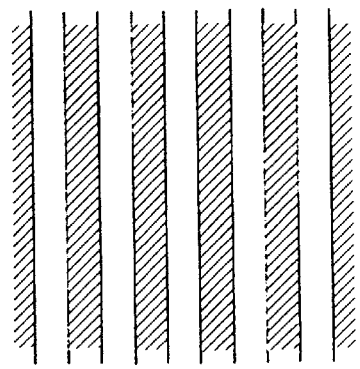
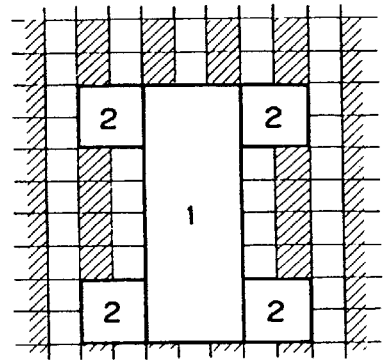
FIG. 11A    FIG. 11B
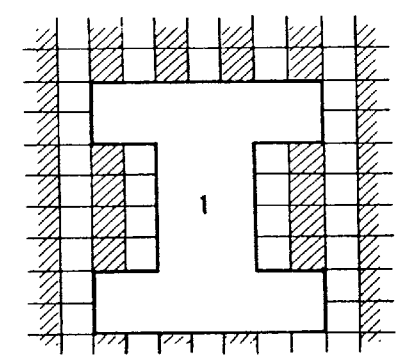
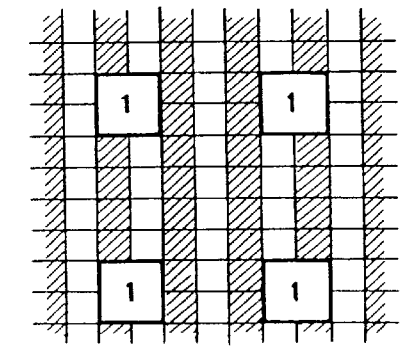
FIG. 11C    FIG. 11D

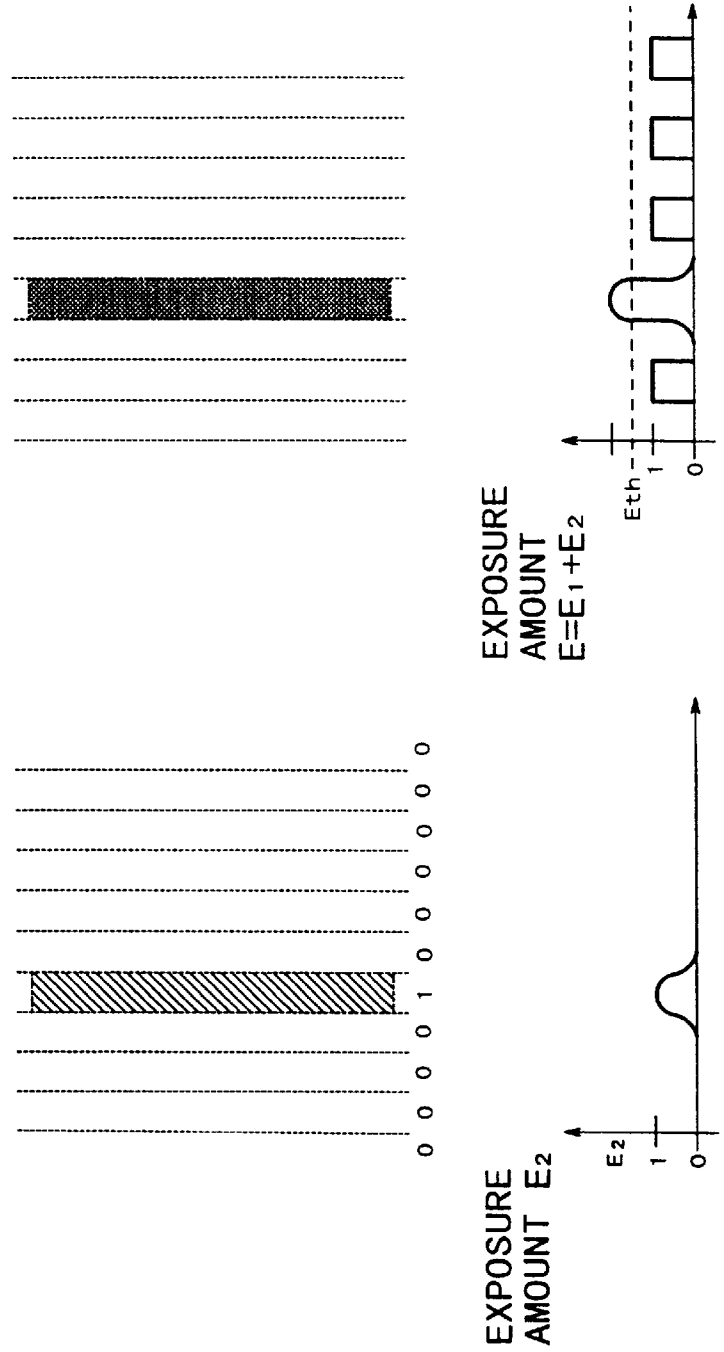

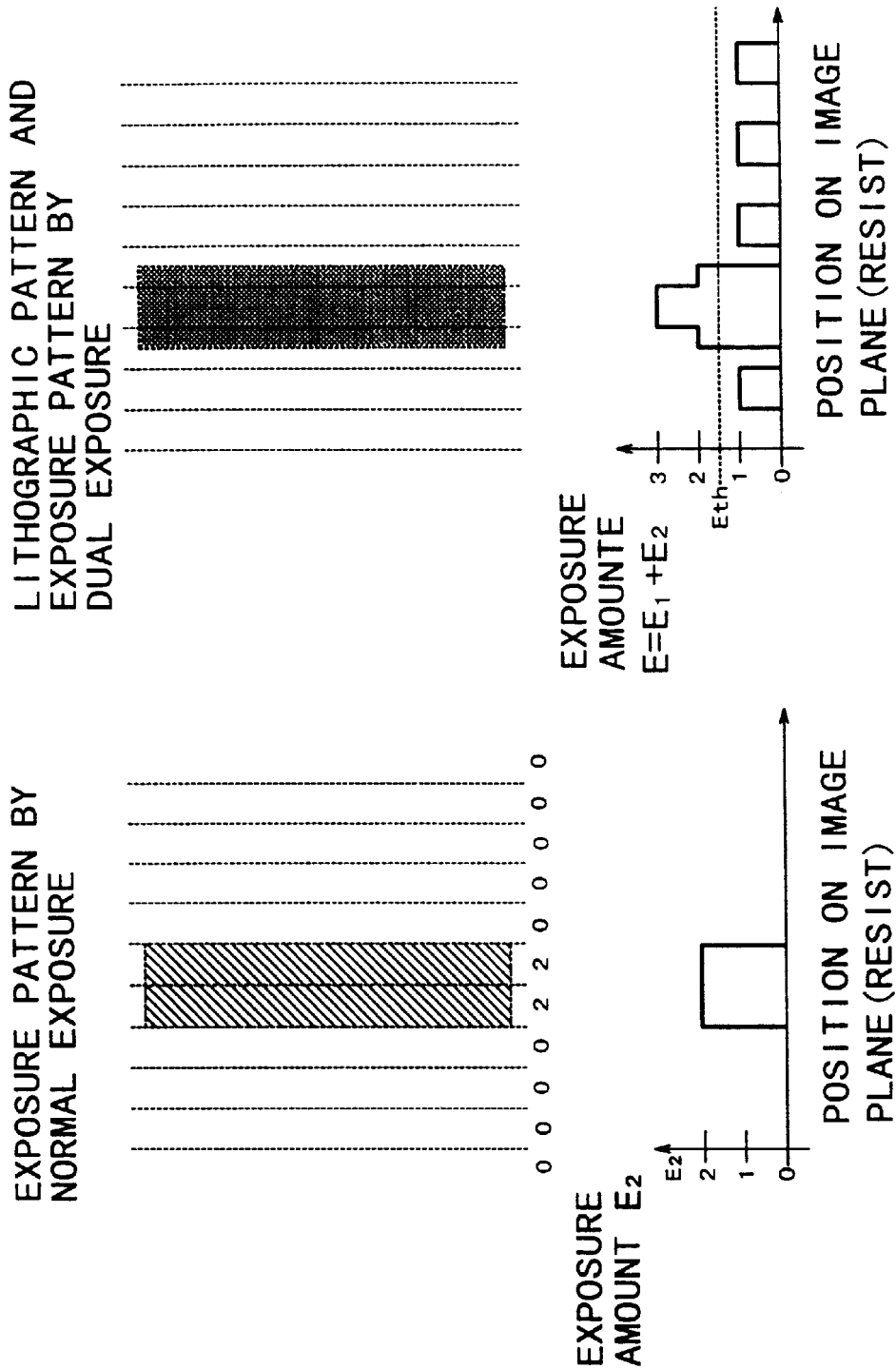

EXPOSURE PATTERN BY NORMAL EXPOSURE
LITHOGRAPHIC PATTERN AND EXPOSURE PATTERN BY DUAL EXPOSURE
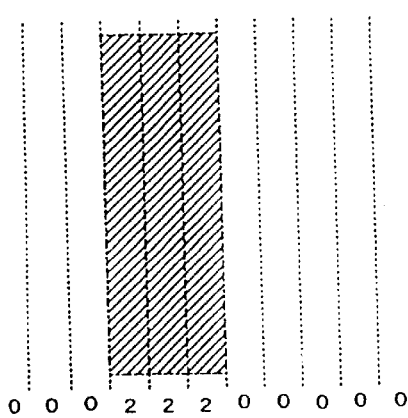
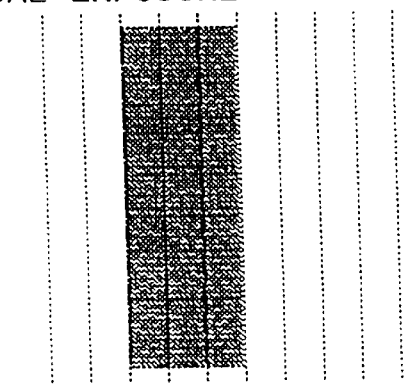
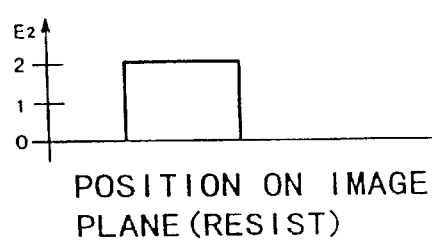
FIG. 31A
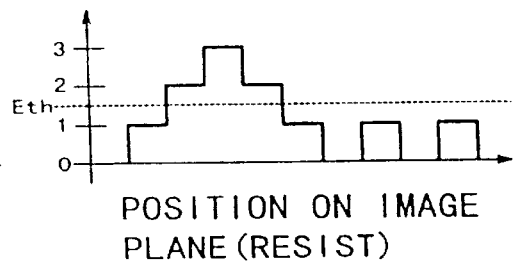
FIG. 31B
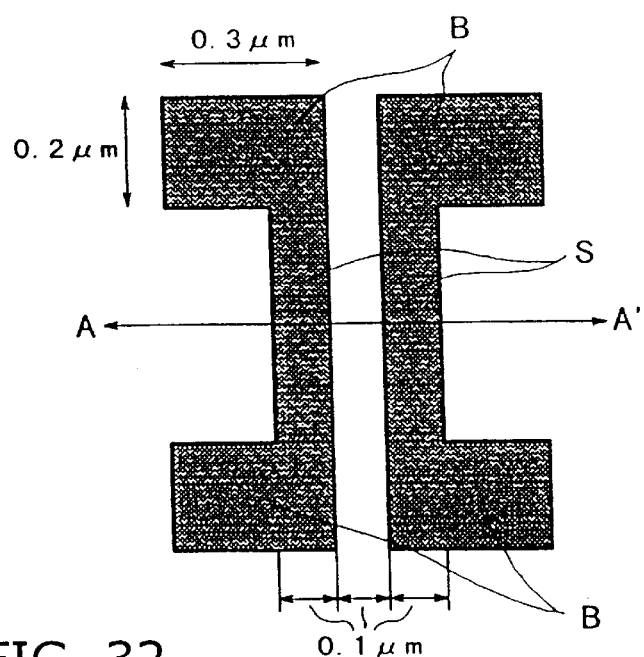
FIG. 32

FIG. 33

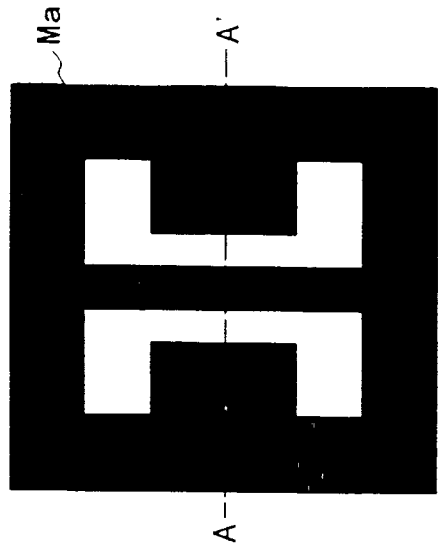
FIG. 47A
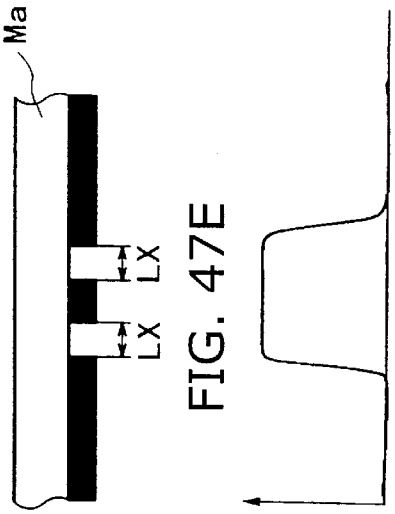
FIG. 47D
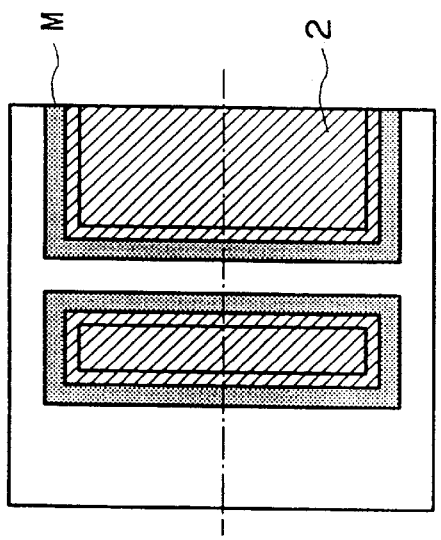
FIG. 47B
FIG. 47C
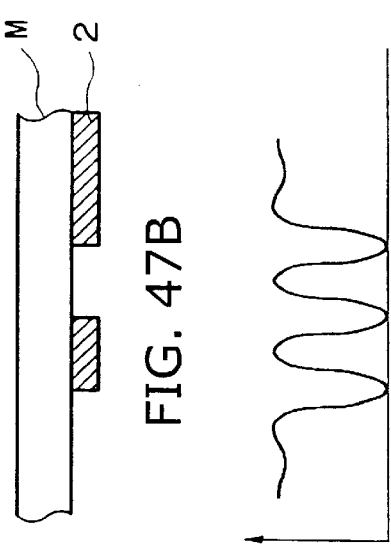
FIG. 47E
FIG. 47F

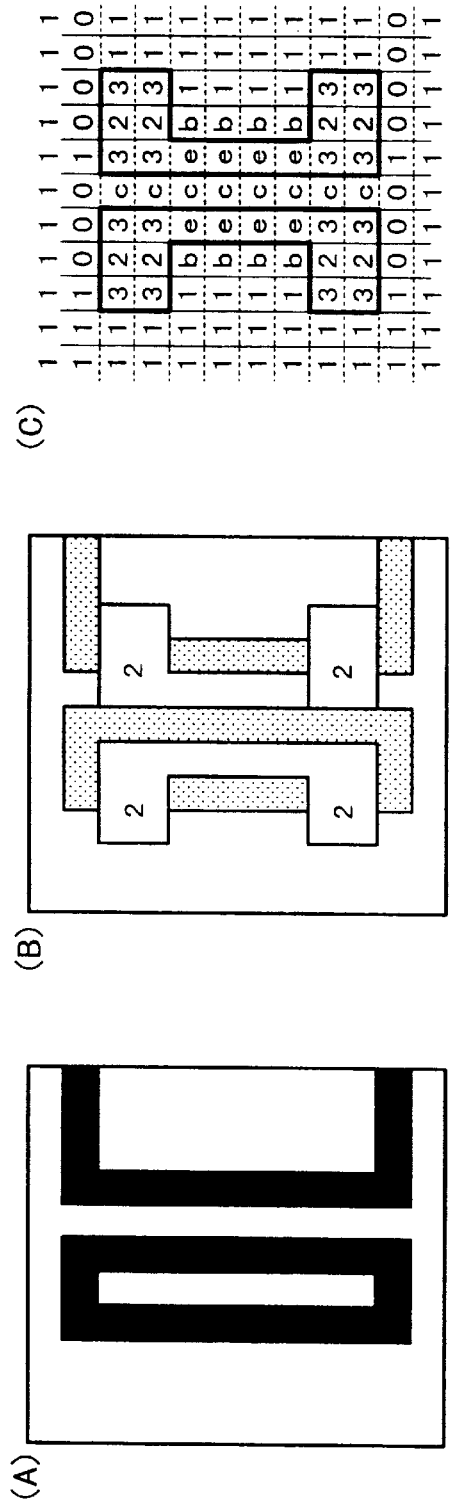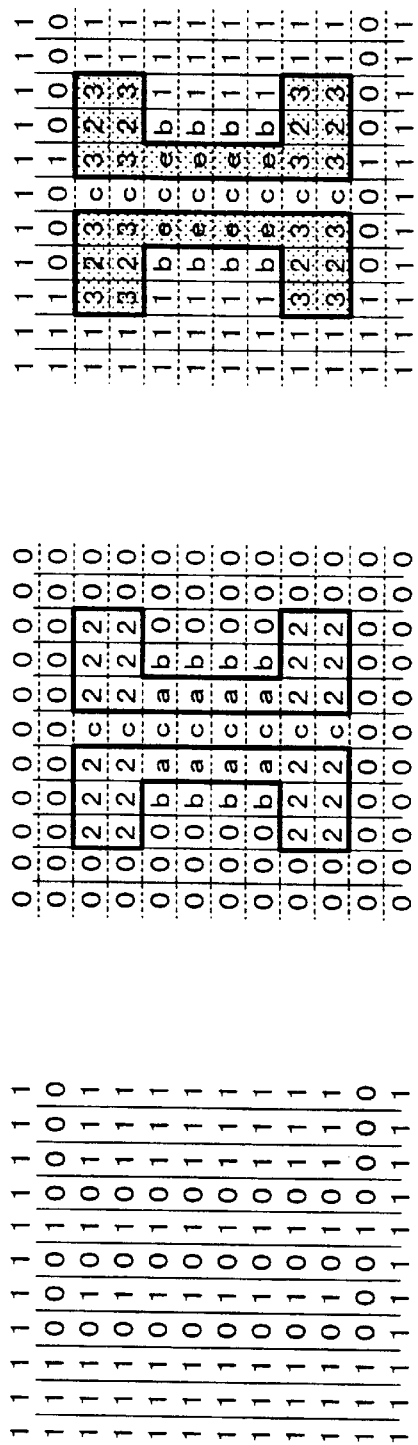
FIG. 49

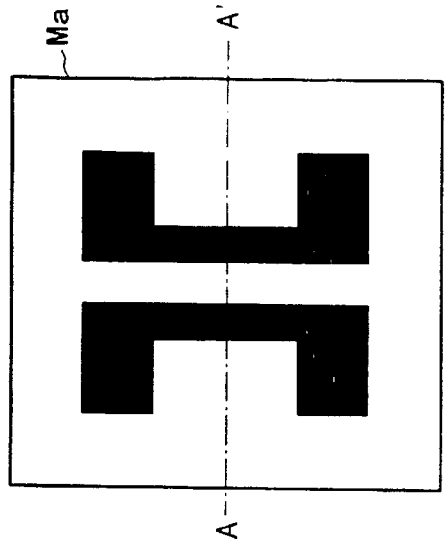
FIG. 50A
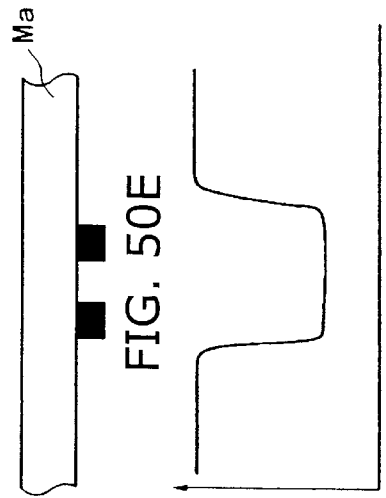
FIG. 50D
FIG. 50B
FIG. 50E
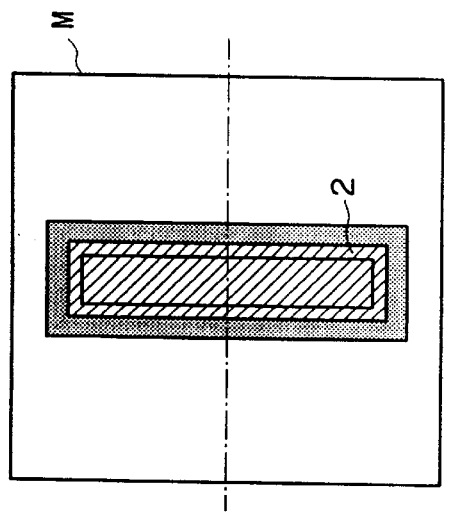
FIG. 50C
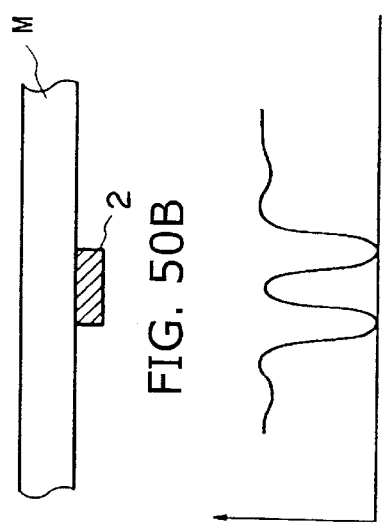
FIG. 50F

DUAL EXPOSURE WITH PERIODIC
PATTERN AND CIRCUIT PATTERN

CIRCUIT PATTERN
WITH SINGLE BAR

CIRCUIT PATTERN
WITH TWO BARS

CIRCUIT PATTERN
WITH THREE BARS (A) EXPOSURE AMOUNT DISTRIBUTION BY ONLY THREE-BAR PATTERN (CONTRAST IS POSITIVE: b>c)
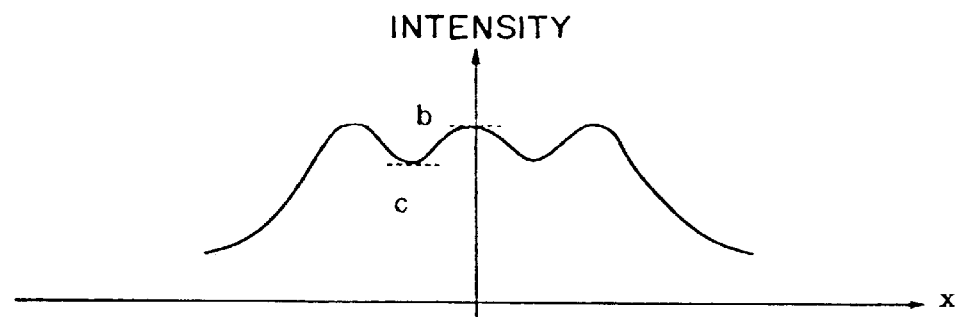
(B) EXPOSURE AMOUNT DISTRIBUTION BY PERIODIC PATTERN ONLY
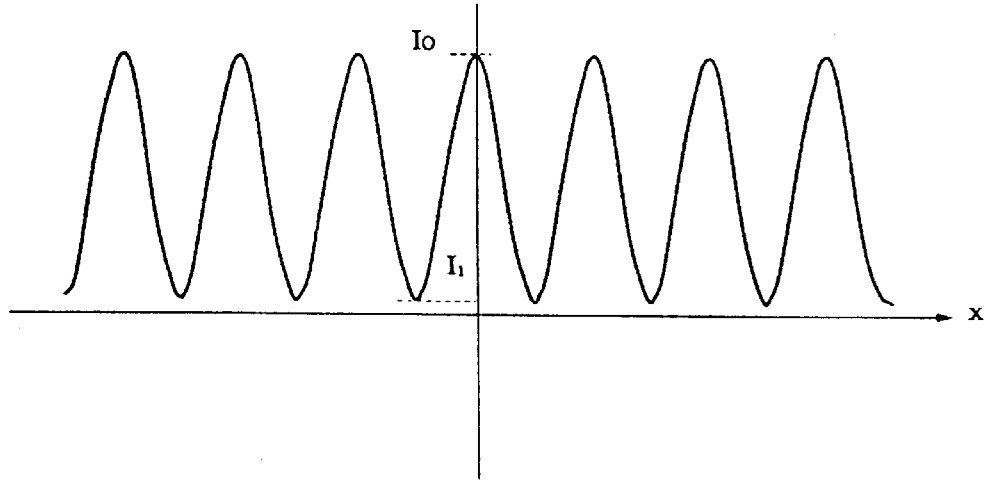
(C) EXPOSURE AMOUNT DISTRIBUTION BY DUAL EXPOSURE
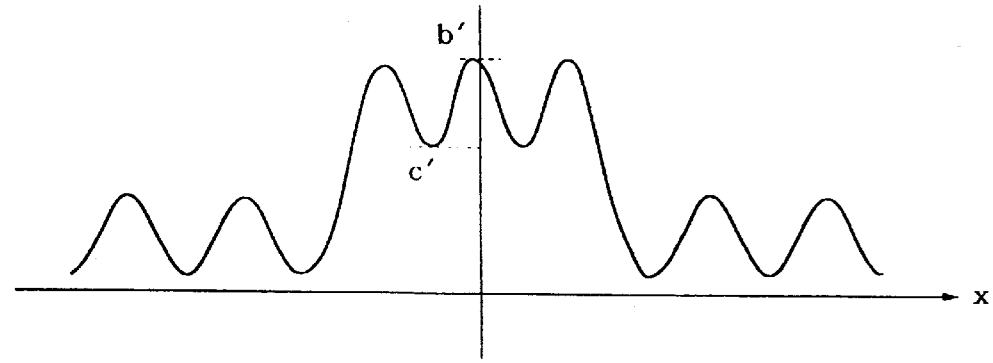
FIG. 57

CONTRAST IN SINGLE EXPOSURE OF PHASE SHIFT MASK
ILLUMINATION CONDITION σ=0.5
(A) THREE BARS
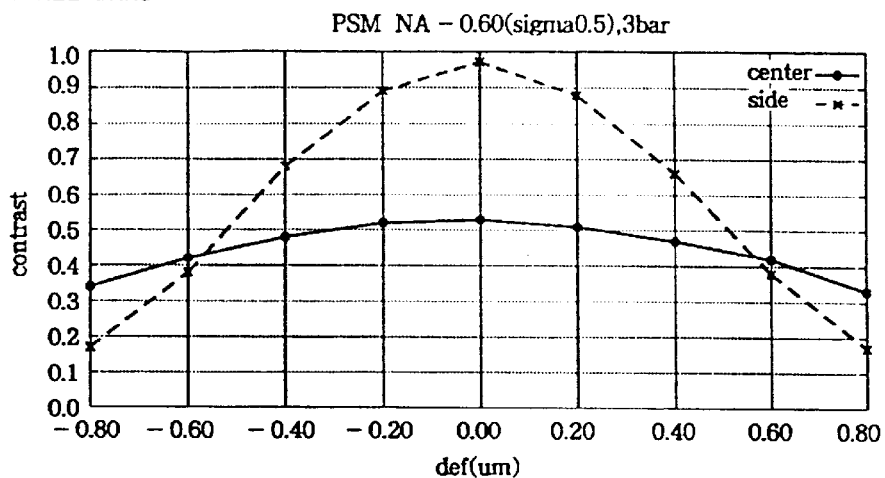
(B) TWO BARS
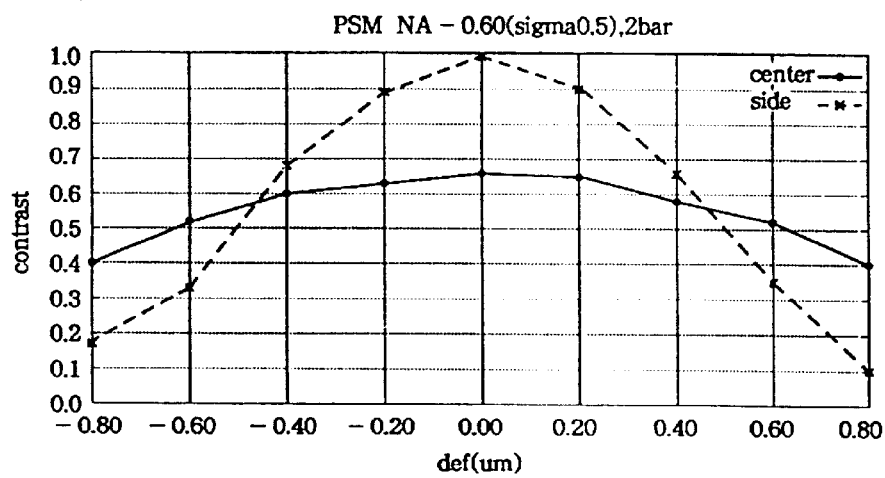
(C) ISOLATED SINGLE BAR
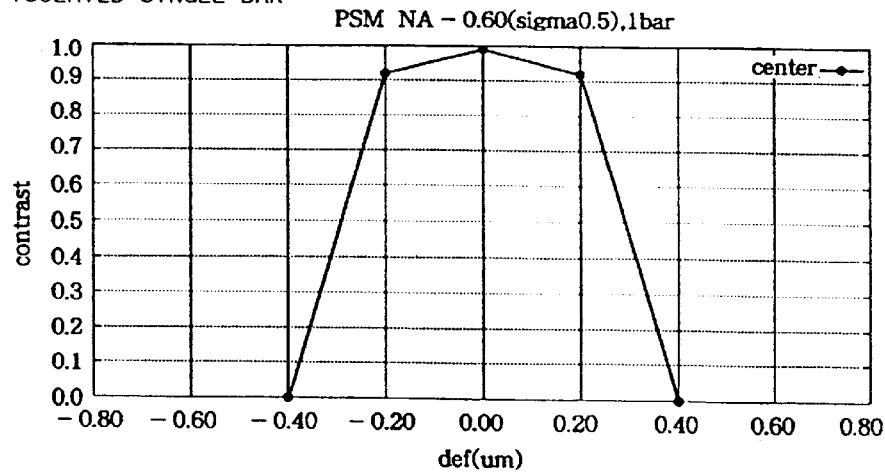
FIG. 60

CONTRAST IN DUAL EXPOSURE
ILLUMINATION CONDITION FOR PERIODIC PATTERN $\sigma=0.2$
ILLUMINATION CONDITION FOR ORDINARY PATTERN $\sigma=0.8$ RING-LIKE
LIGHT QUANTITY RATIO $k=1.5$
(A) THREE BARS
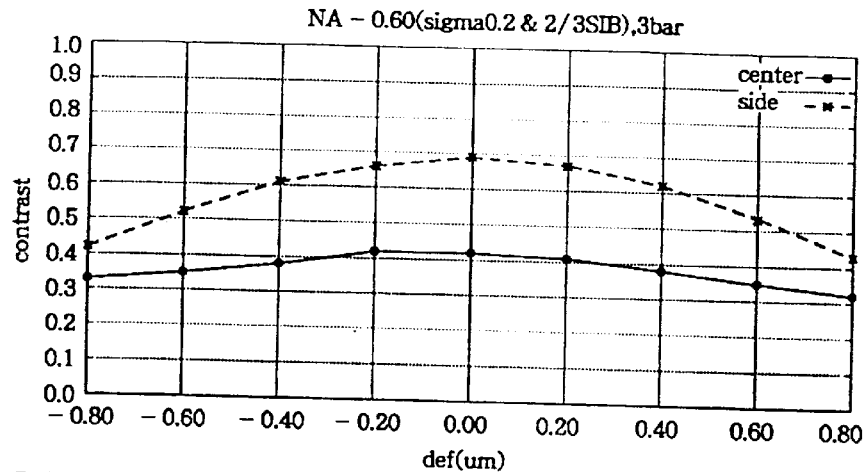
(B) TWO BARS
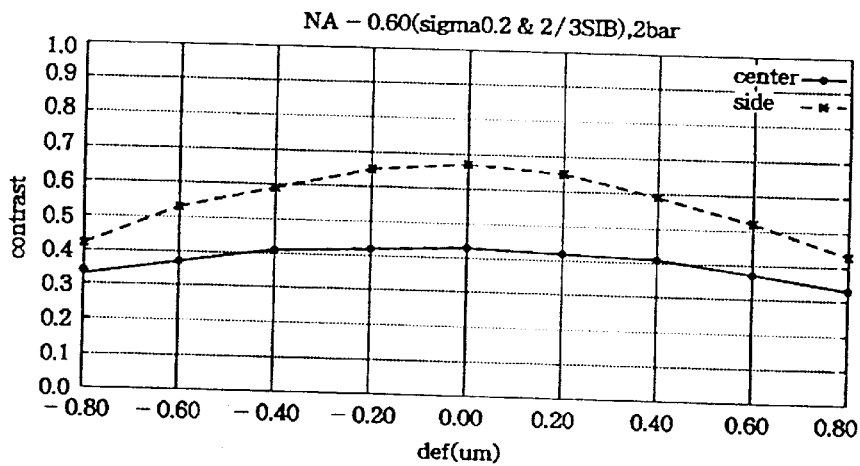
(C) ISOLATED SINGLE BAR
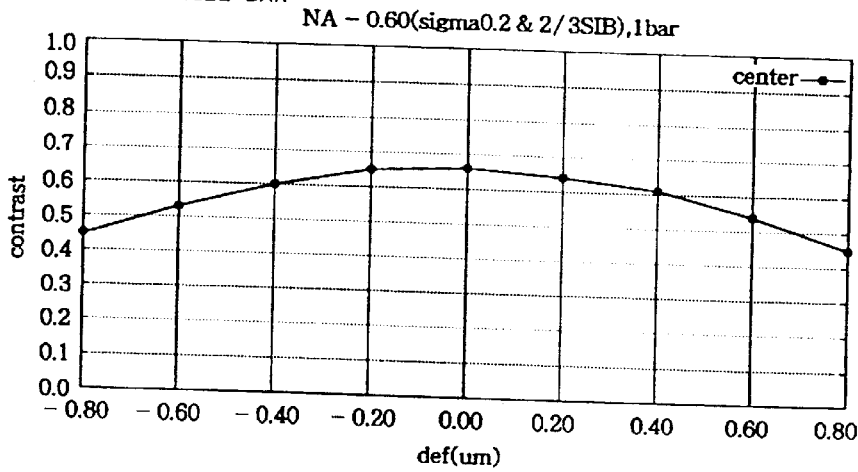
FIG. 61

LINEWIDTH LINEARITY ERROR OF BAR PATTERN EXPOSURE
ILLUMINATION CONDITION σ=0.53～0.8 RING-LIKE
(A) FIVE BARS
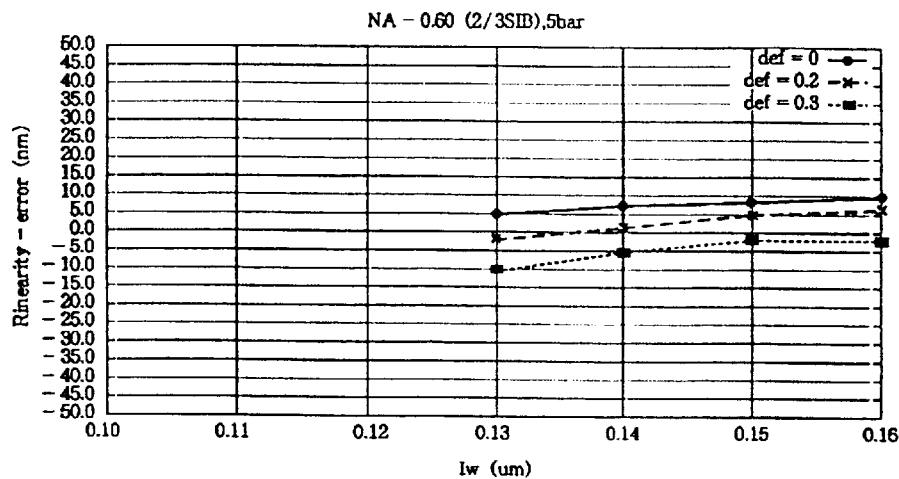
(B) TWO BARS
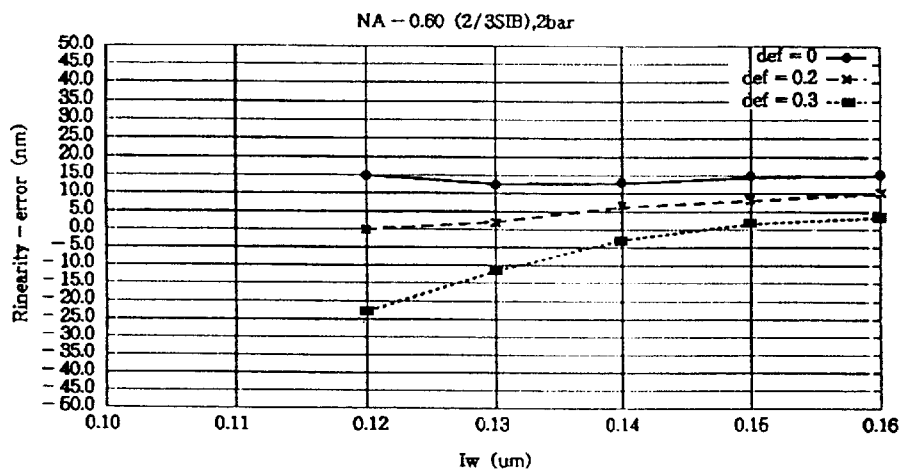
(C) ISOLATED SINGLE BAR
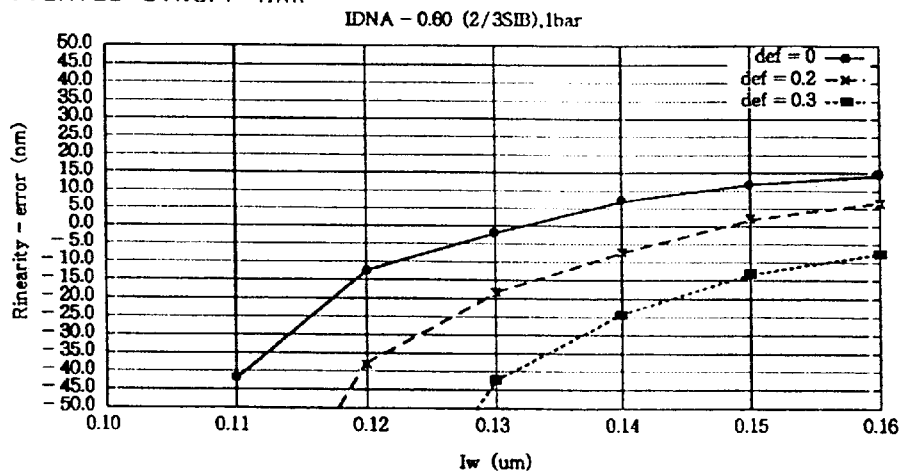
FIG. 62

LINEWIDTH LINEARITY ERROR OF BAR PATTERN EXPOSURE
ILLUMINATION CONDITION FOR PERIODIC PATTERN $\sigma=0.2$
ILLUMINATION CONDITION FOR ORDINARY PATTERN $\sigma=0.53\sim0.8$ RING-LIKE
LIGHT QUANTITY RATIO k=1.5
(A) FIVE BARS
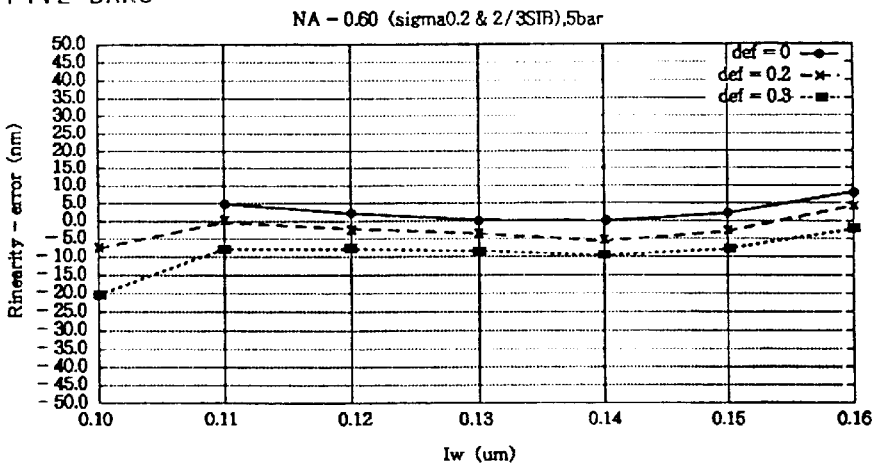
(B) TWO BARS
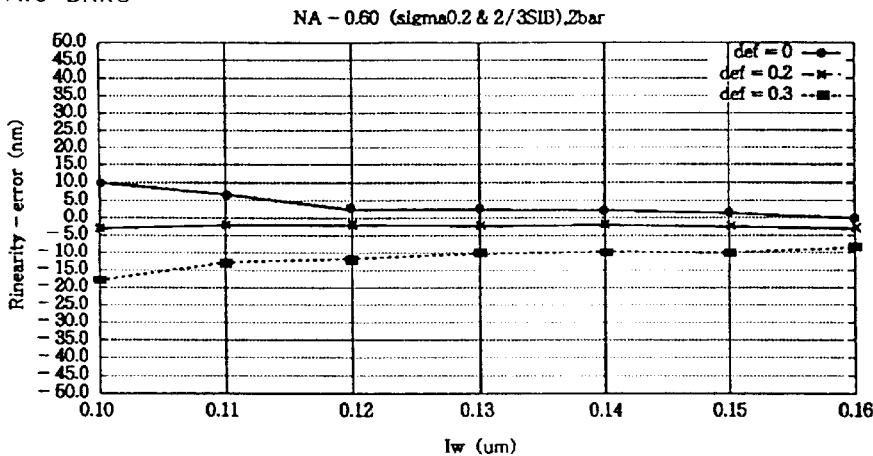
(C) ISOLATED SINGLE BAR
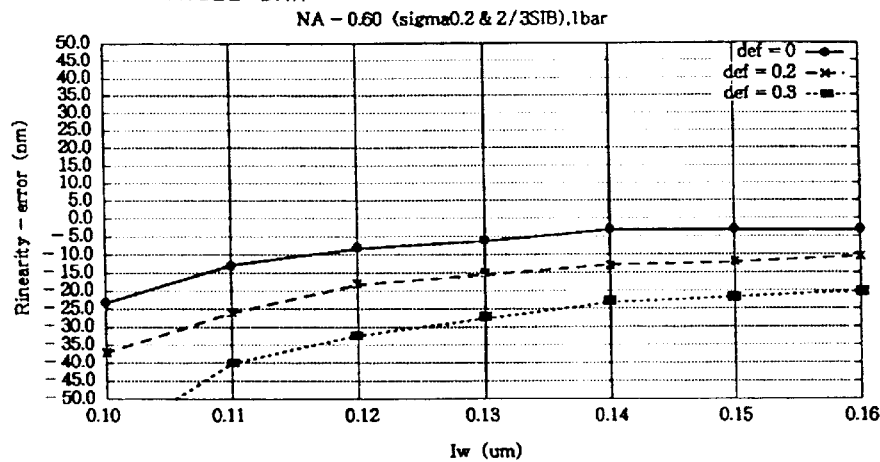
FIG. 63

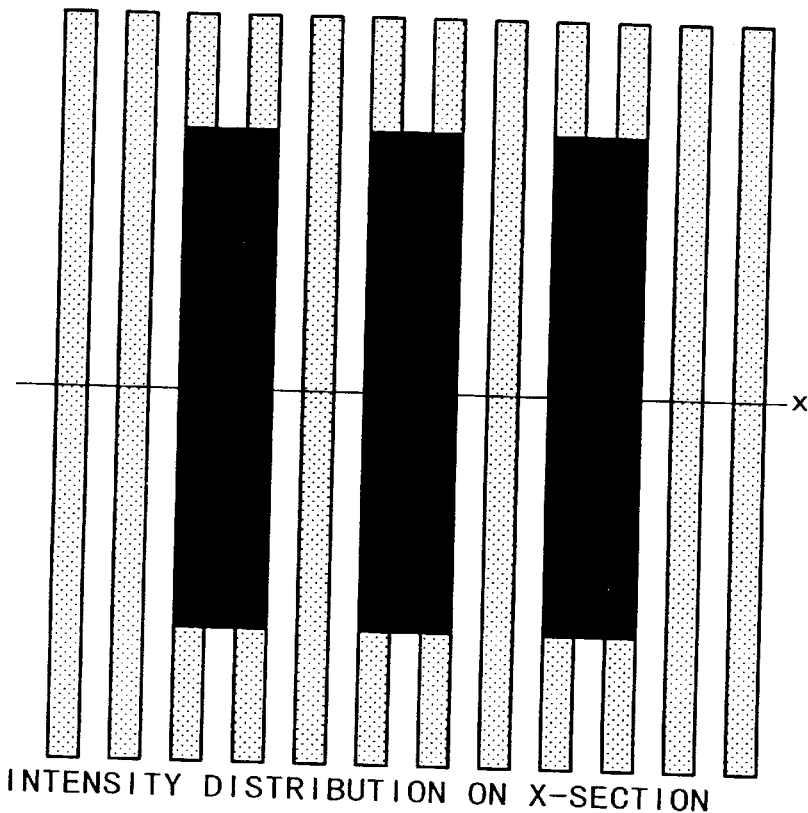
DUAL EXPOSURE WITH PERIODIC PATTERN AND ORDINARY PATTERN
(LINEWIDTH OF ORDINARY PATTERN IS TRIPLE OF PERIODIC PATTERN)
INTENSITY DISTRIBUTION ON X-SECTION
PERIODIC PATTERN 
ORDINARY PATTERN 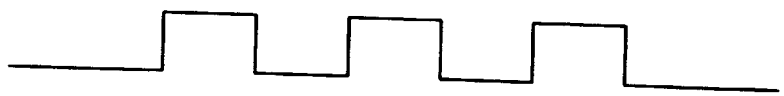
INTENSITY DISTRIBUTION AFTER DUAL EXPOSURE 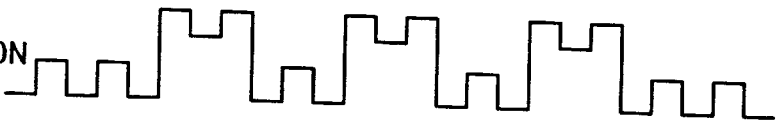
FIG. 64

TWO-DIMENSIONAL IMAGE OF ISOLATED LINE (A) TWO-DIMENSIONAL IMAGE BY ORDINARY EXPOSURE
ILLUMINATION CONDITION
$\sigma=0.8$ RING-LIKE

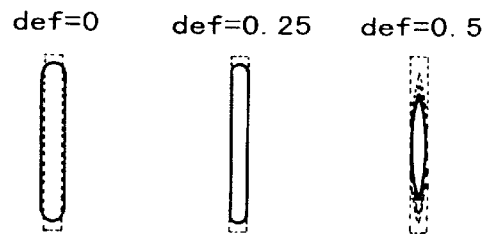

(B) TWO-DIMENSIONAL IMAGE BY DUAL EXPOSURE
ILLUMINATION CONDITION FOR PERIODIC PATTERN
$\sigma=0.2$
ILLUMINATION CONDITION FOR ORDINARY PATTERN
$\sigma=0.8$ RING-LIKE

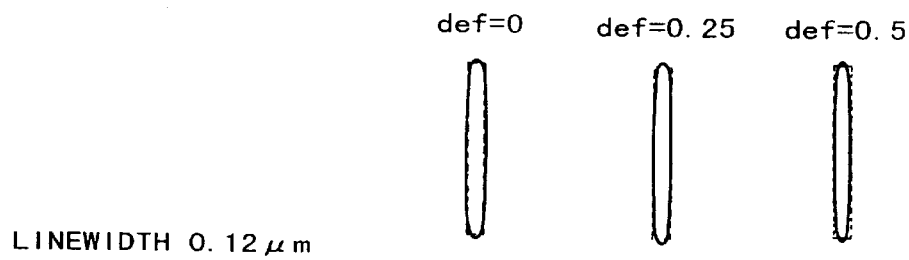

LINEWIDTH $0.12\,\mu m$

LINEWIDTH IN LATERAL DIRECTION (%)

|  | def=0 | def=0.25 | def=0.5 |
|---|---|---|---|
| ORDINARY EXPOSURE | 100 | 82 | 0 |
| DUAL EXPOSURE | 100 | 88 | 39 |

LINEWIDTH IN LONGITUDINAL DIRECTION (%)

|  | def=0 | def=0.25 | def=0.5 |
|---|---|---|---|
| ORDINARY EXPOSURE | 87 | 84 | 0 |
| DUAL EXPOSURE | 91 | 89 | 58 |

FIG. 66

INTENSITY DISTRIBUTIONS BY PERIODIC PATTERN,
ORDINARY PATTERN AND DUAL EXPOSURE
(A) EXPOSURE AMOUNT DISTRIBUTION BY
THREE-BAR PATTERN ONLY
(CONTRAST IS ZERO: b=c)
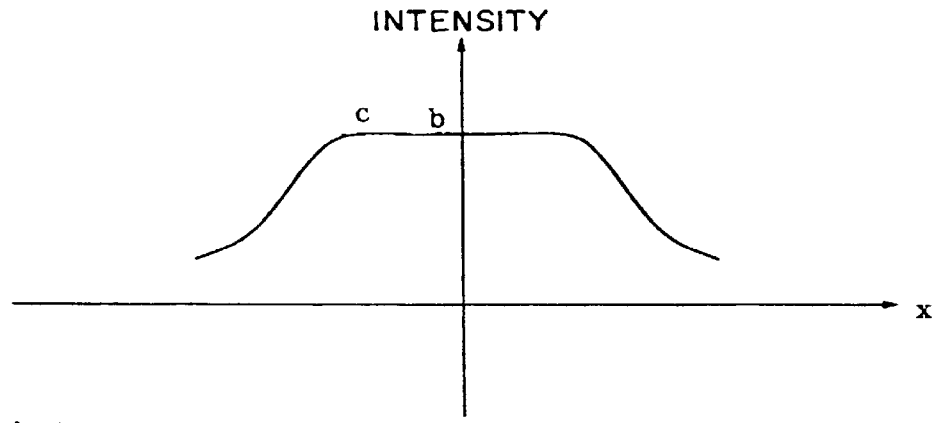
(B) EXPOSURE AMOUNT DISTRIBUTION BY
PERIODIC PATTERN ONLY
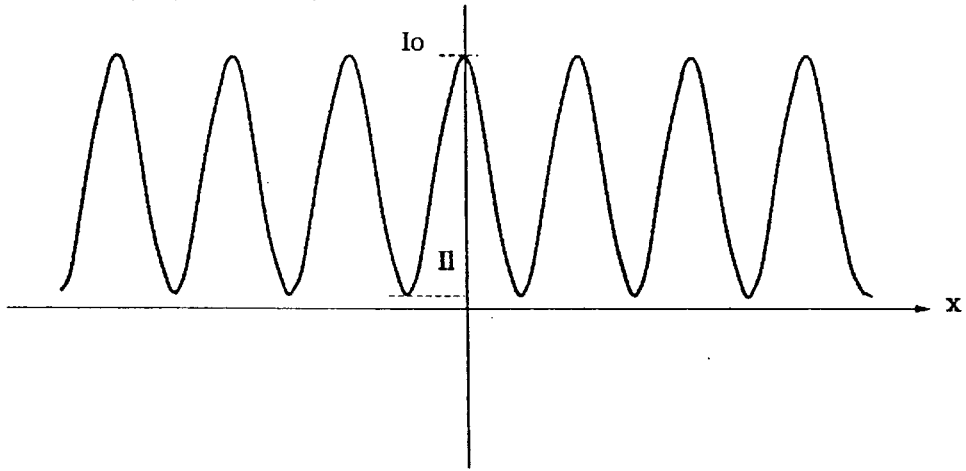
(C) EXPOSURE AMOUNT DISTRIBUTION BY
DUAL EXPOSURE
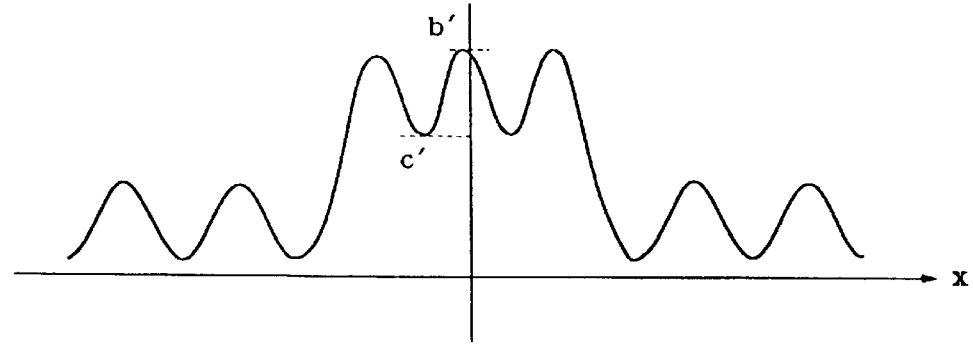
FIG. 67

INTENSITY DISTRIBUTIONS BY PERIODIC PATTERN,
ORDINARY PATTERN AND DUAL EXPOSURE
(A) EXPOSURE AMOUNT DISTRIBUTION BY
THREE-BAR PATTERN ONLY
(CONTRAST IS NEGATIVE: b<c)
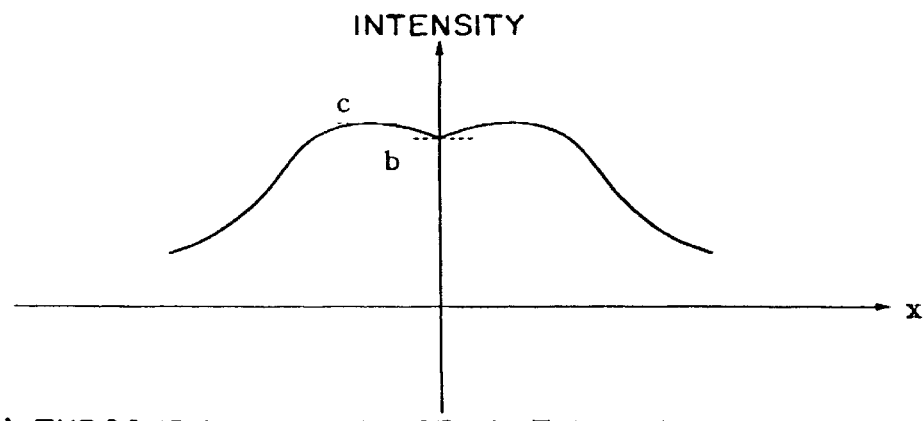
(B) EXPOSURE AMOUNT DISTRIBUTION BY
PERIODIC PATTERN ONLY
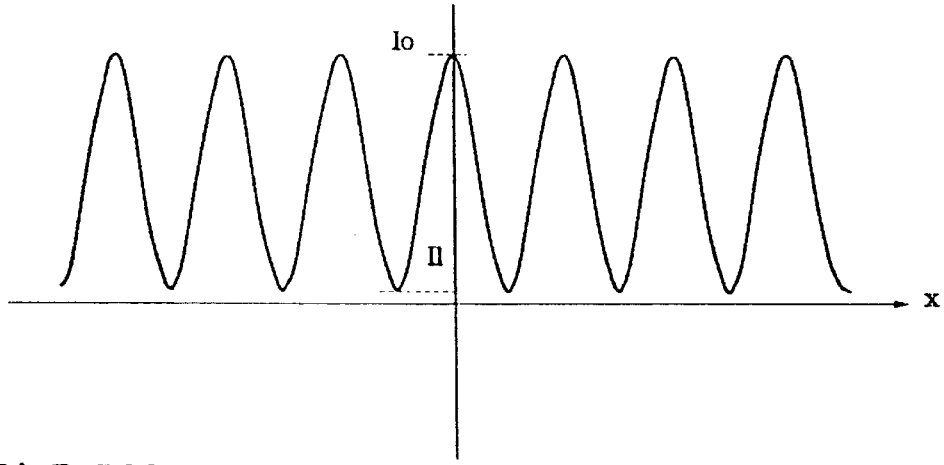
(C) EXPOSURE AMOUNT DISTRIBUTION BY
DUAL EXPOSURE
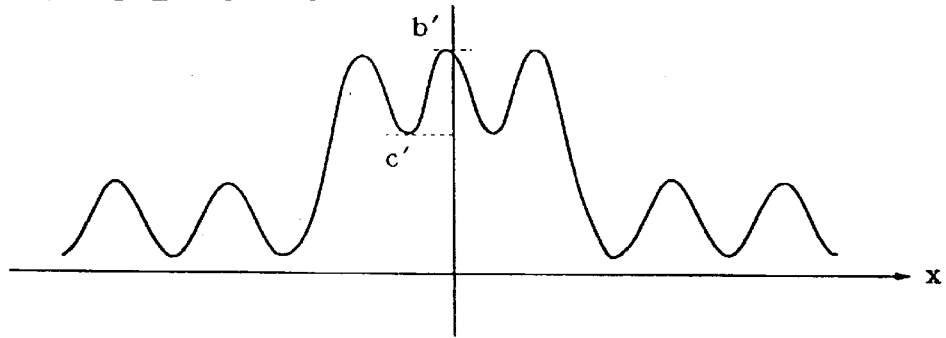
FIG. 68

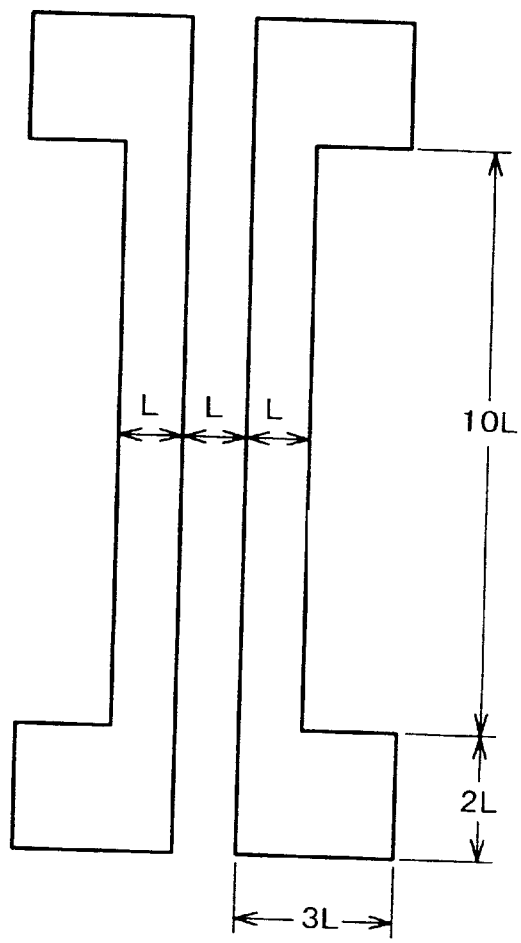
ORDINARY ILLUMINATION PATTERN
"L" IS LINEWIDTH NOT RESOLVABLE BY SINGLE EXPOSURE
WITH EXPOSURE APPARATUS TO BE USED FOR EXPOSURE.
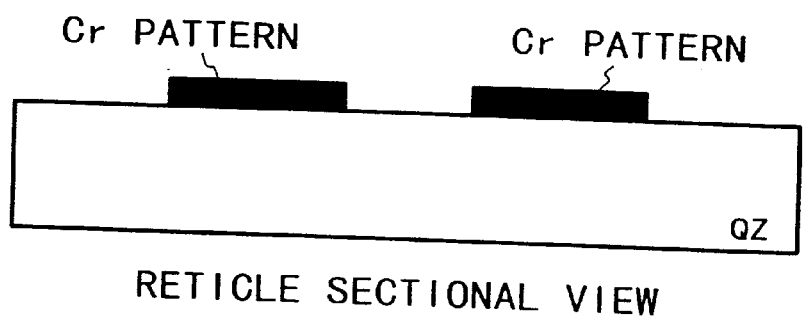
RETICLE SECTIONAL VIEW
FIG. 69

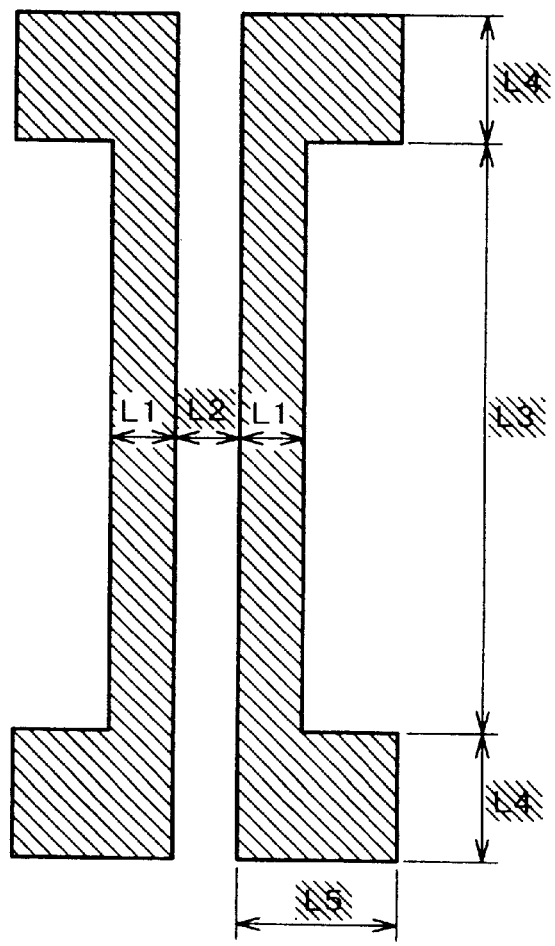
HALFTONE PHASE SHIFT PATTERN
"L" IS LINEWIDTH NOT RESOLVABLE BY SINGLE EXPOSURE
WITH EXPOSURE APPARATUS TO BE USED FOR EXPOSURE.
HALFTONE PHASE SHIFT PATTERN
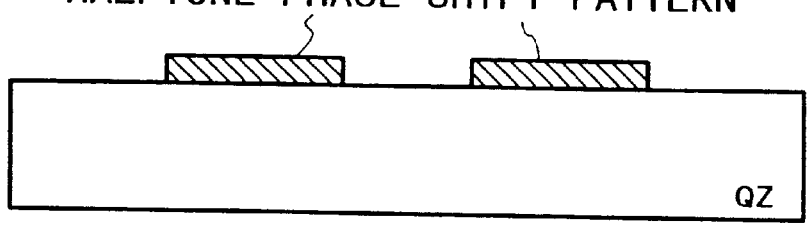
RETICLE SECTIONAL VIEW
FIG. 70

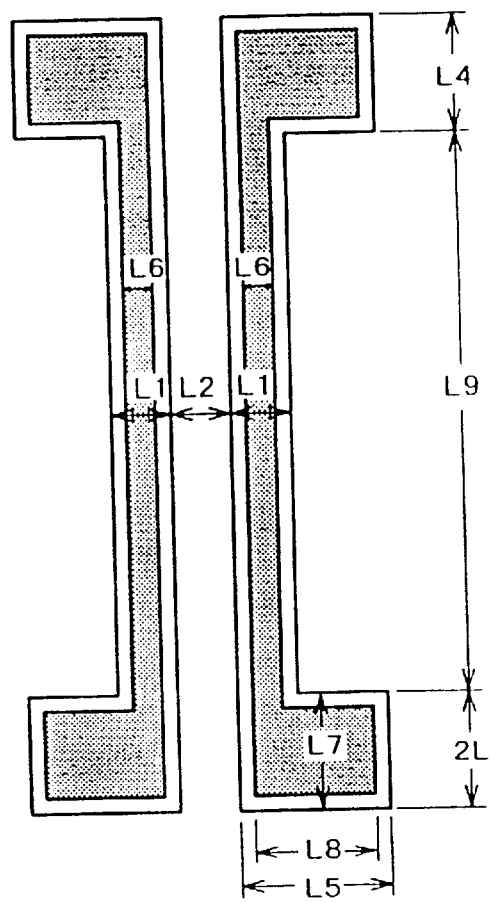
RIM TYPE PHASE SHIFT PATTERN
DOTTED AREA IS Cr PATTERN (LIGHT BLOCKING PORTION),
AND PHASE SHIFTER RIM SURROUNDS IT.
"L" IS LINEWIDTH NOT RESOLVABLE BY SINGLE EXPOSURE
WITH EXPOSURE APPARATUS TO BE USED FOR EXPOSURE.
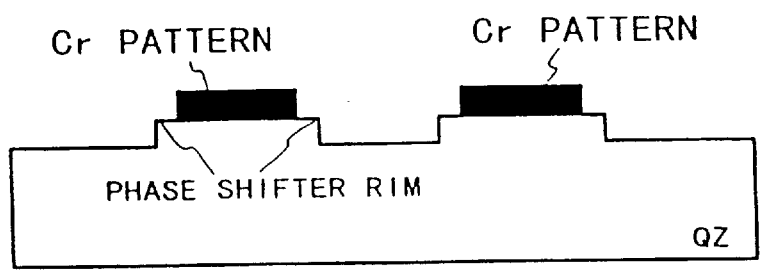
RETICLE SECTIONAL VIEW
FIG. 71

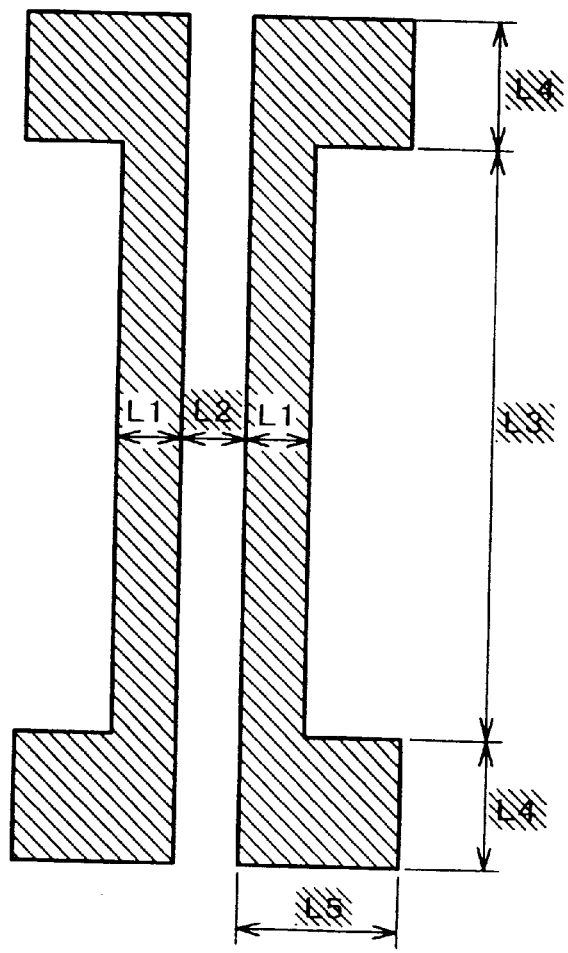
CHROMIUM-LESS SHIFTER LIGHT-BLOCKING TYPE PHASE SHIFT PATTERN
"L" IS LINEWIDTH NOT RESOLVABLE BY SINGLE EXPOSURE WITH EXPOSURE APPARATUS TO BE USED FOR EXPOSURE.
PHASE SHIFT PATTERN
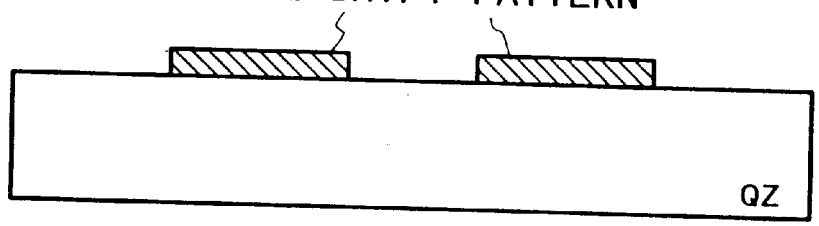
RETICLE SECTIONAL VIEW
FIG. 72

0.1 μm

EFFECTIVE LIGHT SOURCE (SMALL $\sigma$)

LIGHT DISTRIBUTION ON PUPIL (OBJECT SPECTRUM)
LIMIT RESOLUTION BY COHERENT TWO-DIMENSIONAL
EXPOSURE, ACCOMPLISHED (FOUR-BEAM INTERFERENCE)

0.14 $\mu$m L&S (HOLE)

EFFECTIVE LIGHT SOURCE
(45-DEG. QUADRUPOLE)

CORRESPONDING TO MULTIPLE EXPOSURE
OF ONE-DIMENSIONAL LIMIT RESOLUTION
0.1 μmL&S(HOLE)

LIGHT DISTRIBUTION ON PUPIL (OBJECT SPECTRUM)

EFFECTIVE LIGHT SOURCE
(45-DEG. QUADRUPOLE)

CORRESPONDING TO MULTIPLE EXPOSURE
OF ONE-DIMENSIONAL LIMIT RESOLUTION
0.1 μmL&S(HOLE)

LIGHT DISTRIBUTION ON PUPIL (OBJECT SPECTRUM)

DOUBLE-BEAM INTERFERENCE

| 0 | 1 | 0 | 1 | 0 | 1 | 0 | 1 | 0 | 1 | 0 |

| | | | | | | | | | | |
|---|---|---|---|---|---|---|---|---|---|---|
| 0 | 0 | 1 | 0 | 1 | 0 | 1 | 0 | 1 | 0 | 1 | 0 |
| 1 | 1 | 2 | 1 | 2 | 1 | 2 | 1 | 2 | 1 | 2 | 1 |
| 0 | 0 | 1 | 0 | 1 | 0 | 1 | 0 | 1 | 0 | 1 | 0 |
| 1 | 1 | 2 | 1 | 2 | 1 | 2 | 1 | 2 | 1 | 2 | 1 |
| 0 | 0 | 1 | 0 | 1 | 0 | 1 | 0 | 1 | 0 | 1 | 0 |
| 1 | 1 | 2 | 1 | 2 | 1 | 2 | 1 | 2 | 1 | 2 | 1 |
| 0 | 0 | 1 | 0 | 1 | 0 | 1 | 0 | 1 | 0 | 1 | 0 |
| 1 | 1 | 2 | 1 | 2 | 1 | 2 | 1 | 2 | 1 | 2 | 1 |
| 0 | 0 | 1 | 0 | 1 | 0 | 1 | 0 | 1 | 0 | 1 | 0 |
| 1 | 1 | 2 | 1 | 2 | 1 | 2 | 1 | 2 | 1 | 2 | 1 |

DOUBLE-BEAM INTERFERENCE

PRINCPLE OF DOUBLE-BEAM
INTERFERENCE IN STEPPER

EFFECTIVE LIGHT SOURCE (SMALL $\sigma$)

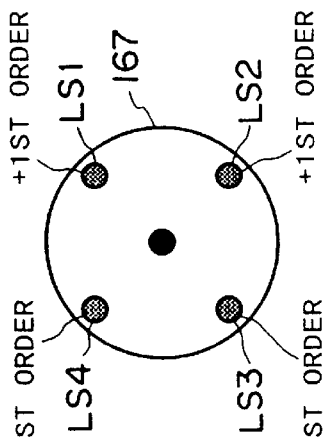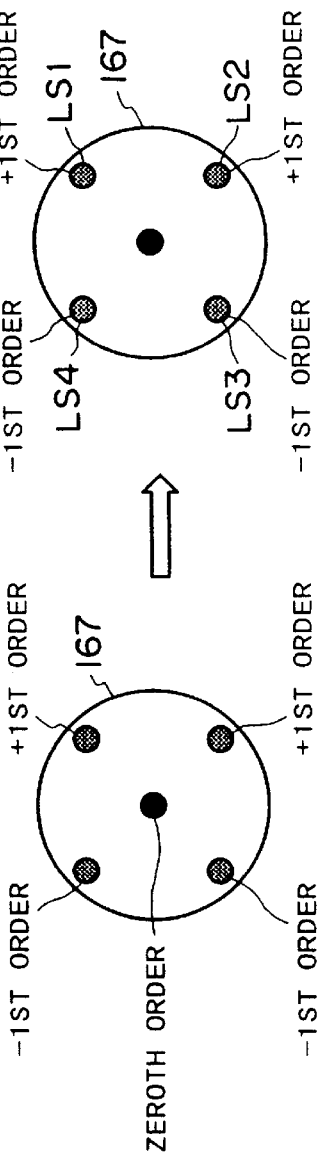
FIG. 95

LIMIT RESOLUTION BY COHERENT TWO-DIMENSIONAL EXPOSURE,
ACCOMPLISHED (FOUR-BEAM INTERFERENCE)

0.14 μm L&S(HOLE)

EFFECT ON IMAGE

EFFECTIVE LIGHT SOURCE
(45-DEG. QUADRUPOLE, LOW
TRANSMISSION FACTOR
AT 2 AND 4)

SUPERPOSITION OF DOUBLE-BEAM INTERFERENCE
0.1 μm L&S

SIDE LOBES ARE EXCLUDED
(MAY BY INCLUDED IN MA, WITH LARGE $\sigma$)

FOUR-BEAM INTERFERENCE

| 0 | 0 | 0 | 0 | 0 | 0 | 0 | 0 | 0 | 0 | 0 |
|---|---|---|---|---|---|---|---|---|---|---|
| 0 | 1 | 0 | 1 | 0 | 1 | 0 | 1 | 0 | 1 | 0 |
| 0 | 0 | 0 | 0 | 0 | 0 | 0 | 0 | 0 | 0 | 0 |
| 0 | 1 | 0 | 1 | 0 | 1 | 0 | 1 | 0 | 1 | 0 |
| 0 | 0 | 0 | 0 | 0 | 0 | 0 | 0 | 0 | 0 | 0 |
| 0 | 1 | 0 | 1 | 0 | 1 | 0 | 1 | 0 | 1 | 0 |
| 0 | 0 | 0 | 0 | 0 | 0 | 0 | 0 | 0 | 0 | 0 |
| 0 | 1 | 0 | 1 | 0 | 1 | 0 | 1 | 0 | 1 | 0 |
| 0 | 0 | 0 | 0 | 0 | 0 | 0 | 0 | 0 | 0 | 0 |
| 0 | 1 | 0 | 1 | 0 | 1 | 0 | 1 | 0 | 1 | 0 |

FOUR-BEAM INTERFERENCE 4.14 μm L&S

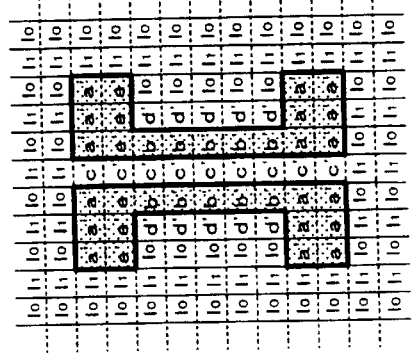
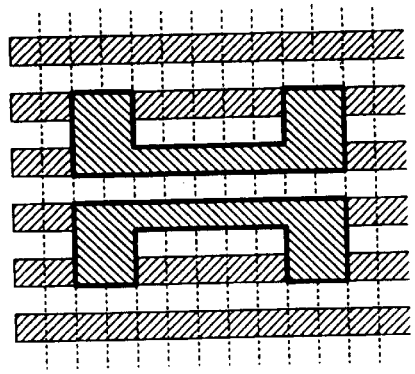
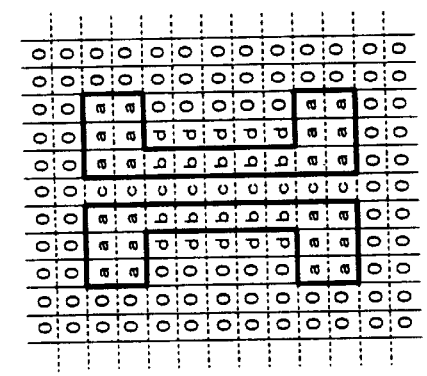
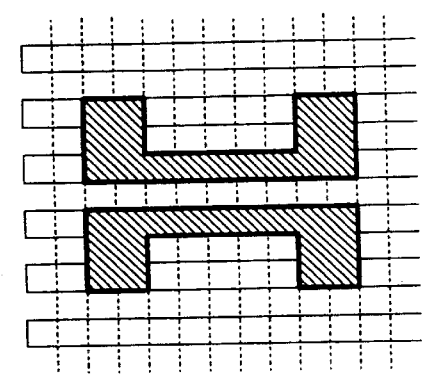
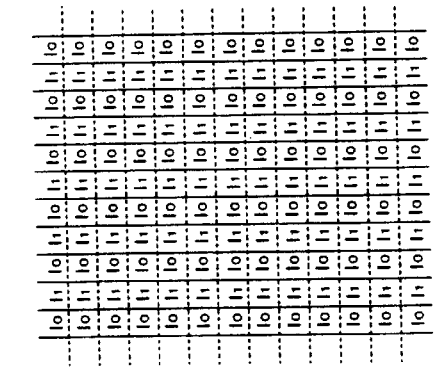
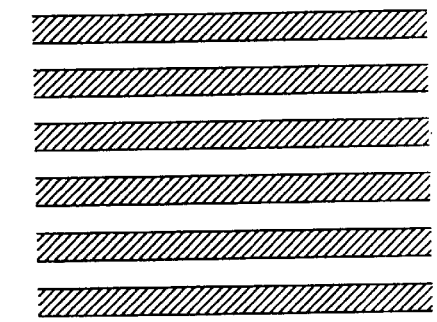
FIG. 110

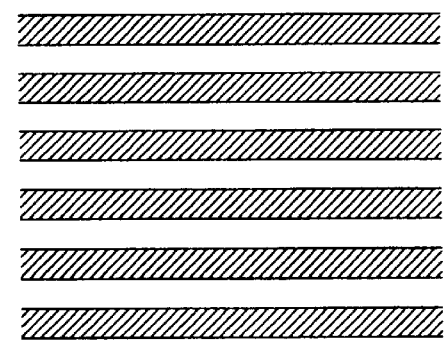
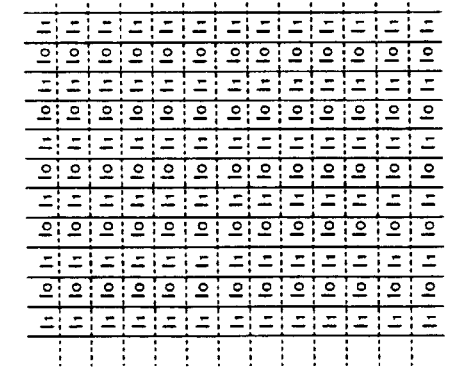
(C)
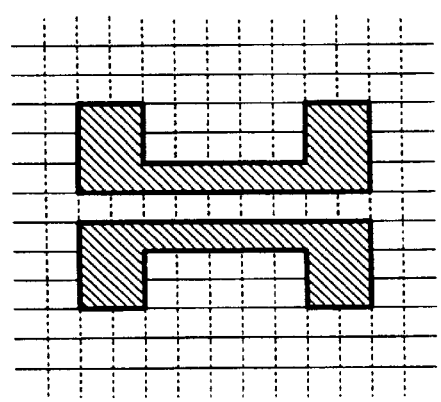
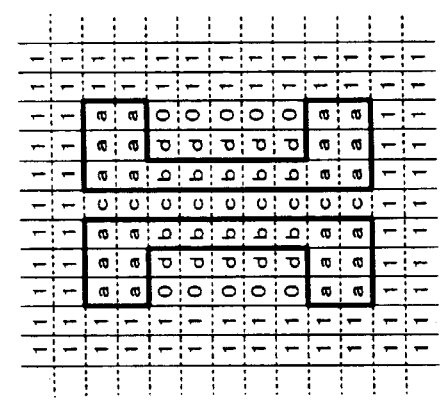
(B)
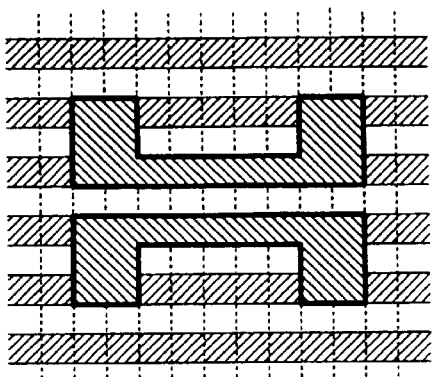
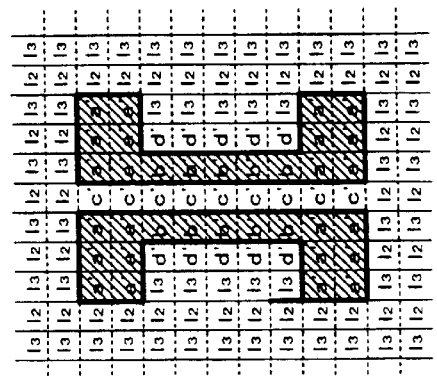
(A)
FIG. 115

MULTIPLE EXPOSURE DEVICE FORMATION

This application is a continuation-in-part of application Ser. No. 09/184,958, filed Nov. 3, 1998 now abandoned, and application Ser. No. 09/255,330, filed Feb. 23, 1999 now abandoned. Application Ser. No. 09/255,330, in turn, is a continuation-in-part of application Ser. No. 09/244,844, filed Feb. 4, 1999.

FIELD OF THE INVENTION AND RELATED ART

This invention relates to an exposure method, an exposure apparatus and a device manufacturing method. In one preferred embodiment, the invention is concerned with a dual or multiple exposure method for printing a fine circuit pattern on a photosensitive substrate, and an exposure apparatus and a device manufacturing method based on the dual (multiple) exposure method. The exposure method and apparatus of the present invention are suitably usable in the manufacture of microdevices such as semiconductor chips (e.g., IC or LSI), display devices (e.g., a liquid crystal panel), detecting devices (e.g., a magnetic head), or image pickup devices (e.g., a CCD), for example.

In the manufacture of devices such as IC, LSI, or liquid crystal panels, for example, on the basis of photolithography, generally, a projection exposure method and a projection exposure apparatus are used, in which a circuit pattern of a photomask or reticle (hereinafter "mask") is projected by a projection optical system onto a photosensitive substrate (hereinafter "wafer") such as a silicon wafer or glass plate having a photoresist coating applied thereto, for example, whereby the pattern is transferred or printed on the substrate.

In order to meet further increases in the density of integration of such devices, further miniaturization of a pattern to be transferred to a wafer (that is, further improvement of resolution) as well as a further increase of the area of a single chip are required. In projection exposure methods and projection exposure apparatuses which are the primary types of microfabrication technology, attempts have been made to improve the resolution and the exposure area that an image of a size (linewidth) of 0.5 micron or less can be formed in a wide range.

FIG. 19 is a schematic view of a projection exposure apparatus of a known type. Denoted in FIG. 19 at 191 is an excimer laser which is a light source for deep ultraviolet light exposure. Denoted at 192 is an illumination optical system, and denoted at 193 is illumination light. Denoted at 194 is a mask, and denoted at 195 is object-side exposure light which, after being emitted from the mask 194, enters an optical system 196. The optical system 196 comprises a reduction projection optical system. Denoted at 197 is image-side exposure light which, after being emitted from the optical system 196, impinges on a photosensitive substrate 198. The substrate 198 comprises a wafer. Denoted at 199 is a substrate stage for holding the photosensitive substrate 198.

Laser light emitted by the excimer laser 191 is directed by a guiding (or directing) optical system to the illumination optical system 192. By means of the projection optical system 192, the light is adjusted or transformed into illumination light 193 having a predetermined light intensity distribution, an orientation distribution, and an opening angle (numerical aperture NA), for example. The illumination light 193 illuminates the mask 194. The mask 194 has a fine pattern of chromium, for example, formed on a quartz substrate. The pattern has a size corresponding to an inverse (e.g., 2×, 4×, or 5×) of the projection magnification of the projection optical system 192. The illumination light 193 is transmissively diffracted by the fine pattern of the mask 194, whereby object-side exposure light 195 is provided. The projection optical system 196 serves to transform the object-side exposure light 195 into image-side exposure light 197 with which the fine pattern of the mask 194 is imaged upon the wafer 198, at the above-described projection magnification and with sufficiently small aberration. As illustrated in an enlarged view at the bottom of FIG. 19, the image-side exposure light 197 is converged upon the wafer 198 with a predetermined numerical aperture (NA=sin θ), whereby an image of the fine pattern is formed on the wafer 198. For sequentially printing the fine pattern on different regions (shot regions, each being a region for the production of one or plural chips), the substrate stage 199 moves stepwise along an image plane of the projection optical system to change the position of the wafer 198 with respect to the projection optical system 196.

Practically, however, with current projection exposure apparatuses having an excimer laser as a light source, it is difficult to form a pattern of 0.15 micron or less.

In the projection optical system 196, there is a limitation in resolution due to a tradeoff between optical resolution and depth of focus which is attributable to the wavelength of exposure light (hereinafter "exposure wavelength"). The relation between resolution R and depth of focus DOF of a projection exposure apparatus can be expressed in accordance with Rayleigh's equation, such as equations (1) and (2) below:

$$R = k_1(\lambda/NA) \quad (1)$$

$$DOF = k_2(\lambda/NA^2) \quad (2)$$

where λ is the exposure wavelength, NA is the image-side numerical aperture that represents brightness of the projection optical system 196, and $k_1$ and $k_2$ are constants which are usually about 0.5–0.7. It is seen from equations (1) and (2) that, in order to provide higher resolution with a smaller resolution value R, the numerical aperture NA may be enlarged (enlargement of NA). However, in a practical exposure process, the depth of focus DOF of the projection optical system 196 should be not less than a certain value and, therefore, enlargement of the numerical aperture NA beyond a certain level is not practicable. Thus, for higher resolution, it is necessary to make the exposure wavelength λ shorter (shortening of wavelength).

However, shortening of the wavelength raises a serious problem. That is, there is no lens glass material available for the projection optical system 196. Almost all glass materials have about a zero transmissivity to the deep ultraviolet region. While there is a fused silica which can be produced as a glass material in an exposure apparatus with an exposure wavelength about 248 nm in accordance with a special manufacturing method, the transmissivity of even such fused silica decreases drastically to an exposure wavelength not longer than 193 nm. Thus, it may be very difficult to develop a practical glass material having a sufficiently high transmission factor in a region not longer than an exposure wavelength of 150 nm, corresponding to a fine pattern of 0.15 micron or less. Further, the glass material to be used in the deep ultraviolet region should, to some extent, satisfy several other conditions such as durability, uniformness of birefringence or refraction factor, optical distortion, and workability or machining characteristic, for example. For these reasons, development of a practical glass material for use in an exposure wavelength region not longer than 150 nm will not easily be accomplished.

In conventional projection exposure methods and projection exposure apparatuses, such as described, for the formation of a pattern of 0.15 micron or less upon a wafer 198, the exposure wavelength should be shortened to about 150 nm or less. Nevertheless, since there is no practical glass material available for such a wavelength region, practically, it is very difficult to form a pattern of 0.15 micron or less on the wafer 198.

U.S. Pat. No. 5,415,835 shows a process of forming a fine pattern by use of dual-beam interference exposure (also known as "double-beam interference exposure"). This exposure process involves the use of two mutually coherent light beams that interfere with each other to produce an interference fringe. With this dual-beam interference exposure process, a pattern of 0.15 micron or less may be formed on a wafer.

Referring to FIG. 15, the principle of dual-beam interference exposure will be explained. In accordance with dual-beam interference exposure, laser light from a laser 151 which comprises parallel light having coherency is divided by a half mirror 152 into two light beams. These light beams are then reflected by flat mirrors 153, such that the two laser light beams (coherent parallel light beams) intersect with each other at an angle not less than zero deg. and not greater than 90 deg., whereby an interference fringe is produced at the intersection. A wafer 154 is exposed and sensitized by use of this interference fringe (i.e., the light intensity distribution of it), by which a fine periodic pattern corresponding to the intensity distribution of the interference fringe is formed on the wafer.

When the two light beams intersect at the wafer surface in a state wherein they are inclined with respect to a normal to the wafer surface oppositely by the same angle, the resolution R attainable with this dual-beam interference exposure process can be expressed by equation (3) below:

$$R = \lambda/(4 \sin \theta)$$
$$= \lambda/4NA$$
$$= 0.25(\lambda/NA) \quad (3)$$

where R represents widths of line and space, respectively, that is, widths of bright and dark portions of the interference fringe, respectively, and $\theta$ denotes an incidence angle (absolute value) of the two light beams with respect to the image plane. (AS noted above, NA=sin $\theta$.)

Comparing equation (1) for resolution according to an ordinary projection exposure process with equation (3) for resolution according to a dual-beam interference exposure process, since resolution R in the dual-beam interference exposure corresponds to that in a case where $k_1=0.25$ in equation (1), it is seen that with the dual-beam interference exposure, a resolution two or more times higher than that of an ordinary projection exposure process ($k_1=0.5$ to 0.7) can be provided. Although it is not discussed in the aforementioned U.S. patent, if $\lambda=0.248$ nm (KrF excimer laser) and NA=0.6, a resolution R=0.10 micron may be attainable.

In accordance with the dual-beam interference exposure process just described, however, basically only a simple fringe pattern corresponding to the light intensity distribution of an interference fringe (i.e., exposure amount distribution) is attainable. It is not possible to produce a complicated pattern of a desired shape, such as a circuit pattern, on a wafer using this exposure process.

The aforementioned U.S. Pat. No. 5,415,835 proposes a procedure in which, after a simple (periodic) exposure amount distribution is applied to a resist of a wafer through an interference fringe by using a dual-beam interference exposure apparatus, a separate exposure apparatus is used so that a portion of the resist corresponding to the bright portion of the interference fringe is exposed to an image of an opening of a mask by which a certain exposure amount is applied to that portion (dual exposure). By this, the exposure amounts only at particular line portions of plural bright portions of the interference fringe are enlarged uniformly, beyond the threshold of the resist. Consequently, after development, isolated lines (resist pattern) are produced.

With this dual exposure method proposed in U.S. Pat. No. 5,415,835, however, what is attainable is only a circuit pattern of a simple shape which comprises a portion of stripe patterns that can be formed by double-beam interference exposure. On the other hand, an ordinary circuit pattern comprises a combination of many types of patterns having various linewidths and various orientations. It is, therefore, not attainable to produce a complicated pattern such as a circuit pattern.

Further, while the aforementioned U.S. Pat. No. 5,415,835 discusses a combined use of a dual-beam interference exposure process and an ordinary exposure process, it does not mention the structure of an exposure apparatus suitable for this combination.

Japanese Laid-Open Patent Application, Laid-Open No. 253649/1995 shows a dual exposure method with which a fine isolated pattern similar to that of the aforementioned U.S. Pat. No. 5,415,835 may be formed. In accordance with this dual exposure method, an ordinary projection exposure apparatus is used to perform both a double-beam interference exposure based on a phase shift pattern and an exposure based on an image of a fine opening pattern (which are not resolvable with this exposure apparatus), to the same region on a resist of a wafer. The exposure wavelengths used in these exposures differ from each other by 50 nm or more.

Further, in the dual exposure method shown in Japanese Laid-Open Patent Application, Laid-Open No. 253649/1995, the pattern of the mask is formed by use of a material having a wavelength selectivity such that the double-beam interference exposure and the ordinary exposure are performed by using one and the same mask (pattern). The pattern (of the mask) in the ordinary exposure comprises one or more isolated patterns, and also, the circuit pattern (exposure amount distribution or surface step distribution after development) produced as a result of dual exposure comprises one or more isolated patterns, only.

Therefore, even with the dual exposure method shown in Japanese Laid-Open Patent Application, Laid Open No. 253649/1995, like the aforementioned U.S. Pat. No. 5,415,835, it is not attainable to produce a pattern of a complicated shape such as a circuit pattern.

SUMMARY OF THE INVENTION

It is an object of the present invention to provide an exposure method and/or an exposure apparatus by which a circuit pattern of a complicated shape can be produced through multiple exposure. Here, the words "multiple exposure" refer to a process wherein exposures are made to the same location on a resist without intervention of a development process between these exposures. The exposures may be double or triple or more.

It is another object of the present invention to provide a device manufacturing method and/or an exposure apparatus that uses a dual or multiple exposure method.

In accordance with an aspect of the present invention, there is provided an exposure method for dual or multiple exposure, comprising the steps of:

performing a first exposure process by use of an interference fringe produced by interference of two light beams; and performing a second exposure process by use of a light pattern different from the interference fringe; wherein, in at least one of the first and second exposure processes, a multiplex exposure amount distribution is provided.

In one preferred form of this aspect of the present invention, in the second exposure process, a multiplex exposure amount distribution may be applied.

In one preferred form of this aspect of the present invention, the second exposure process may be performed by use of plural masks having different patterns.

In one preferred form of this aspect of the present invention, the second exposure process may be performed by use of a mask with plural transparent regions having different transmissivities.

In one preferred form of this aspect of the present invention, the first exposure process may be performed by use of a pattern of a phase shift mask and a projection exposure apparatus.

In one preferred form of this aspect of the present invention, the first exposure process may be performed by use of an interferometer.

In one preferred form of this aspect of the present invention, the first and second exposure processes may be performed by use of a projection exposure apparatus.

In one preferred form of this aspect of the present invention, the first exposure process may be performed by use of a phase shift mask.

In one preferred form of this aspect of the present invention, in the first exposure process, a multiplex exposure amount distribution may be applied.

In accordance with another aspect of the present invention, there is provided a device manufacturing method including a step for transferring a device pattern onto a workpiece by use of an exposure method as recited above.

In accordance with a further aspect of the present invention, there is provided a projection exposure apparatus for performing an exposure method as recited above.

The first and second exposure processes may be performed sequentially or at the same time. When they are performed sequentially, basically, either may be performed first.

Here, the word "multiplex" referred to above in relation to the phrase "multiplex exposure amount distribution" means that, unlike a binary exposure amount (two levels including a zero level exposure amount) to be applied to a photosensitive substrate, more than a binary exposure amount (three or more levels including a zero level exposure amount) is given. Further, the words "ordinary exposure (process)" are used to refer to an exposure process which is to be done with a resolution lower than that attainable with dual-beam interference exposure and to be done with a pattern different from that used in the dual-beam interference exposure. A typical example of such an ordinary exposure process is projection exposure for projecting a mask pattern through a projection exposure apparatus such as shown in FIG. 19.

Each of the dual-beam interference exposure process and ordinary exposure process to be performed in the present invention may comprise a single exposure step or plural exposure steps. In the latter case, in each step, a different exposure amount may be applied to a photosensitive substrate.

In an exposure method and exposure apparatus according to the present invention, if the second exposure process is to be performed through projection exposure, the first and second exposure processes may use exposure wavelengths not greater than 400 nm, preferably not greater than 250 nm. Exposure light of a wavelength not greater than 250 mm may be available from a KrF excimer laser (about 248 nm) or an ArF excimer laser (about 193 nm).

An exposure apparatus according to the present invention may comprise a projection optical system for projecting a pattern of a mask onto a wafer, and a mask illumination system for selectively providing partially coherent illumination and coherent illumination. An ordinary exposure process may be performed with partially coherent illumination, while dual-beam interference illumination may be performed with coherent illumination. Here, the words "partially coherent illumination" are used to refer to an illumination mode with σ (="numerical aperture of the illumination optical system" divided by "numerical aperture of the projection optical system") which is larger than zero and smaller than one. The words "coherent illumination" are used to refer to an illumination mode with σ which is equal to or close to zero, it being very small as compared with the a value of the partially coherent illumination.

The exposure apparatus described just above may use an exposure wavelength not greater than 400 nm, preferably not greater than 250 nm. Exposure light of a wavelength not greater than 250 mm may be available from a KrF excimer laser (about 248 nm) or an ArF excimer laser (about 193 nm).

One preferred embodiment of the present invention, to be described later, includes an optical system for a mask illumination optical system that enables interchanging between partially coherent illumination and coherent illumination.

An exposure system according to another preferred embodiment of the present invention may comprise a combination of a dual-beam interference exposure apparatus and an ordinary (projection) exposure apparatus, and a movement stage for holding a workpiece (photosensitive substrate) and being used in both of these apparatuses. This exposure system may use an exposure wavelength not greater than 400 nm, preferably not greater than 250 nm. Exposure light of a wavelength not greater than 250 mm may be available from a KrF excimer laser (about 248 nm) or an ArF excimer laser (about 193 nm).

In accordance with another aspect of the present invention, there is provided an exposure method and exposure apparatus for exposing a resist with a mask having pattern portions being different with respect to contrast of image, wherein the position where an image of a pattern portion, of the mask, having lowest contrast of image is formed is exposed with an image of contrast higher than the lowest contrast image, whereby contrast of an exposure amount distribution related to the pattern portion of lowest contrast is improved.

In accordance with still another aspect of the present invention, there is provided an exposure method and apparatus for exposing a resist with a mask having pattern portions being different with respect to linewidth, wherein the position where an image of a pattern portion, of the mask, having a smallest linewidth is formed is exposed with an image of contrast higher than the image of the smallest linewidth pattern portion, whereby contrast of an exposure amount distribution related to the pattern of lower contrast is improved.

In accordance with a further aspect of the present invention, there is provided an exposure method and exposure apparatus for exposing a resist with a mask having plural pattern portions being different with respect to contrast of image, wherein multiple exposure to be performed with the method or apparatus includes a first exposure in which an exposure amount by an image of a pattern portion, of the pattern portions of the mask, of lowest contrast does not exceed an exposure threshold of the resist while an exposure amount by an image of another pattern portion exceeds the exposure threshold, and a second exposure in which the position where the image of lowest contrast is formed is exposed with an image of contrast higher than the image of lowest contrast.

In accordance with a still further aspect of the present invention, there is provided an exposure method and exposure apparatus for exposing a resist with a mask having plural pattern portions being different with respect to linewidth, wherein multiple exposure to be performed with the method or apparatus includes a first exposure in which an exposure amount by an image of a pattern portion, of the pattern portions of the mask, of smallest linewidth does not exceed an exposure threshold of the resist while an exposure amount by an image of another pattern portion exceeds the exposure threshold, and a second exposure in which the position where the image of smallest linewidth is formed is exposed with an image of a contrast higher than the image of lowest contrast.

In one preferred form of these aspects of the present invention, the resist may be exposed with images of patterns of the mask by use of radiation such as ultraviolet rays, X-rays, or an electron beam, for example, and with the use of or without use of a projection optical system.

The image of high or higher contrast may be formed by use of radiation of the same wavelength as the aforementioned radiation.

The resist may be exposed with the higher contrast image and the image of the pattern simultaneously. The resist may be exposed with the higher contrast image and, thereafter, it may be imaged with the image of the pattern. The resist may be exposed with the image of the pattern and, thereafter, it may be exposed with the higher contrast image.

The image of higher contrast may be formed by projecting a mask of a phase shift type. The phase shift type mask may comprise a Levenson-type phase shift mask. The phase shift type mask may include a phase shifter portion for applying a mutual phase shift of 180 deg. to radiation beams passing through two regions, respectively, without passing a light blocking portion. The phase shift type mask may include an isolated pattern provided by the phase shifter portion. The phase shift type mask may include a repetition pattern having arrayed phase shifter portions.

The image of higher contrast may be formed by projecting two parallel lights, resulting from division of laser light, onto the resist in different directions, to cause interference of them on the resist. The image of higher contrast may be formed by using a probe of light or electrons. The image of higher contrast may be formed by illuminating a repetition pattern of the mask along an oblique direction and by projecting it.

The first-mentioned mask may comprise a phase shift mask. The first-mentioned mask may comprise a phase shift mask of one of halftone type, rim type and chromium-less shifter light blocking type, with a result of a good-contrast exposure amount distribution.

The pattern of the first-mentioned mask may be illuminated along an oblique direction and may be projected by a projection optical system. The image of higher contrast may be formed in a state where a is not greater than 0.3 and by imaging a pattern of a phase shift mask, wherein the phase shift mask may comprise a Levenson-type phase shift mask.

In one preferred form of an exposure method and exposure apparatus of the present invention, the center position of the intensity distribution of an image of the pattern of the mask should be registered with the center position of the intensity distribution of the image of higher contrast. However, from the relation with contrast of an exposure amount distribution to be finally formed upon the resist, deviation within a certain range is allowed to the center positions of the intensity distributions of these images.

There is no limitation to exposure wavelength, in the present invention. However, the present invention is particularly suitably usable with an exposure wavelength of 250 nm or shorter. An exposure wavelength not longer than 250 nm may be provided by use of a KrF excimer laser (about 248 nm) or an ArF excimer laser (about 193 nm).

The present invention may be embodied, for example, by use of a projection exposure apparatus comprising a projection optical system for projecting a pattern of a mask to a wafer, and a mask illumination optical system which can perform (large σ) partial coherent illumination wherein σ (sigma) is relatively large, and (small σ) partial coherent illumination wherein σ is relatively small or coherent illumination. For example, projection exposure of the mask pattern (circuit pattern) may be performed through the large σ partial coherent illumination, while a phase shift type mask may be illuminated through coherent illumination or small σ partial coherent illumination. With such double-beam interference illumination, exposure of a higher contrast image by an interference image can be made.

The words "partial coherent illumination" refer to illumination wherein the value of σ (="mask side numerical aperture of the illumination optical system"/"mask side numerical aperture of the projection optical system") is larger than zero and smaller than 1. The words "coherent illumination" refer to one in which the value of g is zero or close to zero, and it is very small as compared with σ of partial illumination. A large σ refers to σ not smaller than 0.6, while a small σ refers to σ not larger than 0.3.

The exposure apparatus may include an optical system for the mask illumination optical system, wherein partial coherent illumination, coherent illumination, and partial coherent illumination of a relatively small σ can be interchanged.

The present invention may be embodied by an exposure system which includes a double-beam interference exposure apparatus such as shown in FIG. 15, a projection exposure apparatus such as shown in FIG. 19, and a movement stage used in both of these exposure apparatuses for holding a wafer (photosensitive substrate). An exposure wavelength to be used may be not longer than 400 nm as described and, particularly, not longer than 250 nm. Light of an exposure wavelength not longer than 250 nm may be provided by use of a KrF excimer laser (about 248 nm) or an ArF excimer laser (about 193 nm).

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A and 2B are schematic views, respectively, for explaining an exposure pattern through a dual-beam interference exposure process.

FIGS. 7A and 7B are schematic views, respectively, for explaining an example of an exposure pattern (lithographic pattern) to be produced in a first embodiment of the present invention.

FIGS. 8A and 8B are schematic views, respectively, for explaining another example of an exposure pattern (lithographic pattern) to be produced in the first embodiment of the present invention.

FIGS. 11A, 11B, 11C and 11D are schematic views, respectively, for explaining a second embodiment of the present invention.

FIGS. 29A and 29B are schematic views, respectively, for explaining an example of an exposure pattern (lithography pattern) which can be produced in a first embodiment of the present invention.

FIGS. 30A and 30B are schematic views, respectively, for explaining another example of an exposure pattern (lithography pattern) which can be produced in the first embodiment of the present invention.

FIGS. 31A and 31B are schematic views, respectively, for explaining a further example of an exposure pattern (lithography pattern) which can be produced in the first embodiment of the present invention.

FIG. 32 is a schematic view for explaining a gate pattern which can be produced in a second embodiment of the present invention.

FIG. 33 is a schematic view for explaining a dual exposure process in the second embodiment of the present invention.

FIGS. 47A–47F are schematic views, respectively, for explaining a ground mask for gate pattern exposure and an ordinary mask, as well as an exposure distribution on the mask surface.

FIG. 49 is a schematic view for two-dimensionally explaining an embodiment of the present invention.

FIGS. 50A–50F are schematic views, respectively, for explaining another example of forming a gate pattern by using a black ground.

FIG. 57 consists of three schematic views for explaining intensity distributions (exposure amount distributions) to be produced on a resist by exposure with a three-bar pattern (image), exposure with a periodic pattern (image) and dual exposure with a three-bar pattern (image) and periodic pattern (image), respectively.

FIG. 60 shows graphs for explaining the relation between defocus and contrast, when exposures of patterns with single to three bars are made by use of a phase shift mask and under σ=0.5.

FIG. 61 shows graphs for explaining the relation between defocus and contrast, when dual exposure by a pattern with single to three bars and a periodic pattern is made in accordance with ordinary illumination of σ=0.2 for the periodic pattern and with ring-like illumination of σ=0.8 for the bar pattern.

FIG. 62 shows graphs for explaining a linewidth linearity error, when exposures by patterns (images) of single to three bars are made in accordance with ring-like illumination of σ=0.53–0.8.

FIG. 63 shows graphs for explaining linewidth linearity error, when dual exposures by patterns (images) of single to three bars and a periodic pattern (image) are made in accordance with ordinary illumination of σ=0.2 for the periodic pattern and with ring-like illumination of σ=0.53–0.8 for bar patterns.

FIG. 64 is a schematic view for explaining dual exposure with a periodic pattern and a three-bar pattern having a large linewidth ratio.

FIG. 66 is a schematic view for explaining a difference in two-dimensional image by single exposure with a single bar pattern and dual exposure combined with a periodic pattern.

FIG. 67 is a schematic view for explaining intensity distributions resulting from exposure with a zero-contrast pattern (image), exposure with a high-contrast periodic pattern (image) and dual exposure based on these exposures.

FIG. 68 is a schematic view for explaining intensity distributions resulting from exposure with a zero-contrast pattern (image), exposure with a high-contrast periodic pattern (image) and dual exposure based on these exposures.

FIG. 69 is a schematic view of a reticle having an ordinary chromium pattern.

FIG. 70 is a schematic view of a reticle having a halftone phase shift pattern.

FIG. 71 is a schematic view of a reticle having a rim type phase shift pattern.

FIG. 72 is a schematic view of a reticle having a chromium-less shifter light blocking type phase shift pattern.

FIG. 95 is a schematic view for explaining a light intensity distribution on a pupil plane, in FIG. 92.

FIG. 110 is a schematic view for explaining exposure amount setting in a multiple exposure process according to the present invention.

FIG. 115 is a schematic view for explaining another example of exposure amount setting for a positive type resist, in a multiple exposure method according to a further embodiment of the present invention.

DESCRIPTION OF THE PREFERRED EMBODIMENTS

Referring to FIGS. 1–9, an exposure method according to an embodiment of the present invention will be described.

Figure 1:
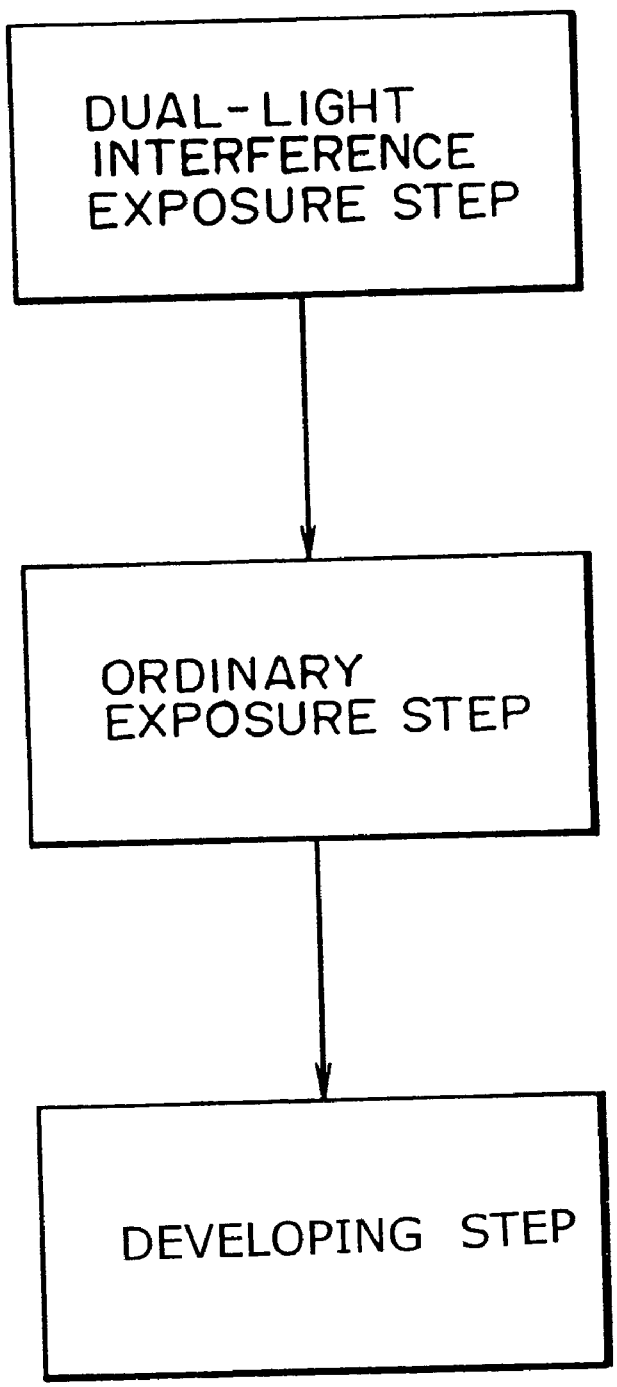
FIG. 1 is a flow chart of an exposure method according to an embodiment of the present invention.

FIG. 1 is a flow chart showing the exposure method in this embodiment of the present invention. FIG. 1 illustrates a dual-beam interference exposure step, a projection exposure step (ordinary exposure step), and a developing step, in respective blocks of the flow chart. The order of the dual-beam interference exposure step and the projection exposure step may be reversed from that shown in FIG. 1. If any one of these steps comprises plural exposures, these steps may be made alternately. Between these exposure steps, a step for a fine alignment operation may be included, while not shown in the drawings.

In an exposure operation according to the flow chart of FIG. 1, first a wafer (photosensitive substrate) is exposed with a periodic pattern (interference fringe) such as shown in FIG. 2A through the dual-beam interference exposure. The numerals in FIG. 2A denote the amount of exposure. Those regions with hatching in FIG. 2A correspond to portions with exposure amount 1 (actually, arbitrary), while the blank regions correspond to portions with a zero exposure amount.

For development of such a periodic pattern after exposure, usually the exposure threshold $E_{th}$ for the resist of the photosensitive substrate is set between exposure amounts 0 and 1, as illustrated at the bottom of FIG. 2B. The upper portion of FIG. 2B illustrates a lithographic pattern (pattern with concaved and protruded portions) to be produced finally.

Figure 3A:
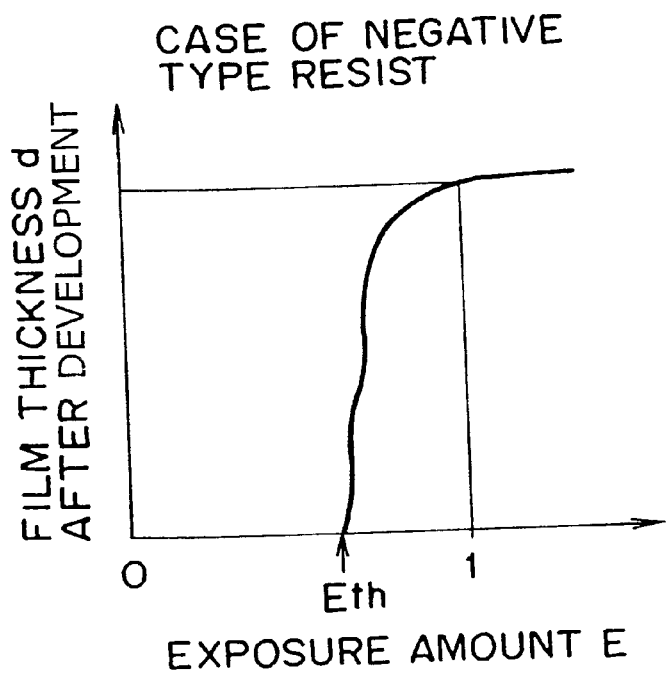
FIGS. 3A and 3B are graphs, respectively, for explaining an exposure sensitivity characteristic of resist materials.
Figure 3B:
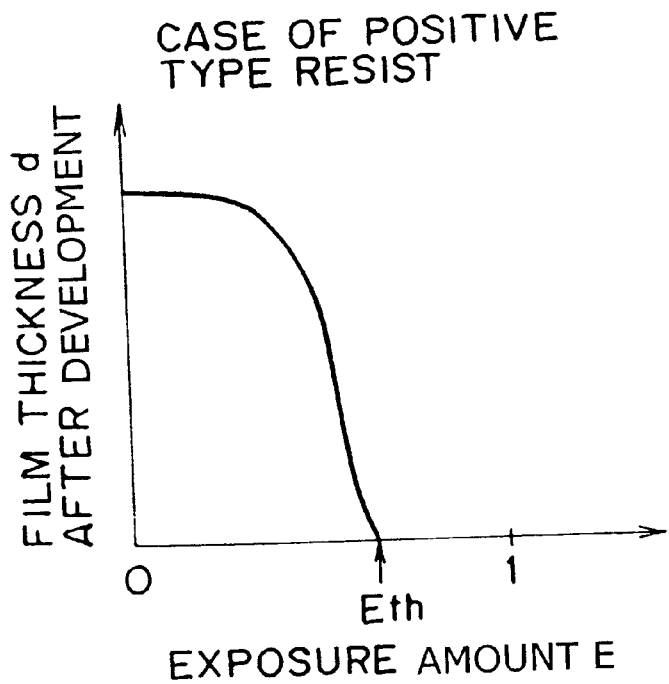

FIGS. 3A and 3B illustrate an exposure amount dependency of film thickness after development and exposure threshold, with regard to the resist of the photosensitive substrate, in this case, the graphs being plotted in relation to a positive type resist and negative type resist. The film thickness after development becomes zero, with a level higher than the exposure threshold in the case of a positive type resist, and with a level lower than the exposure threshold in the case of a negative type resist.

Figure 4:
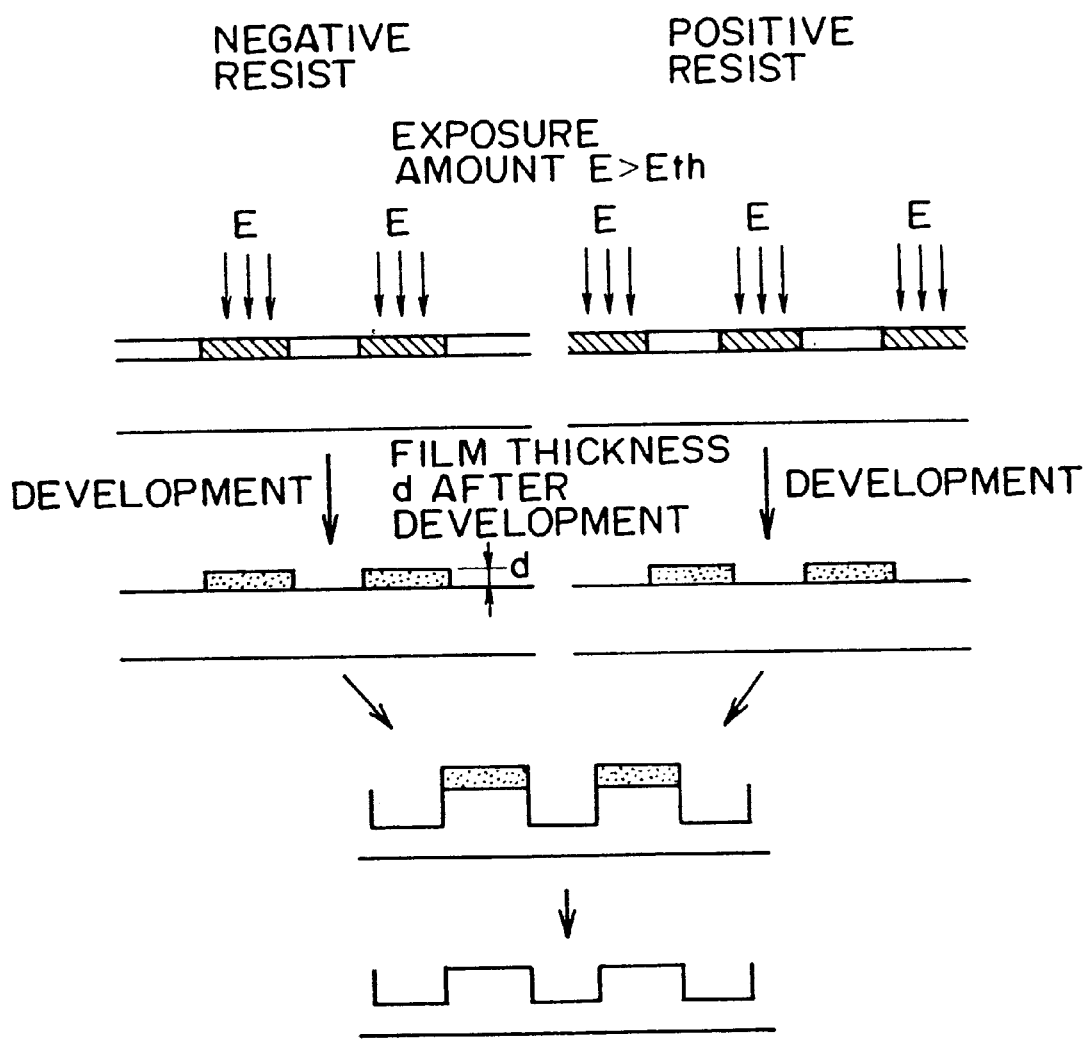
FIG. 4 is a schematic view for explaining pattern formation with a development process.

FIG. 4 is a schematic view for explaining, in relation to the positive and negative type resists, the formation of a lithographic pattern after a development process and an etching process after the exposure process is performed as described above.

Figure 6:
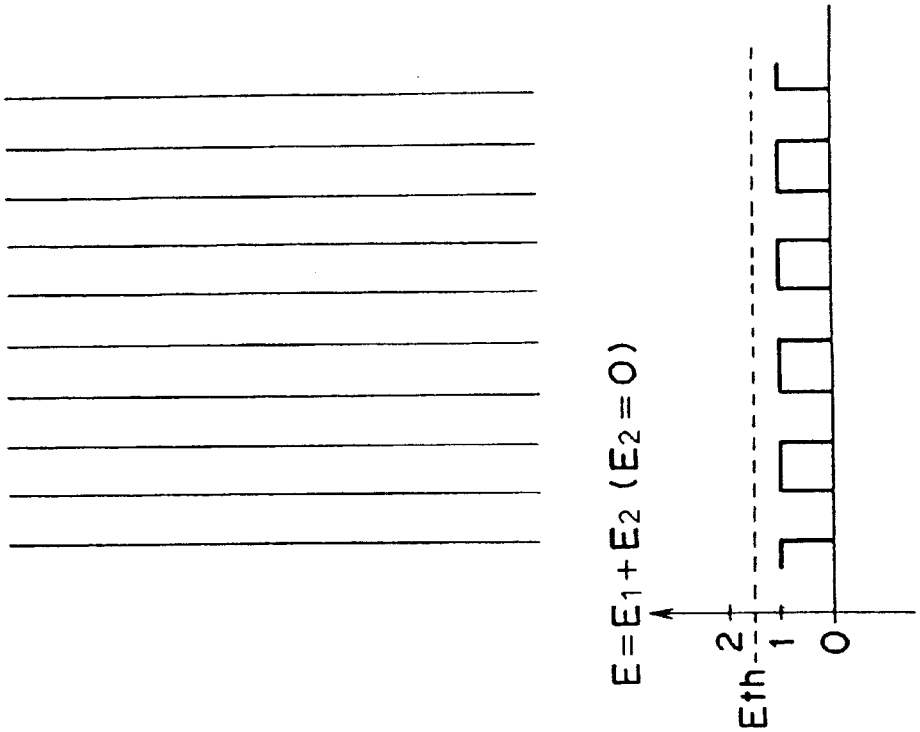
FIG. 6 is a schematic view for explaining an exposure pattern through a dual-beam interference exposure according to the present invention.

In this embodiment, as compared with a usual exposure sensitivity setting described above, as shown in FIG. 5 (the same as FIG. 2A) and FIG. 6, the exposure threshold $E_{th}$ for the resist of the photosensitive substrate is set to be larger than 1 where the largest exposure amount with the dual-beam interference exposure is taken as 1. In this photosensitive substrate, if the exposure pattern (exposure amount distribution) provided only by the dual-beam interference exposure (FIG. 2) is developed, because of an insufficient exposure amount, there is no portion produced wherein the film thickness becomes zero with the development, although there is a small thickness variation. Thus, no lithographic pattern is formed through the etching. This can be regarded as being a disappearance of a dual-light interference exposure pattern. (Here, while the invention is described with reference to a case where a negative type resist is used, the invention is applicable also to a case where a positive type resist is used.) In FIG. 6, the upper portion illustrates a lithographic pattern (no pattern is formed). The graph at the bottom of the drawing illustrates the relation between the exposure amount distribution and the exposure threshold value. Reference character $E_1$ at the bottom denotes the exposure amount in the dual-beam interference exposure, and reference character $E_2$ denotes the exposure amount in the ordinary projection exposure.

In this embodiment, an exposure pattern of a high resolution which may otherwise disappear only through dual-beam interference exposure is mixed with an exposure pattern through ordinary projection exposure, to assure that only a desired region is selectively exposed by an amount greater than the exposure threshold for a resist, such that a desired lithographic pattern is finally produced.

FIG. 7A illustrates an exposure pattern through ordinary projection exposure. In this embodiment, the resolution of this ordinary projection exposure is about a half of that of the dual-beam interference exposure. Thus, the linewidth of the exposure pattern with the projection exposure is illustrated as being about twice that of the linewidth of the exposure pattern through the dual-beam interference exposure.

Figure 5:
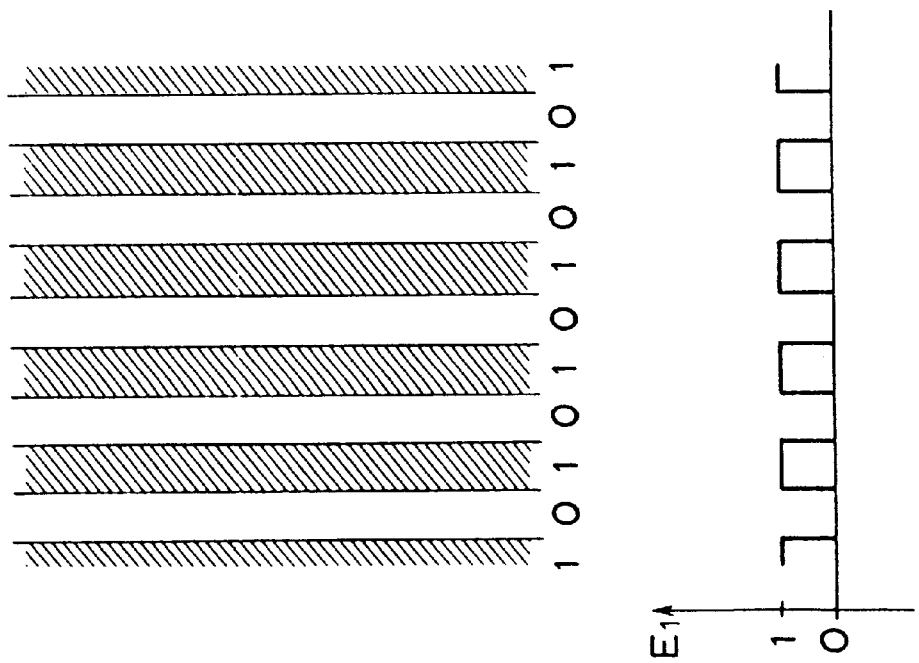
FIG. 5 is a schematic view for explaining an exposure pattern through an ordinary dual-beam interference exposure process.

When the projection exposure process for defining the exposure pattern of FIG. 7A is performed, after the dual-beam interference exposure process of FIG. 5 without a development process, superposedly to the same region of the same resist, the total exposure amount distribution of this resist is such as shown in the graph at the bottom of FIG. 7B. Here, since the ratio between the exposure amount $E_1$ of the dual-beam interference exposure and the exposure amount $E_2$ of the projection exposure is 1:1 and the exposure threshold $E_{th}$ for the resist is set to be between exposure amount $E_1$ (=1) and the sum (=2) of the exposure amount $E_1$ and exposure amount $E_2$, a lithographic pattern such as shown in the upper portion of FIG. 7B can be produced. The isolated line pattern shown in the upper portion of FIG. 7B has a resolution determined by the dual-beam interference exposure and, additionally, it is not a simple periodic pattern. Thus, it is seen that a pattern of high resolution, greater than the resolution attainable with ordinary projection exposure, is produced.

If it is assumed that a projection exposure process that can produce an exposure pattern of FIG. 8 (i.e., projection exposure of a linewidth twice the exposure pattern of FIG. 5 and with an exposure amount higher than the exposure threshold (here, an exposure amount twice higher than the threshold)) is performed, after the dual-beam interference exposure process of FIG. 5 and without a development process, superposedly to the same region of the same resist, then the total exposure amount distribution on the resist will be such as illustrated in FIG. 8B. Thus, the exposure pattern through the dual-beam interference exposure disappears, and finally only a lithographic pattern through projection exposure is produced.

Figure 9B:
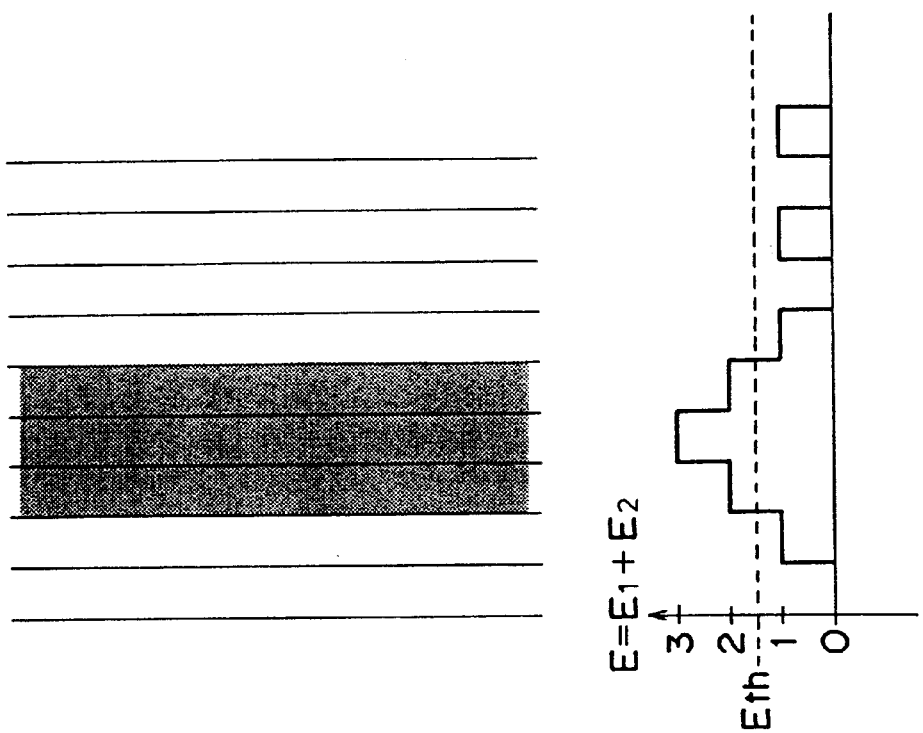
FIGS. 9A and 9B are schematic views, respectively, for explaining another example of an exposure pattern (lithographic pattern) to be produced in the first embodiment of the present invention.
Figure 9A:
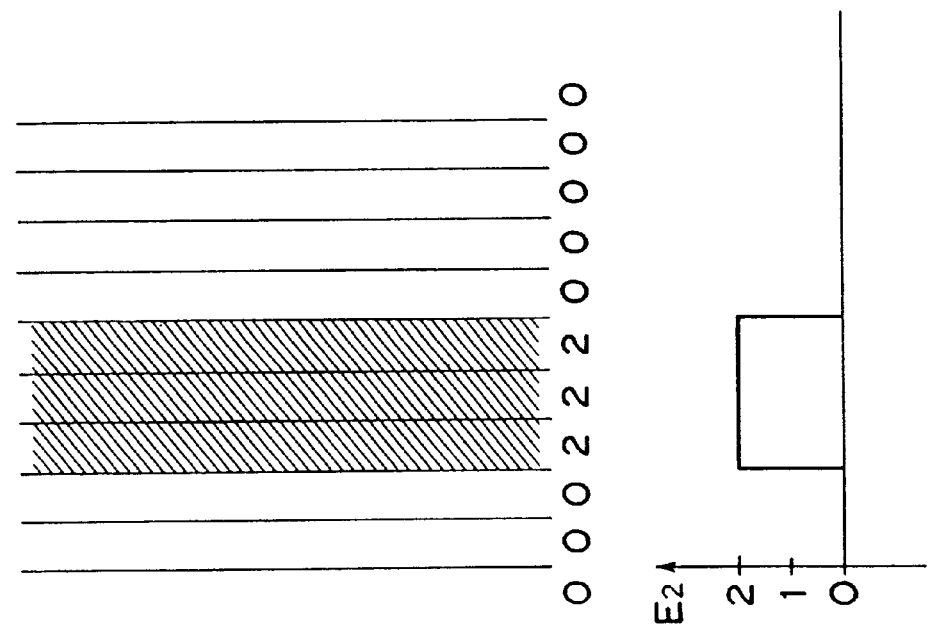

The same concept applies also to a case where a linewidth three times larger than the exposure pattern of FIG. 5 is to be produced, as illustrated in FIGS. 9A and 9B. For an exposure pattern of a linewidth four times larger or more, basically from the combination of an exposure pattern with a double linewidth and an exposure pattern with a triple linewidth, the linewidth of the finally produced lithographic pattern is apparent. Any lithographic pattern that can be accomplished through projection exposure can be produced in this embodiment.

By adjusting the exposure amount distribution (absolute value and distribution) through the dual-beam interference exposure and projection exposure described above as well as by adjusting the threshold level for a resist of a photosensitive substrate, a circuit pattern which comprises one of various combinations of patterns such as illustrated in FIGS. 6, 7B, 8B and 9B and which has a minimum linewidth corresponding to the resolution of dual-beam interference exposure (i.e., the pattern of FIG. 7B), can be produced.

The principle of the exposure method in this embodiment of the present invention may be summarized as follows:

(1) A pattern region not exposed by projection exposure, that is, a dual-beam interference exposure pattern less than an exposure threshold of a resist, disappears with a developing process.

(2) As regards a pattern region of projection exposure made with an exposure amount not larger than the exposure threshold of the resist, an exposure pattern having a resolution of dual-beam interference exposure as determined by the combination of the projection exposure and dual-beam interference exposure, is produced.

(3) As regards a pattern region of the projection exposure made with an exposure amount not less than the exposure threshold, a desired pattern (corresponding to a mask) is produced, like the projection exposure.

It is an additional advantage of the exposure method that, in the portion of highest resolution dual-beam interference exposure, a depth of focus which is remarkably larger than that with ordinary exposure is attainable.

In the foregoing description, as regards the order of dual-beam interference exposure and projection exposure, the dual-beam interference exposure is made first. However, the order is not limited to this.

Next, another embodiment will be described.

Figure 10:
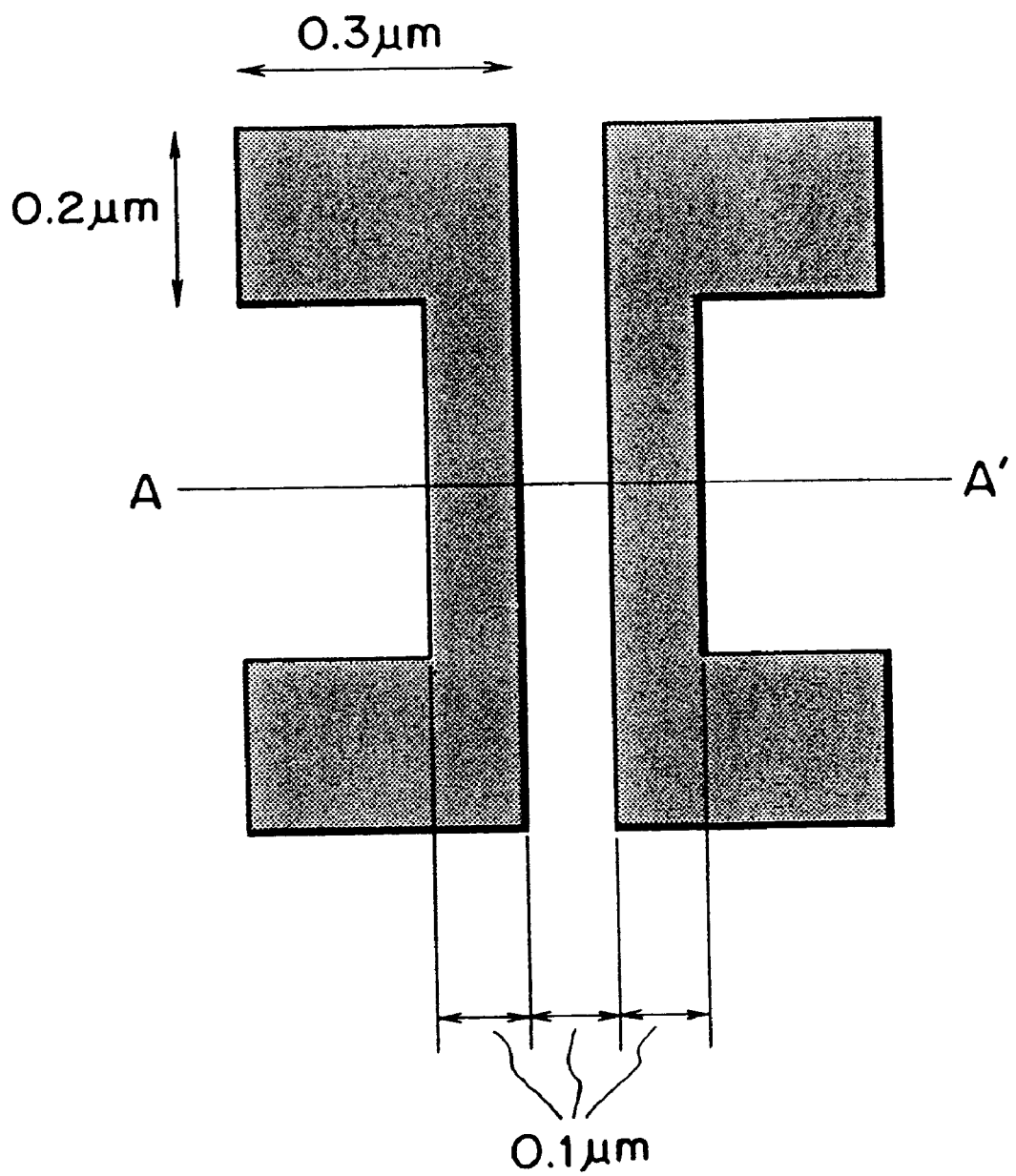
FIG. 10 is a schematic view for explaining a gate pattern.

This embodiment concerns a circuit pattern (lithography pattern) comprising what can be called a gate-like pattern, such as shown in FIG. 10, to be produced through the exposure process.

The gate pattern shown in FIG. 10 has a minimum linewidth of 0.1 micron in a lateral direction, i.e., along a line A—A in the drawing, while it is 0.2 micron or more in a longitudinal direction. In accordance with this embodiment of the present invention, for a two-dimensional pattern in which high resolution is required only with respect to a one-dimensional direction, dual-beam interference exposure may be performed only with respect to the one-dimensional direction for which high resolution is required.

Referring to FIGS. 11A–11D, examples of a combination of dual-beam interference exposure only in a one-dimensional direction with ordinary projection exposure according to this embodiment, will be described.

FIG. 11A shows a periodic exposure pattern made through dual-beam interference exposure only with respect to a one-dimensional direction. This exposure pattern has a period of 0.2 micron, and this exposure pattern corresponds to a line-and-space pattern of a linewidth 0.1 micron. Numerals in the lower portion of FIG. 11A denote exposure amount.

Figure 16:
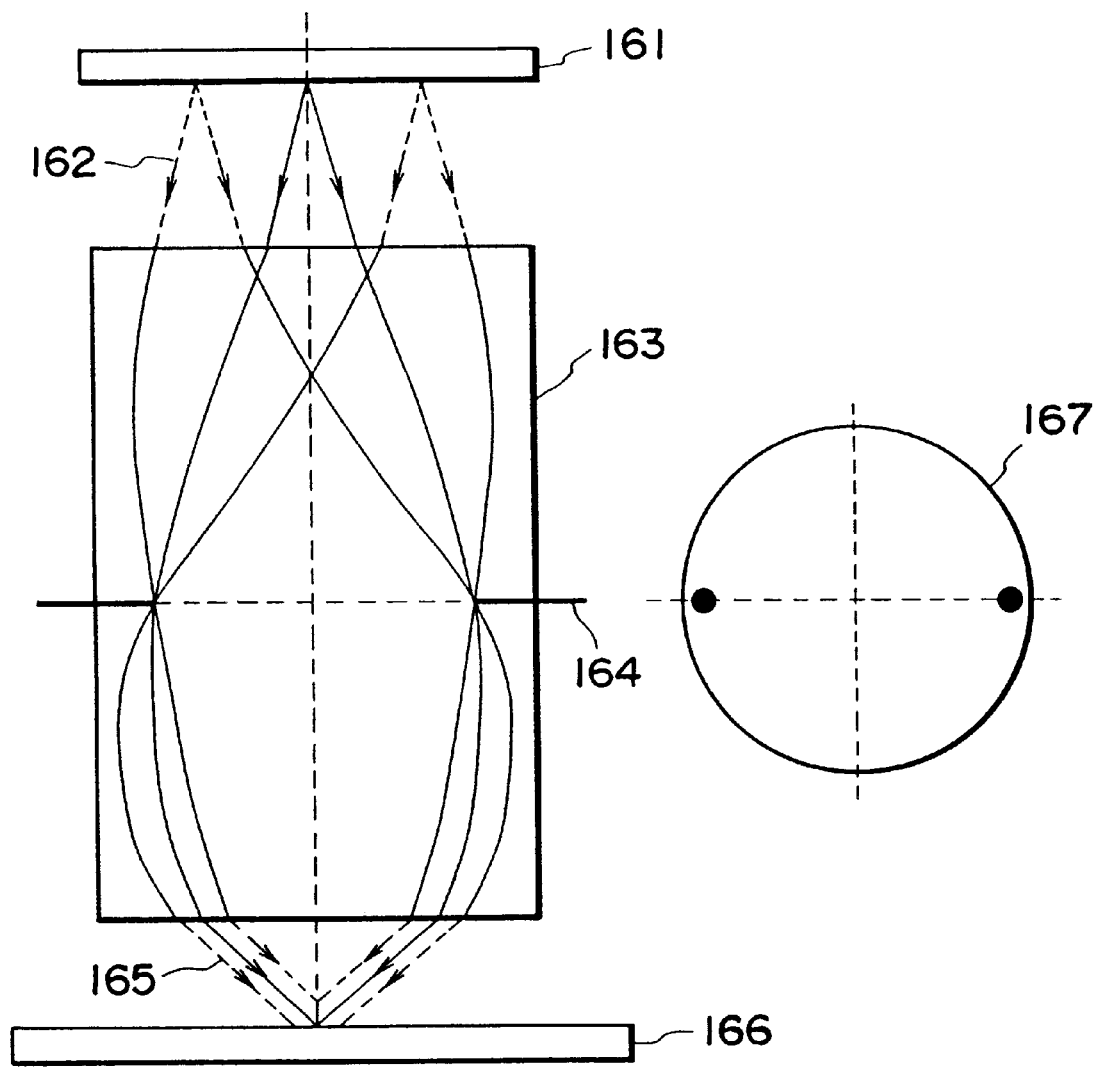
FIG. 16 is a schematic view of a main portion of an example of a projection exposure apparatus for performing dual-beam interference exposure.
Figure 17:
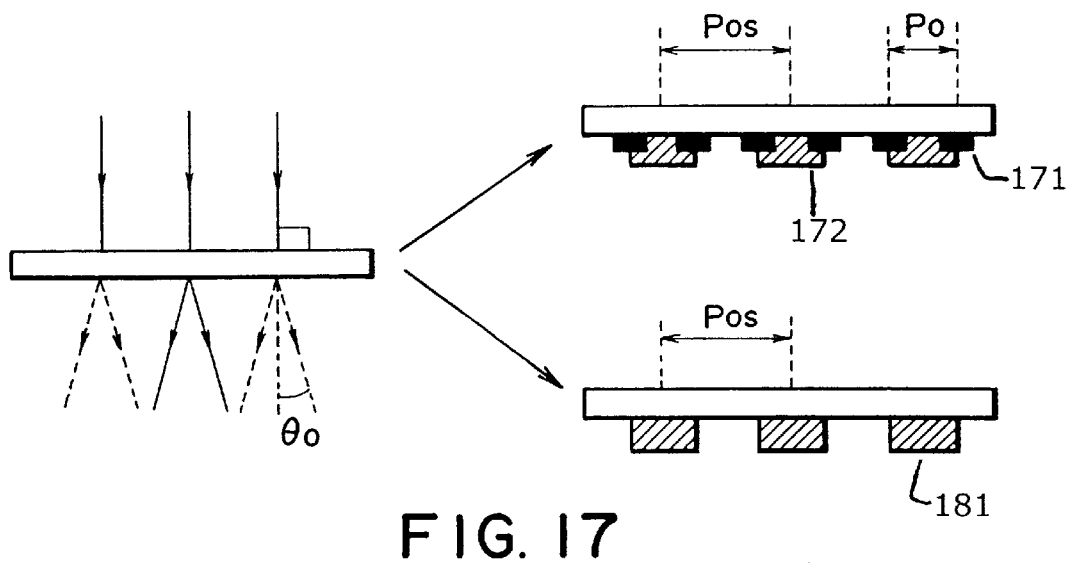
FIG. 17 is a schematic view for explaining an example of a mask and illumination method which can be used in the apparatus of FIG. 16.
Figure 18:
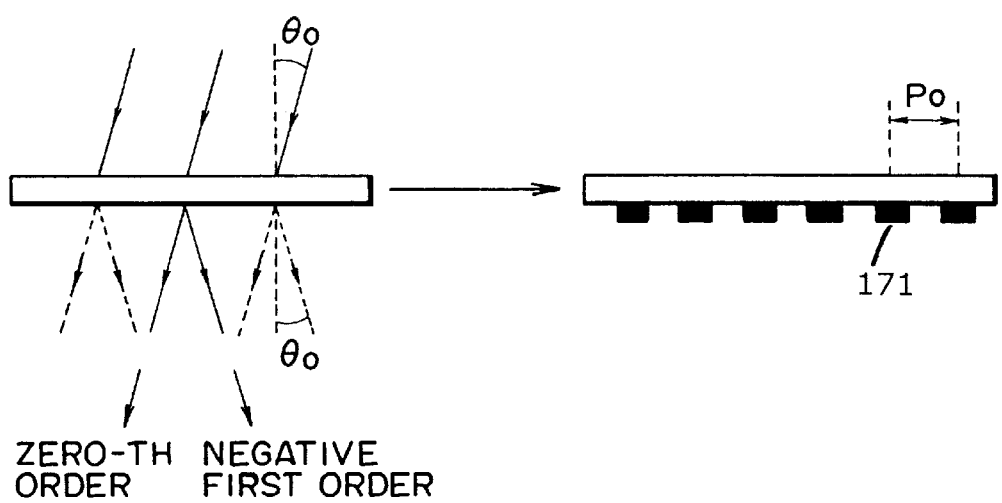
FIG. 18 is a schematic view for explaining another example of a mask and illumination method which can be used in the apparatus of FIG. 16.

An exposure apparatus that accomplishes such dual-beam interference exposure described above, may be one as shown in FIG. 15 that includes a wave dividing and combining optical system having a laser 151, a half mirror 152 and a flat mirror 153. Alternatively, it may be a projection exposure apparatus such as shown in FIG. 16 with its mask and illumination method being arranged such as shown in FIG. 17 or 18.

The exposure apparatus of FIG. 15 will be described in detail.

Figure 15:
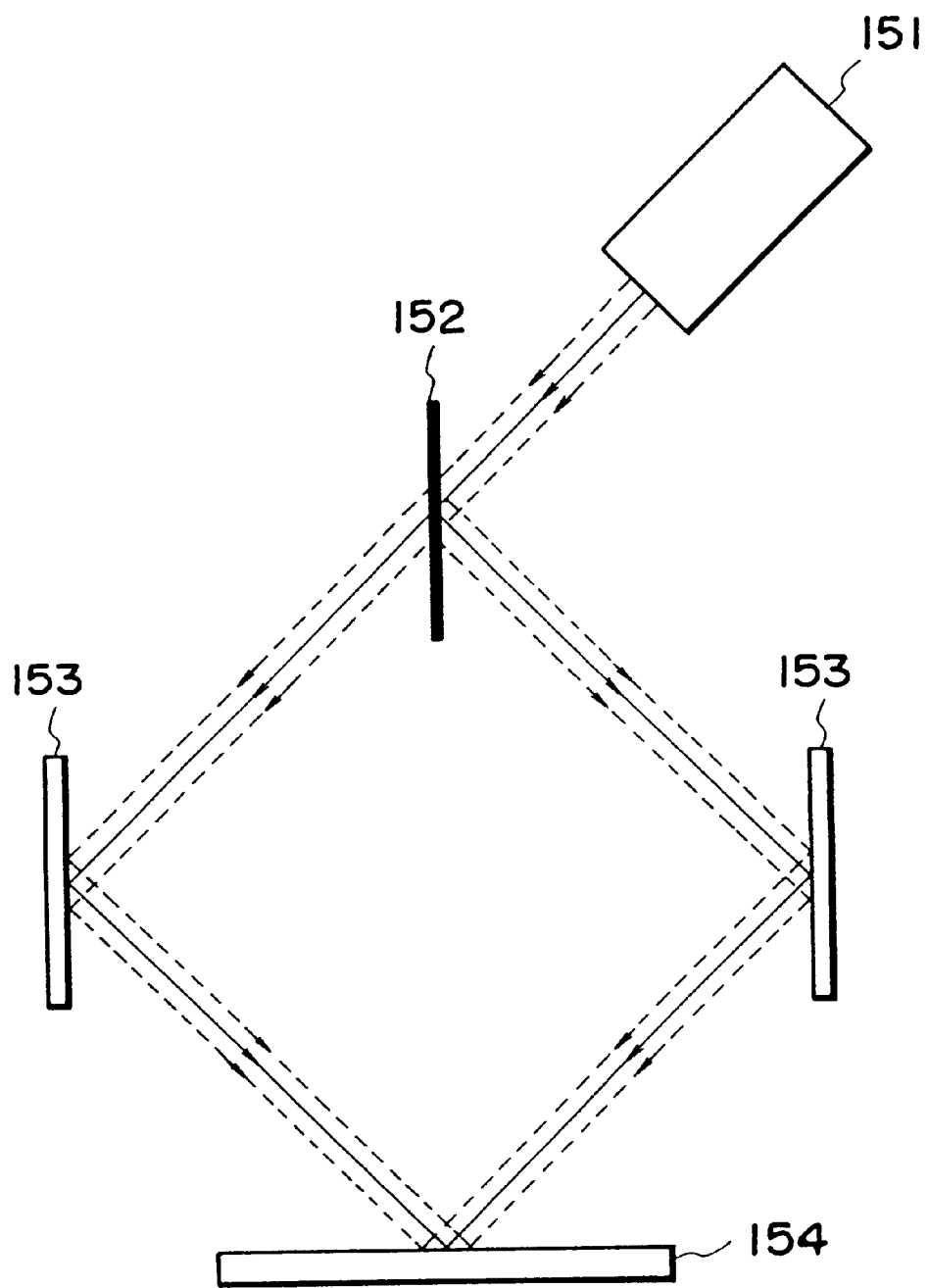
FIG. 15 is a schematic view of a main portion of an example of a dual-beam interference exposure apparatus.

In the exposure apparatus of FIG. 15, two light beams to be combined with each other as described are obliquely incident on a wafer 154 at an angle $\theta$. The linewidth of an interference fringe pattern (exposure pattern) formed on the wafer 154 can be expressed by equation (3) set forth above. The relation between the angle $\theta$ and the numerical aperture NA at the image plane side of the wave dividing and combining optical system is NA=sin $\theta$. The angle $\theta$ can be adjusted and set as desired by changing the angles of a pair of flat mirrors 153, respectively. If the angle $\theta$ of the paired flat mirrors is set large, the linewidth of fringes of the interference fringe pattern becomes smaller. For example, if the two light beams have a wavelength 248 nm (KrF excimer laser), even with $\theta$=38 deg., an interference fringe pattern of a fringe linewidth of about 0.1 micron can be produced. Here, in this case, NA=sin $\theta$=0.62. As a matter of course, if the angle $\theta$ is made larger than 38 deg., a higher resolution is attainable.

Next, an exposure apparatus shown in FIGS. 16–18 will be described.

The exposure apparatus of FIG. 16 is a projection exposure apparatus having an ordinary reduction projection optical system which comprises a number of lenses. Currently, an apparatus of NA=0.6 or more with respect to an exposure wavelength 248 nm is available.

Denoted in FIG. 16 at 161 is a mask, and denoted at 162 is exposure light on the object side which is emitted from the mask 161 and enters an optical system 163. The optical system 163 comprises a projection optical system. Denoted at 164 is an aperture stop, and denoted at 165 is exposure light on the image side which is emitted from the projection optical system 163 and impinges on a wafer 166. The wafer 166 comprises a photosensitive substrate. Reference numeral 167 denotes the position of light, in a pair of dots, upon a pupil plane corresponding to the circular opening of the stop 164. FIG. 16 is a schematic view which shows the state in which dual-beam interference exposure is being performed. Each of exposure light 162 on the object side and exposure light 165 on the image side comprises two parallel light beams, as compared with ordinary projection exposure shown in FIG. 19.

In order to perform dual-beam interference exposure with the use of an ordinary projection exposure apparatus such as shown in FIG. 16, its mask and its illumination method may be set as shown in FIG. 17 or 18. Three examples will be described below.

FIG. 17 at the upper right shows a Levensen type phase shift mask which comprises a mask having light blocking portions 171 of chromium, with a pitch $P_0$ which is 0 as can be expressed by equation (4) below, as well as phase shifters 172 of pitch $P_{OS}$ as can be expressed by equation (5) below:

$$P_0 = P/M = 2R/M = \lambda/M \cdot (2NA) \quad (4)$$

$$P_{OS} = 2P_0 = \lambda/M \cdot (NA) \quad (5)$$

where M is the projection magnification of the projection optical system 163, $\lambda$ is the exposure wavelength, and NA is the numerical aperture of the projection optical system 163 on the image side.

On the other hand, a mask shown in FIG. 17 at the lower right is a shifter edge type phase shift mask, and it is arranged like the Levensen type to provide phase shifters 181 of pitch $P_{OS}$ that satisfy equation (5) above.

In order to use the phase shift masks of FIG. 17 to perform dual-beam interference exposure, the mask may be illuminated with coherent illumination wherein $\sigma$=0 or a value close to 0. More specifically, parallel light is projected to the mask in a direction perpendicular to the mask surface (in a direction parallel to the optical axis).

With this illumination, as regards zero-th order transmissively diffractive light from the mask in the aforementioned perpendicular direction, since phase differences of adjacent transmissive light rays provided by phase shifters are $\pi$ and canceled with each other, there is no such light produced. As regards positive and negative first order diffractive light, two parallel light beams are produced from the mask symmetrically with respect to the optical axis of the projection optical system 163, and they provide two exposure lights on the object side, shown in FIG. 16. As regards diffractive light rays of second order or higher, they do not enter the aperture of the aperture stop 164 of the projection optical system 163. Thus, they do not contribute to imaging.

A mask shown in FIG. 18 comprises a mask having light blocking portions 171 of chromium, with a pitch $P_0$ which can be expressed by equation (6) similar to equation (4).

$$P_0 = P/M = 2R/M = \lambda/M \cdot (2NA) \quad (6)$$

where M is the projection magnification of the projection optical system 163, $\lambda$ is the exposure wavelength, and NA is the numerical aperture of the projection optical system 163.

For the mask of FIG. 18 having no phase shifter, oblique illumination with one or two parallel light beams is performed. The incidence angle $\theta_0$ of the parallel light upon the mask is set to satisfy equation (7) below. When two parallel light beams are used, the mask is illuminated with parallel lights oppositely inclined with each other by an angle $\theta_0$ with reference to the optical axis.

$$\sin \theta_0 = M \times NA \quad (7)$$

where M is the projection magnification of the projection optical system 163, and NA is the numerical aperture of the projection optical system 163.

When the mask of FIG. 18 without a phase shifter is illuminated by oblique illumination with the use of parallel light satisfying equation (7), there are produced two light beams from the mask to provide two object-side exposure lights 162 (FIG. 16): that is, zero-th order transmissively diffractive light which advances at an angle $\theta_0$ with respect to the optical axis, and negative first order transmissively diffractive light which advances along a light path symmetrical with the path of zero-th order transmissively diffractive light with respect to the optical axis of the projection optical system. These two light beams enter the aperture of the aperture stop 164 of the projection optical system 163, by which imaging is performed.

In the present invention, oblique illumination with the use of one or two parallel light beams as described above, is regarded as one of "coherent illumination".

A dual-beam interference exposure process using an ordinary projection exposure apparatus is such as described above. Since the illumination optical system of the ordinary projection exposure apparatus such as shown in FIG. 19 is arranged to perform partially coherent illumination, in this projection exposure apparatus, the coherent illumination can be substantially effected, for example, by replacing an aperture stop (not shown) corresponding to $0<\sigma<1$ of the illumination optical system of FIG. 19 by a peculiar aperture stop corresponding to $\sigma \approx 0$.

Referring back to FIGS. 10 and 11, the embodiment shown in these drawings will be described in greater detail.

Figure 19:
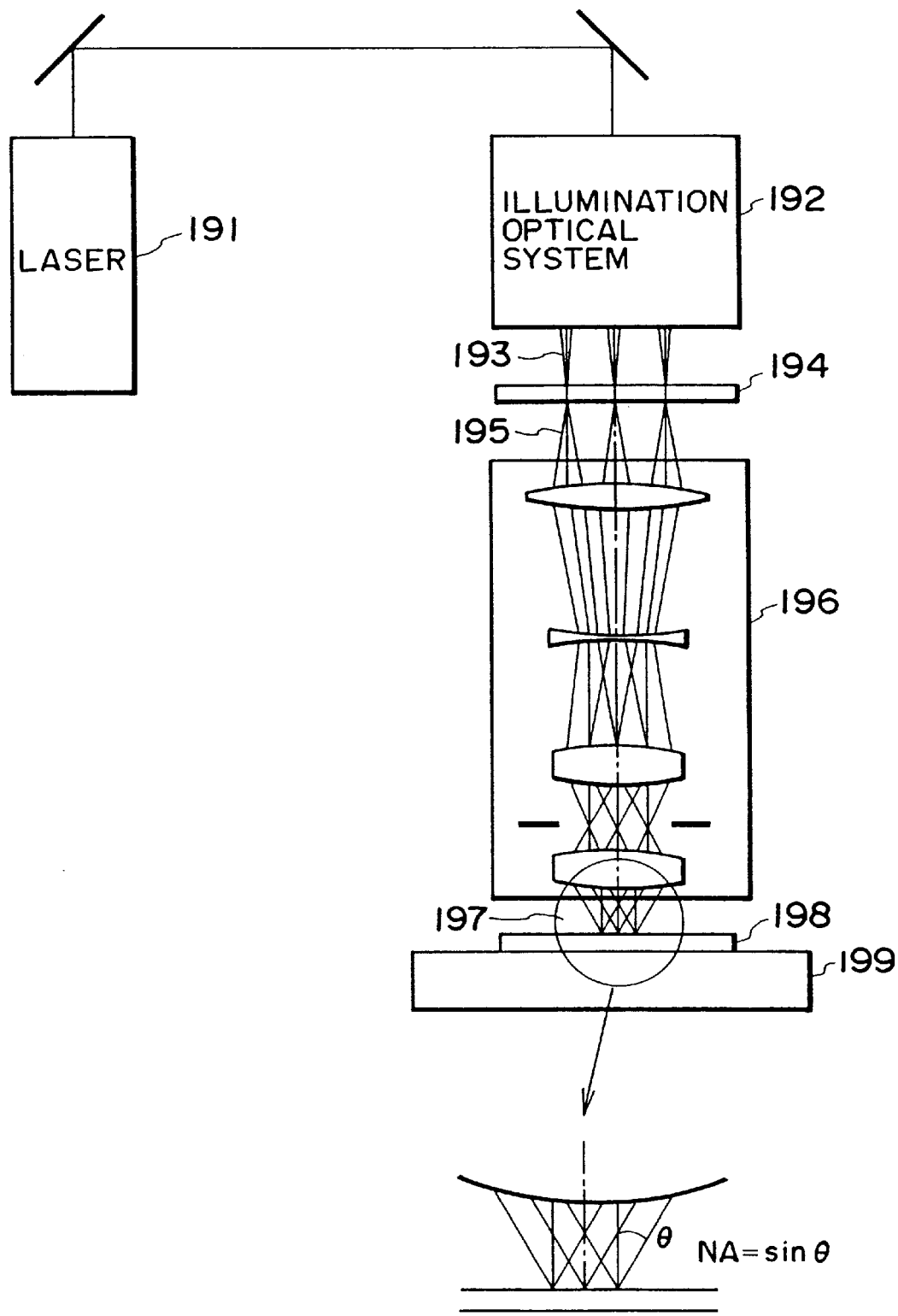
FIG. 19 is a schematic view of a projection exposure apparatus of a known type.

In this embodiment, through the ordinary projection exposure (e.g., by partially coherent illumination to a mask with the apparatus of FIG. 19) subsequent to the dual-beam interference exposure described hereinbefore, an H-shaped pattern exposure shown in FIG. 11B may be performed. An upper half of FIG. 11B shows a relative positional relationship with the exposure pattern through the dual-beam interference exposure as well as an exposure amount at five regions of the exposure pattern defined through the ordinary projection exposure. The lower half of FIG. 11B illustrates a map of an exposure amount to a resist of the wafer through the ordinary projection exposure, depicted at a resolution of 0.1 micron pitch laterally and longitudinally.

The linewidth of an exposure pattern resulting from this projection exposure is 0.2 micron, which is twice that in dual-beam interference exposure. A projection exposure process which produces a multiplex exposure amount distribution (different exposure amounts in different regions) such as described above, may use a particular mask having plural stages of transmissivities: that is, for example, a transmissivity T % at apertures of the mask corresponding to the regions depicted with numeral 1 in the drawing, and a transmissivity 2T % at apertures of the mask corresponding to the regions depicted with numeral 2 in the drawing. According to this method, the projection exposure can be accomplished through a single exposure. As regards the exposure amount ratio upon the wafer (photosensitive substrate) in these exposure processes when the above-described particular mask is used, there is a relation "dual-beam interference exposure":"projection exposure at apertures with transmissivity T":"projection exposure with transmissivity 2T"=1:1:2.

Another method for accomplishing projection exposure with different exposure amounts at different regions may be a method wherein two types of masks effective to produce exposure patterns such as shown in the upper half and lower half of FIG. 11D are used to perform exposures sequentially. On that occasion, since the exposure amount with each mask may be a single stage (level), the transmissivity of apertures of the mask may also be a single stage. As regards the exposure amount ratio upon the wafer (photosensitive substrate) in this case, there is a relation "dual-beam interference exposure":"first projection exposure":"second projection exposure"=1:1:1.

Next, the manner of formation of a fine circuit pattern (FIG. 10) through a combination of dual-beam interference exposure and ordinary projection exposure, as described above, will be explained. In this embodiment, there is no development process between the dual-beam interference exposure and ordinary projection exposure. Thus, within the region wherein exposure patterns through these exposure processes are superposed one upon another, the exposure amounts are accumulated, and the exposure amount (distribution) after accumulation defines a fresh exposure pattern.

The upper half of FIG. 11C shows an exposure amount distribution (exposure pattern) resulting from accumulation or superposition of an exposure pattern of FIG. 11A and an exposure pattern of FIG. 11B, in this embodiment. The lower half of FIG. 11C shows a pattern which can be defined as a result of a development process made to this exposure pattern. This embodiment uses a wafer resist having an exposure threshold larger than 1 and smaller than 2. For this reason, only the portion with an exposure amount larger than 1 appears as a pattern as a result of a development process. The shape and size of the pattern shown in the lower half of FIG. 11C correspond to the shape and size of the gate pattern of FIG. 10, respectively. It is seen, therefore, that, in accordance with the exposure method of this embodiment of the present invention, a circuit pattern with a fine linewidth such as 0.1 micron, for example, can be produced by a projection exposure apparatus having an illumination optical system with which partially coherent illumination and coherent illumination can be performed selectively.

Figures 12, 13:
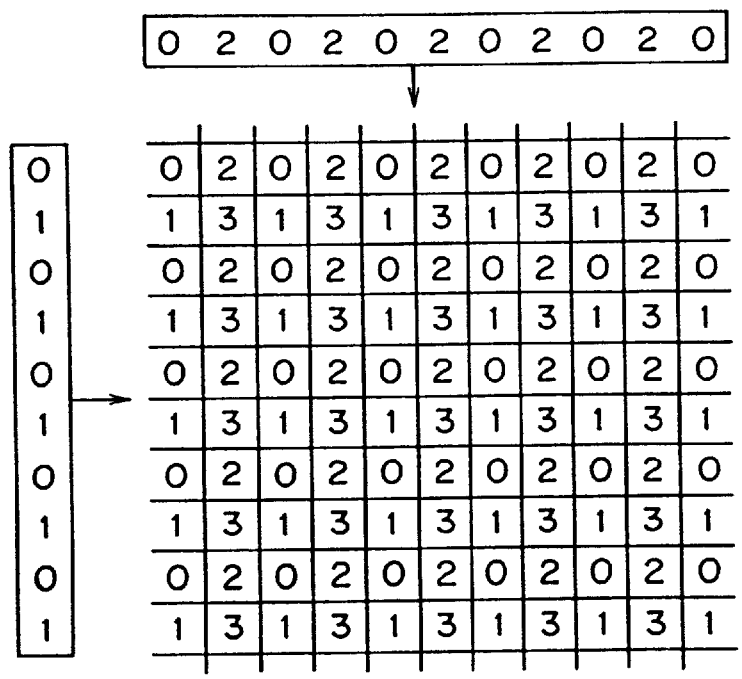
FIG. 12 is a schematic view for explaining a dual-beam interference exposure pattern in a third embodiment of the present invention.
FIG. 13 is a schematic view for explaining a pattern formed with two-dimensional blocks, in the third embodiment of the present invention.
Figure 14:
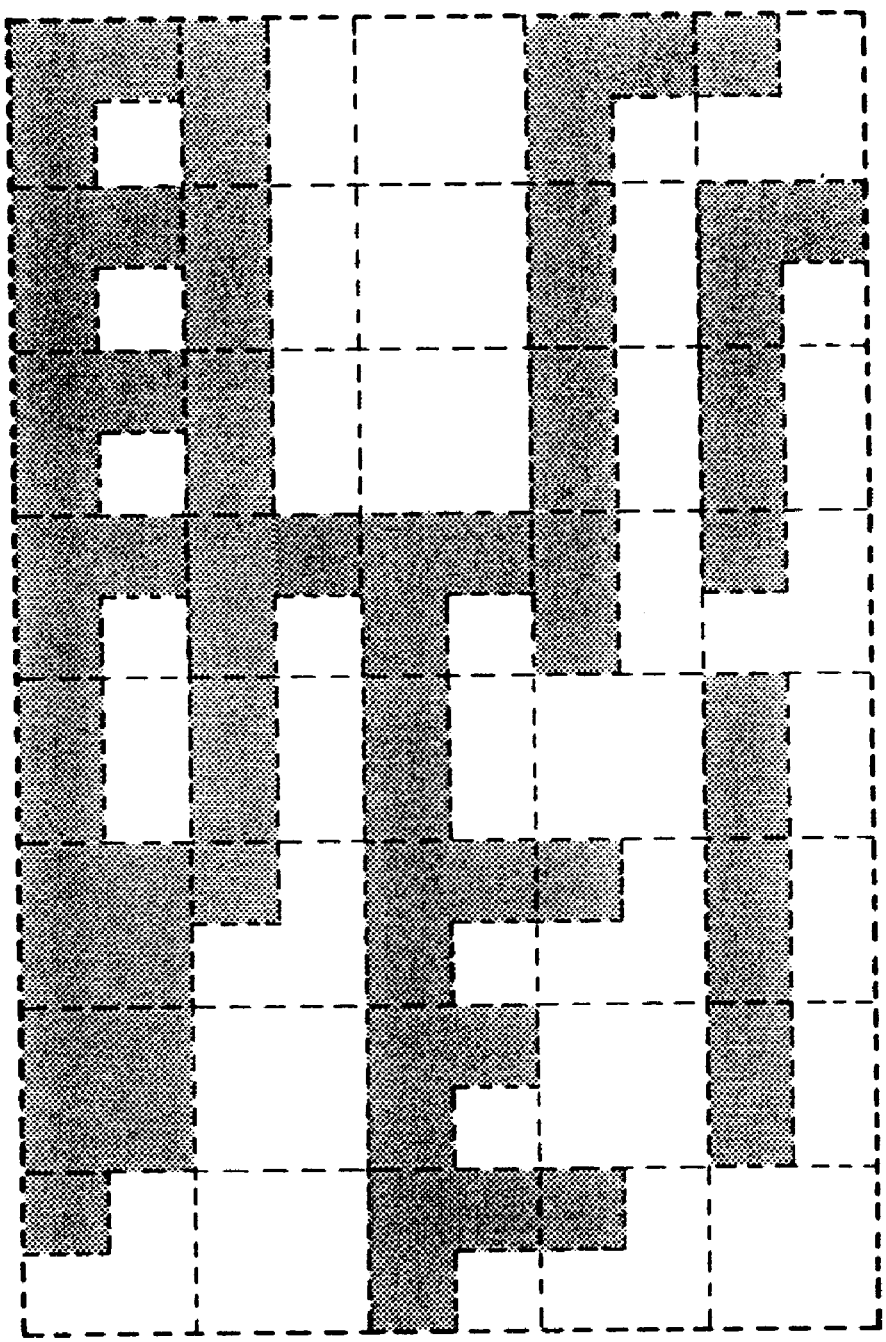
FIG. 14 is a schematic view for explaining an example of an exposure pattern to be formed in accordance with the third embodiment of the present invention.

Referring to FIGS. 12–14, another embodiment of the present invention will be described. In this embodiment, an exposure pattern of a multiplex exposure amount distribution (with four exposure amounts of 0, 1, 2 and 3) is produced by superposing an interference fringe pattern of longitudinal fringes and an interference fringe pattern of lateral fringes, by performing dual-beam interference exposure twice.

FIG. 12 shows a map of an exposure amount distribution of an exposure pattern as a longitudinal interference fringe pattern and a lateral interference fringe pattern are superposed one upon another through twice dual-beam interference exposures. Here, in order to expand the variation of an exposure pattern (lithography pattern) to be finally obtainable from superposition of dual-beam interference exposure and ordinary exposure, the exposure amount (numeral 2) at bright portions of the longitudinal interference fringe pattern is set to be twice that of the exposure amount (numeral 1) at the bright portions of the lateral interference fringe pattern. However, the types of exposure amounts at the bright portions are not limited to two, as disclosed.

In the exposure pattern of FIG. 12, as a result of twice dual-beam interference exposures, the exposure amount comprises four stages, from 0 to 3. The number of stages of exposure amount through projection exposure, which is sufficiently effective in regard to such dual-beam interference exposure, is not less than 5. In this case, the exposure threshold for a resist of a wafer (photosensitive substrate) may be set to be larger than 3 (largest exposure amount in dual-beam interference exposure) and smaller than 4 (largest level of exposure amounts 0, 1, 2, 3 and 4) of projection exposure.

FIG. 13 illustrates exposure amounts of exposure patterns which can be provided as a result of projection exposure with five-stage exposure amounts (0, 1, 2, 3, 4). Portions with hatching in FIG. 13 correspond to regions above the exposure threshold. These portions finally provide exposure patterns. The illustration in FIG. 13 is made in terms of resolution of projection exposure of a half of that in dual-beam interference exposure, and in the unit of a block having a side with a length twice that of FIG. 12.

FIG. 14 illustrates an example of an exposure pattern (lithography pattern) formed in a wider area, by changing the exposure amount of projection exposure in the unit of a block. It is seen from FIG. 14 that, in accordance with this embodiment, a circuit pattern having a resolution of dual-beam interference exposure and including a wide variety of patterns other than a periodic pattern, can be produced.

In this embodiment, an ordinary exposure process is performed in the unit of a block which is twice the linewidth of dual-beam interference exposure. However, the invention is not limited to this. Projection exposure may be performed to an arbitrary exposure pattern within the range of resolution of the projection exposure.

Further, in the embodiment described above, the exposure pattern linewidth through dual-beam interference exposure is the same both for longitudinal fringes and lateral fringes. However, they may have different linewidths. Also, desired angles may be chosen for these two types of fringes.

Figure 20:
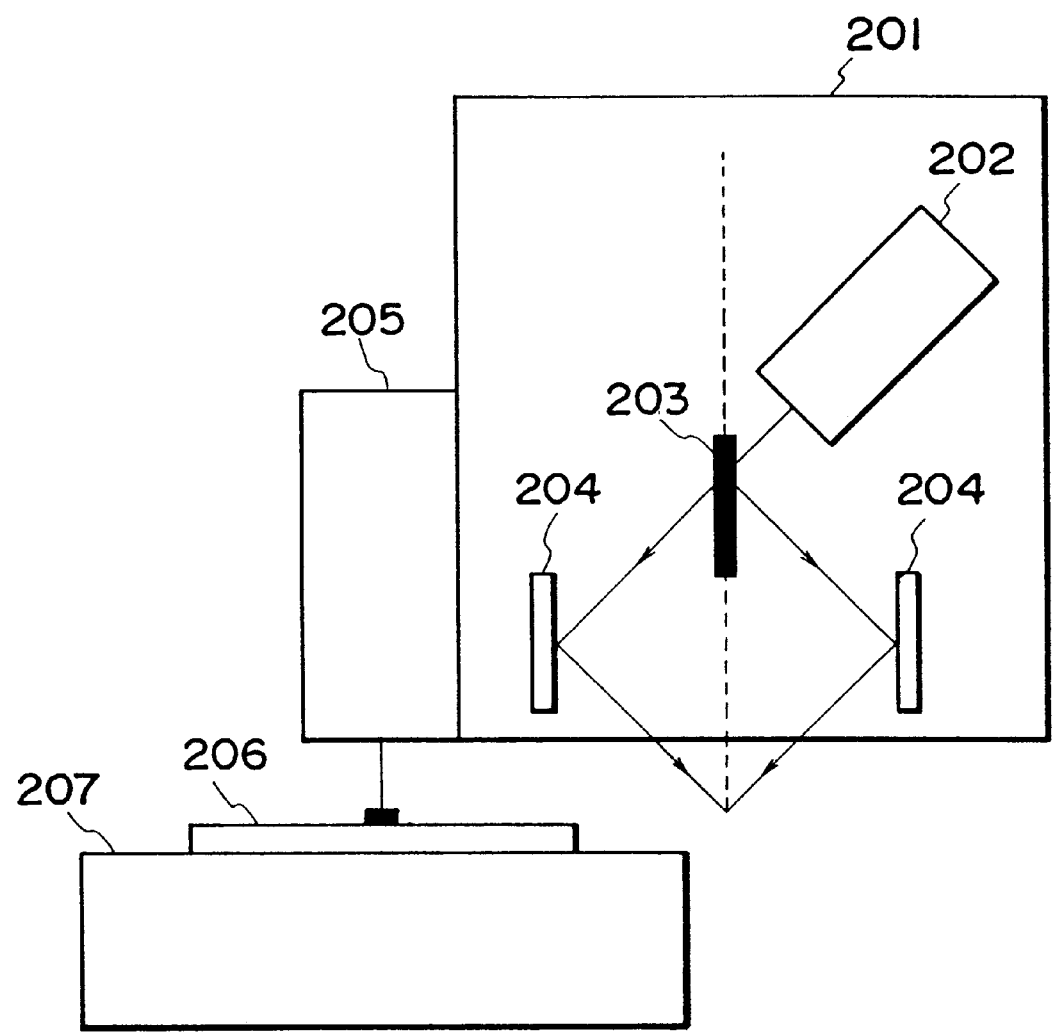
FIG. 20 is a schematic view of an example of a dual-beam interference exposure apparatus according to the present invention.

FIG. 20 is a schematic view of an example of an exposure apparatus for dual-beam interference exposure. Denoted in FIG. 20 at 201 is a light interference exposure optical system having a basic structure similar to that of the optical system of FIG. 15. Denoted at 202 is a KrF or an ArF excimer laser, and denoted at 203 is a half mirror. Denoted at 204 is a flat mirror, and denoted at 205 is an off-axis type alignment optical system with which the positional relation with the optical system 201 is fixed or it can be detected appropriately as a base line (amount). The alignment optical system 205 serves to observe an alignment mark for dual-beam interference, formed on a wafer 206, to detect the position thereof. Denoted at 206 is a wafer (photosensitive substrate). Denoted at 207 is an X-Y-Z stage which is movable along a plane perpendicular to the optical axis of the optical system 201 and along a direction of the optical axis. The position of this stage can be controlled exactly, by means of a laser interferometer, for example. Since the components 205 and 207 have a well-known structure and function, a detailed description thereof will be omitted.

Figure 21:
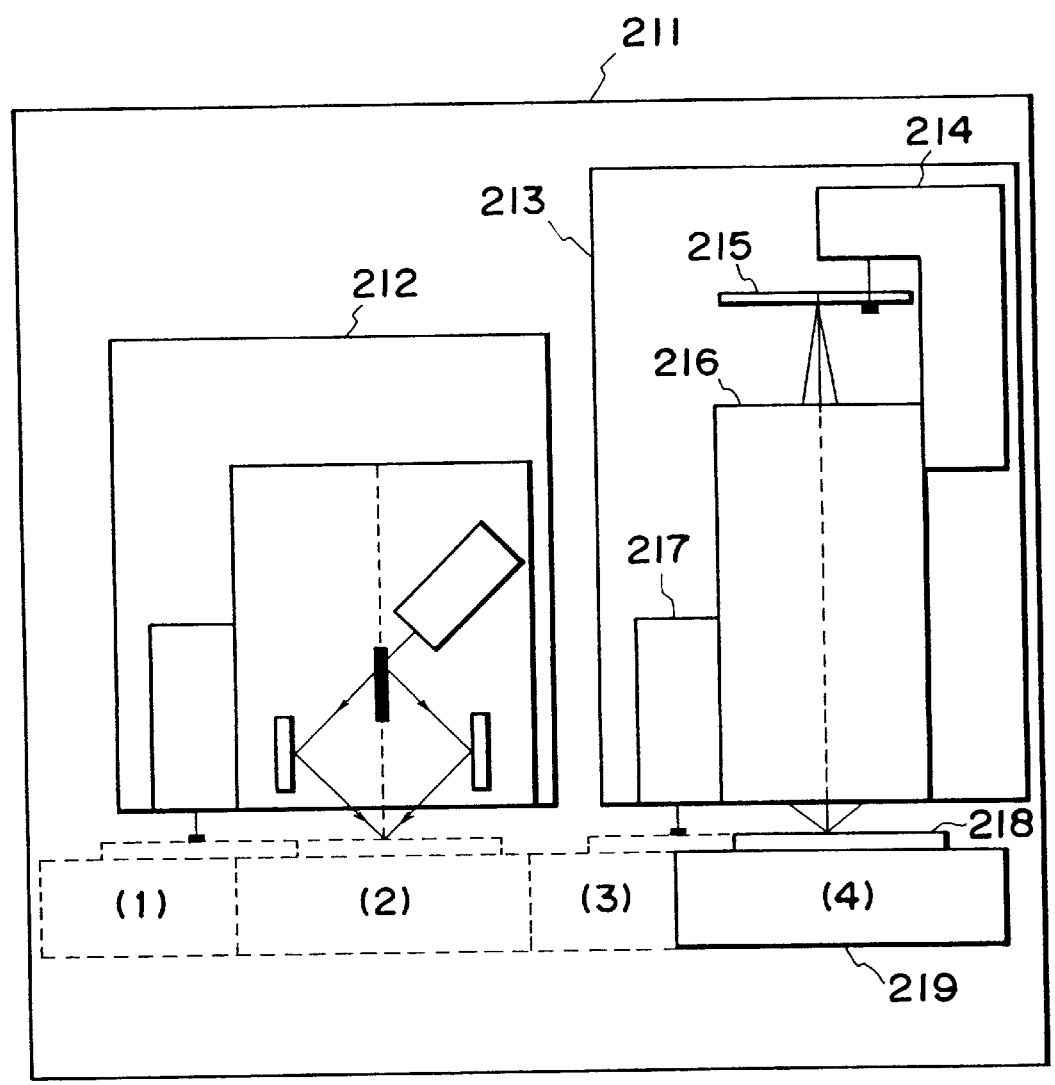
FIG. 21 is a schematic view of an example of a high-resolution exposure apparatus according to the present invention.

FIG. 21 is a schematic view of a high resolution exposure system which comprises a dual-beam interference exposure apparatus and an ordinary projection exposure apparatus.

Denoted in FIG. 21 at 212 is a dual-beam interference exposure apparatus which includes the optical systems 201 and 205 shown in FIG. 20. Denoted at 213 is an ordinary projection exposure apparatus which comprises an illumination optical system (not shown), a reticle alignment optical system 214, a wafer alignment optical system (off-axis alignment optical system) 217, and a projection optical system 216 for projecting a circuit pattern of a mask 215 onto a wafer 218 in a reduced scale.

The reticle alignment optical system 214 serves to observe an alignment mark formed on the mask 215 to detect the position thereof. The wafer alignment optical system 217 serves to observe an alignment mark formed on the wafer 206 for projection exposure or to be used also for dual-beam interference, to detect the position thereof. Since the optical systems 214, 216 and 217 have well-known structures and functions, a detailed description thereof will be omitted.

Denoted in FIG. 21 at 219 is a common X-Y-Z stage to be used in both of the dual-beam interference exposure apparatus 212 and the projection exposure apparatus 213. This X-Y-Z stage 219 is movable along a plane perpendicular to the optical axes of the exposure apparatuses 212 and 213 and along these optical axis directions. The position thereof with respect to the X and Y directions can be controlled exactly, by means of a laser interferometer, for example.

The X-Y-Z stage 219 having a wafer 218 held thereon is moved to a station at (1) in FIG. 21, and there, the position thereof is measured precisely. In accordance with the result of the measurement, the X-Y-Z stage is moved to a station at (2) in FIG. 21, which corresponds to the exposure station of the exposure apparatus 212. There, dual-beam interference exposure is made to the wafer 218. Subsequently, it is moved to a station at (3) in FIG. 21, and the position thereof is measured precisely. Then, it is moved to a station at (4) of FIG. 21, corresponding to the exposure station of the exposure apparatus 213, where the projection exposure is made to the wafer 218.

In the exposure apparatus 213, the off-axis alignment optical system 217 may be replaced by a TTL alignment optical system (not shown) for observing an alignment mark of the wafer 218 through the projection optical system 216 to detect the position thereof, or alternatively by a TTR alignment optical system (not shown) for observing an alignment mark of the wafer 218 through the projection optical system 216 and the mask (reticle) 215 to detect the position thereof.

Figure 22:
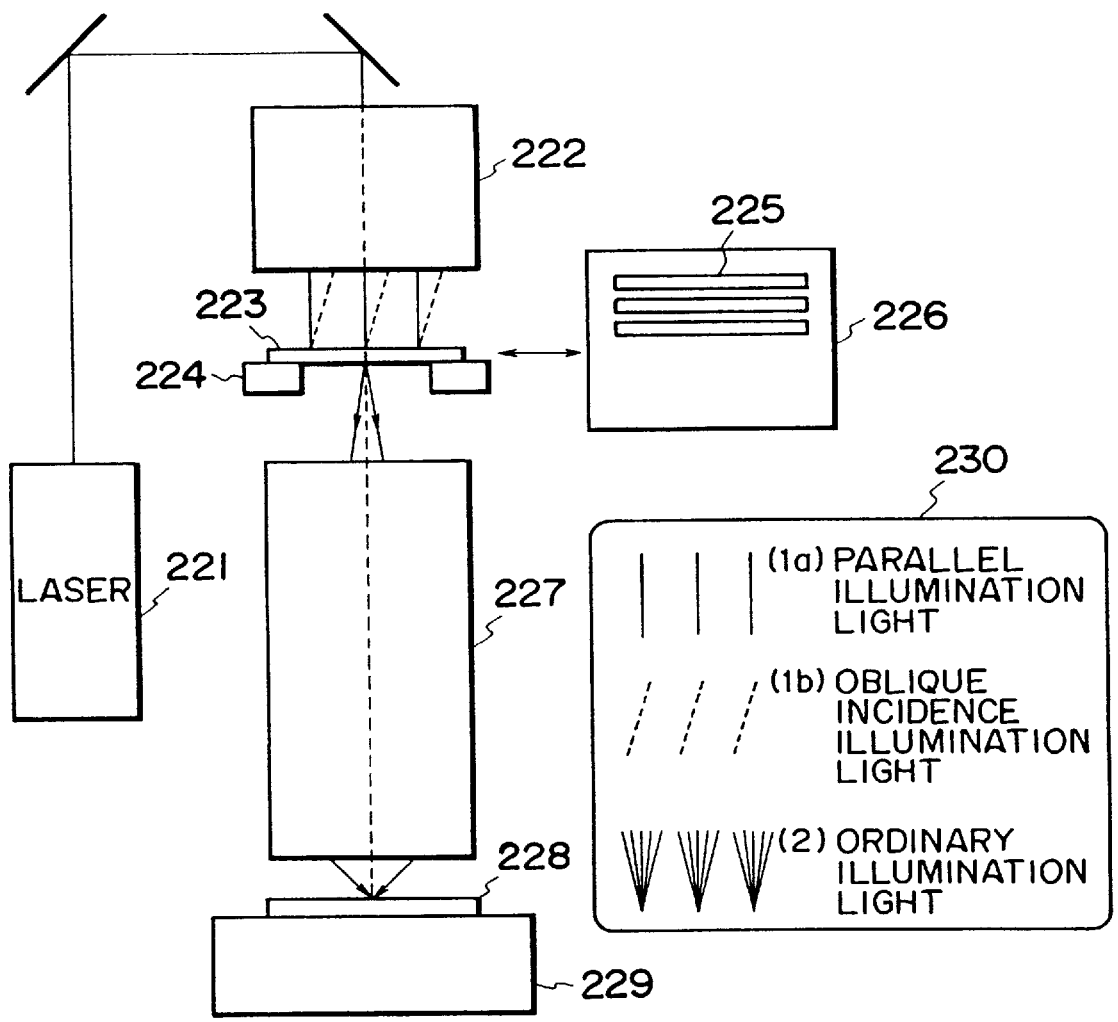
FIG. 22 is a schematic view of another example of a high-resolution exposure apparatus according to the present invention.

FIG. 22 is a schematic view of a high resolution exposure apparatus by which both of dual-beam interference exposure and ordinary projection exposure can be accomplished.

Denoted in FIG. 22 at 221 is a KrF or an ArF excimer laser, and denoted at 222 is an illumination optical system. Denoted at 223 is a mask (reticle), and denoted at 224 is a mask stage. Denoted at 227 is a projection optical system for projecting a circuit pattern of the mask 223 onto a wafer 228 in a reduced scale. Denoted at 225 is a mask (reticle) changer which is provided to selectively supply, to the mask stage, one of an ordinary reticle, a Levenson-type phase shift mask (reticle) as described hereinbefore, an edge shifter type mask (reticle), and a periodic pattern mask (reticle) without a phase shifter.

Denoted in FIG. 22 at 229 is a common X-Y-Z stage to be used both for dual-beam interference exposure and for projection exposure. This X-Y-Z stage is movable along a plane perpendicular to the optical axis of the optical system 227 and along this optical axis direction. The position thereof can be controlled exactly, by means of a laser interferometer, for example.

The exposure apparatus of FIG. 22 includes a reticle alignment optical system (not shown), and a wafer alignment optical system (an off-axis alignment optical system, a TTL alignment optical system or TTR alignment optical system as described with reference to FIG. 21).

The illumination optical system 222 of FIG. 22 is arranged to alternately provide partially coherent illumination and coherent illumination. In the coherent illumination mode, illumination light (1a) or (1b) in the drawing, within block 230, is supplied to one of a Levenson-type phase shift reticle, an edge shifter type reticle, and a periodic pattern reticle without a phase shifter. In the partially coherent illumination mode, illumination light (2) in block 230 is supplied to a desired reticle. Switching from the partially coherent illumination mode to the coherent illumination mode may be done by replacing an aperture stop, usually disposed just after a fly's eye lens of the illumination optical system 222, by a coherent illumination stop having an aperture diameter sufficiently smaller than that of the former aperture stop.

By using any one of the exposure methods and/or exposure apparatuses described hereinbefore, various microdevices such as semiconductor chips (e.g., IC or LSI), display devices (e.g., a liquid crystal panel), detecting devices (e.g., a magnetic head), or image pickup devices (e.g., a CCD) can be produced.

The present invention is not limited to the forms as described above. Within the scope of the present invention, many modifications are possible. Particularly, the number (times) of exposures in the dual-beam interference exposure process and ordinary exposure process, as well as the number of stages (levels) of exposure amount, may be chosen appropriately. Further, superposition of exposures may be adjusted, as desired, with a shift, for example. Such an adjustment will be effective to expand the variation of circuit patterns to be produced.

In accordance with the embodiments of the present invention as described hereinbefore, it is possible to produce a complicated pattern of a very small linewidth of 0.15 micron or less, by a mixture of dual-interference exposure and ordinary exposure.

Figure 23:
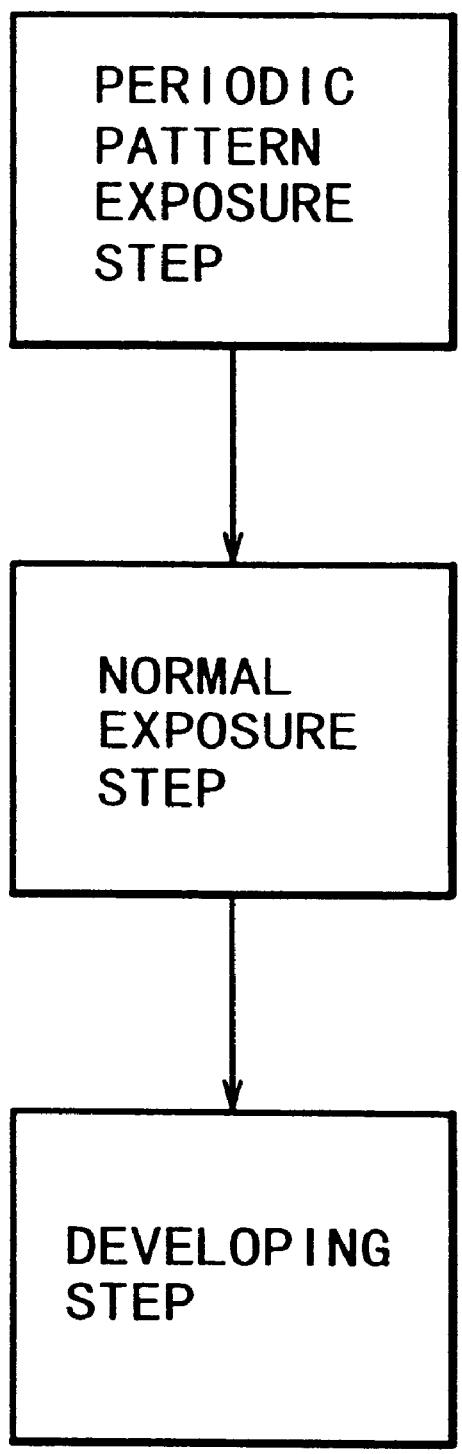
FIG. 23 is a flow chart for explaining an exposure method according to another embodiment of the present invention.

FIG. 23 is a flow chart of an exposure apparatus according to another embodiment of the present invention. FIG. 23 shows the flow of blocks for (i) a periodic pattern exposure step wherein exposure of a resist is performed with an image of high contrast (high contrast image), according to an important feature of this embodiment, (ii) an ordinary exposure step wherein exposure of the resist is performed by an image of a mask having such a circuit pattern that the exposure amount distribution becomes low in contrast when a conventional method is used, and (iii) a developing step for developing the resist to which dual exposure by the above-described two steps has been made. It is to be noted that the order of the periodic pattern exposure step and the ordinary exposure step in FIG. 23 may be reversed. Alternatively, they may be made simultaneously. If the procedure comprises triple exposure or more than triple exposure in which one of the periodic pattern exposure and the ordinary exposure includes plural exposure steps, the periodic pattern exposure and the ordinary exposure may be made alternately. A precise alignment step, for example, is interposed between these exposure steps, although not shown in the drawing. The periodic pattern exposure or the ordinary exposure step may be performed by use of a step-and-repeat type or step-and-scan type projection exposure apparatus.

The mask for ordinary exposure has plural patterns which are different from each other with respect to linewidth or orientation. The circuit pattern with which the exposure amount distribution on the resist through multiple exposure is a fine pattern, among the plural patterns, having a smallest linewidth and whose image has lowest contrast.

Figures 24A, 24B:
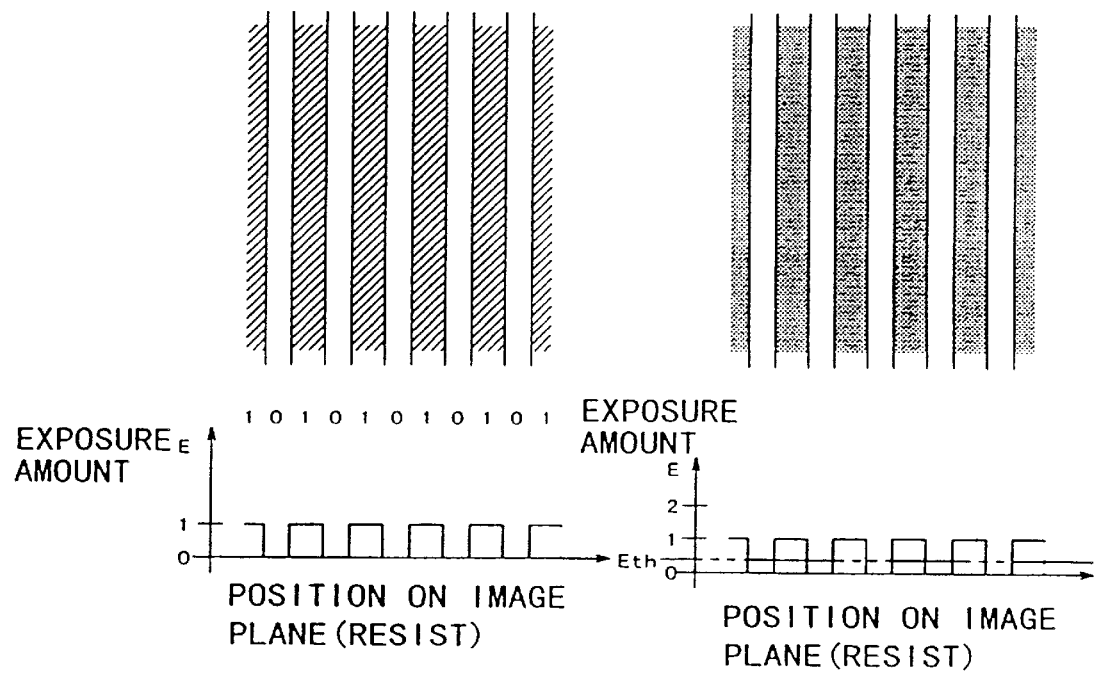
FIGS. 24A and 24B are schematic views, respectively, for explaining a periodic pattern (exposure pattern) which can be produced by double-beam interference exposure.

When multiple exposure is to be done in accordance with the flow diagram of FIG. 23, first a resist of a wafer (photosensitive substrate) is exposed with a periodic pattern image such as shown in FIG. 24A. Numerals in FIG. 24A denote exposure amounts. FIG. 24A shows an image of a periodic pattern of a mask, wherein blank portions correspond to portions (i.e., shadow) with which the resist is not exposed (sensitized). Hatched portions correspond to portions (i.e., light) with which the resist is exposed. The exposure amount is assumed as zero (0) at the blank portions and as 1 at the hatched portions. What is illustrated in FIG. 24A may be deemed to be the pattern of the mask itself. If a resist is exposed only with such a periodic pattern and, without multiple exposure, it is developed, the relation between the exposure amount by the image of a periodic pattern and the exposure threshold of the resist is usually set so that the resist exposure threshold $E_{th}$ (limit value with which the resist film thickness after development becomes zero) comes between exposure amounts 0 and 1 as shown in the graph at the bottom of FIG. 24B. The upper half of FIG. 24B shows in plan view a lithography pattern (surface step pattern) finally obtainable after development of the resist, having been exposed with the image of FIG. 24A. One of the blank portion and hatched portion corresponds to a protrusion of the surface step while the other corresponds to a groove.

Figure 25A:
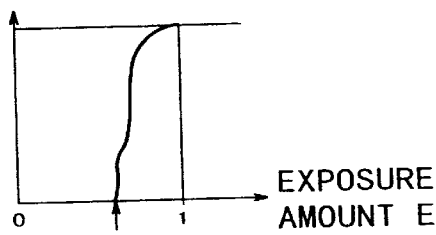
FIGS. 25A and 25B are graphs for explaining an exposure sensitivity characteristic of a resist.
Figure 25B:
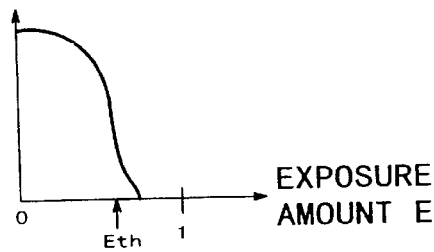

FIGS. 25A and 25B show exposure amount dependency of the resist film thickness after development as well as the exposure threshold, in cases of a positive type wafer resist and negative type resist, respectively. The resist film thickness becomes zero with an exposure amount not less than the exposure threshold, in the case of a positive type resist, and with an exposure amount not more than the exposure threshold, in the case of a negative type resist.

Figure 26:
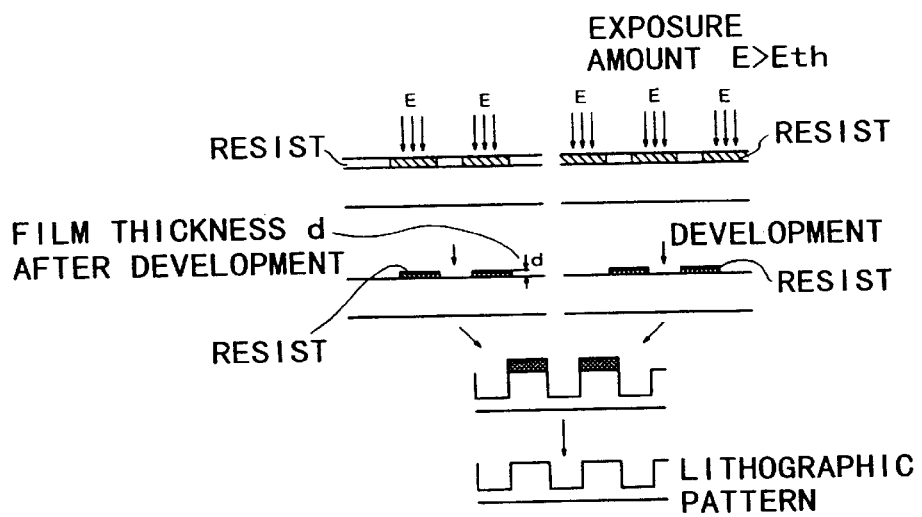
FIG. 26 is a schematic view for explaining pattern formation with development.

FIG. 26 is a schematic view for explaining, with respect to a negative type resist (at the upper left in the drawing) and a positive type resist (at the upper right), formation of a lithography pattern as a result of exposure described above and after a development and an etching process.

Figure 27:
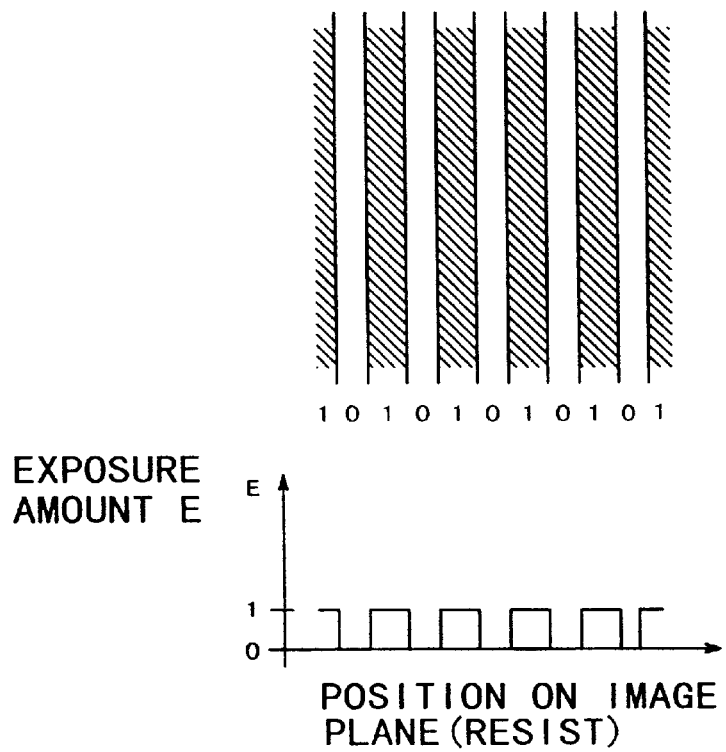
FIG. 27 is a schematic view for explaining a periodic pattern (exposure pattern) which can be produced by double-beam interference exposure.
Figure 28:
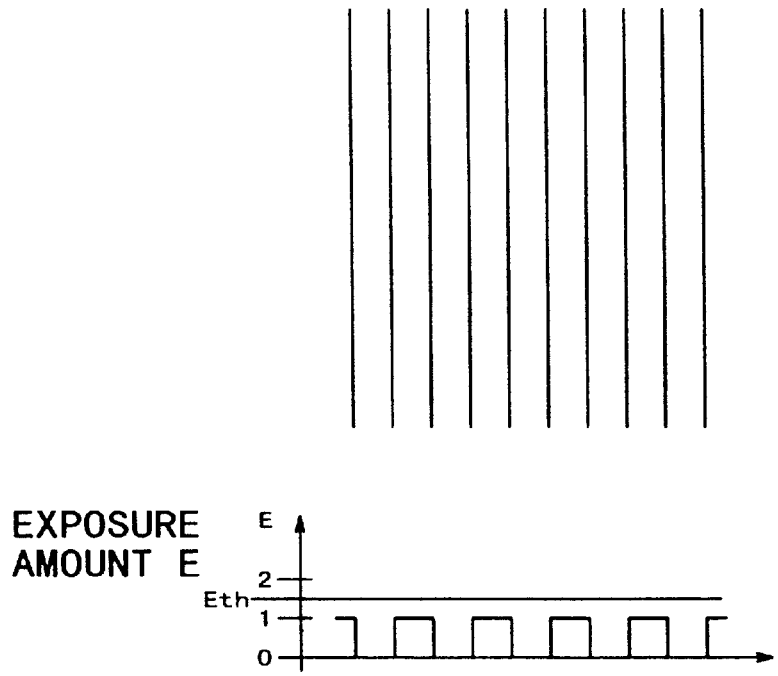
FIG. 28 is a schematic view for explaining a periodic pattern (exposure pattern) which can be produced by double-beam interference exposure according to an embodiment of the present invention.

In the dual exposure method of this embodiment, as compared with ordinary exposure sensitivity setting in FIGS. 24–26, if a largest exposure amount in the periodic pattern exposure (first step in FIG. 23) with which an image of high contrast is provided is assumed as being 1, the exposure threshold $E_{th}$ of the resist of the wafer (photosensitive substrate) is set to be larger than 1 (see the bottom of FIG. 28). Here, if the resist exposure pattern (exposure amount distribution) resulting from only exposure with the periodic pattern image (FIG. 27) is developed, due to insufficient exposure amount, there is produced no portions of zero film thickness, after development, although there may be small resist film thickness variation. Thus, no lithography pattern (surface step) is produced on the wafer by etching. This can be regarded as disappearance of a periodic pattern recorded on the resist in the latent image. Although the present invention will be described with reference to a negative type resist, the present invention is usable with a positive type resist. The top portion of FIG. 28 shows in plan view a lithography pattern obtainable by exposure with a periodic pattern image only (although there are plural narrow lines drawn, practically they do nothing). The graph at the bottom shows the relation between an exposure amount distribution on the resist in this exposure and the exposure threshold $E_{th}$.

An important feature of this embodiment resides in that, due to multiple exposure, the exposure pattern ($E_1$) by the periodic pattern image including a fine and high-contrast image (which might otherwise disappear only through the periodic pattern exposure at the first step of FIG. 23) and the exposure pattern ($E_2$) by an image of a circuit pattern of an arbitrary shape including a pattern of a size not greater than the resolving power of the exposure apparatus, are mixed with each other, and, as a result of which only a desired region of the resist is exposed with an exposure amount ($E_1+E_2$) not less than the resist exposure threshold $E_{th}$), such that a desired lithography pattern corresponding to the circuit pattern of a desired shape is finally produced. What is important in this mixture is a pattern, among the circuit pattern, having a smallest linewidth. A high contrast image is well superposed on the position of a pattern image, only by which an exposure amount distribution of a desired contrast is not attainable with the exposure thereof.

FIG. 29A shows an exposure pattern of a resist resulting from the ordinary exposure described above. It is a pattern, of the circuit pattern to be projected on the wafer, having a smallest linewidth. It comprises an exposure amount distribution on the resist by an image of a pattern which is not resolved because the pattern is a fine pattern less than the resolution of the projection exposure apparatus. Clearly, the produced exposure amount distribution is blurred and expanded.

The pattern on the mask, having a smallest linewidth, which provides the exposure pattern of FIG. 29A may be a fine pattern having a linewidth a half of the linewidth resolvable by the projection exposure apparatus, that is, the linewidth by which desired contrast is obtainable. The mask pattern includes, in addition to such a fine pattern, various patterns of various linewidths resolvable.

When ordinary exposure of a circuit pattern, providing a blurred exposure pattern of FIG. 29A, is performed before (or after or simultaneously) the periodic pattern exposure of FIG. 27 by which a sharp fine exposure pattern can be produced, superposedly to the same region (same position) on the same resist without intervention of a development process, the total exposure amount distribution on that region of the resist will be such as shown in the graph at the bottom of FIG. 29B. Here, the ratio between the exposure amount E1 by the high contrast image through the periodic pattern exposure and the exposure amount by the blurred image of the ordinary exposure is set to 1:1, and also the resist exposure threshold $E_{th}$ is set to be in the range of the sum $E_1+E_2$ (=2) of the exposure amount $E_1$ (=1) by the periodic pattern exposure and the exposure amount $E_2$ (=1) by the ordinary exposure. Therefore, when the wafer to which the dual exposure of this embodiment has been made is developed, a lithography pattern such as shown at the top of FIG. 29B is produced. In this procedure, the center of the blurred exposure pattern by the ordinary exposure and the peak of the sharp exposure pattern by the periodic pattern exposure should be registered with each other. The isolated line pattern shown in the plan view of the lithography pattern at the top of FIG. 29B has a resolution (i.e., linewidth) similar to a lithography pattern to be produced by periodic pattern exposure. Thus, a pattern of a very small linewidth above the resolution of ordinary projection exposure is accomplished, by this dual exposure. On the other hand, among the pattern printed by this ordinary exposure, a pattern having a relatively large linewidth in the range of resolution of the exposure apparatus, other than one having a smallest linewidth, the contrast of an exposure amount distribution of which can be improved by the dual exposure, provides an image of good contrast.

If the ordinary exposure for producing an exposure pattern by a pattern image of a large linewidth shown in FIG. 30 (i.e., projection exposure effective to produce an exposure amount distribution not less than the exposure threshold $E_{th}$ (here, exposure amount twice the threshold) and with a linewidth twice the exposure pattern of FIG. 27) is performed after the periodic pattern exposure of FIG. 27 without a development process, superposedly upon the same region (position) on the same resist, and if the center of the exposure pattern by the ordinary exposure is in registration with the center or peak of the exposure pattern by the periodic pattern exposure, the produced combined image or combined exposure pattern has good symmetry. Thus, a good combined image or combined exposure pattern can be produced. If so or not so, however, the combined exposure pattern on the resist, that is, the total exposure amount distribution will be such as shown in the graph at the bottom of FIG. 30B, for example. After development, the exposure pattern by the periodic pattern exposure disappears and, finally, only the lithography pattern by ordinary exposure such as shown at the top of FIG. 30B is formed.

Also in a case of a circuit pattern, as the exposure pattern of FIG. 31A, which may result in an exposure pattern resolvable at high contrast at a linewidth three times the linewidth of the exposure pattern of FIG. 27, or in a case of a circuit pattern (not shown) which may result in an exposure pattern resolvable at high contrast at a linewidth four times the linewidth of the exposure pattern of FIG. 27, like the case of FIG. 30, only a lithography pattern based on ordinary exposure is formed (FIG. 30B) after development even though dual exposure is performed. Thus, even by dual exposure comprising periodic pattern exposure and ordinary exposure using a mask having plural patterns different in linewidth as producing an exposure pattern of FIG. 28 and an exposure pattern of FIG. 28 or 29, a lithography pattern finally obtainable can be exactly defined in phase just corresponding to the circuit pattern of the mask, including its linewidth. Therefore, various lithography patterns obtainable through projection exposure, for example, can be formed with the dual exposure method of this embodiment of the present invention.

By adjusting an exposure amount distribution (absolute value and distribution) to be provided by the periodic pattern exposure comprising a high contrast image and the ordinary exposure including a low contrast image corresponding to a pattern of smallest linewidth, as well as by adjusting the threshold $E_{th}$ of the resist of the photosensitive substrate, a circuit pattern can be formed on the wafer, which circuit pattern may comprise a combination of various, patterns such as shown in FIGS. 28, 29B, 30B, and 31B and which may have a smallest linewidth (resolution) similar to that of an exposure pattern obtainable through simple periodic pattern exposure (as the pattern of FIG. 29B).

The principle of dual exposure in this embodiment described above can be summarized as follows.

(1) An exposure pattern formed in a region by periodic pattern exposure with a maximum exposure amount not greater than the exposure threshold $E_{th}$, to which region the ordinary exposure is not performed, disappears as a result of development.

(2) As regards the exposure pattern region (exposure region) of ordinary exposure to which an exposure amount not greater than the resist exposure threshold $E_{th}$ is supplied to the resist, an exposure patterns having resolution the same as the periodic pattern exposure which is determined by the combination of exposure patterns by respective ordinary exposure and periodic pattern exposure, can be formed in that region.

(3) As regards the exposure pattern region (exposure region) of ordinary exposure to which an exposure amount not less than the resist exposure threshold $E_{th}$ is supplied to the resist, an exposure pattern having the same resolution as the exposure pattern by ordinary exposure which is determined by the exposure patterns by respective ordinary exposure and periodic pattern exposure, can be formed in that region.

Additionally, there is a further advantage in the dual exposure method of this embodiment that, when the periodic pattern exposure to which a highest resolution is required is performed on the basis of double-beam interference exposure using a phase shift type reticle, for example, a depth of focus remarkably larger than that by imaging of a periodic pattern through ordinary projection exposure can be provided.

As regards the order of periodic pattern exposure and ordinary exposure, while the former is made first in the foregoing description, the order may be reversed or they may be performed simultaneously.

Next, another embodiment of the exposure method of the present invention will be described.

In this embodiment, a circuit pattern (lithography pattern) to be produced by exposure concerns what can be called a gate pattern such as shown in FIG. 32. Thus, for a mask to be used in ordinary exposure, a mask with a circuit pattern having an analogous shape as the pattern of FIG. 32 may be used.

The gate pattern of FIG. 32 has a smallest linewidth of 0.1 micron in the direction A–A' in the drawing, but it has a smallest linewidth of 0.2 micron or more in the longitudinal direction, which is within the range of resolution by ordinary exposure. In accordance with this embodiment of the present invention, as regards a two-dimensional pattern having a smallest linewidth pattern portion S with respect to which high resolution is required only in a one dimensional direction (lateral direction), periodic pattern exposure based on double-beam interference exposure, for example, is performed only with respect to the one-dimensional direction in which high resolution is required. Reference character B in the drawing denotes pattern portions having a relatively large linewidth.

Figure 33:
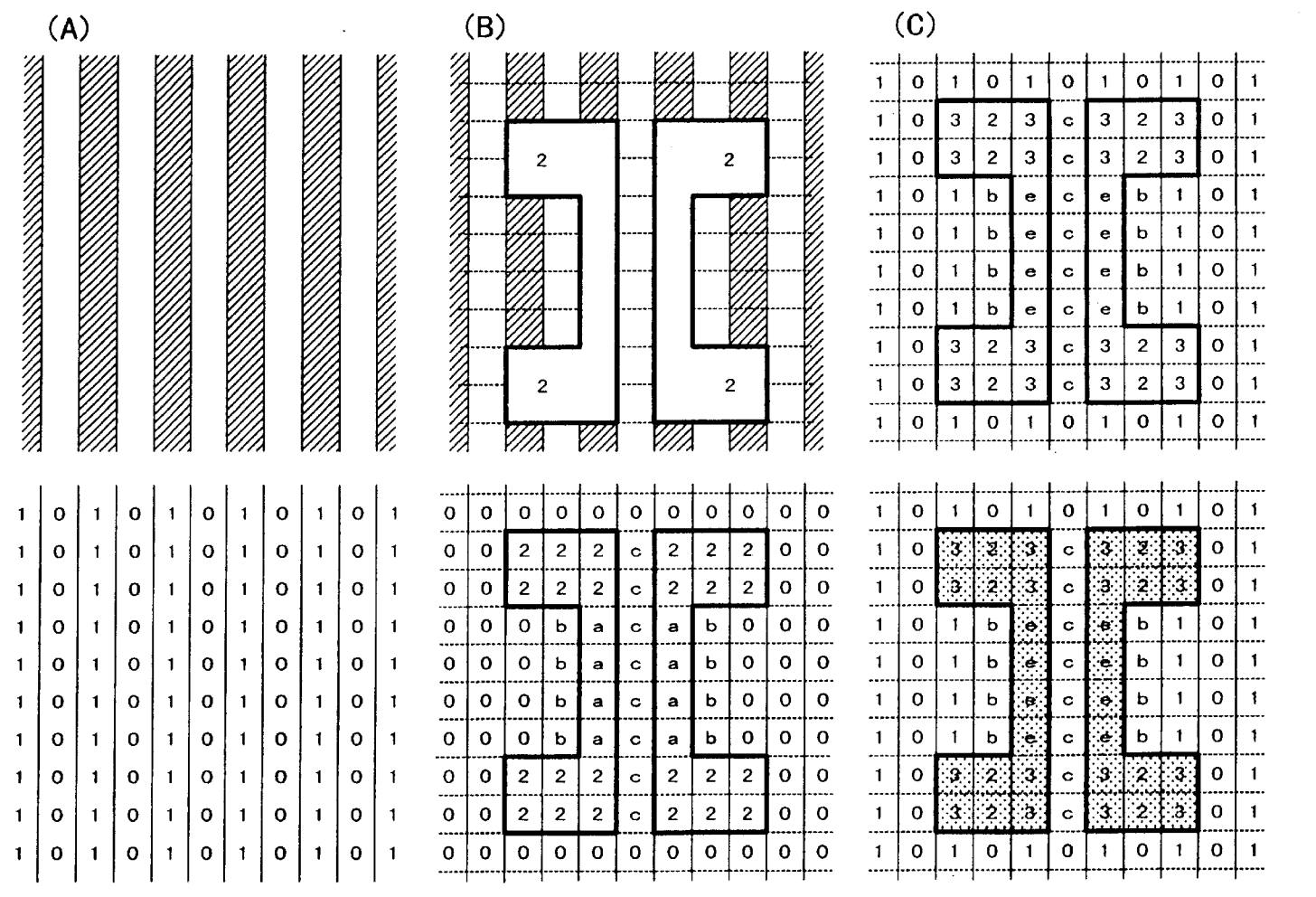

Referring to FIG. 33, the procedure of duel exposure using the same exposure wavelength and based on a combination of one-dimensional periodic pattern exposure and ordinary exposure of a gate pattern which cannot be resolved only by ordinary exposure, will be explained.

FIG. 33 at (A) is a plan view of a periodic exposure pattern to be produced by double-beam interference exposure in which a repetition pattern is formed with respect to a one-dimensional direction. This exposure pattern has a period of 0.2 micron, and this exposure pattern corresponds to a line-and-space pattern of 0.1 micron linewidth of each line and space. Numerical values at the bottom of FIG. 33 denote exposure amounts upon the resist.

Figure 36:
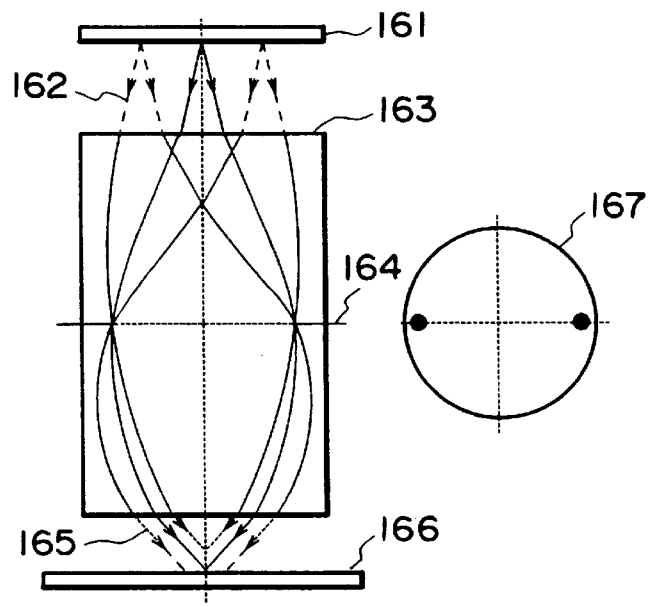
FIG. 36 is a schematic view for explaining an example of a projection exposure apparatus for performing periodic pattern exposure based on double-beam interference.
Figure 37:
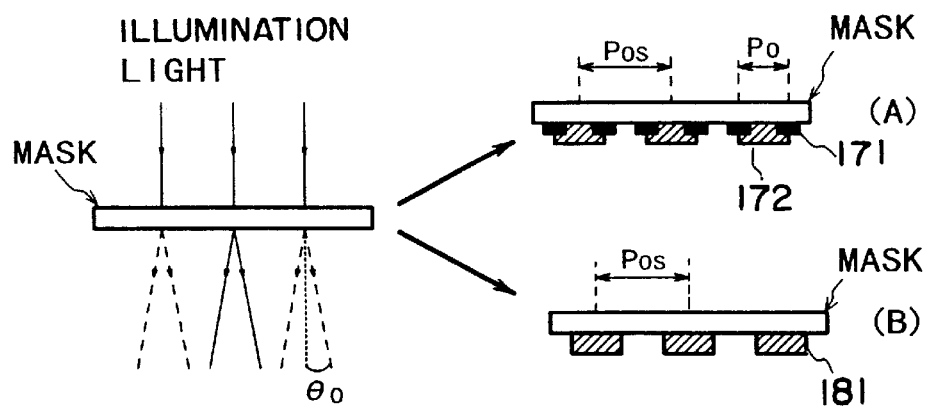
FIG. 37 is a schematic view for explaining an example of a mask and an illumination method therefor, to be used in a projection exposure apparatus of the present invention.
Figure 38:
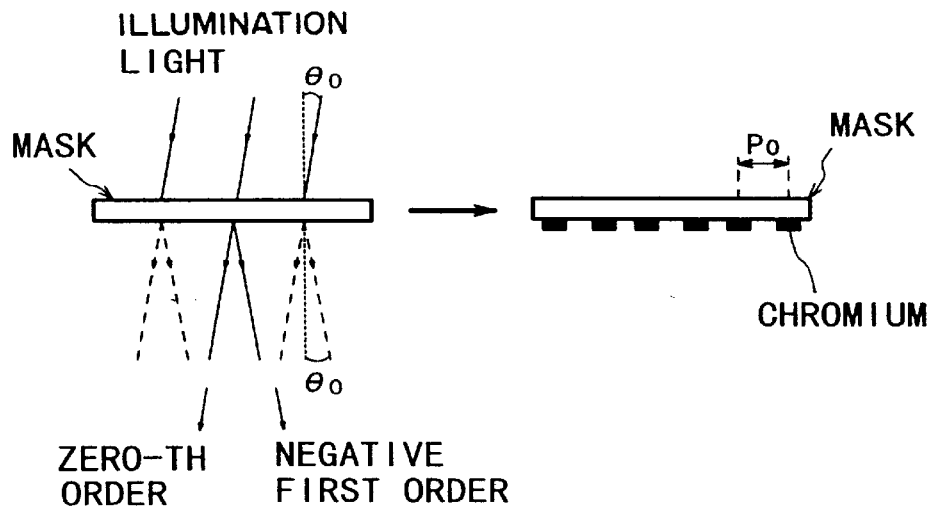
FIG. 38 is a schematic view for explaining another example of a mask and an illumination method therefor, to be used in a projection exposure apparatus of the present invention.

An exposure apparatus for accomplishing the periodic pattern exposure through such double-beam interference, may be one shown in FIG. 15 and having a laser 151, a half mirror 152, and flat mirrors 153, or a projection exposure apparatus shown in FIG. 36 wherein the mask and the illumination light is arranged such as shown in FIG. 37 or 38. Of course, the projection exposure apparatus shown in FIG. 36, 37, or 38 may be used for ordinary exposure.

The exposure apparatus of FIG. 15 will now be explained in detail.

In the exposure apparatus of FIG. 15, as described hereinbefore, two light beams to be combined are obliquely incident on the wafer 154 at an incidence angle θ, whereby an interference fringe (image) is formed on the resist of the wafer 154. The linewidth of the interference fringe formed on the wafer 154 can be expressed by equation (3) mentioned hereinbefore. The relation between the angle θ and the image plane side NA of the wave dividing and combining optical system is NA=sin θ. The angle θ can be changed as desired by changing angles of the paired flat mirrors 153, respectively. If the angle θ of these flat mirrors is made large, the linewidth of each fringe of the interference fringe pattern becomes smaller. For example, in a case where the wavelength (exposure wavelength) of the two light beams is 248 nm (KrF excimer laser), use of an angle θ of 38 deg. enables, formation of an interference fringe pattern having dark and bright fringes of about 0.1 micron linewidth. In this case, NA=sin θ=0.62. If the angle θ is made larger than 38 deg., an interference fringe of a narrower linewidth can be formed and, therefore, higher resolution is attainable.

Next, an exposure apparatus shown in FIGS. 36–38 will be explained.

The exposure apparatus of FIG. 36 is a step-and-repeat type or step-and-scan type projection exposure apparatus having a reduction projection optical system (comprising a number of lenses) for projecting a circuit pattern of a reticle onto a wafer in a reduced scale. In these types of exposure apparatuses, currently, an image-side NA not less than 0.6 with respect to an exposure wavelength of 248 nm is available.

Denoted in FIG. 36 at 161 is a mask (reticle), and denoted at 162 is object-side exposure light emitted from the mask 161 and entering an optical system 163. Denoted at 163 is a projection optical system, and denoted at 164 is an aperture stop. Denoted at 165 is image-side exposure light emitted from the projection optical system 163 and impinging on a wafer 166. Denoted at 166 is a wafer which is a photosensitive substrate. Denoted at 167 is a pupil plane which corresponds to a circular opening of the stop 164. The positions thereon of the two light beams are depicted by a pair of dots. FIG. 36 is a schematic view of the exposure apparatus when it is set to an exposure mode for periodic pattern exposure. Thus, each of the object-side exposure light 162 and the image-side exposure light 165 comprises two parallel light ray beams without a light ray beam parallel to the optical axis, as compared with those of ordinary exposure in FIG. 19.

In order to perform double-beam interference exposure through a projection exposure apparatus such as shown in FIG. 36, a mask and an illumination method therefor may be so set as shown in FIG. 37 or 38. Referring to FIGS. 37 and 38, three examples of a combination of a mask and an illumination method therefor will be explained.

FIG. 37 at (A) shows a Levenson-type phase shift mask. As illustrated at a left-hand portion of FIG. 37, this mask may be illuminated perpendicularly. For example, this mask may comprise a mask having light blocking portions 171 of chromium of a pitch $P_0$ which can be expressed by equation (8) and phase shifters 172 of quartz of a pitch $P_{OS}$ which can be expressed by equation (9).

$$P_0 = \lambda/(M \cdot 2NA) \tag{8}$$

$$P_{OS} = 2P_0 = \lambda/(M \cdot NA) \tag{9}$$

wherein M is the projection magnification of the projection optical system 163, λ is the exposure wavelength and NA is an image-side numerical aperture of the projection optical system 163.

On the other hand, the mask shown in FIG. 37 may comprise a shifter edge type phase shift mask having no light blocking portion of chromium. As shown in the left-hand portion of FIG. 37, also, this mask may be illuminated perpendicularly. Similarly to the Levenson-type phase shift mask, this mask has phase shifters 181 of quartz of a pitch $P_{OS}$ which satisfies equation (9) above. The masks shown at (A) and (B) both include a substrate made of quartz.

In order to perform double-beam interference exposure using a phase shift mask shown in FIG. 37 at (A) or (B), the mask may be illuminated in accordance with coherent illumination wherein σ=0 (or a value close to zero) or with small σ partial coherent illumination wherein σ≦0.3. More specifically, the stop with a circular opening in the illumination optical system for illuminating the mask may be changed by replacing a stop for an ordinary mask (this being for large σ coherent illumination with σ≧0.6) by a small σ stop for a phase shift mask described above, and illumination light is projected to the mask surface in a direction perpendicular thereto (i.e., in a direction parallel to the optical axis).

When the phase shift mask is so illuminated as above, there is no zero-th order transmissively diffractive light emerging from the mask in the perpendicular direction because a phase difference n is applied to adjacent transmissive lights from the phase shifter so that they cancel with each other. On the other hand, there are produced two parallel light ray beams (±first order transmissively diffractive lights) from the mask which are symmetrical with each other with respect to the optical axis of the projection optical system 163. These light beams (object-side exposure light 165) interfere with each other on the wafer 166 to produce an interference fringe (image) thereupon. Diffractive light of a second order or higher does not enter the opening of the aperture stop 164 of the projection optical system 163, and, therefore, it does not contribute to imaging.

The mask shown in FIG. 38 may comprise a mask having light blocking portions of chromium of a pitch $P_0$ which can be expressed by equation (10) similar to equation (8), for example, and it may be illuminated in a direction inclined by an angle $\theta_0$ with respect to the optical axis of the projection optical system 163.

$$P_0=\lambda/(M \cdot 2NA) \quad (10)$$

wherein M is the projection magnification of the projection optical system 163, $\lambda$ is the exposure wavelength and NA is the image-side numerical aperture of the projection optical system 163.

A mask having no phase shifter such as shown in FIG. 38 may be illuminated along an oblique direction by one or two parallel light ray fluxes by which two light fluxes for interference fringe formation can be produced. On that occasion, the incidence angle $\theta_0$ of the illumination light upon the mask may be set to satisfy equation (11), for example.

In an idealistic case, the mask may be illuminated with a pair of parallel light ray fluxes inclined symmetrically with respect to a symmetry plane, containing the optical axis, and oppositely by an angle $\theta_0$.

$$\sin \theta_0 = M \cdot NA \quad (11)$$

wherein M is the projection magnification of the projection optical system 163, and NA is an image-side numerical aperture of the projection optical system 163.

When oblique illumination is performed to the mask having no phase shifter, as shown in FIG. 38, from the mask, there are produced two light fluxes of zero-th order transmissively diffractive light which advances straight with an angle $\theta_0$ with respect to the optical axis and negative first order transmissively diffractive light which advances along a light path symmetrical with the light path of the zero-th order transmissively diffractive light with respect to the optical axis (i.e., advancing with an angle $-\theta_0$ with respect to the optical axis). These two light beams provide two object-side exposure lights 162 shown in FIG. 36. These two light beams enter the opening of the aperture stop 164 of the projection optical system 163, such that the repetition pattern of chromium is imaged thereby. The thus formed image comprises an interference fringe.

In this specification, such oblique incidence illumination by parallel light fluxes is also referred to as "coherent illumination".

What is described above concerns the procedure for performing double-beam interference exposure by use of a projection exposure apparatus. On the basis of this procedure, a periodic exposure pattern such as shown in FIG. 33 at (A) can be produced. Since the illumination optical system 192 of the projection exposure apparatus shown in FIG. 19 is structured to perform partial coherent illumination with σ of about 0.6, the optical arrangement may be changed by, for example, interchanging the aperture stop (not shown) of σ of about 0.6 in the illumination optical system 192 of FIG. 19 by a small σ aperture stop corresponding to $\sigma \leq 0.3$, by which small partial coherent illumination or substantially coherent illumination can be performed within the projection exposure apparatus.

Referring back to the second embodiment shown in FIGS. 32 and 33, in this embodiment, before or after the periodic pattern exposure based on double-beam interference exposure described above, ordinary exposure through mask projection is made (e.g., partial coherent illumination with σ is about 0.6 may be made to the mask by using the apparatus of FIG. 1). By this, a gate pattern illustrated as blank portions in FIG. 33 at (B) is printed. The upper portion at (B) of FIG. 33 illustrates the relative positional relation between the gate pattern (image) for dual exposure and the periodic pattern (image) resulting from double-beam interference exposure, as well as an exposure amount at the mask by the gate pattern to be projected. The lower portion illustrates exposure amounts to the wafer resist by the gate pattern image through ordinary exposure, being mapped in terms of longitudinal and lateral resolution of 0.1 micron pitch.

A minimum linewidth portion (pattern image) of the image of this gate pattern through the projection exposure is not resolved and is blurred. Thus, the contrast is low and exposure amounts at points in this portion are lowered. As regards the exposure amount by this pattern image of low contrast, when it is considered with respect to the central portion of the pattern image and peripheral portions at opposite sides of the central portion, separately, and when the exposure amounts at the central portion and the peripheral portion are denoted by a and b and the exposure amount at a portion between pattern images to which blurred images are coming from the opposite sides is denoted by C, then there are provided relations in exposure amount that 1<a<2, 0<b<1 and 0<C<1. Thus, there is produced an exposure amount distribution in which regions of the gate pattern image have different exposure amounts. The exposure amount ratio of respective exposures in a dual exposure process using a mask having such a gate pattern, upon the mask (resist), may be 1:2 ("periodic pattern exposure" vs. "ordinary exposure), for example.

Next, formation of a gate pattern (fine circuit: pattern) of FIG. 32 based on a combination of periodic pattern exposure and ordinary exposure, will be explained in greater detail. In this embodiment, there is no development process performed between the periodic pattern exposure based on double-beam interference exposure and the ordinary exposure based on projection exposure. Therefore, exposure amounts at each point in the region where exposure patterns by respective exposures are superposed, are accumulated and, after the accumulation, a separate exposure pattern, (exposure amount distribution) is produced. A development process will be made to this exposure pattern. In the thus produced separate exposure pattern, the contrast of the exposure amount distribution related to a smallest linewidth pattern portion of the gate pattern is improved as a result oi the dual exposure, and the exposure amount there is above the resist exposure threshold (to be described later).

FIG. 33 at (C) shows in its upper portion the exposure pattern (exposure amount distribution) to be produced as a result of accumulation of the exposure pattern at (A) of FIG. 33 and the exposure pattern at (B) of FIG. 33, being accumulated by dual exposure. The exposure amount at regions e is 1+a which is larger than 2 and smaller than 3. The lower portion at (C) in FIG. 33 shows a surface step pattern (depicted by blank and hatching) produced as a result of a development process to the exposure pattern shown in the upper portion at (C) of FIG. 13. In this embodiment, the resist of a wafer used has an exposure threshold which is larger than 1 and smaller than 2. Therefore, as a result of development, only such a portion as having an exposure amount greater than 1 appears as the surface step pattern of FIG. 32. The shape and size of the pattern depicted by blank and hatching in the lower portion at (C) of FIG. 33 corresponds to those of the gate pattern shown in FIG. 32. Thus, in accordance with the exposure method of this embodiment, a gate pattern (circuit pattern) having plural pattern portions B and C of different linewidths, including a very small linewidth of 0.1 micron, can be produced on the basis of dual exposure as described above, by use of a projection exposure apparatus having an illumination optical system in which two types of masks are interchangeably usable and in which large σ partial coherent illumination and one of coherent illumination and small σ partial coherent illumination can be interchangeably performed, with the use of the same exposure light (exposure wavelength).

Figure 34:
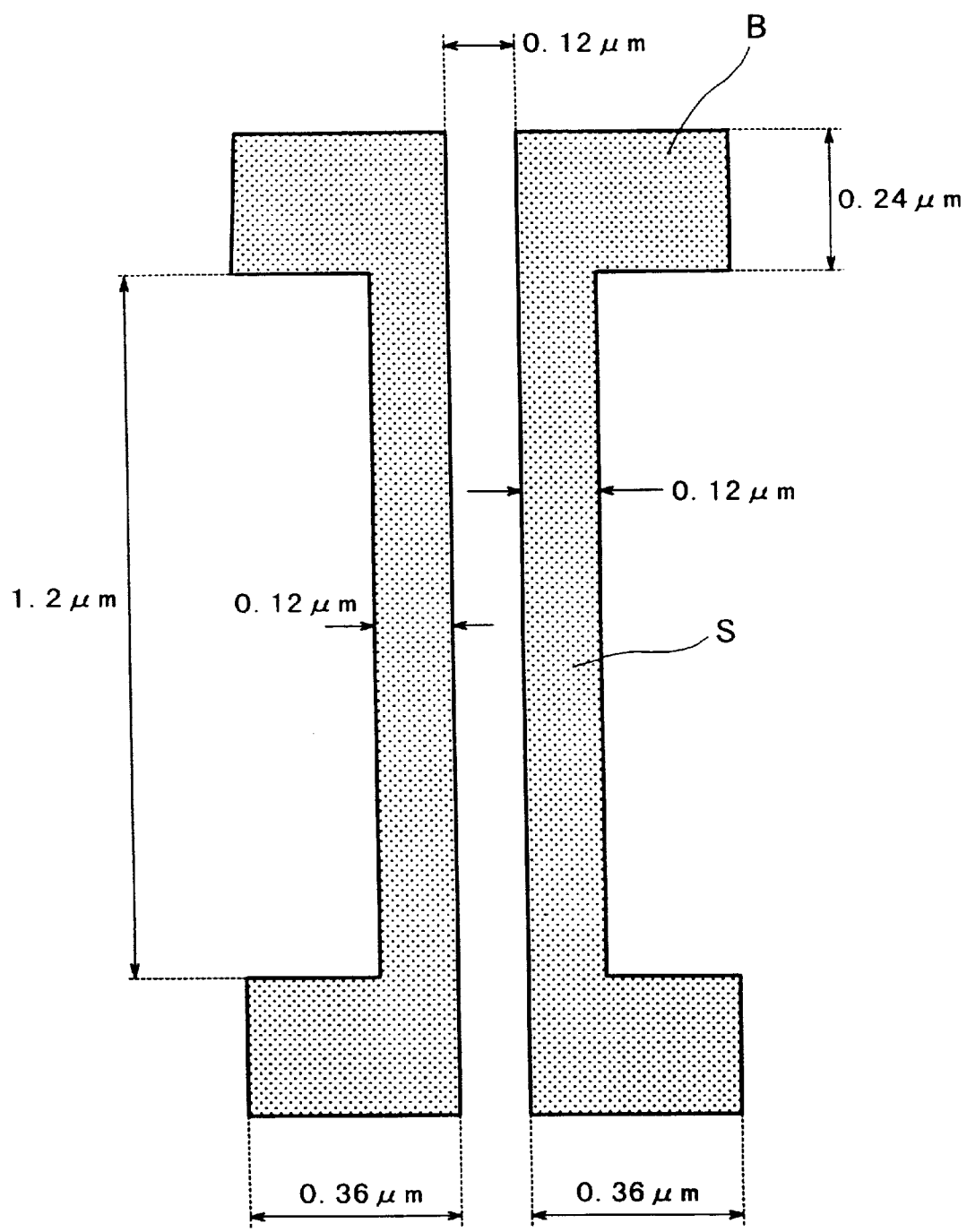
FIG. 34 is an enlarged view of a gate pattern.
Figure 35:
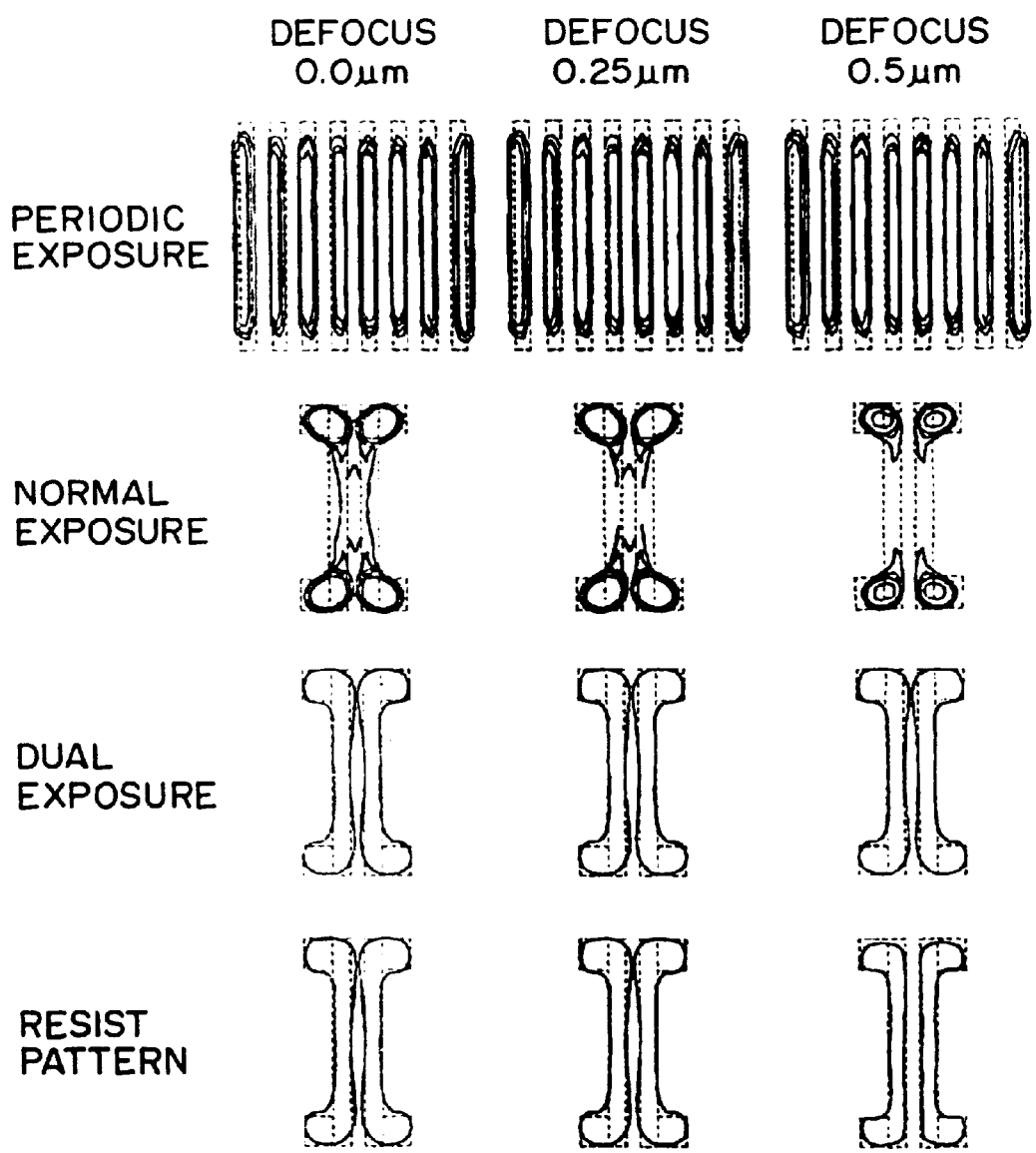
FIG. 35 is a schematic view for explaining a pattern forming process.

FIGS. 34 and 35 illustrate examples of what can be obtained by dual exposure of the second embodiment, by use of a stepper (projection exposure apparatus) having a light source of a KrF excimer laser which produces laser light of a wavelength λ=248 nm. A resist of a wafer may be exposed with an image of a gate pattern shown in FIG. 34, having a smallest linewidth of 0.12 micron. Without performing development thereafter, a Levenson-type phase shift mask may be used to print an image of an interference fringe of high contrast superposedly upon the same exposure position of the gate pattern image on the resist, so that bright portions of the interference fringe are registered with the image of smallest linewidth pattern portions of the gate pattern. An exposure condition therefor will be described below, in detail.

The projection lens may have an NA of 0.3 and, as regards the illumination system, it may be arranged so that it performs perpendicular illumination with σ=0.3 for the periodic pattern exposure using a Levenson-type phase shift mask and also that it performs oblique illumination for ordinary exposure using a mask with a gate pattern, by use of light from a ring-like secondary light source (a light source at or adjacent to a light exit surface of an optical integrator) having σ=0.8 at the ring outside diameter and σ=0.6 at the inside ring diameter for providing ring-like illumination. The exposure amount may be so set that the exposure amount by the ordinary exposure is twice the exposure amount by the periodic pattern exposure.

In FIG. 35, the topmost row illustrates exposure amount distributions on a wafer resist to be provided by an interference fringe (image) by periodic pattern exposure. The second row illustrates exposures amount distributions on the resist by a gate pattern image by ordinary exposure. The third row illustrates exposure amount distributions to be provided by dual exposure comprising periodic pattern and projection exposure. The fourth row illustrates surface step patterns (resist patterns) to be formed on the wafer as a result of resist development.

In each row, illustrations are made to an exposure amount distribution and a surface step pattern, in regard to cases of a defocus amount of 0.0 micron of the wafer with respect to the focus position of the projection optical system, a defocus amount of 0.2 micron and a defocus amount of 0.5 micron, respectively.

As illustrated at the second row of FIG. 35, with a single projection exposure process, a and contrast and fine gate pattern image is not obtainable due to blur. However, by superposing a high contrast image of the periodic pattern at the first row of FIG. 35 onto the exposure position defined on the resist by projection exposure, also, the fine gate pattern image portion (image of the smallest linewidth pattern S) is improved in contrast and can be resolved as illustrated at the third row of FIG. 35. A surface step pattern corresponding to a desired gate pattern such as shown at the fourth row of FIG. 35 was practically produced.

Figure 39:
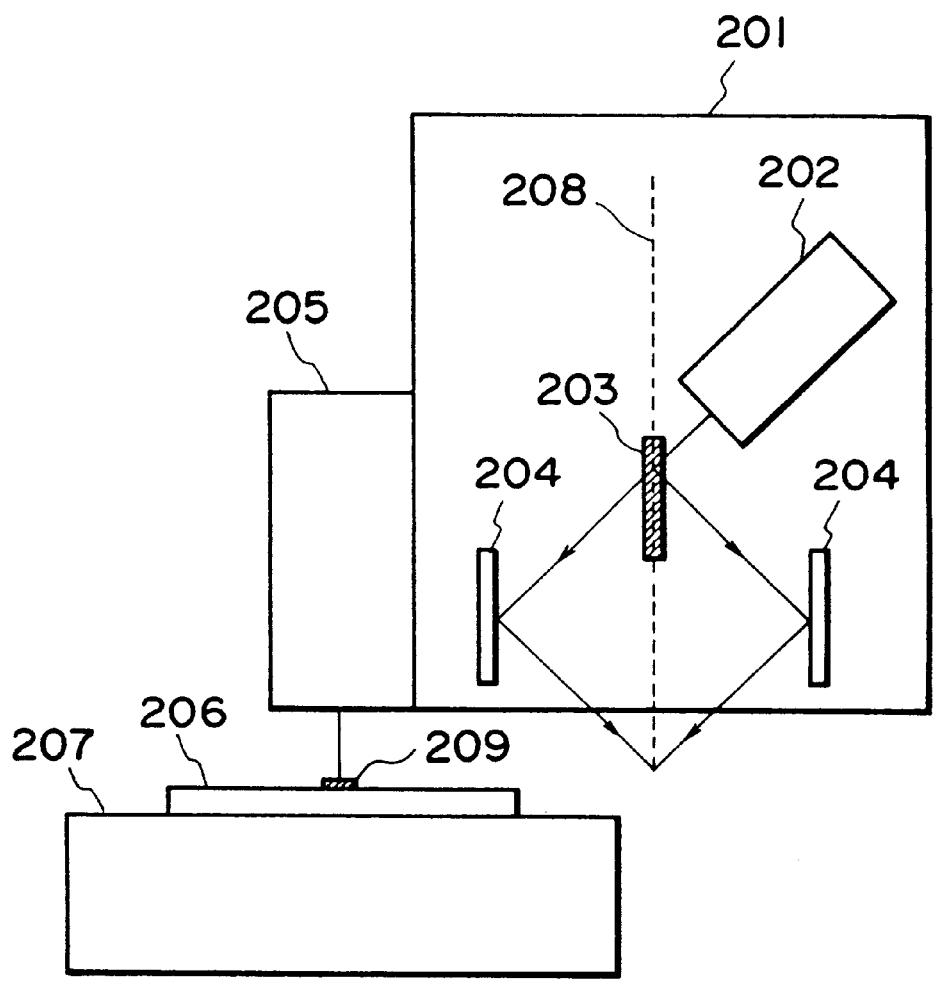
FIG. 39 is a schematic view for explaining an example of a double-beam interference exposure apparatus according to the present invention.

FIG. 39 is a schematic view of an example of an exposure apparatus for double-beam interference exposure, which is able to perform periodic pattern exposure in the multiple exposure method according to the present invention. Denoted in FIG. 39 at 201 is a wave separating and combining optical system for double-beam interference, and the basic structure therefore is similar to that of the optical system of FIG. 15. Denoted at 202 is a KrF excimer laser (wavelength of about 248 nm) or an ArF excimer laser (wavelength of about 193 nm). Denoted at 203 is a half mirror, and denoted at 204 is a flat mirror. Denoted at 205 is an off-axis type alignment optical system having a positional relation with the optical system 202 completely held fixed or being able to detect that positional relation as a base line (length) appropriately. This alignment optical system is operable to observe an alignment mark 209 on a wafer 206 to detect the position thereof, for wafer autoalignment. Denoted at 207 is an X-Y-Z stage which is movable along an X-Y plane perpendicular to the optical axis of the optical system 201 and along the optical axis direction (Z direction). The position of this stage with respect to the X and Y directions can be controlled precisely by using a laser interferometer (not shown), for example. Since the structures and functions of these devices 205 and 207 are well known in the art, a detailed description therefor will be omitted.

Figure 40:
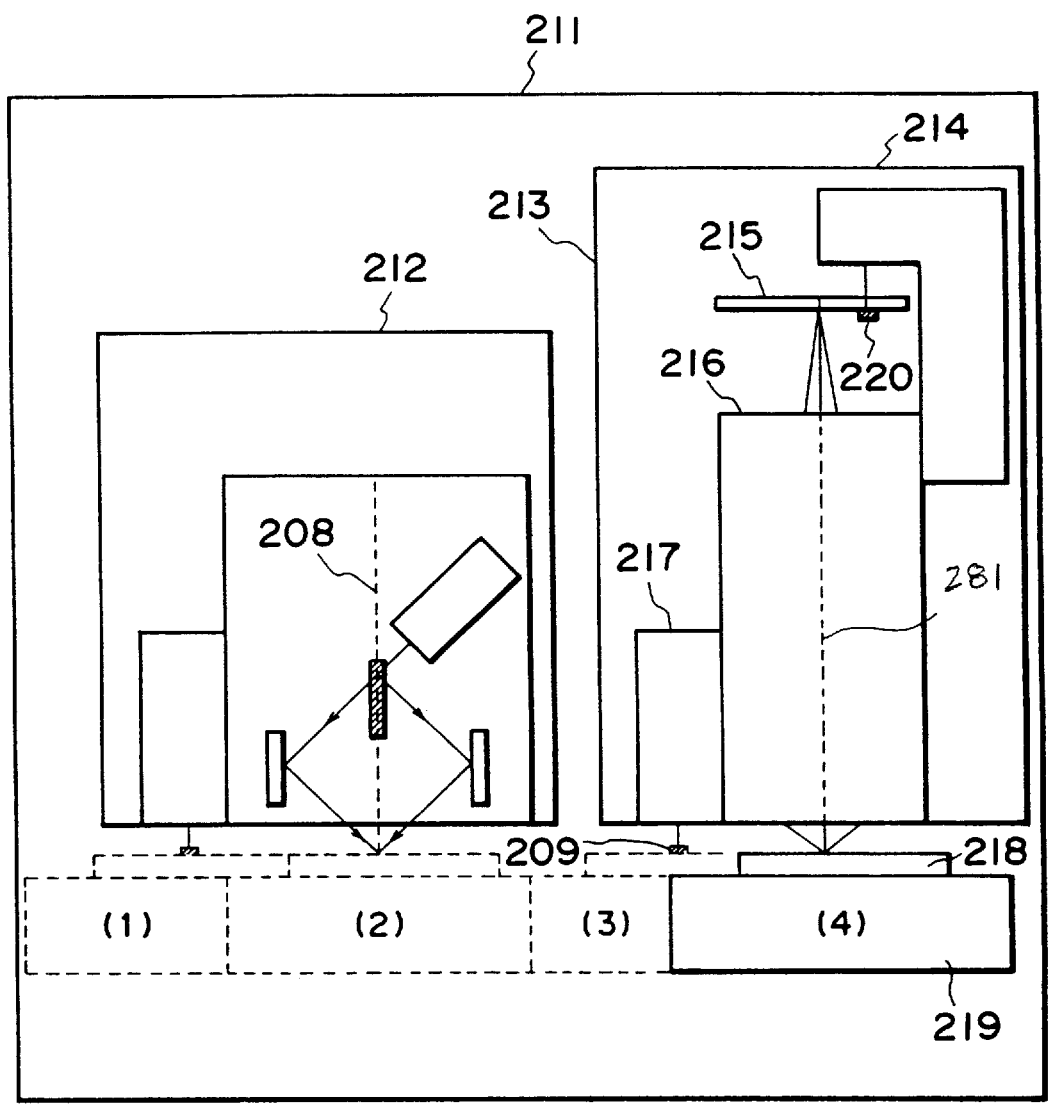
FIG. 40 is a schematic view for explaining an example of a high resolution exposure apparatus according to the present invention.

FIG. 40 is a schematic view of a high resolution exposure system which comprises a double beam interference exposure apparatus for periodic pattern exposure and a projection exposure apparatus for ordinary exposure, for performing the exposure method according to the present invention.

Denoted in FIG. 40 at 212 is a double-beam interference exposure apparatus which includes optical systems 201 and 205 shown in FIG. 39. Denoted at 213 is an ordinary projection exposure apparatus which comprises an illumination optical system (not shown), a reticle alignment optical system 214, an off-axis alignment optical system 217 for wafer alignment, and a projection optical system 216 for projecting a circuit pattern of a mask 215, such as shown in FIG. 34, for example, onto a wafer 218 in a reduced scale. The illumination optical system (not shown) of the exposure apparatus 213 is operable to perform large σ illumination, like the projection exposure apparatus used in the second embodiment described hereinbefore, and it can provide ring-like illumination of σ=0.6 at the inside ring diameter and σ=0.8 at the outside ring diameter.

The reticle alignment optical system 214 is operable to observe an alignment mark 220 on the mask 215 to detect the position thereof, for reticle autoalignment. The wafer alignment optical system 217 is operable to observe an alignment mark 209 on the wafer 206, both for projection exposure and double-beam interference exposure, to detect the position thereof to perform wafer autoalignment. Since the structures and functions of these optical systems 214, 216, and 217 are well known in the art, a detailed description therefor will be omitted.

Denoted at 219 in FIG. 40 is a single X-Y-Z stage which is used both in the double-beam interference exposure apparatus 212 and in the projection exposure apparatus 213. The stage 219 is movable along a plane perpendicular to the optical axes 208 and 281 of these exposure apparatuses 212 and 213 and along the optical axis direction. The position of the stage with respect to the X and Y directions can be controlled precisely by using a laser interferometer, for example.

The stage 219 having a wafer 218 held thereon is moved into the position (1) in FIG. 40, the position of the wafer 218 thereat is measured accurately. On the basis of the result of the measurement, the wafer 218 is moved into the exposure position in the exposure apparatus 212 whereat double-beam interference exposure (periodic pattern exposure) is made to the wafer 218. Thereafter, it is moved into the position (3) in FIG. 40, whereat the position of the wafer 218 is measured accurately. Then, it is moved into the exposure position in the exposure apparatus 213, as depicted at position (4), whereat projection exposure (ordinary exposure) is performed to the wafer 218.

In the exposure apparatus 213, the off-axis alignment optical system 217 may be replaced by a TTL alignment optical system (not shown) for observing an alignment mark of the wafer 218 through the projection optical system 216 to detect the position thereof, or a TTR alignment optical system (not shown) for observing an alignment mark of the wafer 218 through the projection optical system 216 and through the mask 215 to detect the position thereof.

Figure 41:
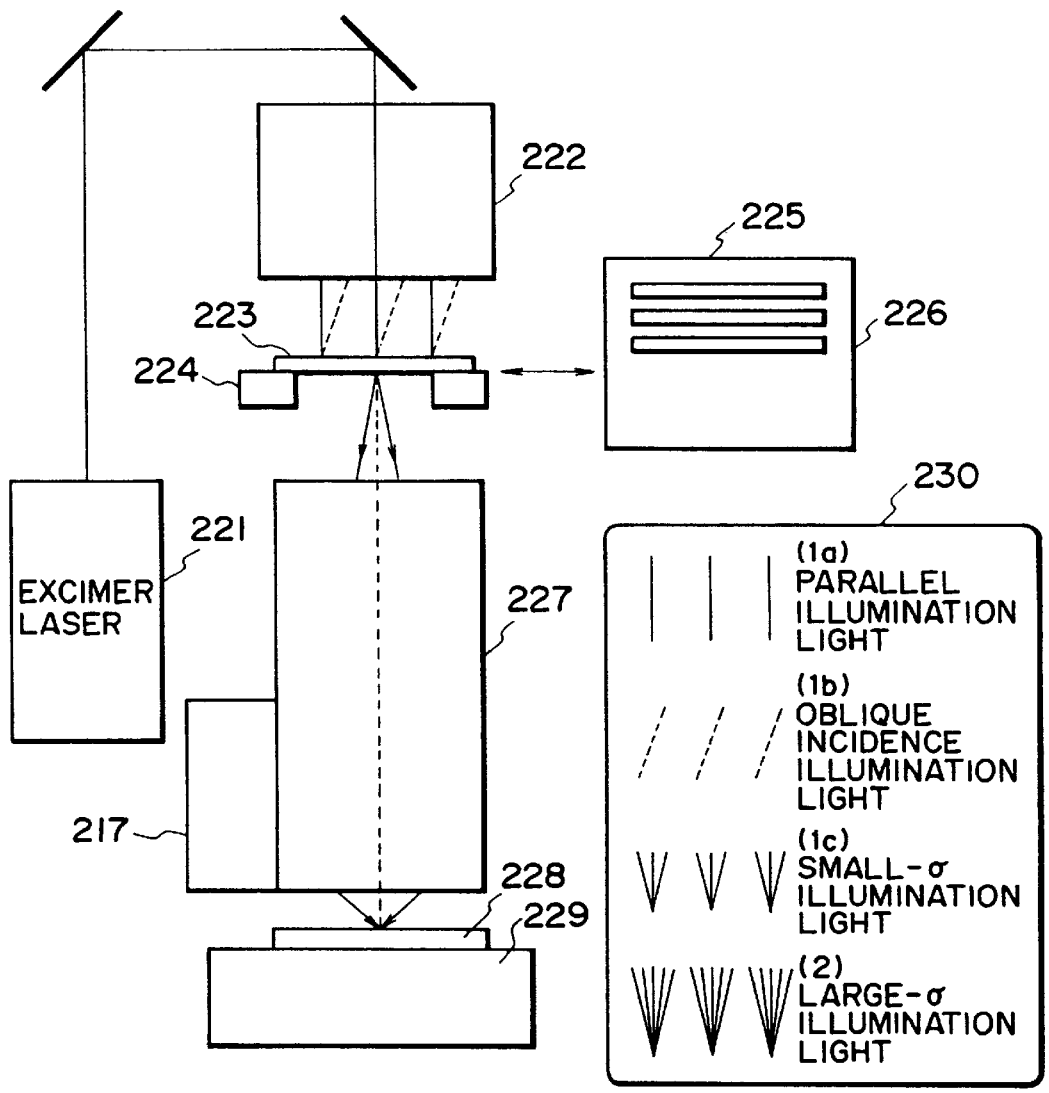
FIG. 41 is a schematic view for explaining another example of a high resolution exposure apparatus according to the present invention.

FIG. 41 is a schematic view of a high resolution exposure apparatus which is able to perform both periodic pattern exposure (high contrast projection exposure), enabling the multiple exposure method of the present invention, and ordinary projection exposure (projection exposure of low contrast image or images of low and high contrasts mixed).

Denoted at 221 in FIG. 41 is a KrF excimer laser (wavelength of about 248 nm) or an ArF excimer laser wavelength of about 193 nm), and denoted at 222 is an illumination optical system. Denoted at 223 is a mask, and denoted at 224 is a mask stage. Denoted at 227 is a projection optical system for projecting a circuit pattern of a mask 227 onto a wafer 228 in a reduced scale. Denoted at 225 is a mask (reticle) changer for selectively supplying, to the stage 224, one of a mask having a circuit pattern as that of FIG. 34 formed thereon and a periodic pattern reticle without a circuit pattern, such as a Levenson-type phase shift mask, an edge shifter type mask, and a periodic pattern mask without a phase shifter, for example. The periodic pattern reticle may be one having a certain type of circuit pattern formed at a position different from the periodic pattern.

Denoted at 229 in FIG. 41 is a single X-Y-Z stage which is used both for periodic pattern exposure, based on double-beam interference exposure, and for ordinary exposure based on projection exposure. The stage 229 is movable along a plane perpendicular to the optical axis of the optical system 227 and along the optical axis direction. The position of the stage with respect to the X and Y directions can be controlled precisely by using a laser interferometer, for example.

The exposure apparatus of FIG. 41 comprises a reticle alignment optical system (not shown), and an off-axis alignment optical system 217 such as described with reference to FIG. 40. In addition to this, the exposure apparatus includes a TTL alignment optical system and a TTR alignment optical system (both unshown). By using these alignment optical systems, alignment of the mask 223 and shot areas of the wafer 228 can be performed.

The illumination optical system 222 of the FIG. 41 apparatus is structured so that large σ partial coherent illumination and one of small σ partial coherent illumination and coherent illumination can be performed interchangeably. For coherent illumination, illumination light (1a) or (1b) within block 230, such as having been described with reference to FIGS. 37 and 38, is supplied; whereas for small σ partial coherent illumination, illumination light (1c) in block 230 is supplied, both to one of a Levenson-type phase shift mask as described, an edge shifter type mask and a periodic chromium pattern mask without a phase shifter. For large σ partial coherent illumination, illumination light (2) in block 230 is supplied to a mask having a desired circuit pattern formed thereon. Changing from large σ partial coherent illumination to small σ partial coherent illumination may be made by replacing a stop with a large aperture diameter normally disposed just after the fly's eye lens of the illumination optical system 222 by a coherent illumination stop having a sufficiently small aperture diameter as compared with the former. Here, large σ refers to σ≧0.6, and small σ refers to σ≦0.3. In place of illumination light (2) in block 230, ring-like illumination light described hereinbefore may be used.

Any one of the exposure methods and exposure apparatuses having been described above can be used for the manufacture of various devices such as a semiconductor chip (e.g., IC or LSI), a display devices (e.g., a liquid crystal panel), a detector element (e.g., a magnetic head), or an image pickup device (e.g., a CCD), for example.

The present invention is not limited to the embodiments described above. Various modifications are possible within the scope of the present invention. Particularly, the number of exposures and levels of exposure amounts in the periodic pattern exposure such as double-beam interference exposure and in the ordinary exposure may be selected as desired. Further, as regards superposition of exposure patterns, they may be superposed with a slight shift, for example. The selection and adjustment such as above enables enlargement of variation of circuit patterns to be produced.

Next, an example of exposure amount setting method according to the present invention will be described.

FIG. 110 shows at its bottom portions the intensity distributions defined by exposures on a wafer.

The exposure amount distribution at (A) in FIG. 110 results from exposure with a periodic pattern and, idealistically, it comprises a rectangular wave of 1 and 0. However, since this is a linewidth near the resolution limit of double-beam interference exposure, it comprises a sine wave provided by zeroth order light and first order light. The maximum value of the sine wave is denoted by $I_0$, and the minimum is denoted by $I_1$. Here, depending on the a of illumination condition, the values of $I_0$ and $I_1$ are determined.

The exposure amount distribution at (B) of FIG. 110 results from ordinary or standard exposure, and it shows representative values at respective portions. The smallest linewidth portion of this exposure pattern provided by projection exposure is not resolved but is blurred. Thus, the light intensities at these points are lowered. The exposure amount may be roughly separated into pattern central portions b, opposite side portions d, and central portions c where blurs are coming from the opposite sides. The linewidth twice the smallest linewidth is larger than the values of b, c and d. Since, however, it is a linewidth close to the resolution limit of projection exposure, it is slightly blurred and takes a value of a. These values a, b, c, and d are variable in dependence upon the illumination condition.

The exposure amount at (C) of FIG. 110 results from the addition of the exposure pattern at FIG. 110(A) and the exposure pattern at FIG. 110(B). The light quantity ratio in exposures by double-beam exposure and projection exposure differs in dependence upon the illumination conditions in respective exposures. The light quantity ratio of exposures in the addition is determined as an illumination ratio of the illumination system, and it may be expressed by:

"double-beam interference exposure" vs. "projection exposure"=1:k and the value k can be determined as follows.

The exposure amount distribution at (C) of FIG. 110 can be expressed by using the above described exposure amount distributions and light quantity ratios, and by using the following equations:

$$a'=k \times a+I_0$$

$$a''=k \times a+I_1$$

$$b'=k \times b+I_0$$

$$c'=k \times c+I_1$$

$$d'=k \times d+I_1$$

In order to obtain a desired gate pattern, the following relations are given with respect to the sensitization threshold IC of a resist.

If, for example, the resist is a negative type it follows that:

$a'>I_c$ $a''>I_c$ $b'>I_c$ $c'<I_c$ $d'<I_c$

Preferably, the values a', a", and b' have small differences, while particularly values c' and b' preferably have a large difference. By solving these formulae, an optimum light quantity ratio of the respective illumination conditions can be determined. Particularly, the following two formulae related to a fine pattern are important:

For a negative type resist:

$k \times b+I_0>I_c$ $k \times c+I_1<I_c$

For a positive type resist:

$k \times b+I_1<I_c$ $k \times c+I_0>I_c$

In a positive type resist, while the magnitude relation in the exposure amount distribution is inverted and the inequality symbol with the resist threshold $I_c$ is reversed, the optimum light quantity ratio can be determined similarly.

By combining two different illumination methods for the double-beam interference exposure and projection exposure described above, a fine circuit pattern such as shown in FIG. 34 can be produced. This will be described below in detail.

In this embodiment, there is no developing process intervening between the double-beam interference exposure and ordinary projection exposure. Thus, in the region where exposure patterns of these exposures overlap, the exposure amounts are accumulated and, the cumulative exposure amount (distribution) defines a separate exposure pattern.

Figure 111A:
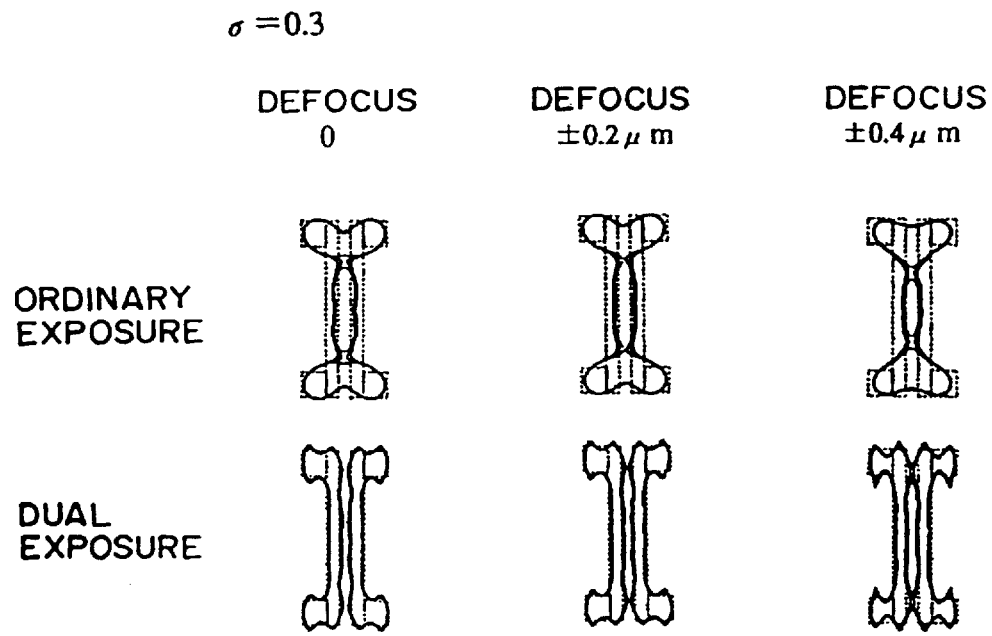
FIGS. 111A and 111B are schematic views, respectively, for explaining defocus characteristics of a pattern produced in accordance with the multiple exposure process of the present invention.
Figure 112A:
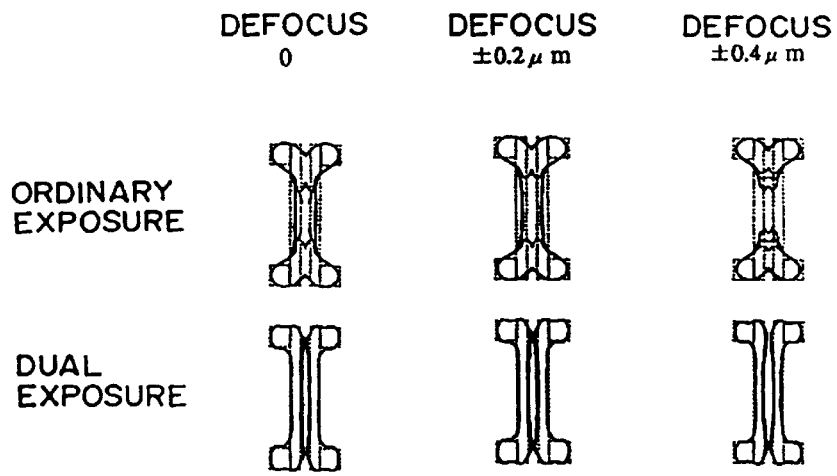
FIGS. 112A and 112B are schematic views, respectively, similarly for explaining defocus characteristics a pattern produced in accordance with the multiple exposure process of the present invention.
Figure 112B:
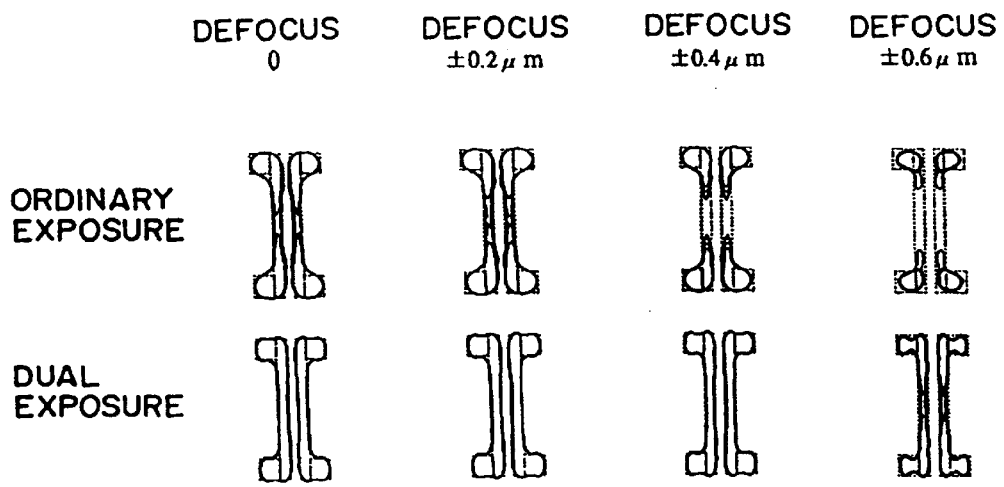

FIGS. 111A and 112A as well as FIGS. 112A and 112B show specific examples wherein a KrF excimer stepper of wavelength 248 nm is used.

More particularly, a gate pattern such as shown in FIG. 34 and having a smallest linewidth of 0.12 micron is printed by ordinary exposure and, in addition thereto, a Levenson-type phase shift mask is used to print a periodic pattern superposedly upon its smallest linewidth.

A projection lens had a numerical aperture NA of 0.6, and σ of the illumination system was 0.3 for the exposure using a Levenson-type mask. For ordinary mask exposure, the ring-like illumination method of σ=0.3, 0.6, and 0.8 was adopted.

When exposure of a periodic pattern is performed in accordance with double-beam exposure using a phase shift mask, for example, coherent illumination may take a value of σ equal to zero or close to it. If the value is too small, the exposure amount per unit time decreases, causing prolongation of exposure time. It is not practicable.

For periodic pattern exposure, σ should preferably be not larger than 0.3. Thus, in Levenson mask exposure, it was at the maximum 0.3.

For ordinary exposure, generally partial coherent illumination is used. If σ is enlarged, the reproducibility of a complicated shape becomes better and the depth increases. This tendency is more notable in a ring-like illumination method in which inside illuminance distribution is lower than the outside, but the contrast is disadvantageously lowered.

As shown in FIG. 111A, if dual exposure is performed with ordinary exposure made under the same illumination condition of σ=0.3 the same as that of the periodic pattern exposure, a gate pattern can be resolved in a defocus range of ±0.2 micron. But, its line pattern portion is waved, and a narrow-width portion may unpreferably be a factor for breakage.

Figure 111B:
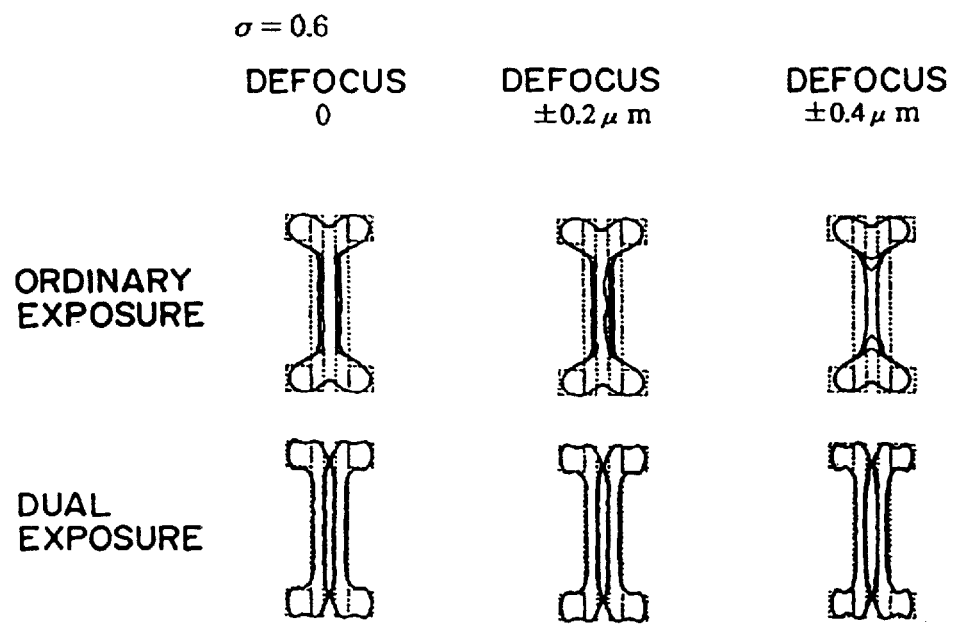

For ordinary pattern exposure, preferably, σ should be not less than 0.6. As shown in FIG. 111B, with σ of 0.6 in ordinary exposure, a gate pattern can be resolved in a defocus range of ±0.4 micron, and waviness of a line pattern portion is removed. The exposure amount ratio between ordinary exposure and periodic pattern exposure was 1.5:1 ("ordinary exposure" vs. "periodic pattern exposure").

As shown in FIG. 112A, if σ of ordinary exposure is as large as 0.8, reproducibility of a complicated pattern is improved. The exposure amount ratio between ordinary exposure and periodic pattern exposure was 2:1 ("ordinary pattern exposure" vs. "periodic pattern exposure"). Preferably, for ordinary pattern exposure, the exposure amount may be two or more times that of the periodic pattern exposure.

FIG. 112B shows a two-dimensional intensity distribution where ordinary exposure was made in accordance with a ring-like illumination method, the intensity being illustrated while taking the illuminances from 0.6 at the ring inside to 0.8 at the outside as 1 and taking the illuminances less than 0.6 at the inside of the ring as 0. The exposure amount ratio between ordinary exposure and periodic pattern exposure was 2.5:1 ("ordinary exposure" vs. "periodic pattern exposure").

With ring-like illumination, the reproducibility of a complicated shape becomes better as compared with a case of σ=0.8, and also the depth is enlarged. A good image was produced with defocus not greater than ±0.4 micron.

As described above, a fine circuit pattern can be produced in accordance with dual exposure using periodic pattern exposure. Due to low light intensity and low contrast, usually a fine pattern of an ordinary exposure pattern is not resolved. However, by combining and superposing it with periodic pattern exposure of high contrast, contrast is enhanced and, therefore, a fine pattern can be resolved.

On the other hand, as regards a large pattern larger than the resolution of an ordinary exposure pattern, the intensity of periodic pattern exposure is superposed thereon and thus contrast is enriched. Therefore, with a width corresponding to a multiple of the linewidth of the periodic pattern exposure, an image of a sharp edge can be produced. Thus, in accordance with the exposure method of this embodiment, a circuit pattern having a small linewidth of 0.12 micron can be produced by use of a projection exposure apparatus having an illumination optical system in which the illumination condition such as σ or light quantity ratio, for example, is made changeable.

As regards the light quantity ratio between the periodic pattern exposure and the ordinary exposure, an optimum value depending on the combination of illumination conditions, was determined in accordance with the formulae mentioned hereinbefore.

Illumination Condition 1

Periodic pattern exposure was made with σ=0.3, while ordinary pattern exposure was made with σ=0.3.

The exposure amount distribution provided by periodic pattern exposure shown at the bottom of FIG. 110(A) and the exposure amount distribution (best focus) provided by ordinary projection exposure shown at the bottom of FIG. 110(B) are as follows.

$I_0$=0.80
$I_1$=0.23
a=1.31
b=0.34
c=0.61
d=0.09
k=1.0

This is optimum. Then,
a'=2.11
a"=1.54
b'=1.21
c'=0.89 and
d'=0.32 are obtained. For comparison, the maximum of a' may be standardized with respect to 1, and the following may result:
a'=1.0
a"=0.73
b'=0.57
c'=0.42
d'=0.15
$I_0$=0.38

Illumination Condition 2

Periodic pattern exposure was made with σ=0.3, while ordinary pattern exposure was made with σ=0.6.

$I_0$=0.80
$I_1$=0.23
a=1.25
b=0.44
c=0.53
d=0.13
k=1.5

This is optimum. Then,
a'=2.68
a"=2.11
b'=1.46
c'=1.03 and
d'=0.43 are obtained. For comparison, the maximum of a' may be standardized with respect to 1, and the following may result:
a'=1.0
a"=0.79
b'=0.55
c'=0.38
d'=0.16
$I_0$=0.30

Illumination Condition 3

Periodic pattern exposure was made with σ=0.3, while ordinary pattern exposure was made with σ=0.8.

$I_0$=0.80
$I_1$=0.23
a=1.20
b=0.48
c=0.47
d=0.16
k=2.0

This is optimum. Then,
a'=3.20
a"=2.63
b'=1.76
c'=1.17 and
d'=0.55 are obtained. The maximum of a' may be standardized with respect to 1, and the following may result:
a'=1.0
a"=0.82
b'=0.55
c'=0.37
d'=0.17
$I_0$=0.25

Illumination Condition 4

Periodic pattern exposure was made with σ=0.3, while ordinary pattern exposure was made with σ=0.8 in ring-like illumination. The illuminance distribution at the inside (ring inside) not greater than 0.6 was zero.

$I_0$=0.80
$I_1$=0.23
a=1.10
b=0.47
c=0.36
d=0.19
k=2.5

This is optimum. Then,
a'=3.55
a"=2.98
b'=1.98
c'=1.13 and
d'=0.71 are obtained. The maximum of a' may be standardized with respect to 1, and the following may result:
a'=10
a"=0.84
b'=0.56
c'=0.32
d'=0.20
$I_0$=0.23

In the foregoing examples, the resist threshold is 1.5 with a largest exposure amount of 3. Standardizing it with respect to the largest exposure amount, the resist threshold is 0.5.

Examining the thus standardized exposure amount distribution, it is seen that values a', a" and b' are larger than the standardized resist threshold 0.5 while values c', d', and $I_0$ are smaller than the threshold.

After a development process, a portion with its exposure amount larger than the resist threshold remains. Therefore, only a portion with exposure amounts of a' and b' remain after the developing process. Thus, the gray portion at the bottom of FIG. 110(C) corresponds to the shape remaining after the developing process.

Generally, for exposure of an ordinary exposure pattern, an exposure amount of about twice the exposure amount for exposure of a periodic pattern is proper. There is an optimum exposure amount ratio depending upon the combination of an illumination condition for exposure of an ordinary exposure pattern and an illumination condition for exposure of a periodic pattern. It can be determined in accordance with the formulae described hereinbefore.

Calculating various combinations of illumination conditions on the basis of the above-described formulae, it has been confirmed that, in a case where σ is 0.3 for periodic pattern exposure and where the illumination condition a for ordinary pattern exposure is smaller than 0.8, a good result is obtainable with an exposure amount not greater than twice the exposure amount for periodic pattern exposure.

If σ=0.3 for periodic pattern exposure and the illumination condition for ordinary pattern exposure is based on ring-like illumination, and if the width of the ring is small, the exposure amount for an ordinary pattern may preferably be not smaller than twice the exposure amount for periodic pattern exposure.

If the illumination condition a for periodic pattern exposure is smaller than 0.3, the exposure amount for ordinary pattern exposure may preferably be twice or more of the exposure amount for periodic pattern exposure.

Referring to FIGS. 42–46H, an exposure method according to another embodiment of the present invention will be described.

Figure 42:
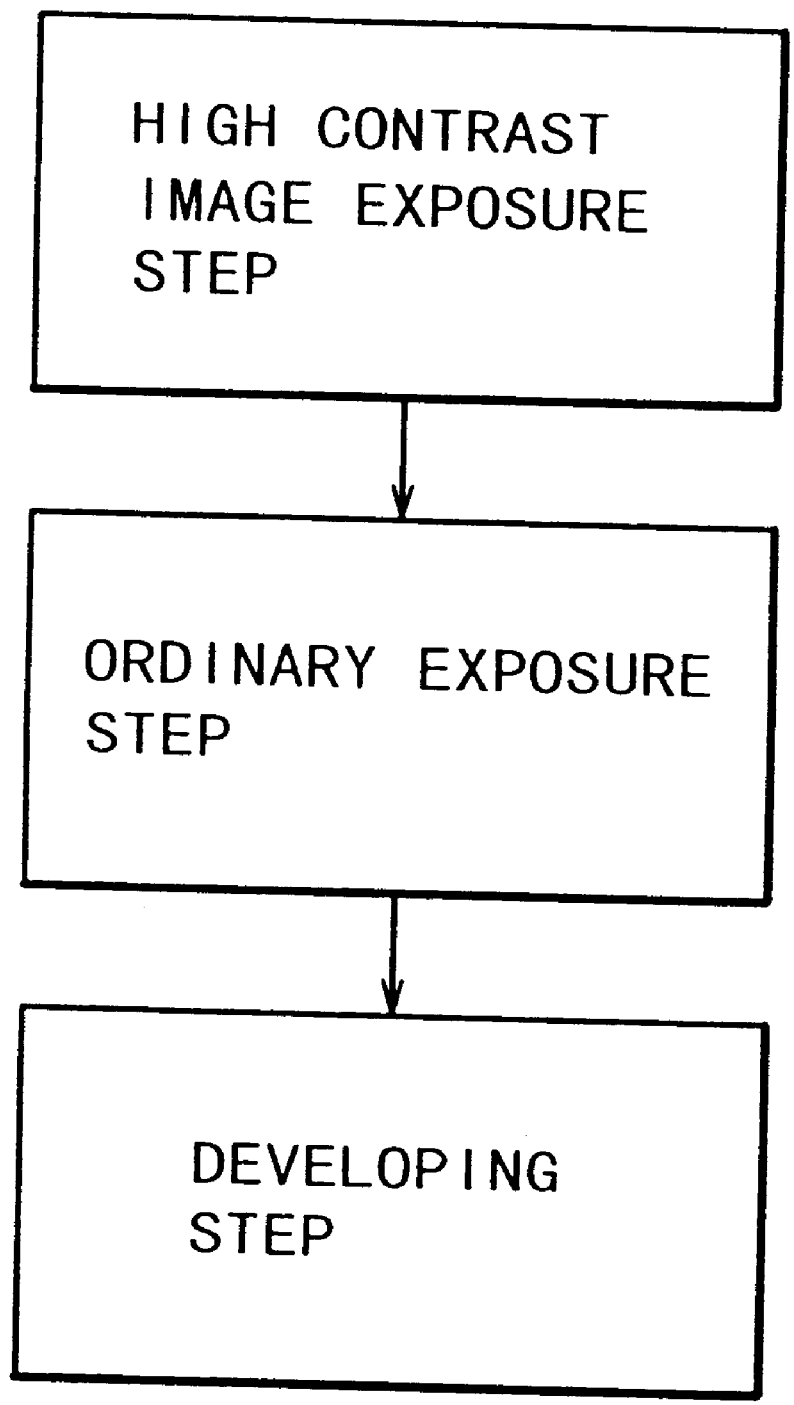
FIG. 42 is a flow chart for explaining an exposure method according to a third embodiment of the present invention.

FIG. 42 is a flow chart for explaining the exposure method according to this embodiment. The flow chart of FIG. 42 illustrates processes and flow of a high-contrast image exposure step (of the exposure method of the present invention), an ordinary or standard exposure step (which may be performed by projection exposure, for example), and a developing step. In FIG. 42, the sequence of the high-contrast image exposure and ordinary exposure may be reversed, or they may be performed simultaneously. If one of these exposure processes includes plural exposures (i.e., multiple exposures more than twice), the high-contrast image exposure and the ordinary exposure may be performed alternately. Between these exposure processes, a step for precise alignment may intervene, although not shown in the drawing.

Figure 43A:
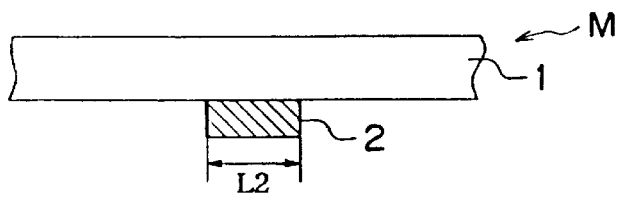
FIGS. 43A–43G are schematic views, respectively, for explaining an exposure pattern to be produced by pattern exposure.

When the procedure shown in FIG. 42 is to be done while performing the high-contrast image exposure by using a phase shift mask having no light blocking portion, first, a resist of a wafer is exposed with a mask M such as in FIG. 43A, by which a high contrast image can be printed. Denoted in this drawing at 1 is a substrate made of quartz, and denoted at 2 is a phase shifter made of quartz.

Figure 43B:
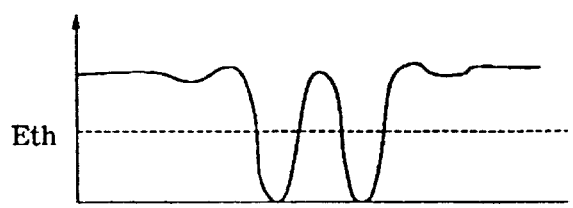

FIG. 43A shows an example of a phase type mask M having a function for applying a phase difference to lights which pass through two adjacent regions, without a light blocking portion. It has a phase shifter 2 of a thickness effective to produce a change of phase by 180 deg. (±30 deg.) in the light passing there, as compared with light passing another region around it (mask pattern). FIG. 43B shows an exposure amount distribution produced by exposing the resist by projecting the pattern 2 of the phase shift mask M of FIG. 43A with the use of a projection exposure apparatus such as shown in FIG. 41, for example. If the phase shifter 2 is superposed on the exposure amount distribution on the wafer of FIG. 43B while taking into account the reduction magnification of the projection optical system, the exposure amount distribution is a distribution having a maximum at the center of the phase shifter 2 and having minimums at positions corresponding to the edges of the phase shifter 2. If the linewidth $L_2$ of the phase shifter is close to the resolution limit as determined by NA of the projection optical system, the exposure amount distribution at the central portion having the maximum value is a distribution close to a sine wave, as shown in FIG. 43B. On the other hand, there are small decreases at the opposite sides of the whole exposure amount distribution, which correspond to the intensity distribution of a subsequent period.

Figure 43C:
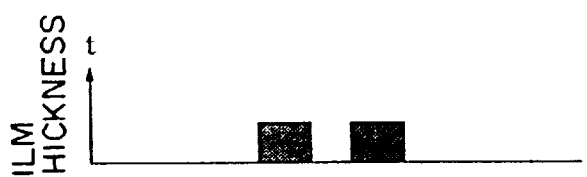
Figure 43D:
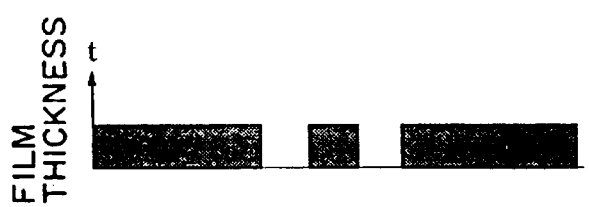

When the resist having been exposed only with the pattern of the phase shifter 2 is developed and if the wafer resist threshold $E_{th}$ is set as shown in FIG. 43B, a resist pattern having two linear protrusions such as shown in FIG. 43C can be produced with the use of a positive type resist, while a resist pattern having two linear grooves such as shown in FIG. 43D can be produced.

Figure 43E:
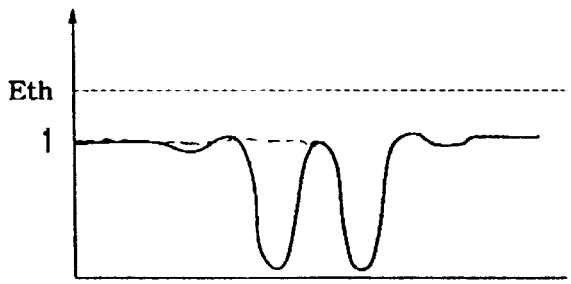

In this embodiment, however, the exposure sensitivity setting (exposure threshold $E_{th}$) shown in FIG. 43B is not used but, as shown in FIG. 43E, the resist exposure threshold $E_{th}$ for the wafer (photosensitive substrate) is set larger than 1 when the center exposure amount in the high contrast image exposure is taken as 1. In this case, the exposure pattern (exposure amount distribution) provided only by exposure with the phase shifter 2 pattern of FIG. 43A has an insufficient exposure amount and, therefore, as a result of development, no zero-thickness portion is produced though there is a small film thickness variation. Consequently, no lithography pattern (surface level difference pattern) is formed on the wafer. This can be regarded as disappearance of the pattern.

Figure 43F:
Figure 43G:

FIG. 43F shows the result of development in a case wherein a positive type resist is used in this example, and FIG. 43G shows the result in a case wherein a negative type resist is used.

An important feature of this embodiment resides in that multiple exposure is performed by which (i) an exposure pattern of high resolution and high contrast which might disappear only through the exposure thereof and (ii) an exposure pattern of an arbitrary shape having plural patterns of different linewidths (including a pattern of low contrast and of a size smaller than the resolution of an ordinary projection exposure apparatus so that it cannot be resolved by exposure thereof), are mixed with each other, and, as a result of this, only a desired region of the resist is exposed with an exposure amount not less than the resist exposure threshold $E_{th}$, such that a desired lithography pattern corresponding to the exposure pattern (mask pattern) of a desired shape described above is finally produced.

Figure 44A:
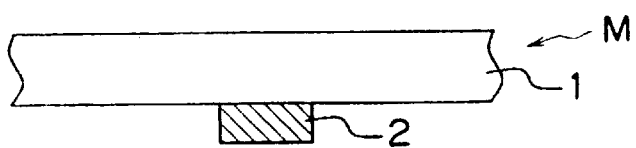
FIGS. 44A–44G are schematic views, respectively, for explaining an example of an exposure pattern (lithography pattern) to be produced by an embodiment of the present invention.
Figure 44B:
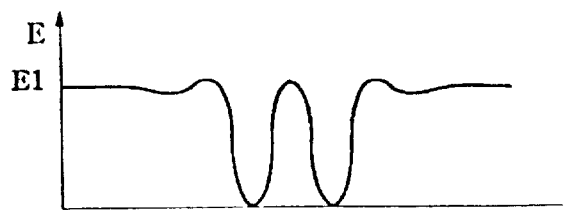

Referring to FIGS. 44A–44G, an exposure method for an isolated line pattern (image) will be described. FIG. 44A shows a phase type mask M having a mask pattern such as shown in FIG. 43A, and FIG. 44B shows an exposure amount distribution on a wafer resist provided by projection exposure using this phase type mask.

Figure 44C:
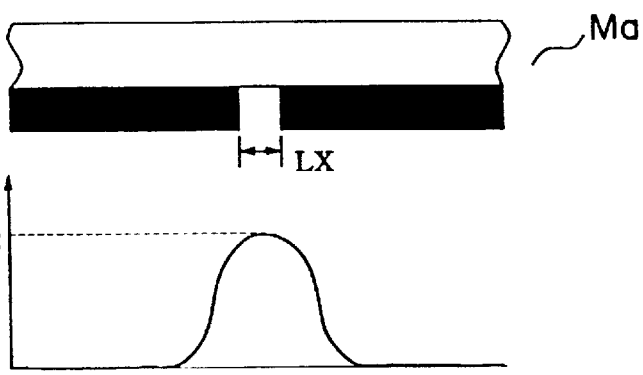
Figure 44D:
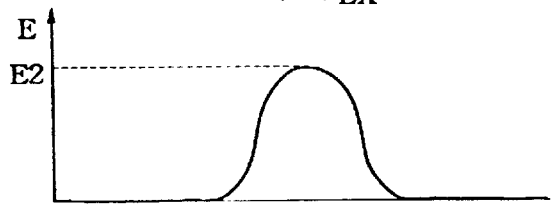

FIG. 44C shows a mask Ma having a circuit pattern to be used for projection exposure corresponding to the ordinary exposure step in FIG. 42. Since this circuit pattern of the mask Ma is a very fine pattern smaller than the resolution of the projection exposure apparatus, the Pattern of linewidth $L_x$ cannot be resolved and, therefore, the produced intensity distribution of the pattern image formed on the wafer is blurred and expanded, as shown in FIG. 44D. The contrast is low. Through exposure with such a low contrast image, the resultant exposure distribution on the resist will be such as shown in FIG. 44D. Even if the exposure threshold $E_{th}$ is lower than the exposure amount $E_2$, a resist pattern with fine protrusions or grooves of a linewidth corresponding to the linewidth $L_x$ of the mask Ma cannot be produced.

In this embodiment, the fine pattern of the mask Ma has a linewidth of about a half of the linewidth (resolution) which can be resolved by the projection exposure apparatus.

The linewidth of the pattern of the mask Ma may be in a range of ½–¼ of the resolution of the projection exposure apparatus.

Figure 44E:
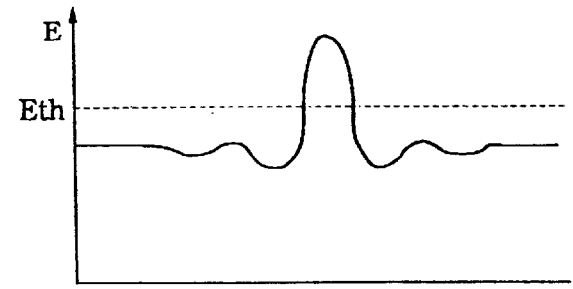

When ordinary exposure for exposing a resist with a fine pattern of the mask Ma of FIG. 44C, is performed after the exposure with a high contrast image using the phase type mask M of FIG. 44A, superposedly to the same region on the same resist by using the same exposure wavelength and by using a separate mask, without intervention of a development process, the total exposure amount distribution on that region of the resist provided by such dual exposure will be such as shown in FIG. 44E where the distributions of FIGS. 44B and 44D are combined. Here, the ratio between the exposure amount $E_1$ by exposure with the high contrast image of the phase shifter 2 of the mask M and the exposure amount $E_2$ by ordinary exposure with the pattern of the mask Ma is set to 1:1. Also, the resist exposure threshold $E_{th}$ is set in the range between the exposure amount $E_1$ (=1) and the sum (=2) of the exposure amount $E_1$ and the exposure amount $E_2$.

Figure 44F:
Figure 44G:
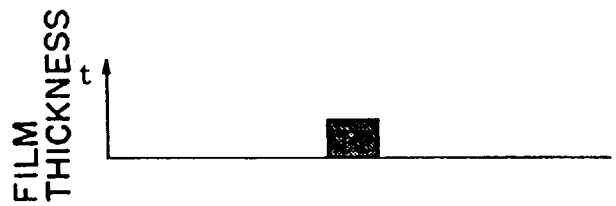

Therefore, a lithography pattern such as shown in FIG. 44F can be produced when a positive type resist is used, while a lithography pattern such as shown in FIG. 44G can be produced when a negative type resist is used. In this procedure, the center of the exposure pattern by the phase type mask M of FIG. 44A and the maximum value position (peak) of the exposure pattern by the pattern of the mask Ma of FIG. 44C should be placed in registration with each other, upon the resist.

The isolated line lithography pattern shown in FIG. 44F or 44G and provided by the dual exposure method of this embodiment, has its resolution determined by the exposure with the phase type mask. Also, there is no unnecessary pattern. Thus, a pattern of a very small linewidth above the resolution of ordinary projection exposure is accomplished by this dual exposure.

Referring to FIGS. 45A–45H, examples of structure of a phase shifter when a high contrast image (high contrast exposure pattern) is to be produced by use of a phase type mask M as well as exposure amount distributions corresponding to these examples and to be provided on a wafer (resist) will be described. In these drawings, areas with hatching denote phase shifters.

Figure 45A:
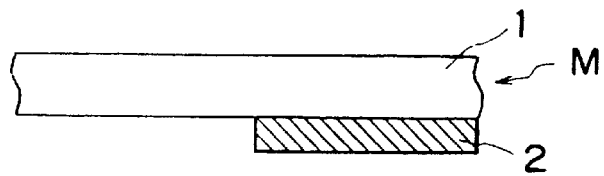
FIGS. 45A–45H are schematic views, respectively, for explaining examples of a phase shift mask for producing various patterns, as well as exposure amount distributions on wafer surfaces.
Figure 45B:
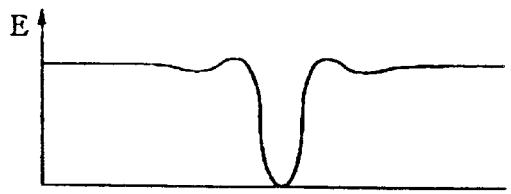
Figure 45C:
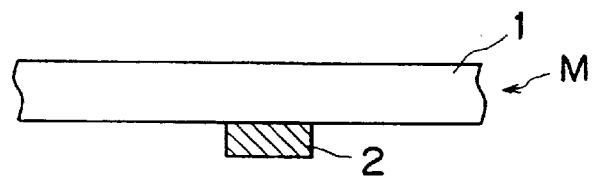
Figure 45D:
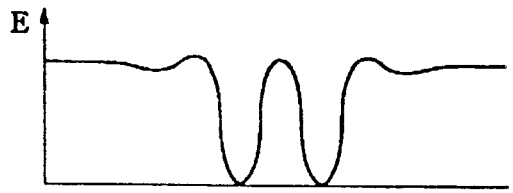
Figure 45E:
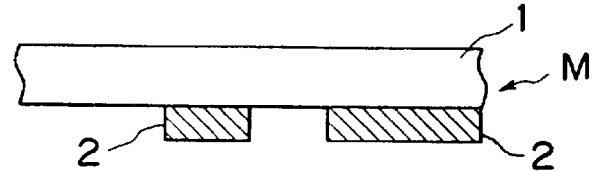
Figure 45F:
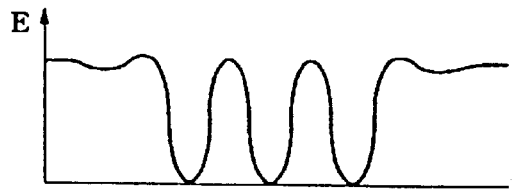
Figure 45G:
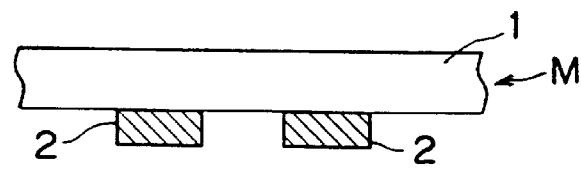
Figure 45H:
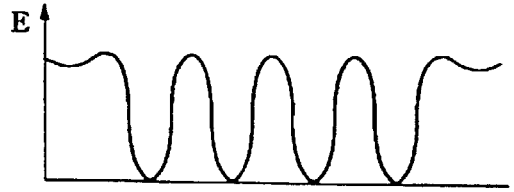

FIG. 45A is a sectional view of a mask with a single edge only. It provides an exposure-amount distribution on a wafer, such as shown in FIG. 45B. This corresponds to a pattern of a single black stripe. FIG. 45C shows the sectional structure of a mask M with an isolated pattern as described above. It functions to provide an exposure distribution on a wafer resist, such as shown in FIG. 45D, which corresponds to a pattern with two black stripes and a single white stripe between them. FIG. 45E is a sectional view of the structure of a mask M having phase shifters effective to produce an exposure amount distribution corresponding to a pattern with three black stripes and two white stripes between them. An exposure amount distribution such as shown in FIG. 45F is produced on the wafer resist. FIG. 45G is a case where the number is enlarged, and it shows the sectional structure of a mask M effective to produce an exposure amount distribution corresponding to a pattern having four black stripes and three white stripes between them. FIG. 45H shows an exposure amount distribution corresponding to this.

In this embodiment, a resist of high γ is used for the wafer and the wafer resist is exposed with a high contrast image of the pattern of a phase shifter of a phase mask M. After this, the same position on the resist having been exposed with the high contrast image is again exposed with a mask pattern having plural patterns of different linewidths (including a line-and-space pattern of a very small linewidth not resolvable) in accordance with an ordinary exposure process and by using the same exposure wavelength. The wafer thus dual exposed is then treated by a developing process, at a predetermined exposure threshold $E_{th}$, whereby a circuit pattern having a small linewidth pattern corresponding to the mask pattern is produced. It is to be noted that the largest exposure amounts in exposure amount distributions of FIGS. 44B and 44D are less than the exposure threshold.

The principle of the dual exposure method in this embodiment described above can be summarized as follows.

(1) An exposure pattern formed in a region by exposure with a high contrast image at a maximum exposure amount not greater than the exposure threshold $E_{th}$, to which region the ordinary exposure is not performed, disappears as a result of development.

(2) As regards the exposure pattern region (exposure region) of ordinary exposure in which an exposure amount not greater than the resist exposure threshold $E_{th}$ is applied to the resist, an exposure pattern having a resolution the same as the exposure pattern provided by the high contrast image exposure, which is determined by the combination of exposure patterns by respective ordinary exposure and high contrast image exposure, can be formed in that region.

(3) As regards the exposure pattern region (exposure region) of ordinary exposure in which an exposure amount not less than the resist exposure threshold $E_{th}$ is applied to a resist, an exposure pattern having the same resolution as the exposure pattern by ordinary exposure which is determined by the exposure patterns by respective ordinary exposure and periodic pattern exposure, can be formed in that region.

Additionally, there is a further advantage in the dual exposure method of this embodiment that with respect to an exposure pattern of highest resolution, a depth of focus remarkably larger than that by ordinary exposure can be provided.

As regards the order of high contrast image exposure and ordinary exposure using a mask pattern image including a low contrast image and a high contrast image, while the former is made first in the foregoing description, the order may be reversed or they may be performed simultaneously.

Next, an embodiment for producing a two-dimensional isolated pattern such as contact holes upon a wafer, will be described. FIGS. 46A–46H illustrate the manner of forming such a two-dimensional isolated pattern.

Figure 46A:
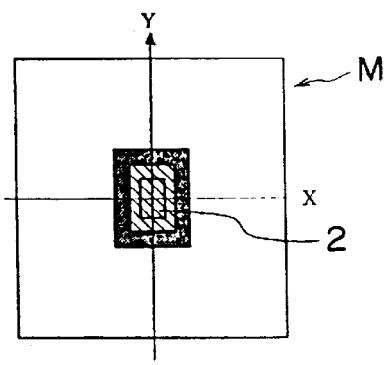
FIGS. 46A–46H are schematic views, respectively, for explaining another example of an exposure pattern (lithography pattern) to be produced by an embodiment of the present invention.

FIG. 46A is a plan view of a phase type mask M for forming a high contrast image as a ground, and a corresponding exposure amount distribution on a wafer. A portion with hatching as denoted at 2 in the drawing corresponds to a phase shifter 2 for shifting the phase of light passing therethrough by 180 deg. as compared with light passing through another region. Around the edge of the phase shifter 2 where the phase shift occurs, the exposure amount decreases. The decreased exposure amount region outside the phase shifter edge is depicted by a gray screen, while the decreased exposure amount region inside the phase shifter edge is illustrated by a square solid line on the mask in superposition.

Figure 46B:
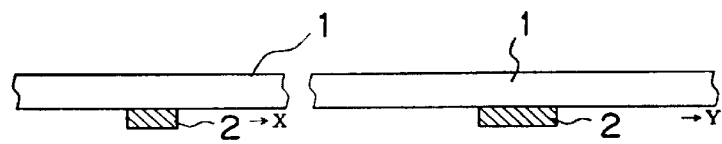
Figure 46C:
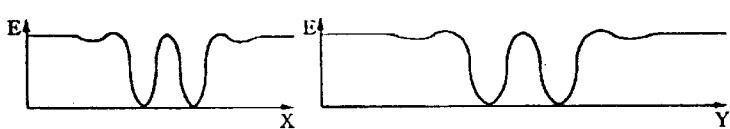

FIGS. 46B–46H show sections of a portion of a phase type mask M effective to produce a high-contrast image and of a portion of a mask Ma having a circuit pattern with plural patterns of different linewidths effective to produce a low contrast image and a high contrast image, as well as corresponding exposure amount distributions, wherein those related to the X-axis direction are shown at the left-hand side while those related to the Y-axis direction are shown at the right-hand side. More specifically, FIG. 46B shows sections of the mask M along the X direction and Y direction, respectively. FIG. 46C shows an exposure amount distribution upon the resist having been exposed with a high contrast image of the mask M, with respect to the X-axis and Y-axis sections, respectively. Since the phase shifter (pattern) 2 of the mask M has a width in the Y-axis direction larger than the width in the X-axis direction thereof, the exposure amount distribution in the Y-axis section has a shape similar to the shape of the exposure amount distribution in the X-axis section if the latter is expanded.

Figure 46D:
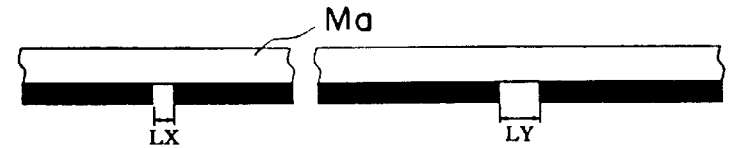
Figure 46E:
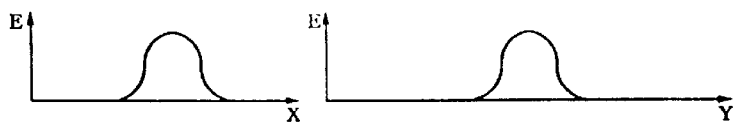
Figure 46F:
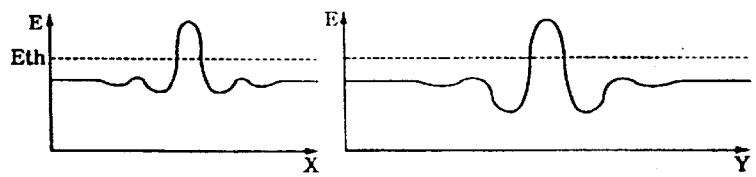
Figure 46G:
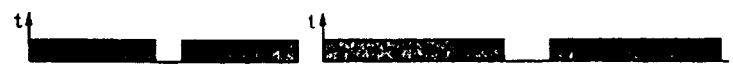
Figure 46H:

FIG. 46D shows sections of the opening of the mask Ma to be projected in ordinary exposure, with respect to the X-axis and Y-axis directions, and this opening has sizes $L_x$ and $L_y$. The sizes $L_x$ and $L_y$ are smaller than the resolution of the exposure apparatus and, therefore, they are not resolved only by ordinary exposure. Thus, the image of this opening of the pattern Ma is blurred, and the exposure amount distribution on the resist is expanded both in the X-axis section and the Y-axis section, as shown in FIG. 46E. The total exposure amount distribution corresponding to accumulation of exposure amount distributions provided by exposures using the two masks M and Ma, corresponds to a combination of a distribution of FIG. 46C and a distribution of FIG. 46E, and it is such as shown in FIG. 46F. If the exposure threshold $E_{th}$ is set as shown in FIG. 46F, a resist pattern after a development process will be such as shown in FIG. 46G, in the case of a positive type resist. The resist pattern after a development process will be such as shown in FIG. 46H, in the case of a negative type resist. In these cases, a very fine isolated pattern not attainable with ordinary projection exposure can be produced. The maximum exposure amounts in exposure amount distributions of FIGS. 46C and 46E are lower than the exposure threshold $E_{th}$.

A further embodiment of the present invention will be described. This embodiment is directed to a gate pattern shown in FIG. 32, for example, as a circuit pattern (lithography pattern) to be produced by exposure.

The gate pattern shown in FIG. 32 will be described here again. The gate pattern of FIG. 32 has a smallest linewidth of 0.1 micron in a lateral direction, i.e., a direction A–A' in the drawing, but it has a smallest linewidth of 0.2 micron or more in the longitudinal direction. In accordance with this embodiment of the present invention, as regards a two dimensional pattern with respect to which high resolution is required only in a one-dimensional direction (direction A–A'), high contrast image exposure may be performed only with respect to the one-dimensional direction in which high resolution is required.

Referring to FIGS. 47A–47G, 48A–48C, and 49, the dual exposure method for printing a high contrast image superposedly upon an opening (white blank in the drawings) of the gate pattern, will be explained.

First, exposure of a resist with a high contrast image for forming an exposure pattern, for applying a large exposure amount to an exposure pattern for a gate pattern, as a ground, will be described.

FIGS. 47A, 47B, and 47C show the exposure process of a high contrast image, and FIGS. 47D, 47E, and 47F show the exposure process of a gate pattern.

FIG. 47A is a plan view of a phase type mask M for forming a high contrast image, and shows an exposure amount distribution to be provided when the resist is exposed therewith. The portions 2 with hatching correspond to a phase shifter for changing the phase of light passing therethrough by 180 deg. as compared with light passing through a different region. About the edge of the phase shifter where the phase shifts, the exposure amount decreases. The decreased exposure amount region outside the phase shifter edge is depicted by a gray screen, while the decreased exposure amount region inside the phase shifter edge is illustrated by a square solid line on the mask in superposition. FIG. 47B is a sectional view of the phase shift mask M, and FIG. 47C shows an exposure amount distribution produced by exposing the resist with the high contrast image of the mask M.

FIG. 47D shows a mask Ma having a gate pattern to be used in ordinary exposure. FIG. 47E is a sectional view, taken along a line A–A' at the center of FIG. 47D. The widths $L_x$ of two openings of the mask Ma in FIG. 47E are not resolved only by a single projection exposure process, and images of these two openings are blurred. Thus, the exposure amount distribution on the resist provided by the projection exposure with the mask Ma is expanded, as shown in FIG. 47F.

Figure 48A:
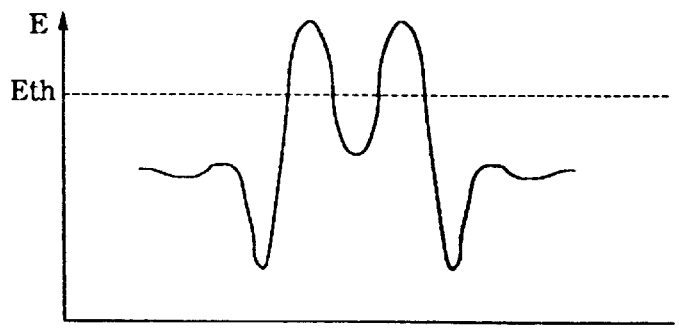
FIGS. 48A–48C are schematic views, respectively, for explaining an exposure amount distribution and a resist image, provided by dual exposure for gate pattern production.
Figure 48B:
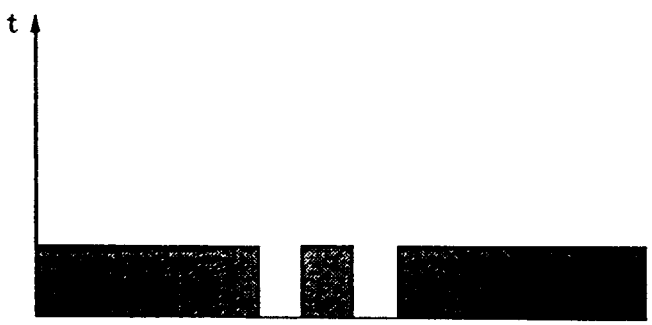

However, the total exposure amount distribution corresponding to combined exposure amounts of mask M and mask Ma, resulting from the dual exposure, will be such as shown in FIG. 48A. If the resist exposure threshold $E_{th}$ is set as shown in FIG. 48A, a resist pattern after a development process when a positive type resist is used will be such as shown in FIG. 48B. The highest exposure amounts in exposure amount distributions of FIGS. 47C and 47E are lower than the exposure threshold $E_{th}$.

Figure 48C:
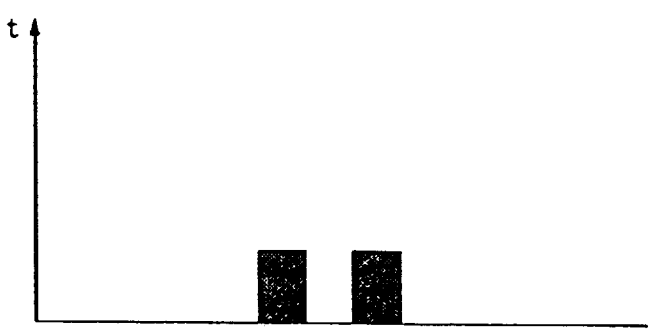

A resist pattern after a development process if a negative type resist is used will be such as shown in FIG. 48C.

While in the foregoing the dual exposure procedure has been described particularly with reference to a smallest linewidth pattern which is at a central portion of a gate pattern, details of dual exposure with reference to the whole of the gate pattern will be described below, in conjunction with FIG. 49.

FIG. 49 at (A) shows an exposure pattern (exposure amount distribution) produced by high contrast image exposure which is based on projection exposure of the mask M. This exposure pattern has a period of 0.2 micron, and it corresponds to a line-and-space (L&S) pattern of 0.1 micron linewidth. Numerical values at the bottom of FIG. 49 denote exposure amounts on a resist.

In this embodiment, projection exposure of a gate pattern (such as depicted by a white blank at (B) of FIG. 49) is accomplished by ordinary exposure (for example, an exposure process to be made by the exposure apparatus of FIG. 41 with large σ partial coherent illumination to the mask), which is to be performed after the high contrast image exposure described above.

FIG. 49 at (B) illustrates the relative positional relation between an exposure pattern defined by the gate pattern of the mask Ma and an exposure pattern defined by the mask M, as well as the exposure amount provided upon the mask in the gate pattern projection exposure. At the bottom of FIG. 49(B), there is illustrated exposure amounts on a wafer resist provided by the gate pattern projection exposure, the exposure amounts being mapped with respect to lateral and longitudinal resolution of 0.1 micron pitch.

The smallest linewidth portion (pattern image) of the image provided by the gate pattern of the mask Ma is not resolved and is expanded, so that the contrast is low. Thus, exposure amount levels at points in this portion are lowered. Here, the central portion of the pattern image and opposite side portions outside it are denoted by a and b, and the portion between pattern images where blurred images from opposite sides overlap is denoted by c. Then, exposure amounts at these portions have relations that $1<a<2$, $0<b<1$, and $0<c<1$, that is, it is large at the center and low at the sides. The ratio of exposure amounts to be applied to the resist through the exposures using the masks M and Ma is 1:2 ("exposure by high contrast image of mask M" vs. "exposure by gate pattern of mask Ma").

Next, the manner of forming a fine gate pattern shown in FIG. 32 by dual exposure based on high contrast image exposure and ordinary exposure of a gate pattern having a pattern not resolvable due to low contrast, will be described. In this embodiment, there is no developing process intervening between the high contrast image exposure and the ordinary exposure using a gate pattern image. Also, these exposures use the same exposure wavelength. Thus, in the region in which exposure patterns of these exposures overlap, the exposure amounts are accumulated, and the cumulative exposure amount defines a separate exposure pattern (exposure amount distribution).

FIG. 49 at (C) illustrates an exposure pattern (exposure amount distribution) resulting from accumulation of the exposure pattern at FIG. 49(A) and the exposure pattern at FIG. 49(B). The exposure amount at regions denoted by e is equal to 1+a which is larger than 2 and smaller than 3. Illustrated by gray shading at the bottom of FIG. 49(C) is a lithography pattern produced as a result of a developing process made to this exposure pattern. In this embodiment, a resist of exposure threshold $E_{th}$ larger than 1 and smaller than 2 is used for the wafer. Therefore, only the region exposed with exposure amounts greater than 1 appears as a pattern, after the development process.

The size and shape of the pattern depicted by gray shading in FIG. 49 at (C) corresponds to those of the gate pattern of FIG. 32. Thus, in accordance with the exposure method of this embodiment of the present invention, a circuit pattern having a very small linewidth of 0.1 micron, for example, can be produced by use of a projection exposure apparatus.

Another embodiment will be described below with reference to FIGS. 50A–50F, 51A–51C, and 52. In this embodiment, a high contrast image as a ground is projected on a resist so that an exposure pattern for applying a small exposure amount to a solid exposure pattern of a gate pattern is formed.

FIGS. 50A, 50B, and 50C show the exposure process of a high contrast image, and FIGS. 50D, 50E, and 50F show the exposure process of a gate pattern.

FIG. 50A is a plan view of a phase type mask M for forming a high contrast image, and shows an exposure amount distribution to be provided when the resist is exposed therewith. The portions 2 with hatching correspond to a phase shifter for changing the phase of light passing therethrough by 180 deg. as compared with light passing through a different region. About the edge of the phase shifter where the phase shifts, the exposure amount decreases. The decreased exposure amount region outside the phase shifter edge is depicted by a gray screen, while the decreased exposure amount region inside the phase shifter edge is illustrated by a square solid line on the mask in superposition. FIG. 50B is a sectional view of the phase shift mask M, and FIG. 50C shows an exposure amount distribution produced by exposing the resist with the high contrast image of the mask M.

FIG. 50D shows a mask Ma having a gate pattern to be used in ordinary exposure. FIG. 50E is a sectional view, taken along a line A–A' at the center of FIG. 50D. The pattern of two very narrow lines at the center of the mask Ma is not resolved only by a single projection exposure process, and its image is blurred and the contrast is lowered. Thus, the exposure amount distribution on the resist provided by this image is expanded, as shown in FIG. 50F.

Figure 51A:
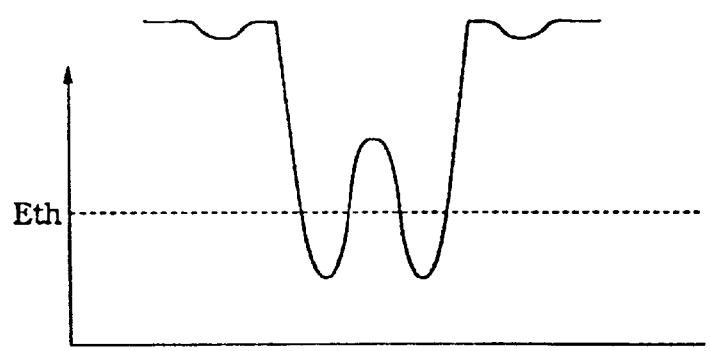
FIGS. 51A–51C are schematic views, respectively, for explaining an exposure amount distribution and a resist pattern, to be provided by dual exposure.
Figure 51B:
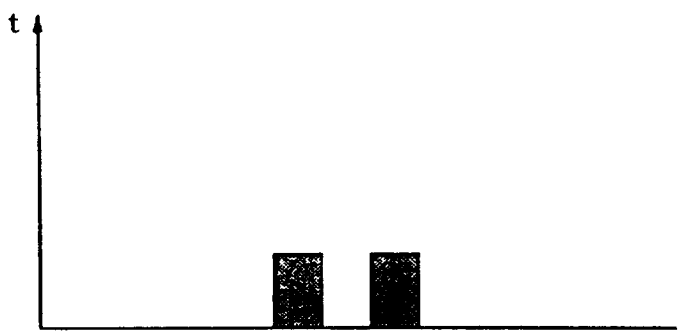
Figure 51C:
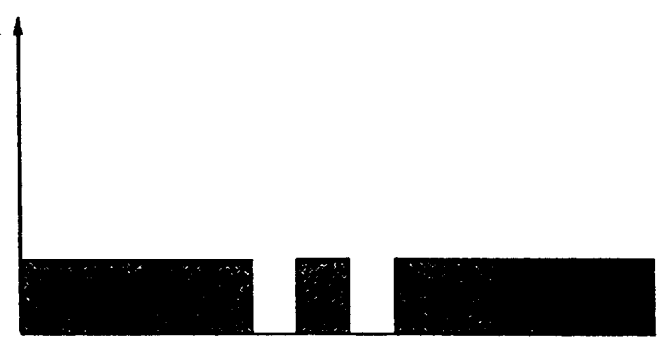

The total exposure amount distribution on the resist provided by dual exposure based on high contrast image exposure through projection of the phase shifter of the mask M and ordinary exposure through projection of the gate pattern image of the mask Ma, will be such as shown in FIG. 51A. If the resist exposure threshold $E_{th}$ is set as shown in FIG. 51A, a resist pattern after a development process when a positive type resist is used will be such as shown in FIG. 51B. A resist pattern after a development process if a negative type resist is used will be such as shown in FIG. 51C.

While in the foregoing the exposure procedure has been described particularly with reference to the central portion of a gate pattern, details of a dual exposure procedure with reference to the whole of the gate pattern will be described below, in conjunction with FIG. 52.

In this embodiment, the high contrast image or the exposure pattern provided thereby has a period of 0.2 micron, and this image or pattern corresponds to a line-and-space (L&S) pattern of 0.1 micron linewidth. Numerical values at the bottom of FIG. 52 denote exposure amounts on a resist.

Figure 52:
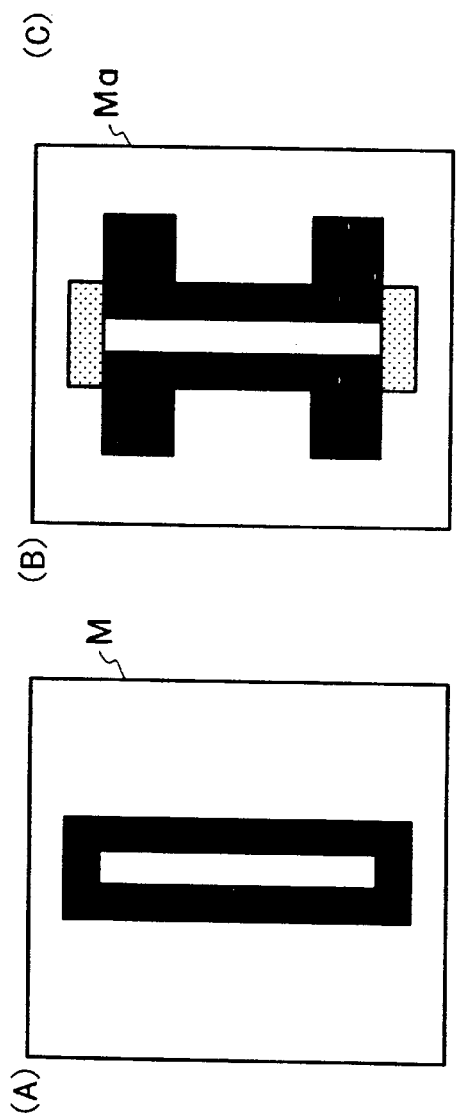
FIG. 52 is a schematic view for two-dimensionally explaining the pattern forming procedure.

In this embodiment, projection exposure of a gate pattern image of the mask Ma (e.g., by projection exposure of the mask Ma through the apparatus of FIG. 41 and through large σ partial coherent illumination) is performed after (or simultaneously with) the projection exposure of the high contrast image of the mask M (e.g., by projection exposure of the mask M through the apparatus of FIG. 41 and through partial coherent illumination), by which exposure of the gate pattern such as shown in FIG. 52 at (B) is accomplished.

FIG. 52 at (B) illustrates the relative positional relation between the high contrast image pattern defined by the mask M and the gate pattern image defined by the mask Ma. At the bottom of FIG. 52(B), there is shown the exposure amounts on a wafer resist provided by a single projection exposure of the gate pattern image of the mask Ma, the exposure amounts being mapped with respect to lateral and longitudinal resolution of 0.1 micron pitch.

The smallest linewidth portion of an exposure pattern provided by projection exposure of this gate pattern is not resolved and is expanded. Thus, the exposure amount levels at points in this portion are lowered, and the contrast decreases. As regards exposure amounts in respective regions of this exposure pattern, roughly stating, it is small at the central portion of the pattern while it is large at the opposite side portions. Here, the exposure amounts at the central portion and the side portions are denoted by f and g, respectively, and the exposure amount at the center where blurred images coming from the opposite sides overlap is denoted by h, then there are relations $0<f<1$, $1<g<2$, and $1<h<2$. Thus, the exposure pattern provided by a gate pattern image having a linewidth not resolvable produces a multiple value exposure amount distribution having different exposure amounts in different regions.

The ratio of exposure amounts upon the wafer resist applied through the exposures using the masks M and Ma is 1:2 ("exposure by high contrast image of mask M" vs. "exposure by gate pattern image of mask Ma").

Next, the manner of forming a fine circuit pattern shown in FIG. 34 by dual exposure based on high contrast image exposure and projection exposure of a gate pattern image as described above, will be explained in detail. In this embodiment, there is no developing process intervening between the high contrast image exposure and the gate pattern image exposure. Thus, in the region in which exposure patterns of these exposure processes overlap, the exposure amounts are accumulated, and the cumulative exposure amount defines a separate exposure pattern (exposure amount distribution).

FIG. 52 at (C) illustrates an exposure pattern (exposure amount distribution) resulting from accumulation of the exposure pattern at FIG. 52(A) and the exposure pattern at FIG. 52(B). The exposure amounts at regions denoted by i and j are equal to 1+1 and 1+j, respectively, which are larger than 2 and smaller than 3.

Illustrated by gray shading at the bottom of FIG. 52(C) is a lithography pattern produced as a result of a developing process made to this exposure pattern. In this embodiment, a resist of an exposure threshold $E_{th}$ larger than 1 and smaller than 2 is used for the wafer. Therefore, only the region exposed with exposure amounts smaller than 2 appears as a pattern, after the development process.

The size and shape of the pattern depicted by gray shading in FIG. 52 at (C) corresponds to those of the gate pattern of FIG. 34. Thus, in accordance with the exposure method of this embodiment of the present invention, a circuit pattern having a very small linewidth of 0.1 micron, for example, can be produced by use of a projection exposure apparatus.

Figure 53B:
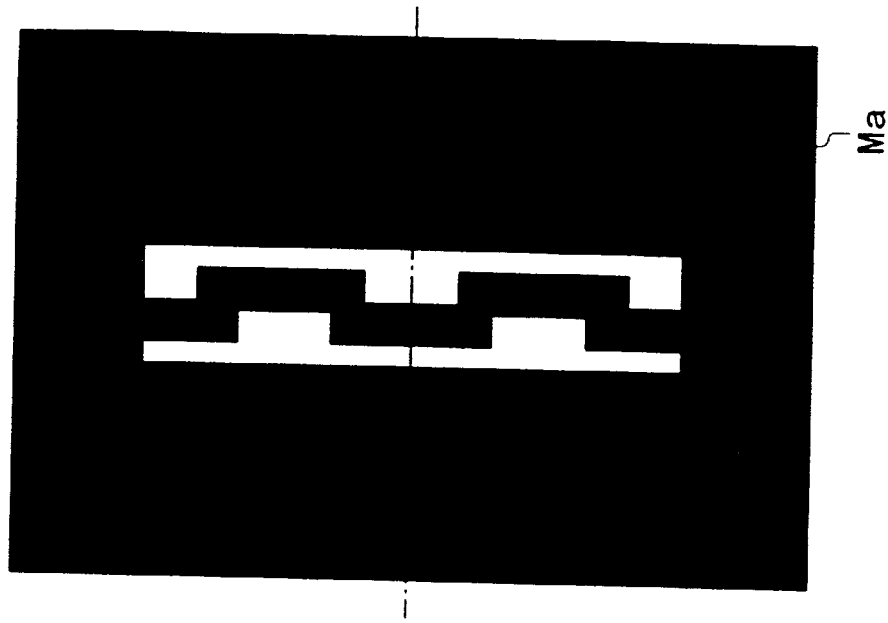
FIGS. 53A and 53B are schematic views, respectively, for explaining another example of a mask pattern for producing a circuit pattern.

Another embodiment of the present invention applied to a circuit pattern of a different shape, will now be described. FIG. 53B shows the shape of such circuit pattern to be processed by this embodiment, and it comprises a pair of patterns having a wide linewidth portion of 0.2 micron, which is twice in width of its minimum linewidth. These paired patterns are disposed with a gap of 0.1 micron.

This embodiment will be described with reference to FIGS. 53A, 53B, 54A–54F, and 55A–55E and with respect to a case wherein, by an exposure pattern to be defined with a high contrast image, a large exposure amount is applied to an exposure pattern defined by a circuit pattern image having a portion for forming a low contrast image.

Figure 53A:
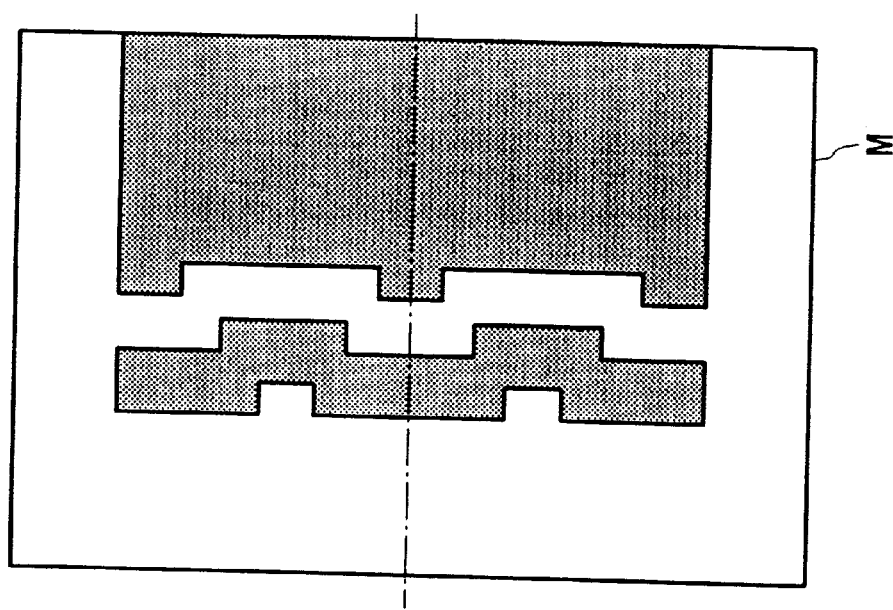

FIG. 53A shows the pattern shape as a phase type mask M for forming a high contrast image, to be used for dual exposure in this embodiment, is viewed from above. FIG. 53B illustrates the pattern shape as a mask pattern Ma for forming a circuit pattern image (including a low contrast image) to be used for dual exposure in this embodiment, is viewed from above.

Figure 54A:
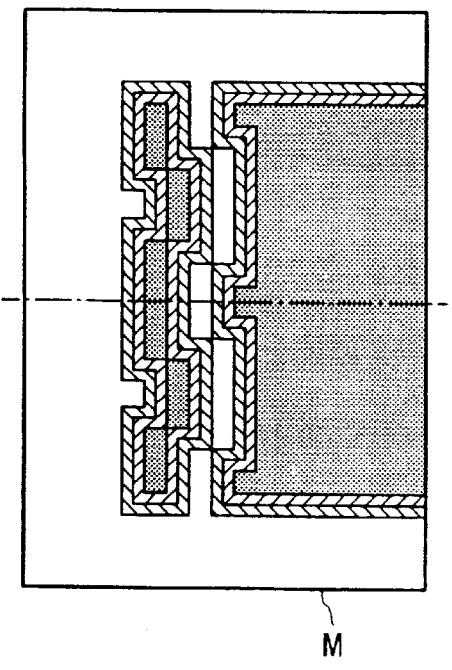
FIGS. 54A–54F are schematic views, respectively, for explaining an exposure amount distribution in relation to a circuit pattern.
Figure 54D:
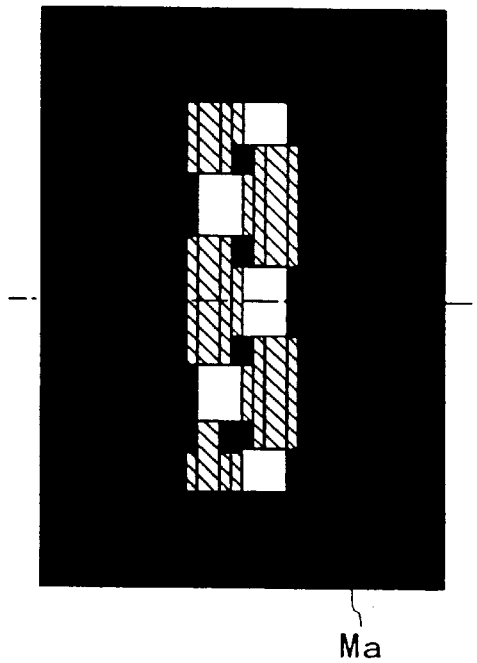
Figure 54B:
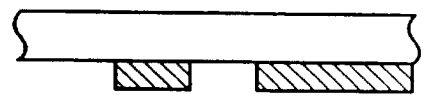
Figure 54E:
Figure 54C:
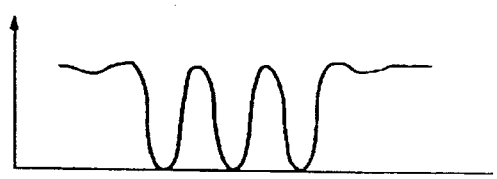
Figure 54F:
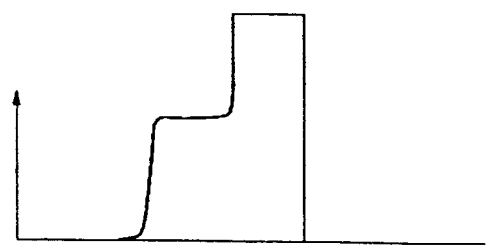

FIGS. 54A–54F illustrate the processes of projection exposure using the masks M and Ma. More specifically, FIGS. 54A, 54B, and 54C show the exposure process for forming a high contrast image by using the mask M, and FIGS. 54D, 54E, and 54F show the exposure process with a pattern image comprising a mixture of high and low contrast images.

FIG. 54A is a plan view of a phase type mask M for forming a high contrast image. The portions with hatching have a function changing the phase of light passing therethrough by 180 deg. as compared with light passing through a different region FIG. 54B is a sectional view of the mask M. FIG. 54C shows the exposure amount distribution on a resist as the pattern image of the mask M is projected thereon.

FIG. 54D is a plan view of a mask Ma for forming a circuit pattern image, and it schematically illustrates an exposure amount distribution, with blur in projection exposure being taken into account. The white blank in FIG. 54D corresponds to a large exposure amount region. The hatched area corresponds to a region being expanded by blurring and having a lowered light quantity. FIG. 54E is a sectional view of the center of the mask Ma. This circuit pattern image is not resolved only by a single projection exposure of the mask Ma, and its image is blurred and the contrast is lowered. Thus, the exposure amount distribution on the resist provided by this image is expanded, as shown in FIG. 54F.

Figure 55A:
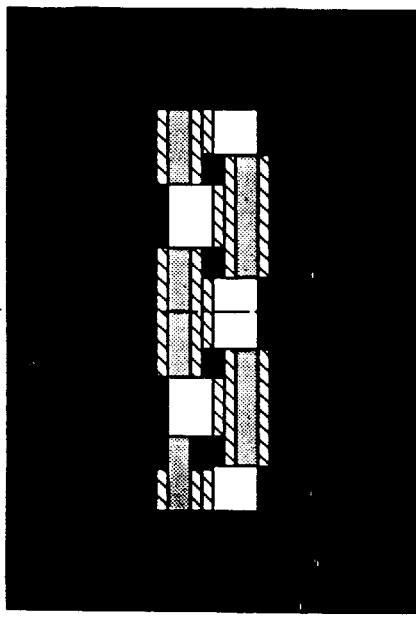
FIGS. 55A–55E are schematic views, respectively, for explaining the circuit pattern forming procedure.

The total exposure amount distribution on the resist provided by dual exposure based on projection exposure of the high contrast image using the mask M and projection exposure of the circuit pattern image using the mask Ma, may be schematically shown as in FIG. 55A. FIG. 55B shows the exposure amount distribution at the central portion. If the resist exposure threshold $E_{th}$ is set as shown in FIG. 55B, a resist pattern after a development process when a positive type resist is used will be such as shown in FIG. 55C. A resist pattern after a development process if a negative type resist is used will be such as shown in FIG. 55D.

Figure 55E:
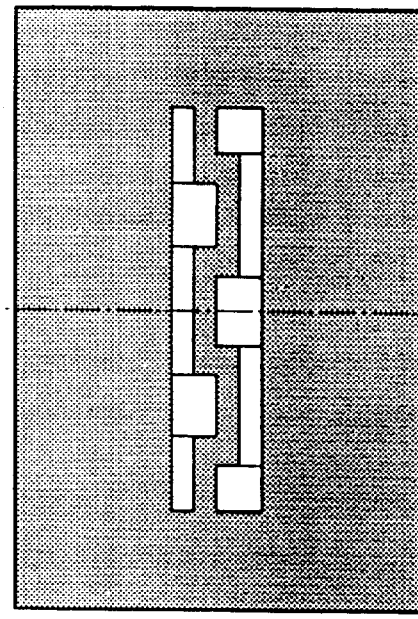
Figure 55B:
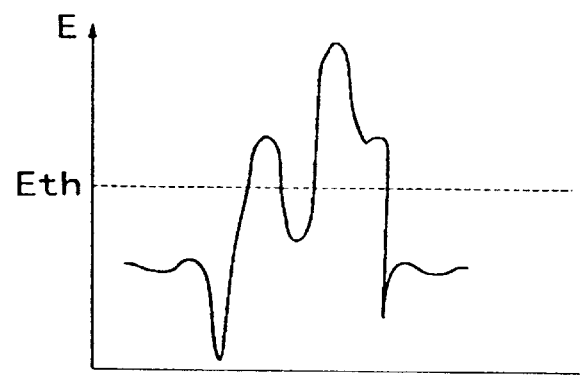
Figure 55C:
Figure 55D:
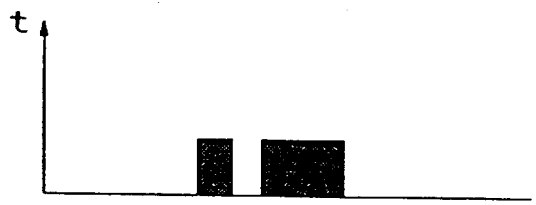

FIG. 55E is a plan view, showing the resultant resist pattern. Thus, a desired circuit pattern can be produced. The dual exposure procedure described above can be performed by using an exposure apparatus such as shown in FIG. 40 or 41, for example. On that occasion, the same exposure wavelength may be used in respective exposures. The same exposure wavelength may be used similarly in embodiments to be described below.

Next, the light quantity ratio in the dual exposure procedure, between the exposure with a high contrast image (hereinafter, to be represented by a periodic pattern) and the exposure with a circuit pattern image, as well as the contrast of an exposure pattern to be produced by the dual exposure, will be described in detail.

Figure 56A:
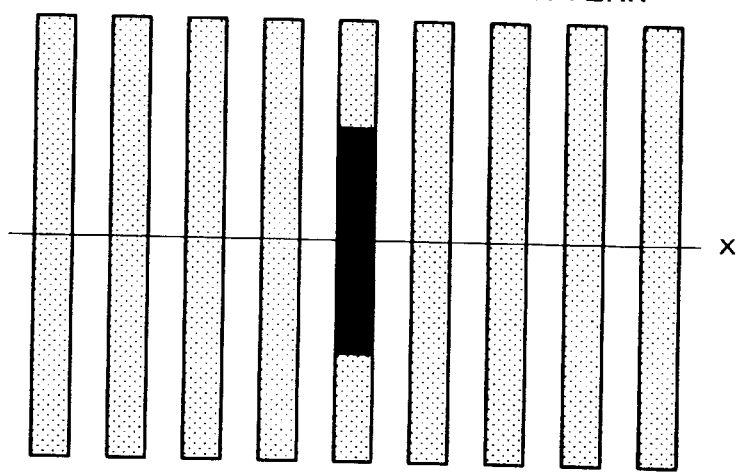
FIGS. 56A–56C are schematic views, respectively, for explaining dual exposure with a high-contrast periodic pattern and a low-contrast pattern with a single to three bars.
Figure 56B:
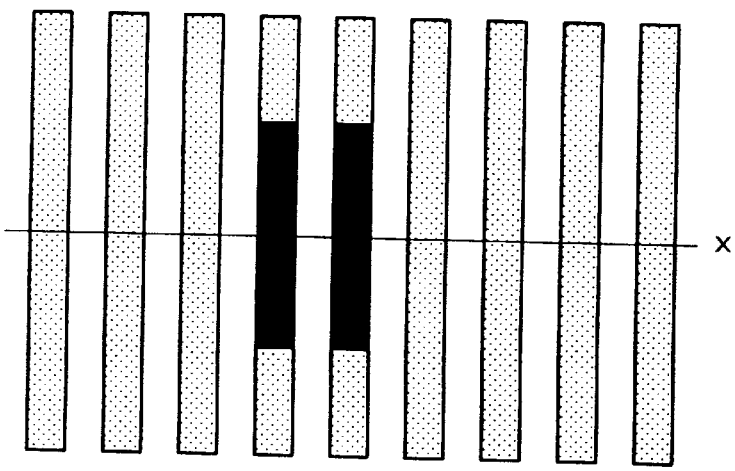
Figure 56C:
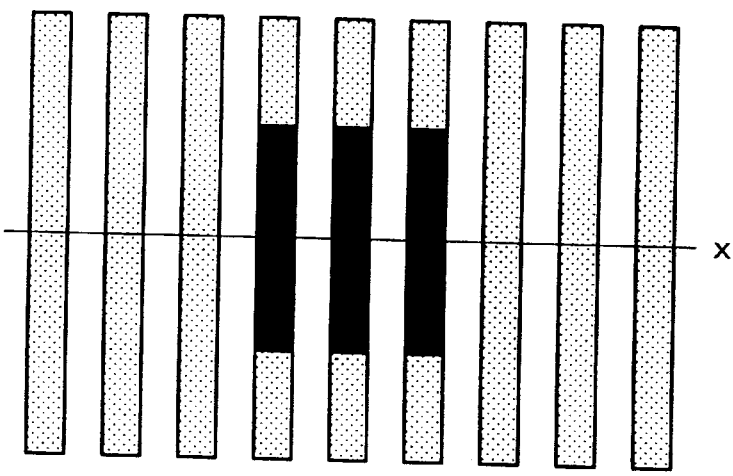

FIGS. 56A–56C illustrate relative positional relation in the dual exposure process, in which the exposure pattern comprising a periodic pattern, to be produced by double-beam interference exposure is depicted by gray shading, while the exposure pattern comprising a circuit pattern, to be produced by a single projection exposure is depicted by solid or black painting. The gray exposure pattern corresponds to a high contrast portion as defined by exposure with a high contrast image, while the black painted exposure pattern corresponds to a low contrast portion as defined by a low contrast image (circuit pattern image). In this case, the circuit pattern comprises a bar pattern. FIG. 56A shows a case of a pattern of a single bar, FIG. 56B shows a case of a pattern of two bars, and FIG. 56C shows a case of a pattern having three bars.

FIG. 57 at (A) shows an exposure amount distribution in an X-axis section, to be applied to a resist with an image of the three-bar pattern of FIG. 56C. The contrast A of the exposure amount distribution (image) of FIG. 57(A) is expressed by:

$$A=(b-c)/(b+c) \qquad (12)$$

If b<c, the contrast becomes negative (see FIG. 68). If b=c, the contrast is zero (see FIG. 67).

The three-bar pattern shown in FIG. 57(A) is a pattern of low contrast and not resolvable, similarly to what has been fully described hereinbefore. By performing a dual exposure procedure in combination with the periodic pattern, forming a high contrast image exposure amount distribution (image) shown in FIG. 57 at (B), an exposure amount distribution of FIG. 57 at (C) providing a pattern of high contrast and being resolvable, can be produced.

If the exposure amount ratio between the exposure process using a three-bar pattern (circuit pattern) and the exposure process using a periodic pattern (high contrast image) is 1:k, then there are relations below:

$$b' = k \times b + I_0$$

$$c' = k \times c + I_1$$

The contrast A' of an exposure amount distribution provided by dual exposure in this case, will be given by:

$$A' = (b' - c')/(b' + c') \quad (13)$$
$$= [(kxb + I_0) - (kxc + I_1)] / [(kxb + I_0) + (kxc + I_1)]$$
$$= [k(b - c) + (I_0 - I_1)] / [k(b + c) + (I_0 + I_1)]$$

Here, from the level of contrast resolvable by the resist (i.e., contrast threshold), the light quantity ratio k can be determined.

If, for example, the contrast threshold of the resist used is $I_c$, the light quantity ratio k may be determined to satisfy the following relation:

$$[k(b-c)+(I_0-I_1)]/[k(b+c)+(I_0+I_1)] > I_c$$

In use of the same mask pattern through the same projection exposure apparatus, values b and c are determined by the illumination condition for the mask illumination, and values $I_0$ and $I_1$ are determined by the periodic pattern forming method.

The contrast A' of the exposure amount distribution after the dual exposure has been changed by A'–A, from the contrast A provided by a single exposure of an ordinary circuit pattern. The amount of this change is given from equations (12) and (13), as follows.

$$A'-A = [k(b-c)+(I_0-I_1)]/[k(b+c)+(I_0+I_1)]$$
$$-(b-c)/(b+c)$$
$$= \{(I_0+I_1)/[k(b+C)+(I_0+I_1)]\}$$
$$\times [(I_0-I_1)/(I_0+I_1)-(b-c)/(b+c)] \quad (14)$$

Here, there is a relation:

$$(I_0-I_1)/[k(b+c)+(I_0+I_1)] > 0$$

Also, $$(I_0-I_1)/(I_0+I_1)$$

in equation (14) is the contrast of a periodic pattern image in the double-beam interference exposure or of the exposure amount distribution provided thereby. Similarly, $$(b-c)/(b+c)$$

in equation (14) is the contrast of the circuit pattern image or of the exposure amount distribution provided thereby. Within the very small linewidth region less than the resolution limit, the contrast by the double-beam interference exposure is higher than that of the circuit pattern image exposure. Therefore, $$(I_0-I_1)/(I_0+I_1)-(b-c)/(b+c) > 0.$$

Namely, A'–A>0, which clearly means that the contrast of an exposure amount distribution increases as a result of dual exposure.

Here, the light quantity ratio k in the case of dual exposure shown in FIG. 56C will be considered.

A highest performance resist material among currently available resist materials is resolvable at 40% contrast (namely, the contrast threshold is 40%). The condition for k with which 40% contrast is attainable may be determined on the basis of A', as follows.

Usually, a mask pattern has a transmission factor of 1 at its pattern portion, and a transmission factor of 0 at its background (although there is a mask pattern with a transmission factor 0 at its pattern portion and transmission factor 2 at its background). The transmission factor at the background may not always be zero, and a halftone type in which the phase is inverted by 180 deg. to provide a few percent transmission factor (it may be not be greater than 10% in many cases) may be used. Such a halftone mask will be described later.

A projection optical system had a wafer side numerical aperture NA of 0.60. For exposure wavelength, laser light of a KrF excimer laser ($\lambda$=248 nm) was used. A three-bar pattern on the mask had a width of 0.12 micron the same as that of a periodic pattern. A periodic pattern image such as shown in FIG. 56C was formed by illuminating a Levenson-type phase shift mask under an illumination condition of $\sigma$=0.2 and by projecting the same. The periodic pattern image produced an exposure amount distribution on the resist, as follows (see FIG. 57(B)):

$I_0 = 095$ $I_1 = 0.06$

A three-bar pattern image such as shown in FIG. 56C was formed on the basis of a ring-like illumination method under the illumination condition that it provides illuminance with the range of $\sigma$=0.8 to $\sigma$=0.53 but provides no illuminance with $\sigma$ less than 0.53. The three-bar pattern image produced an exposure amount distribution on the resist, as follows (see FIG. 57(A)):

b=0.57 c=0.45

Since the contrast A defined only by the projection exposure of the three-bar pattern is 12%, as follows, $$A=(b-c)/(b+c)=0.12$$

it is not resolvable.

In order to provide a contrast A" of 40% or more after dual exposure based on the periodic pattern image and the three-bar pattern image, the following relation should be satisfied:

$$A' = [k(b-c)+(I_0-I_1)]/[k(b+c)+(I_0+I_1)] \geq 0.4$$

By substituting values $I_0$, $I_1$, b, and c described above into this equation, k can be determined as follows.

k=1.67.

It is seen from the above that, in order to provide contrast A' of 40% or more after the dual exposure, the light quantity ratio k of 1.67 should be set Using k=1.67, the contrast of an exposure amount distribution in the cases of pattern images of FIGS. 56A and 56B may be calculated as follows. For dual exposure of a single-bar pattern in FIG. 56A, the lowest intensity level c may be one which corresponds to the intensity level at a position spaced from the X position of the highest intensity level b by a distance corresponding to the linewidth.

$$b = 0.5 \quad I_0 = 0.95$$

$$c = 0.23 \quad I_1 = 0.06$$

$$A = 0.37$$

$$A' = 0.60$$

It is seen from the above that, as a result of dual exposure, the contrast was increased from 37% contrast by the projection exposure of a single-bar pattern to 60% contrast.

The results of calculation in the case of a double-bar pattern in FIG. 56B are as follows.

$$b = 0.52 \quad I_0 = 0.95$$

$$c = 0.43 \quad I_1 = 0.06$$

$$A = 0.09$$

$$A' = 0.41$$

It is seen from the above that, as a result of dual exposure, the contrast was increased from 9% contrast by the projection exposure of a single-bar pattern to 41% contrast.

As described above, in regard to isolated and periodic patterns having one, two and three bars, for example, as a result of a dual exposure procedure, in every case, the contrast increases to 40% or more so that the pattern can be resolved with a 40% resist.

Figure 58:
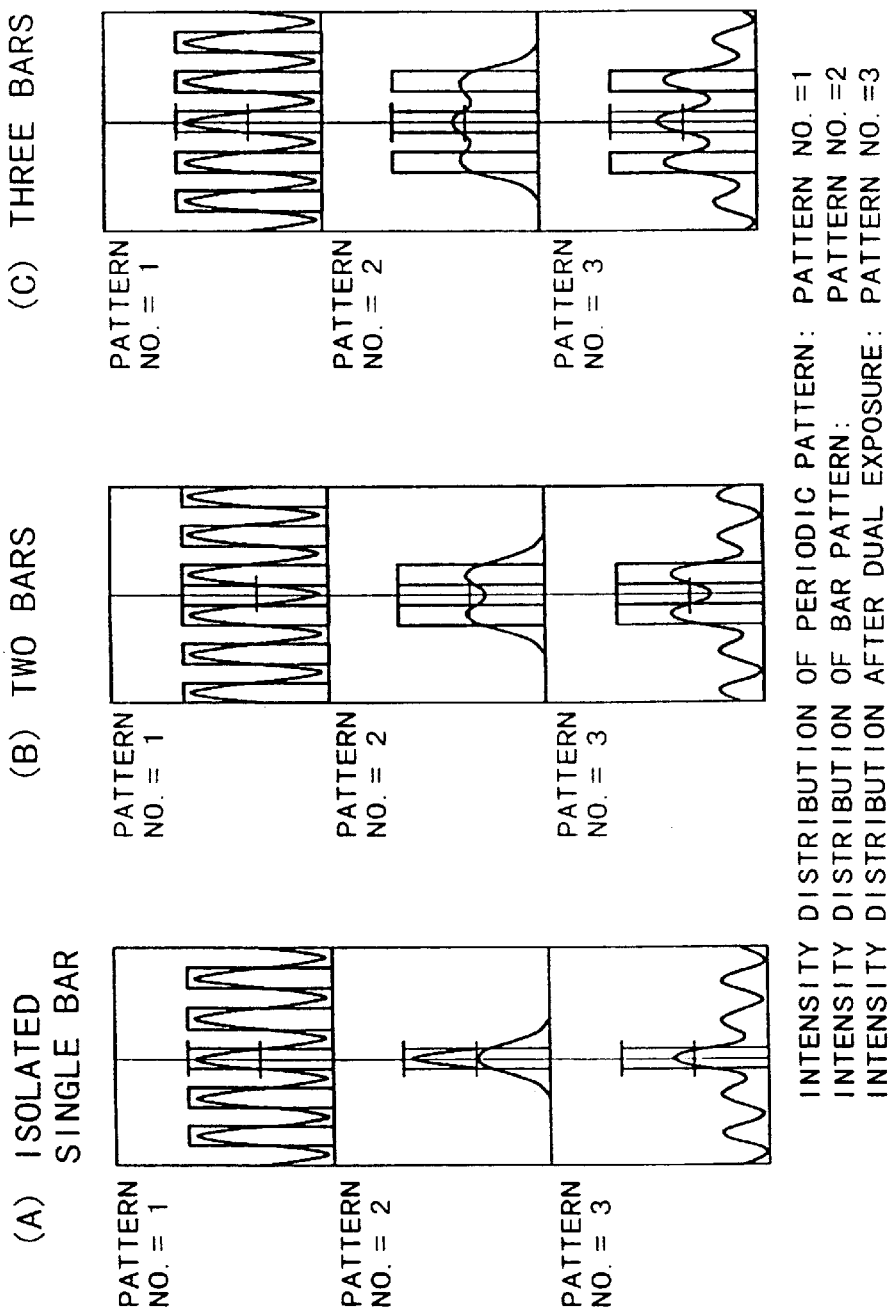
FIG. 58 is a schematic view for explaining intensity distributions to be produced by dual exposure using patterns (images) with single to three bars and a periodic pattern (image).

As described hereinbefore, in accordance with dual exposure based on projection exposure of an ordinary circuit pattern image and projection exposure of a periodic pattern image, providing a high contrast image, the contrast of an exposure amount distribution of a very fine pattern image less than the resolution limit (i.e., usually unresolvable) can be improved significantly. By setting the light quantity ratio k appropriately by suitably setting the illumination condition for the circuit pattern and the illumination condition for the periodic pattern, an exposure amount distribution (the one after dual exposure) with which the contrast level that can be resolved by a resist used can be accomplished. FIG. 58 shows the results.

The projection optical system had an NA=0.60, and a KrF excimer laser was used as a light source. The exposure wavelength was λ=248 nm.

At (A), (B) and (C) of FIG. 58, the topmost portion shows an intensity distribution (exposure amount distribution) of a periodic pattern image, the middle portion shows an intensity distribution (exposure amount distribution) of a bar pattern image, and the lowermost portion shows an intensity distribution (exposure amount distribution) of a combined image after the dual exposure. The bar patterns used comprise a single-bar linear pattern, a double-bar linear pattern and a triple-bar linear pattern, respectively, each having a bar linewidth of 0.12 micron. In the illustrated intensity distributions, each portion depicted by a rectangular line corresponds to the intensity distribution of the bar pattern upon the corresponding mask. In each of the intensity distributions after the dual exposure, shown at the bottom portions, the contrast is improved as compared with the intensity distribution of the bar pattern at the middle portion, and the intensity peak is high and, also, it is at the center of the mask pattern. Thus, the pitch of the pattern is substantially the same as the pitch of the mask pattern.

Figure 59:
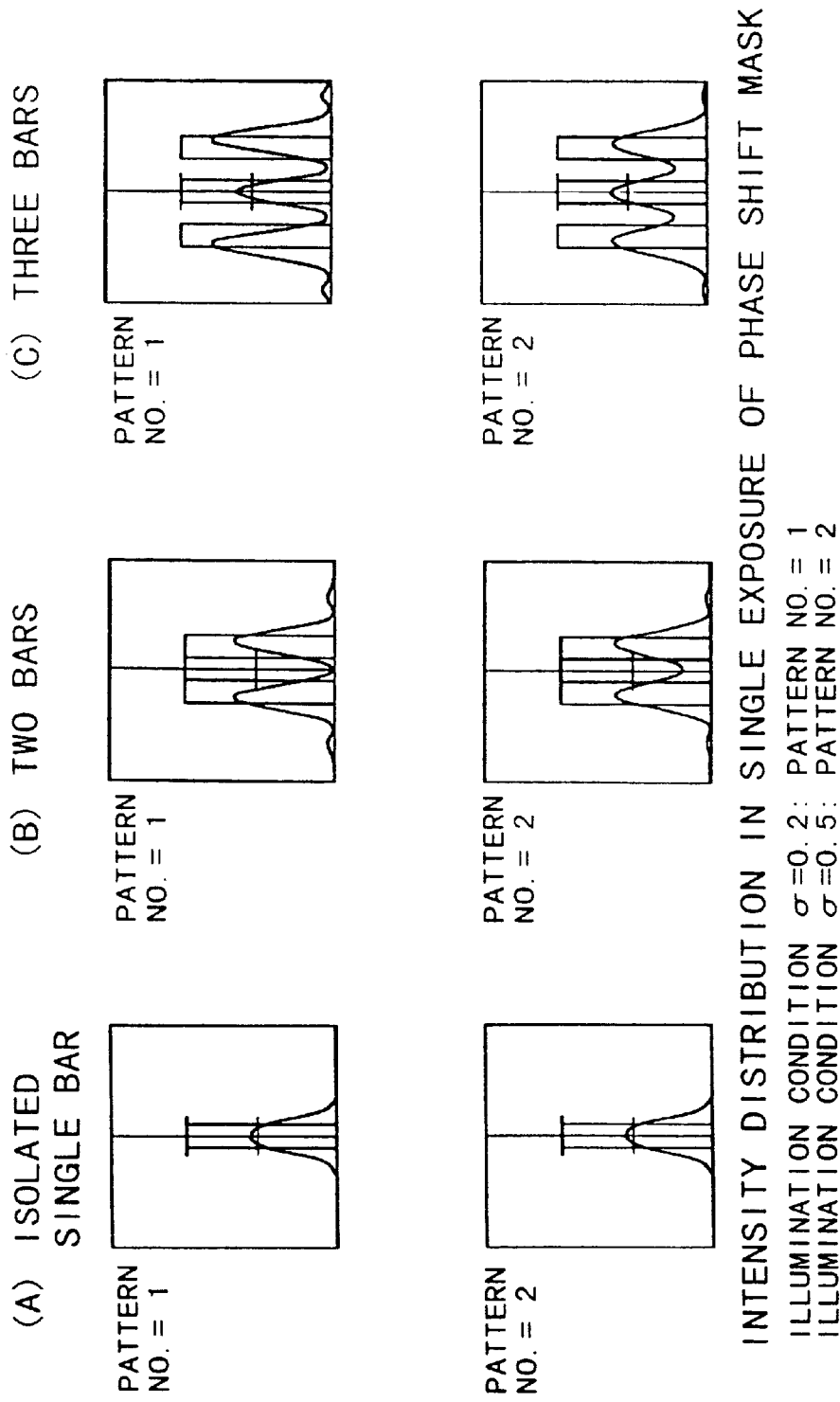
FIG. 59 is a schematic view for explaining intensity distributions resulting from exposures using patterns (images) with single to three bars, being made by use of a phase shift mask and while changing illumination condition (σ).

FIG. 59 is similar to FIG. 58 and shows intensity distributions (exposure amount distributions) of pattern images produced by a single exposure of Levenson-type phase shift masks having similar bar patterns as those of FIG. 58 and having phases of adjacent bars mutually inverted. There are shown in FIG. 59 two cases of σ=0.2 and σ=0.5, respectively. In the example of a single-bar pattern at (A) of FIG. 59, no adjacent pattern is there, and this corresponds to a single-bar pattern of an ordinary mask.

In the examples of two-bar and three-bar patterns at (B) and (C) of FIG. 59, since the phases of adjacent patterns are mutually inverted, a high contrast is produced. The contrast improvement effect is large with a small σ (σ=0.2) (more coherent illumination) as compared with the case of σ=0.5. However, at the opposite ends of the pattern, there is no adjacent pattern of an inverted phase and, therefore, the image intensity there differs from that of the central portion. Particularly, in the case of σ=0.2, there is produced a large intensity peak difference between the central portion and the opposite end portions. With a large σ (σ=0.5), while the contrast lowers slightly, there is no intensity peak difference with respect to the opposite ends. In any of these cases, since the image blurs at the opposite ends, the bottom of the intensity distribution is expanded, such that the intensity peak position displaces from the center of the mask. The pitch of the pattern is not equal to the pith of the mask pattern.

Next, a defocus characteristic of the contrast of an exposure amount distribution to be provided by the dual exposure, will be described.

FIGS. 60 and 61 illustrate changes in contrast with defocus, in a case of single exposure of a phase shift mask and in a case of dual exposure.

As regards a circuit pattern, three types of bar patterns having a single linear bar, two linear bars, and three linear bars, respectively, each having a linewidth of 0.12 micron, were used. In FIGS. 60 and 61, solid lines depict contrast at the bar center. Broken lines depict contrast at the edge, that is, the contrast as calculated from the intensity peak at the outermost bar and the intensity at the position (no bar is present) spaced by a distance corresponding to the linewidth.

FIG. 60 illustrates changes in contrast with defocus, in the exposure amount distribution as provided by a single exposure using the phase shift mask. The illumination condition was σ=0.5.

FIG. 61 illustrates changes in contrast with defocus, in the exposure amount distribution provided by the dual exposure. As regards the illumination condition, for projection exposure of a bar pattern which would result in a low contrast image, the illumination was made on the basis of a ring-like illumination method using σ=0.8 to 0.53, with no illumination inside σ=0.53. For projection exposure for forming a high contrast image, small σ (σ=0.2) partial coherent illumination was used. The light quantity ratio between these exposure processes was 1.5. The projection optical system had an NA=0.6, and the exposure wavelength was 248 nm.

As regards the contrast at the bar center as depicted by solid lines in FIG. 60, with a decrease of periodicity from three bars to two bars and to one bar, the contrast becomes higher with best focus but it is lowered more with an increase of defocus. In other words, the depth of focus becomes smaller with a decrease of periodicity.

Further, there is a large difference between the contrast at the bar center (solid line) and the contrast at the edge (broken line). The depth of focus for providing 40% contrast and 30% contrast, if a smaller one of the focus depths at the bar center and at the edge thereof is taken, will be such as follows.

For 40% contrast, focus depth will be:
1.2 micron (three-bar pattern)
1.1 micron (two-bar pattern)
0.6 micron (single-bar pattern).
For 30% contrast, focus depth will be:
1.4 micron (three-bar pattern)
1.3 micron (two-bar pattern)
0.7 micron (single-bar pattern).

On the other hand, the contrast levels at the bar centers are relatively low, but there are small differences among contrasts of the three-bar, two-bar, and single-bar patterns. A decrease of contrast with defocus is small even if the periodicity becomes small. Further, the difference between the contrast at the bar center (solid line) and the contrast at the edge (broken line) is small.

For 40% contrast, focus depth will be:
0.6 micron (three-bar pattern)
0.9 micron (two-bar pattern)
1.6 micron or more (single-bar pattern).
For 30% contrast, focus depth will be:
1.6 micron or more (three-bar pattern)
1.6 micron or more (two-bar pattern)
1.6 micron or more (single-bar pattern).

Thus, as regards the 40% contrast depth, while substantially the same result as that of the phase shift mask single exposure is obtainable, when the contrast proportion is slowed down to 35% or 30%, a larger depth is attainable with the dual exposure method. Further, since contrast can be changed by the ratio of the light quantity, it can be set above the resist contrast threshold.

What is described above concerns a case wherein the bar pattern has a single linewidth. The following description will be made in regard to the linewidth linearity, and with reference to an example wherein a periodic pattern has a single linewidth but a bar pattern has a mixture of different linewidths.

In this example, the projection optical system and the exposure wavelength were similar to those described above. Also, the illumination conditions for projection exposure of a periodic pattern and projection exposure of a bar pattern were similar to those described above. The periodic pattern had a fixed linewidth of 0.12 micron, as described above. As regards the bar pattern, a five-bar linear pattern, a two-bar linear pattern and a single-bar linear pattern, of linewidths from 0.1 to 0.16 microns were used.

To these patterns, an exposure amount slice level with which, for a sufficiently large linewidth (e.g., 0.36 micron in this example), the mask linewidth and the wafer linewidth are made equal to each other was determined. Then, experiments were made to examine errors of wafer side linewidths, corresponding to 0.1 micron to 0.16 micron, with respect to the mask side linewidths, under the same slice level. Also, for comparison, the linewidth linearity errors in single ordinary bar pattern exposure under the same illumination condition were examined.

FIGS. 62 and 63 illustrate linewidth linearity errors, in relation to linewidths of 0.1–0.16 microns. These drawings show linewidth linearity errors with respect to cases of zero defocus and defocuses of ±0.2 micron and ±0.3 micron. FIG. 62 shows linewidth linearity errors in the ordinary exposure process. The illumination condition was ring-like illumination with $\sigma=0.53–0.8$, and no illuminance inside $\sigma=0.53$.

FIG. 63 illustrates linewidth linearity errors in the dual exposure method. As regards the illumination condition, for bar pattern exposure, it was ring-like illumination with $\sigma=0.53–0.8$ and no illuminance inside $\sigma=0.53$. For periodic pattern exposure, it was small $\sigma$ partial coherent illumination, with $\sigma=0.2$. These linewidths are smaller than the limit resolution and the contrast is low. However, even less than the resolvable contrast, if the exposure slice level was reached, it was calculated as linewidth.

In FIG. 62, the portions where lines are discontinued are those regions in which images are blurred and no pattern is formed. Even if a line is drawn there, resolvable contrast may not be reached.

In FIG. 63, in each pattern case the limit resolution as linewidth reproducibility at respective defocuses is enhanced. Also, the linewidth error is smaller.

In the dual exposure method, as regards relatively large linewidths, the linewidth three times larger than the periodic pattern has good reproducibility. This is because, as shown in FIG. 64, the opposite edges of the pattern of the bar pattern coincide with the periodic pattern. The linewidth twice the periodic pattern has no good reproducibility.

Figure 65:
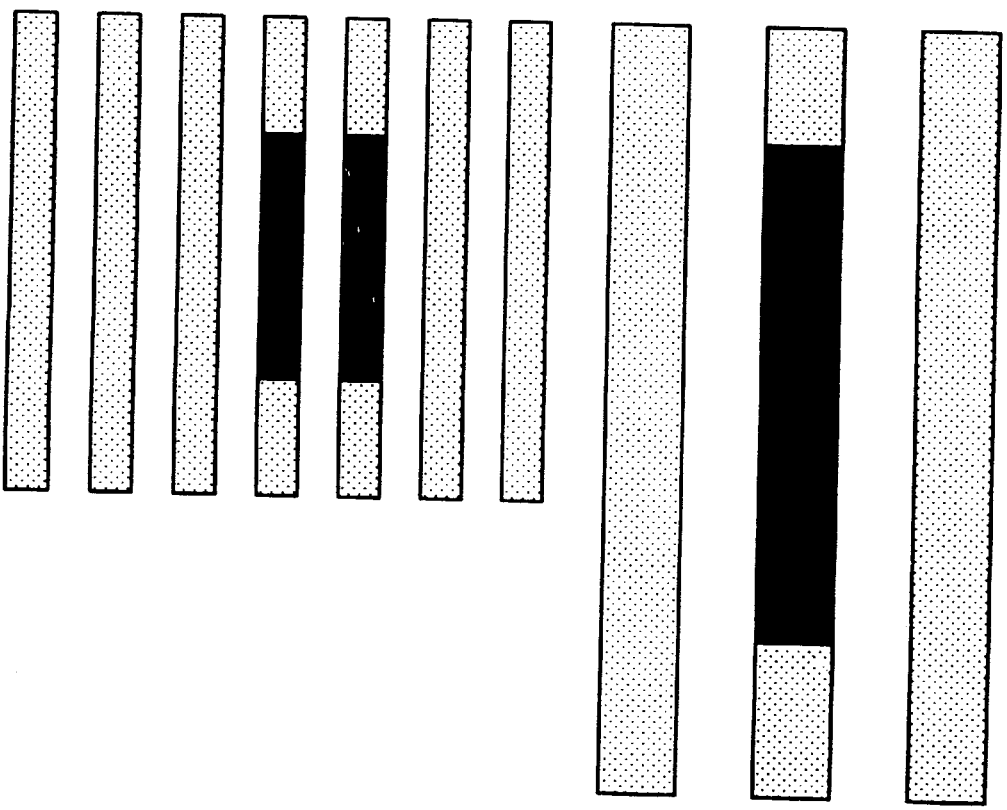
FIG. 65 is a schematic view for explaining dual exposure with a periodic pattern and a bar pattern having different linewidth bars.

As regards the linewidth of the bar pattern, if there are a mixture of a smallest linewidth and a linewidth twice that, for example, partially changing the pitch of the periodic pattern such as shown in FIG. 65 is effective.

As regards the linewidth linearity error in the dual exposure method, while in FIG. 63 the linewidth of the periodic pattern is fixed at 0.12 micron and the linewidth of the bar pattern is changed, clearly, the linewidth linearity error can be reduced by partially changing the pitch of the periodic pattern to twice the linewidth in accordance with the bar pattern linewidth, as shown in FIG. 65.

In a case wherein a single exposure is to be made by use of a Levenson-type phase shift mask having a pattern the same as the bar pattern and having phases of adjacent bars mutually inverted, the linewidth linearity error at the center of the periodic pattern will be substantially equal to the linewidth linearity error in the case wherein the linewidth of the bar pattern and the pitch of the periodic pattern in the dual exposure is made equal to twice the linewidth. Since, however, as regards the edge of the periodic pattern or an isolated pattern, it becomes substantially equal to the linewidth linearity error in the ordinary exposure such as shown in FIG. 62, it is seen that the dual exposure procedure has a superiority also with respect to the linewidth linearity error.

FIG. 66 illustrates two-dimensional images which are results of projection exposure of an isolated line, through a single exposure and through dual exposure. Charts in the drawing show changes in linewidth with defocus as well as the length in the longitudinal direction, being resolved with an exposure amount with which the linewidth at best focus becomes equal to the mask linewidth, the numerals being in the ratio to the mask linewidth. The linewidth the same as the mask linewidth is taken as 100%.

The result of dual exposure, as compared with the result of single bar-pattern projection exposure, is that the length in the longitudinal direction becomes close to the mask linewidth also with the best focus. The linewidth change with defocus is smaller, and the depth of focus is enlarged.

Referring now to FIGS. 69–72, another embodiment of the present invention will be described. This embodiment concerns a different example of a mask (reticle) for forming a pattern which cannot be resolved through a single exposure.

In a dual exposure method procedure, there may be a case wherein, when an ordinary Cr film pattern such as shown in FIG. 69 is used in projection exposure of a pattern image not resolvable by a single exposure using an ordinary exposure apparatus, the exposure amount in the portion superposedly exposed by dual exposure becomes excessive. In that case, film thickness reduction may occur in the resist pattern or contrast of the mask pattern image may become insufficient when defocus occurs. The depth of focus may therefore be shortened. Use of masks or reticles having three types of patterns, to be described below, will, however, be effective to produce a mask pattern image of high contrast as compared with the Cr film pattern of FIG. 69, and to enlarge the depth of focus.

(1) Halftone Phase Shift Pattern (FIG. 70) Transmission factor: 2–10%. Shifter material: Mo series, Cr series, other metal oxide or nitride. Dimension: L1–L5 determined appropriately. Phase: 180 deg. phase difference between lights passing through the halftone portion and an adjacent portion.

(2) Rim Type Phase Shift Pattern (FIG. 71) Dimension: L1–L9 determined appropriately. Phase: 180 deg. phase difference between lights passing through the rim portion and an adjacent portion.

(3) Chromium-less Shifter Light Blocking Type Phase Shift Pattern (FIG. 72)

This type is particularly effective to a very narrow linewidth pattern, as compared with the two types described above. In this type, in a narrow linewidth pattern, phase shift effects at the opposite edges of a phase shift pattern are combined with each other to produce a resist image as a single line pattern.

Dimension: L1–L5 determined appropriately.

Phase: 180 deg. phase difference between lights passing through the pattern portion and an adjacent portion.

The exposure methods and exposure apparatuses described above may be suitably used for production of various devices such as semiconductor chips (e.g., IC or LSI), display devices (e.g., a liquid crystal panel), detecting devices (e.g., a magnetic head), or image pickup devices (e.g., a CCD), for example.

The present invention is not limited to the forms of the embodiments described hereinbefore, and many modifications are possible within the scope of the invention. The number of exposures of high contrast image exposure and circuit pattern image exposure as well as the number of stages of exposure amount may be changed appropriately, as described hereinbefore. Further, if necessary, superposition of exposures may be adjusted appropriately, with shift, for example. Such modification or adjustment will enhance the variation of the circuit pattern to be produced.

The dual exposure method described above effectively improves the contrast of a fine pattern which is low in contrast and is not resolved only by conventional exposure, and it enables resolution of the same. Further, as compared with a single exposure of a pattern of a Levenson-type phase shift mask, the dual exposure method described above is much superior with respect to the linewidth reproducibility. Particularly, single exposure of a pattern of the Levenson-type phase shift mask is not effective to a pattern having no periodicity, and there is a limitation to pattern disposition due to phase inversion. To the contrary, in this dual exposure method, a pattern having no periodicity or a pattern having a complicated shape can be produced. Further, as compared with the method disclosed in U.S. Pat. No. 5,415,835 or Japanese Laid-Open Patent Application, Laid-Open No. 253649/1995, the dual exposure method of the present invention enables a pattern of a more complicated shape.

Figure 73:
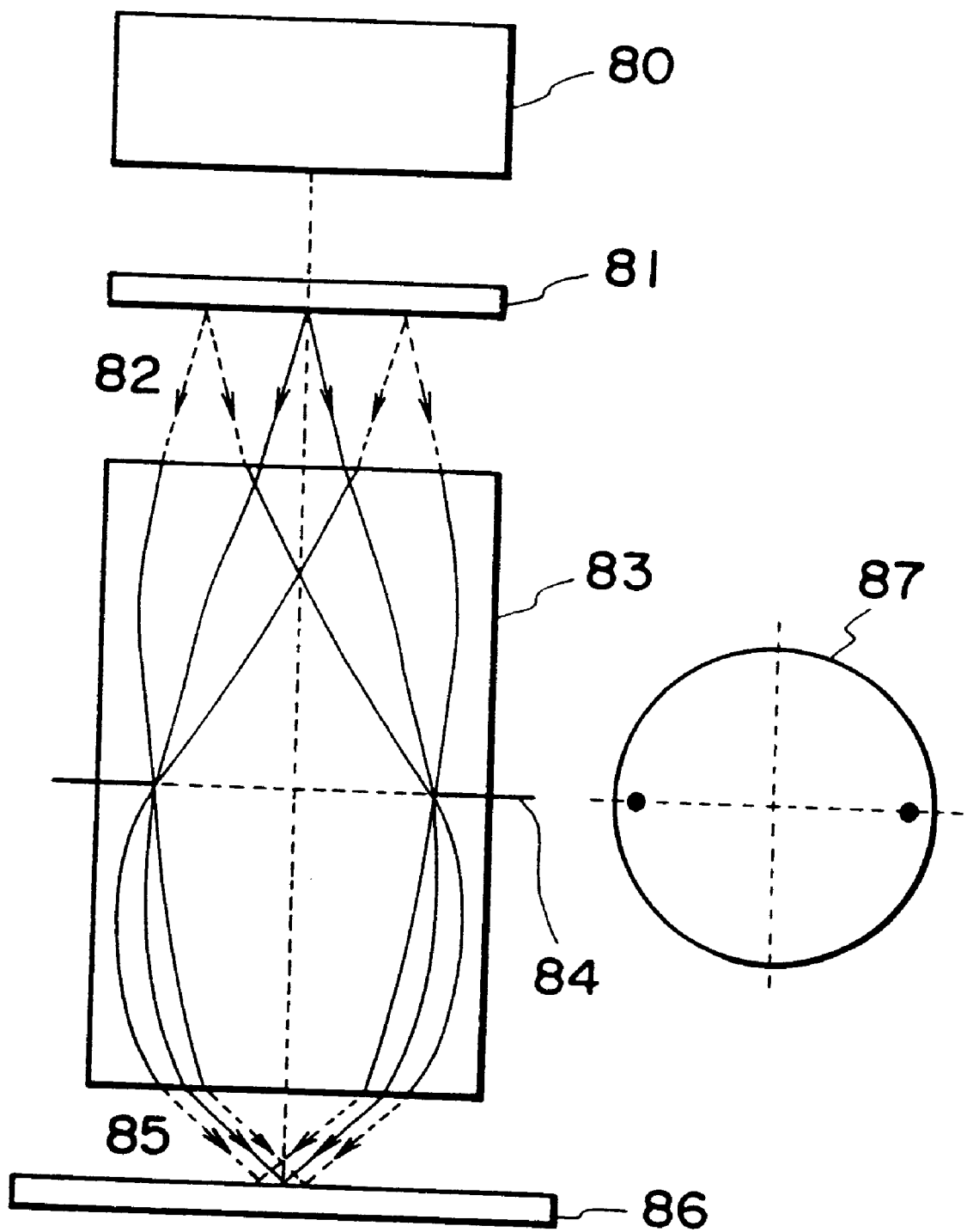
FIG. 73 is a schematic view of an example of an exposure apparatus for double-beam interference, according to the present invention.

FIG. 73 is a schematic view of an exposure apparatus which is usable in the present invention for forming a high-contrast two-dimensional periodic pattern (which may be called a check pattern). In this embodiment, double-beam interference is performed in a set or in two sets (four-beam interference) simultaneously, with respect to two orthogonal directions, such that a check pattern is formed on a photosensitive substrate by a single projection exposure. The thus produced check pattern (periodic pattern) and a circuit pattern (ordinary pattern) such as a gate pattern are superposed, by dual exposure. By setting the threshold of the photosensitive substrate, as will be described later, a desired pattern is produced.

For simplicity, FIG. 73 illustrates the double-beam interference only with respect to one direction. Here, the words "multiple exposure" refer to performing exposure of a photosensitive substrate plural times by use of different patterns, without intervention of a developing process.

The exposure apparatus of FIG. 73 will be described in detail. The exposure apparatus of FIG. 73 includes a projection optical system of a conventional type, which consists of an all dioptric system, for example. A system of NA=0.6 or more with respect to a wavelength of 248 nm, is currently available. Denoted in the drawing at 80 is an illumination system which is operable to perform coherent illumination and partial coherent illumination. Denoted at 81 is a mask, and denoted at 82 is object-side exposure light. Denoted at 83 is a projection optical system, and denoted at 84 is an aperture stop. Denoted at 85 is image-side exposure light, and denoted at 86 is a photosensitive substrate. Denoted at 87 is the position of light upon the pupil plane of the projection optical system 83.

The drawing schematically shows double-beam interference exposure with respect to one direction. The object-side exposure light 82 and the image-side exposure light 85 each comprises two parallel light fluxes. Actually, similar double-beam interference is provided with respect to a direction perpendicular to the sheet of the drawing.

An embodiment for performing double-beam interference exposure by use of an ordinary projection exposure apparatus such as described above, will now be explained. First, a description will be made of an example wherein the mask 81 and the illumination method therefor are set such as shown in FIG. 74 or 75.

Figure 74:
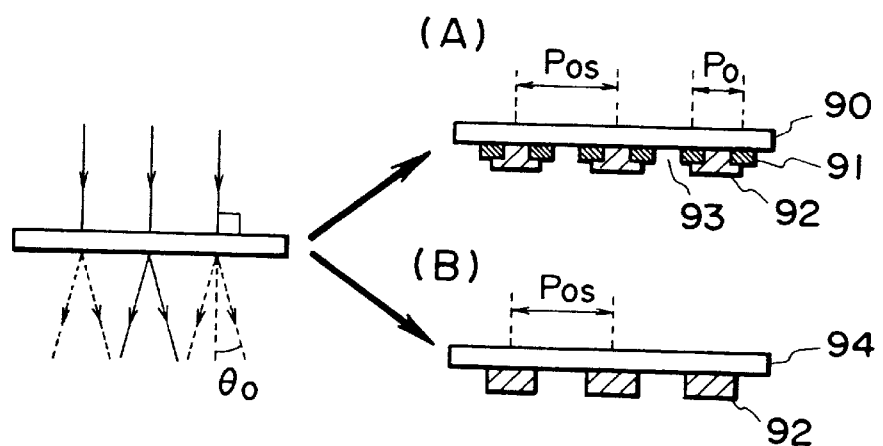
FIG. 74 is a schematic view for explaining a mask and an illumination method which are usable in the exposure apparatus of FIG. 73.
Figure 75:
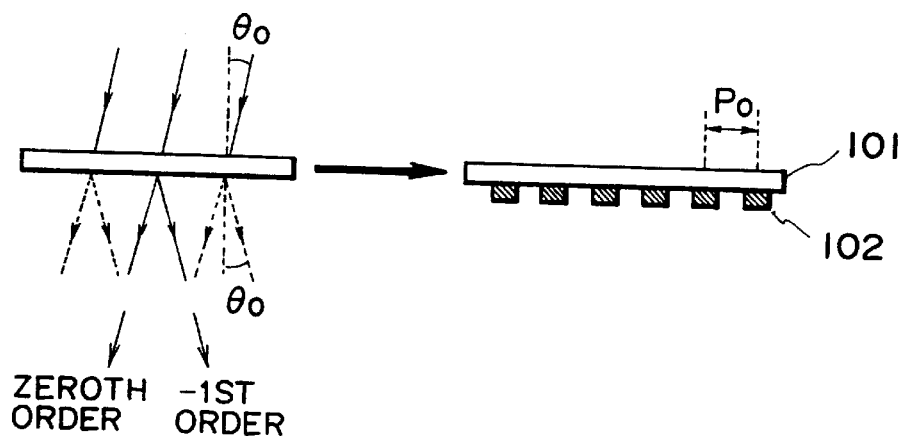
FIG. 75 is a schematic view for explaining another example of a mask and an illumination method, usable in the exposure apparatus of FIG. 73.
Figure 76:
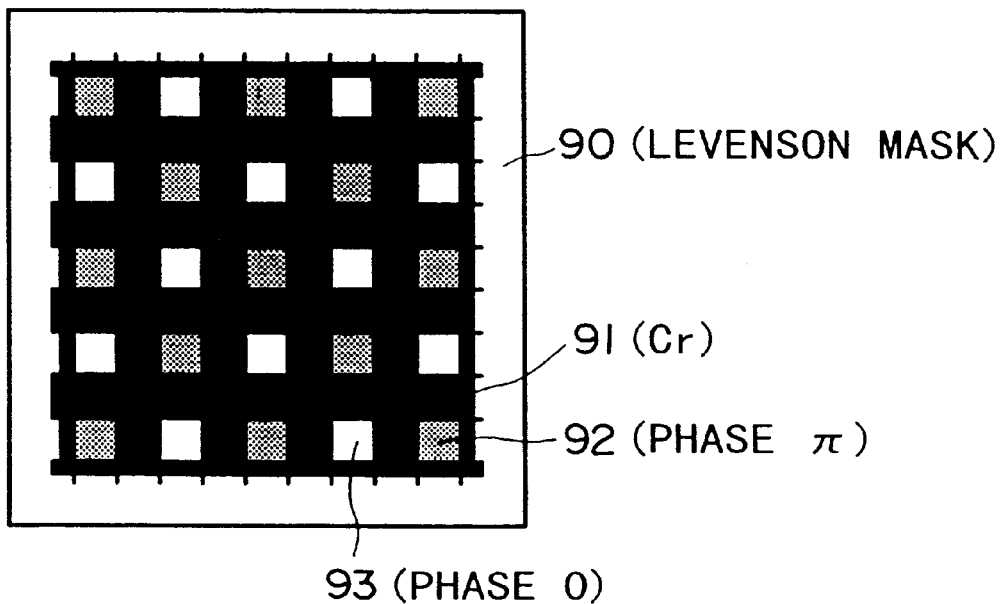
FIG. 76 is a schematic view of a mask according to the present invention.

FIG. 74 at (A) is a sectional view of a Levenson-type phase shift mask 90 having a chromium light blocking portion 91 with a pitch in the perpendicular direction and the horizontal direction being set in accordance with equation (a1) below, and a shifter 92 with a pitch arranged in accordance with equation (a2) below.

$$P_0 = 2MR = M(\lambda/(2NA)) \qquad (a1)$$

$$P_{OS} = 2P_0 = M(\lambda/NA) \qquad (a2)$$

where R is resolution, M is magnification of the projection optical system 83, λ is wavelength, and NA is the image-side numerical aperture NA of the projection optical system 83.

Both of phase shift masks shown at (A) and (B) of FIG. 74 function so that, when the effective light source of the illumination system performs illumination with perpendicularly incident parallel light (coherence factor σ=0), transmitted light rays in a zeroth order diffraction direction, that is, in the perpendicular direction, cancel with each other because of the phase π of adjacent transmission lights of the shifter, such that there is no zeroth order light from the mask. Positive and negative first order diffractive lights intensifying each other and defining 45 deg. with respect to the pattern array direction, are produced symmetrically with respect to the optical axis of the projection optical system.

Figure 79:
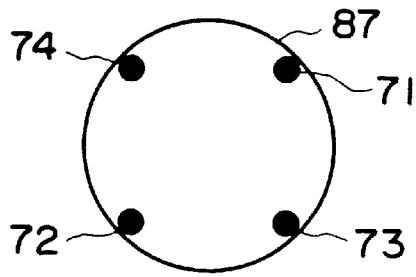
FIG. 79 is a schematic view for explaining light intensity distribution upon a pupil plane in the FIG. 73 apparatus.

Diffractive light of a second order or of orders higher than it do not contribute to imaging, because of restriction by the NA of the projection optical system. FIG. 79 illustrates a light intensity distribution upon the pupil plane 87, in this case.

In FIG. 79, four lights 71, 72, 73, and 74 on the pupil plane 87 cause interference. By this, a check-like light intensity distribution (fine pattern) is produced on the photosensitive substrate 86.

Figure 80:
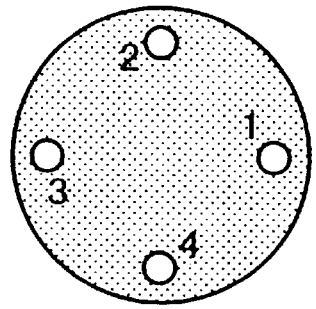
FIG. 80 is a schematic view for explaining another example of an effective light source in the illumination optical system of the FIG. 73 apparatus.

FIG. 80 is a schematic view of effective light sources in a case where a Levenson mask 90 is used and the illumination system is based on oblique incidence illumination. More specifically, the illumination system is based on quadruple illumination in which four effective light sources are disposed in four directions of 0 deg., 90 deg., 180 deg., and 270 deg., respectively.

Figure 81:
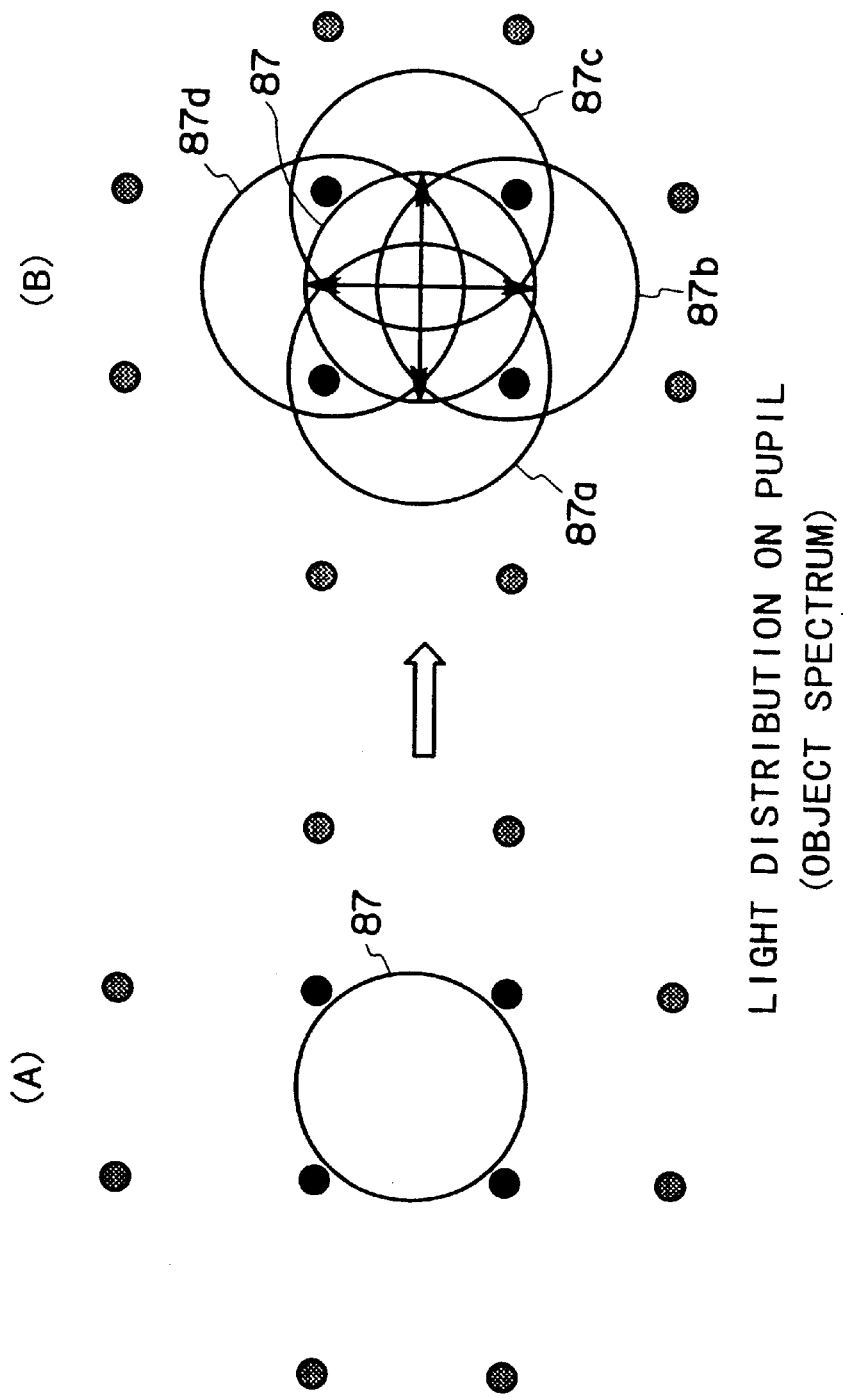
FIG. 81 is a schematic view for explaining another example of a light intensity distribution upon a pupil plane in the FIG. 73 apparatus.

FIG. 81 is a schematic view for explaining a light intensity distribution on the pupil plane 87. The state shown at (A) of FIG. 81 is that no diffractive light is formed inside the pupil plane 87 unless oblique incidence illumination is performed, so that no image is formed.

On the other hand, the stage shown at (B) of FIG. 81 is that, due to oblique incidence illumination by the illumination system (using obliquely projected lights along four directions), positive and negative first order lights are incident upon the pupil (87a–87d).

Figure 82:
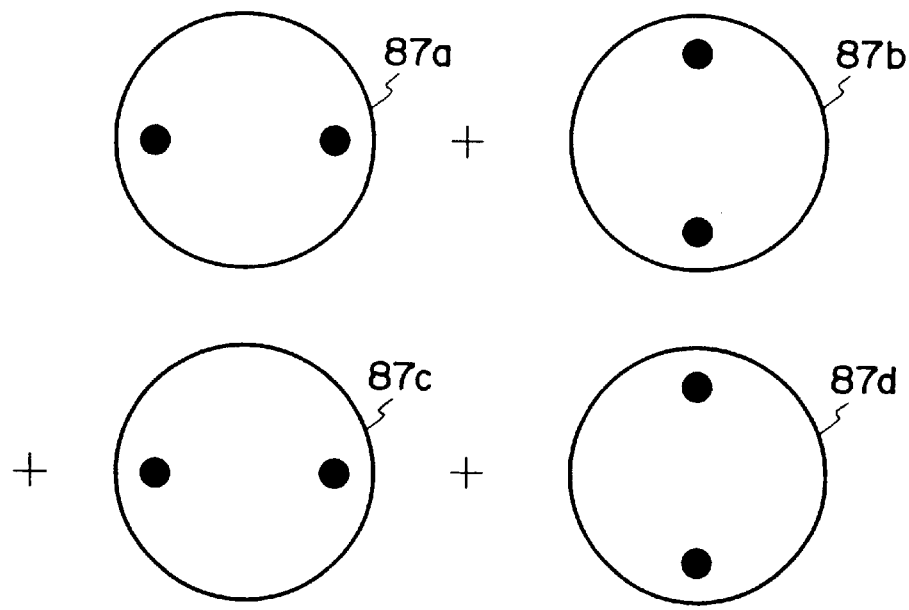
FIG. 82 is a schematic view for explaining a further example of a light intensity distribution upon a pupil plane in the FIG. 73 apparatus.

FIG. 82 is a schematic view for explaining that the light intensity distribution on the pupil 87 shown in FIG. 81 comprises a combination of light intensity distributions upon four pupil planes denoted by 87a–87d. On each of pupils 87a–87d, there is double-beam interference caused by lights from light sources (painted circles).

More specifically, double-beam interference at 87a, double-beam interference at 87b, dual-beam interference at 87c and dual-beam interference at 87d are caused simultaneously. Superposed images of them are formed on the photosensitive substrate. Here, if, in the four-point illumination system effective light source, they are made mutually incoherent by an integrator such as a fly's eye lens, then produced is intensity superposition.

Next, an example using a mask such as shown in FIG. 75 will be described. The mask of FIG. 75 is an ordinary chromium mask, having a chromium light blocking portion 102 with its pitch in the horizontal direction and-perpendicular direction being arranged in accordance with equation (a3), below, the same as equation (a1).

$$P_0 = 2MR = M(\lambda/(2NA)) \tag{a3}$$

Figure 77:
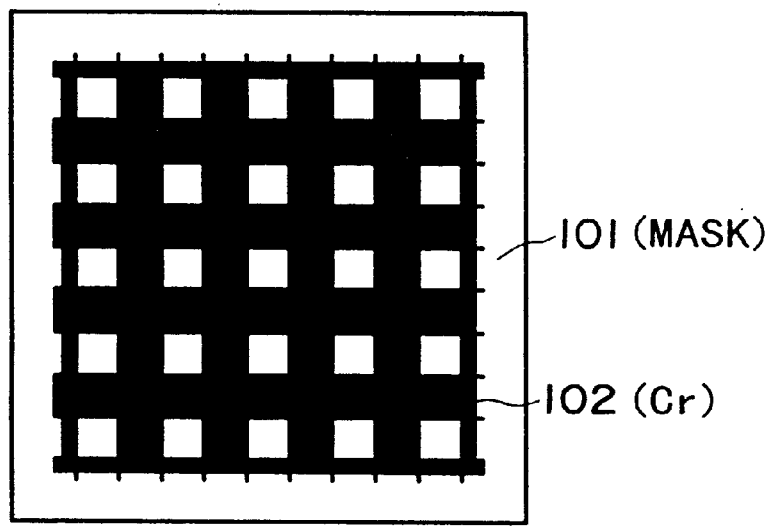
FIG. 77 is a schematic view of another mask according to the present invention.
Figure 78:
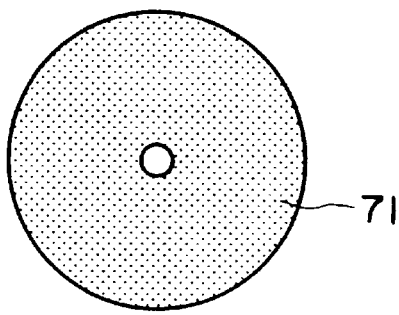
FIG. 78 is a schematic view for explaining an effective light source in an illumination system of the FIG. 73 apparatus.
Figure 83:
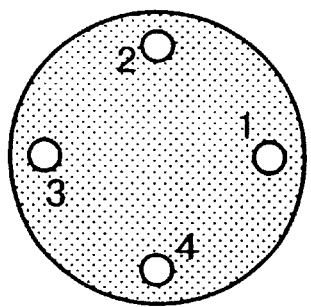
FIG. 83 is a schematic view for explaining another example of an effective light source in the illumination optical system of the FIG. 73 apparatus.

FIG. 77 is a plan view of a main portion of the ordinary chromium mask 101 of FIG. 75. In the mask of FIG. 75, not based on a phase shift method, the effective light sources of the illumination system may be based on oblique incidence illumination with quadrupole illumination in which four effective light sources are disposed at 0 deg., 90 deg., 180 deg., and 270 deg., as shown in FIG. 83. The incident light in this case comprises parallel light having an angle $\theta_0$, where $\theta_0$ can be expressed by equation (a4) below.

$$\sin \theta_0 = M/NA \tag{a4}$$

In response to such incident light, there are produced two lights passing through the mask 101, that is, zeroth order light advancing straight at the same angle $\theta_0$, and negative first order light advancing symmetrically with the zeroth order light with respect to the optical axis of the projection optical system, at an angle $-\theta_0$. These two lights pass through the pupil of the projection optical system, and they contribute to the imaging.

Figure 84:
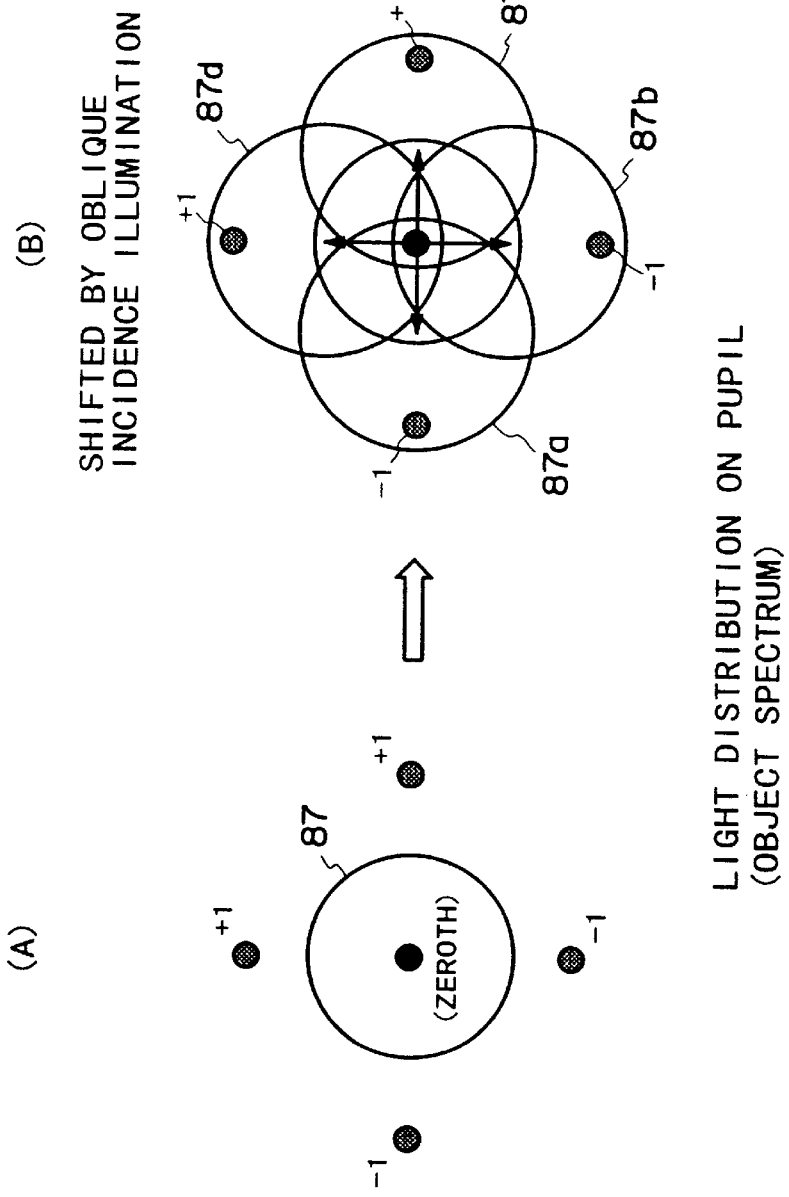
FIG. 84 is a schematic view for explaining another example of a light intensity distribution upon a pupil plane in the FIG. 73 apparatus.

FIG. 84 is a schematic view of a light intensity distribution on the pupil 87, in this case. The state shown at (A) of FIG. 84 is that, if the illumination system is set for perpendicular incidence illumination, only zeroth order light impinges on the pupil 87, such that no pattern image can be formed.

The state shown at (B) of FIG. 84 is that, because of oblique incidence of lights along four directions (i.e., by means of oblique incidence lights in four directions), zeroth order lights and positive first order lights (or negative first order lights) are superposedly incident on the pupil plane (87a–87d).

Figures 85, 86:
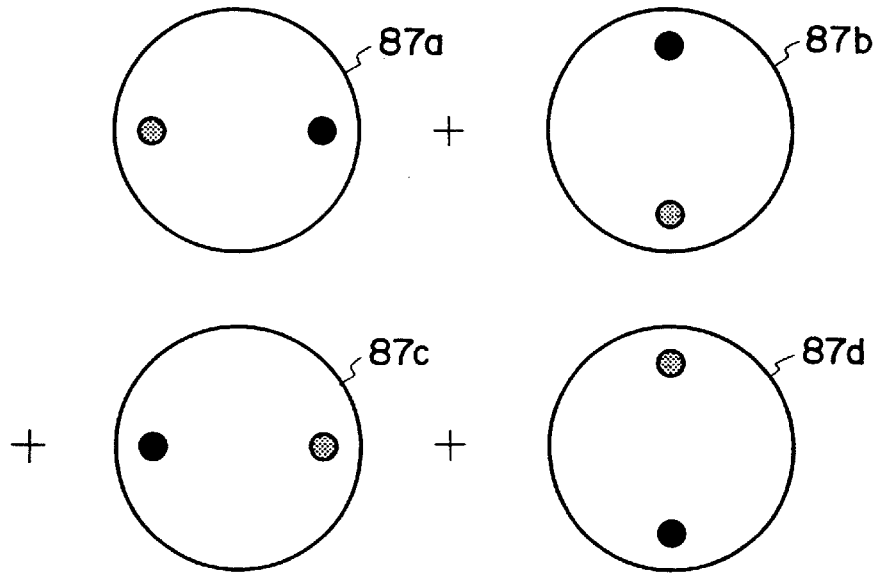
FIG. 85 is a schematic view for explaining a further example of a light intensity distribution upon a pupil plane in the FIG. 73 apparatus.
FIG. 86 is a schematic view for explaining a double-beam interference pattern according to the present invention.

FIG. 85 is a schematic view for explaining that the light intensity distribution on the pupil 87 shown in FIG. 84(B) comprises a combination of light intensity distributions upon four pupil planes denoted by 87a–87d.

What is described above is an example of a mask and illumination therefor for performing double-beam interference exposure by use of an ordinary projection exposure apparatus. By setting the components such as described above, a largest region of the NA of a projection optical system can be used.

In this embodiment, two-dimensional double-beam interference pattern exposure is performed by which a check-like pattern is produced. FIG. 86 is a schematic view of an exposure pattern on a photosensitive substrate resulting from two dimensional double-beam interference exposure of this embodiment, the exposure pattern being illustrated in the form of an exposure amount map. In this embodiment, for an exposure pattern to be produced finally, the double-beam interference exposure is performed with the exposure amount of the same level with respect to the two directions.

In the exposure pattern shown in FIG. 86, as a result of two times double-beam interference exposures, the exposure amount ranges by three stages from 0 to 2. To this exposure pattern, through ordinary exposure, a rough pattern of a size twice the minimum size in the interference exposure is superposed (dual exposure) with an exposure amount of four stages from 0 to 3.

Figure 87:
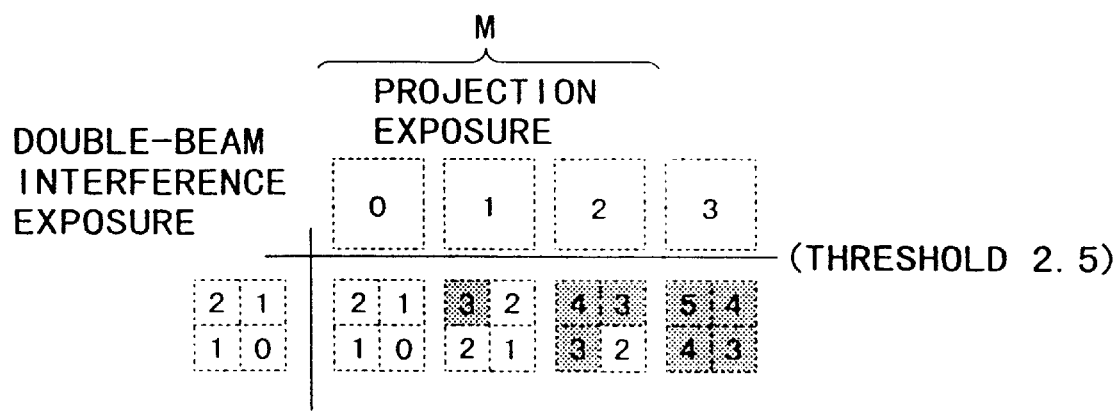
FIG. 87 is a schematic view for explaining a double-beam interference pattern and an ordinary pattern, according to the present invention.

The exposure threshold of the photosensitive substrate may be set to be larger than 2 (the largest exposure amount in the double-beam interference exposure) and smaller than 3 (the largest exposure amount in projection exposure of an ordinary pattern), as shown in FIG. 87, that is 2.5, for example.

FIG. 87 is a schematic view of an example of a pattern which is obtainable by dual exposure based on double-beam interference exposure and projection exposure of an ordinary pattern. FIG. 87 schematically shows a mask M with an ordinary pattern having four stages of transmission factor.

The bottom portion of FIG. 87 shows exposure amounts in the exposure pattern produced as a result of double-beam interference exposure of FIG. 86 and of projection exposure with the use of the mask M, applying exposure amounts of four stages (0, 1, 2, and 3). The regions with hatching represent portions above the exposure threshold, and these regions define a final exposure pattern in multiple exposure.

Figure 89:
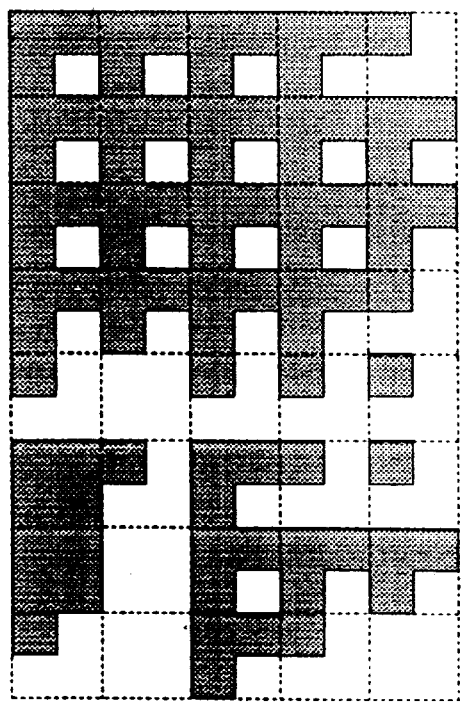
FIG. 89 is a schematic view for explaining a desired pattern according to the present invention.

FIG. 89 is a schematic view of an example of an exposure pattern formed in accordance with this embodiment. By changing the exposure amount in projection exposure in a unit of a block shown in FIG. 87, a fine pattern can be produced in a wider area and in a complicated shape.

Projection exposure with exposure amounts of four stages (0, 1, 2, and 3) such as described above may be performed in a single exposure by use of a halftone mask M having multiple transmission factors such as shown in FIG. 87 and having a phase difference corresponding to a multiple of $2\pi$.

Figure 88:
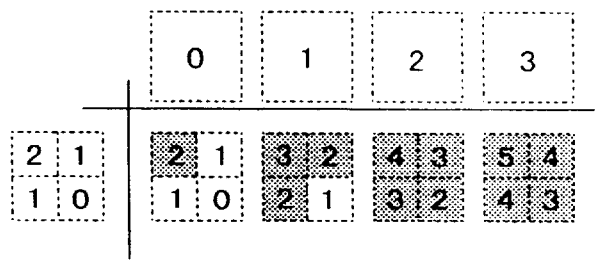
FIG. 88 is a schematic view for explaining a check pattern according to the present invention.

Further, when the threshold is set to a level between 1 and 2, a pattern such as shown in FIG. 88 can be produced only by the double-beam interference. It has four-stage transmission factors effective to provide four-stage exposure amounts, as shown in FIG. 87. Among them, a block of 0% may be defined by chromium light blocking. The block of 100% may comprise a quartz substrate only.

The blocks having 25% and 50% in transmission factor may be formed by vacuum deposition of a material or materials having a refractive index n and an absorption coefficient c, satisfying the following relation:

$$n/c=(m\lambda)/(-1nT)$$

where T is 0.25 or 0.50, m is an integer of 1 or 2, and $\lambda$ is the wavelength.

With the structure described above, at the boundary where the transmission factor changes, the quantity of phase shift becomes equal to a multiple of $2\pi$, and there occurs no change in exposure pattern due to the phase shift effect. Thus, by superposition with the double-beam interference exposure, a desired pattern such as shown in FIG. 89 can be produced.

While, in the foregoing examples, a description has been made of a transmission type halftone mask, the present invention is applicable to a reflection type halftone mask, with essentially the same structure.

Figure 98:
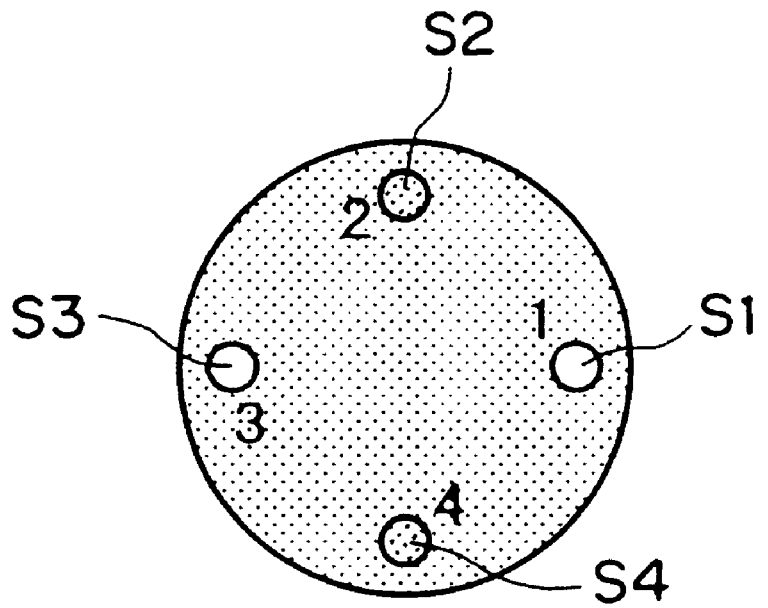
FIG. 98 is a schematic view of an effective light source in an illumination system according to the present invention.

FIG. 98 is a schematic view of an example where the illumination system is based on quadruple illumination, wherein effective light sources S1 and S3 of the four effective light sources have the same intensity while the light sources S2 and S4 have the same intensity but lower than the light sources S1 and S2.

Figure 99:
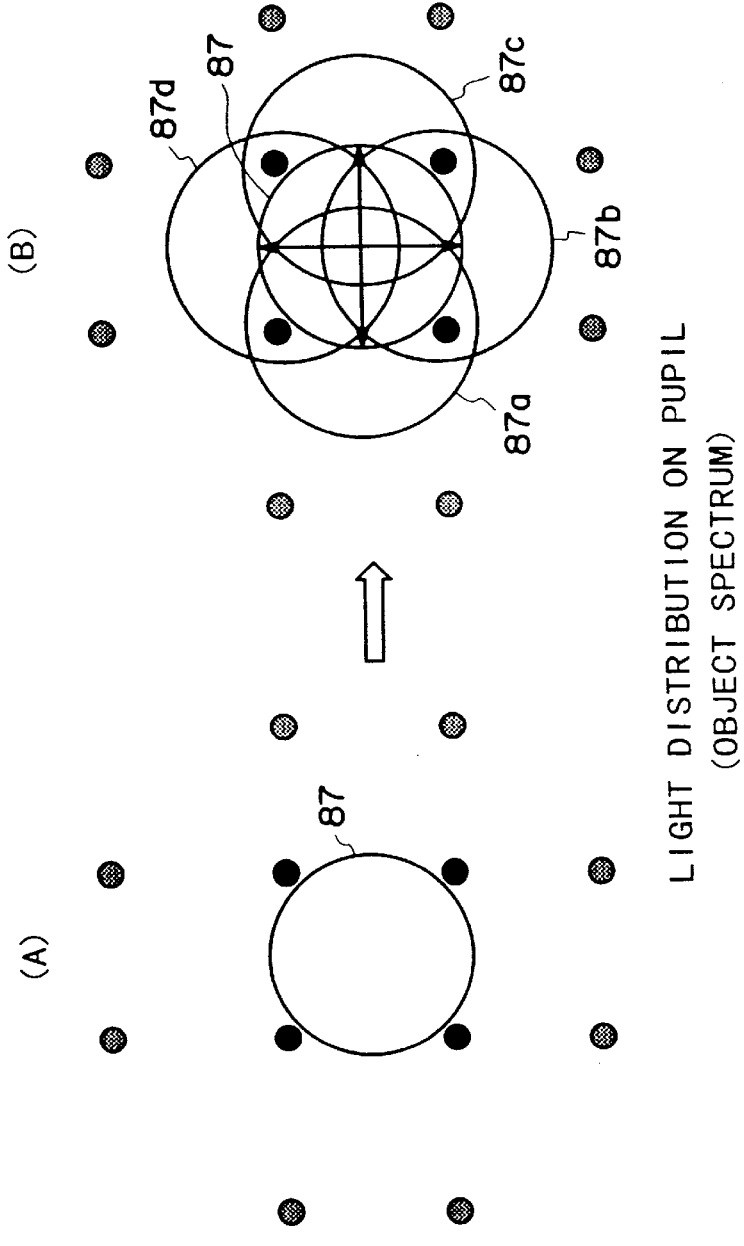
FIG. 99 is a schematic view for explaining intensity distribution at a pupil, in an exposure apparatus according to the present invention.

As regards the mask, a Levenson mask 90 may be used. FIG. 99 at (A) is a schematic view for explaining a light intensity distribution on the pupil 87, and it illustrates the state that no diffractive light is produced inside the pupil 87 so that no image is formed.

The state shown at (B) of FIG. 99 is that the illumination system provides oblique incidence illumination (using obliquely projected lights along four directions) by which positive and negative first order diffractive lights are incident on the pupil (87a–87d).

Figure 100:
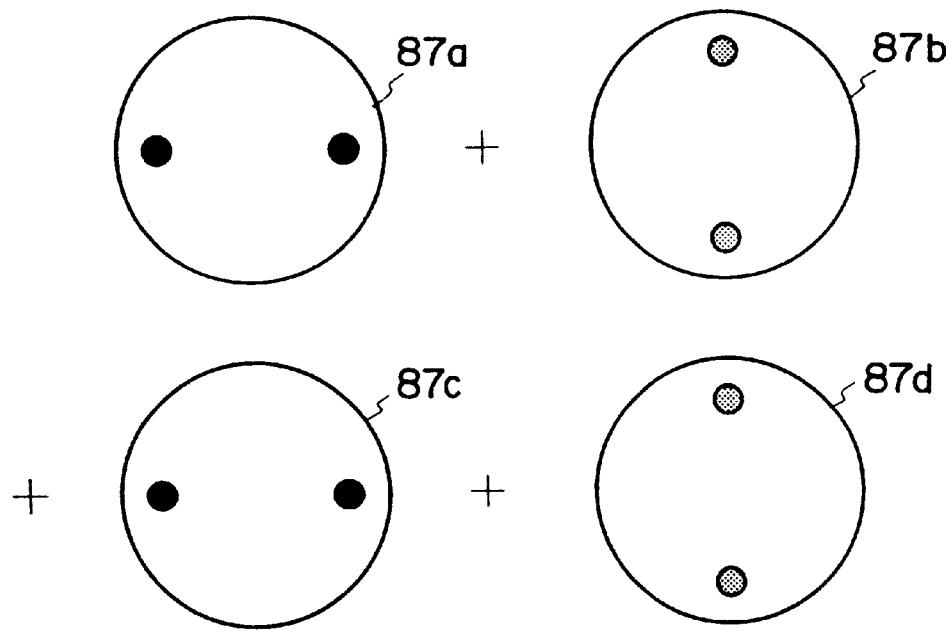
FIG. 100 is a schematic view for explaining another example of an intensity distribution at a pupil, in an exposure apparatus according to the present invention.

FIG. 100 is a schematic view for explaining that the light intensity distribution on the pupil 87 of FIG. 99 comprises a combination of light intensity distributions upon four pupil planes denoted by 87a–87d.

Figure 101:
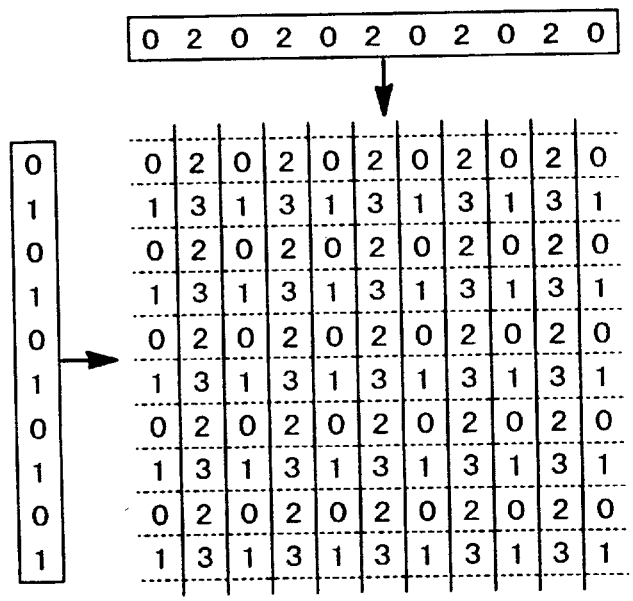
FIG. 101 is a schematic view of a light pattern upon a photosensitive substrate, in an embodiment of the present invention.

FIG. 101 is a schematic view of an exposure pattern on a photosensitive substrate resulting from two-dimensional double-beam interference exposure of this embodiment, the exposure pattern being illustrated in the form of an exposure amount map. In this embodiment, for an exposure pattern to be produced finally, the double-beam interference exposure is performed with the exposure amount of the same level with respect to the two directions.

In the exposure pattern shown in FIG. 101, as a result of two times double-beam interference exposures, the exposure amount ranges by four stages from 0 to 3. To this exposure pattern, through ordinary projection exposure, a rough pattern is superposed (dual exposure) with an exposure amount of five stages from 0 to 4.

Figure 102:
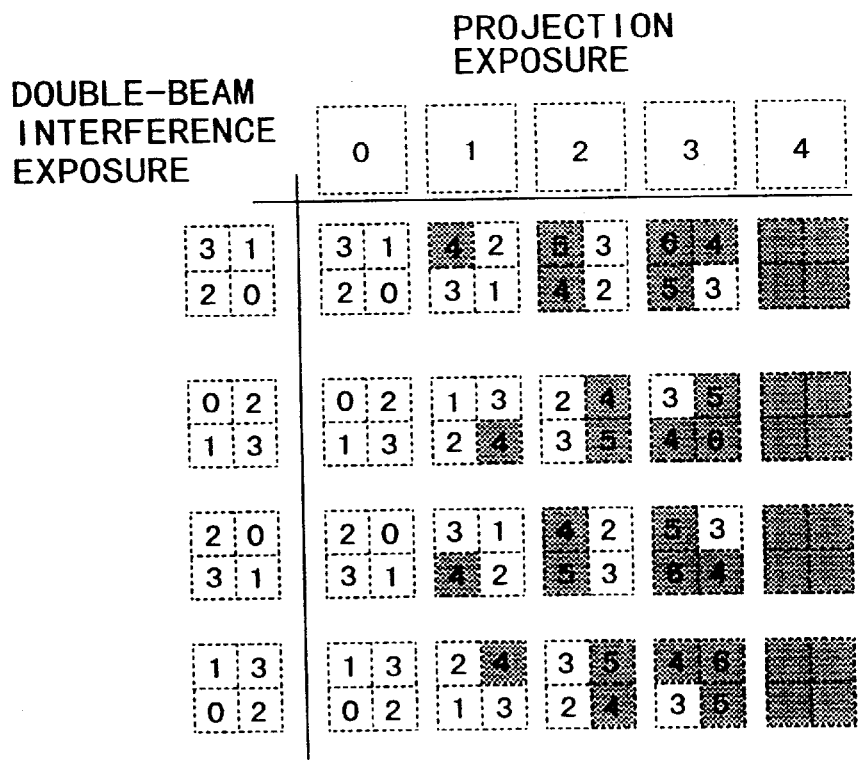
FIG. 102 is a schematic view for explaining multiple exposure based on double-beam interference and ordinary exposure, according to the present invention.

The exposure threshold of the photosensitive substrate may be set to be larger than 3 (the largest exposure amount in the double-beam interference exposure) and smaller than 4 (the largest exposure amount in projection exposure of an ordinary pattern), as shown in FIG. 102.

FIG. 102 is a schematic view of an example of a pattern which is obtainable by dual exposure based on double-beam interference exposure and projection exposure of an ordinary pattern. FIG. 102 schematically shows a mask M with an ordinary pattern having five stages of transmission factor.

The bottom portion of FIG. 102 shows exposure amounts in the exposure pattern produced as a result of double-beam interference exposure of FIG. 101 and of projection exposure with the use of the mask M, applying exposure amounts of five stages (0, 1, 2, 3, and 4). The regions with hatching represent portions above the exposure threshold, and these regions define a final exposure pattern in multiple exposure.

Figure 103:
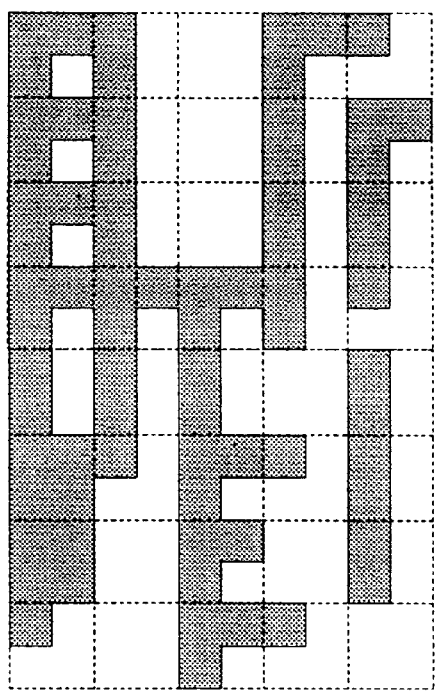
FIG. 103 is a schematic view of an example of a circuit pattern which can be produced in accordance with the present invention.
Figure 104:
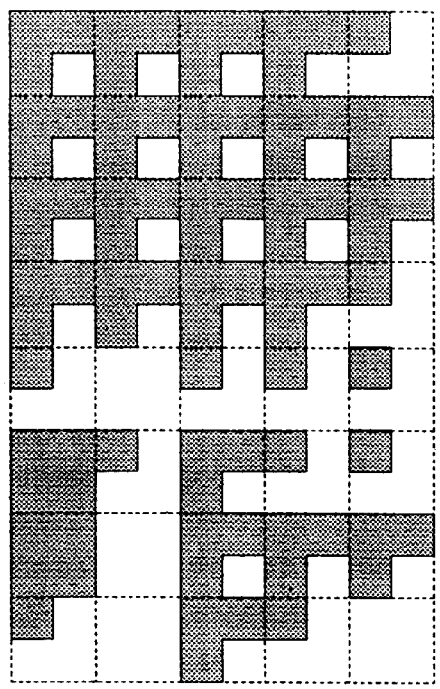
FIG. 104 is a schematic view of another example of a circuit pattern which can be produced in accordance with the present invention.

FIGS. 103 and 104 are schematic views of examples of an exposure pattern formed in accordance with this embodiment. By changing the exposure amount in projection exposure in a unit of a block shown in FIG. 102, a fine pattern can be produced in a wider area and in a complicated shape.

Projection exposure with exposure amounts of five stages (0, 1, 2, 3, and 4) such as described above may be performed in a single exposure by use of a halftone mask M of multiple values, such as shown in FIG. 102.

As shown in FIG. 102, it has five-stage transmission factors effective to provide five-stage exposure amounts. Among them, the 0% block may be defined by chromium light blocking. The 100% block may comprise a quartz substrate only.

The blocks of 25%, 50%, and 75% in transmission factor may be formed by vacuum deposition of a material or materials having a refractive index n and an absorption coefficient c, satisfying the following relation:

$$n/c=(m\lambda)/(-1nT)$$

where T is 0.25, 0.50 or 0.75, m is an integer of 1 or 2, and $\lambda$ is the wavelength.

With the structure described above, also at the boundary where the transmission factor changes, the quantity of phase shift becomes equal to a multiple of $2\pi$, and there occurs no change in exposure pattern due to the phase shift effect. Thus, by superposition with the double-beam interference exposure, a desired pattern such as shown in FIG. 102 can be produced.

While, in the foregoing examples, a description has been made of a transmission type halftone mask, the present invention is applicable to a reflection type halftone mask, with essentially the same structure.

Figure 90:
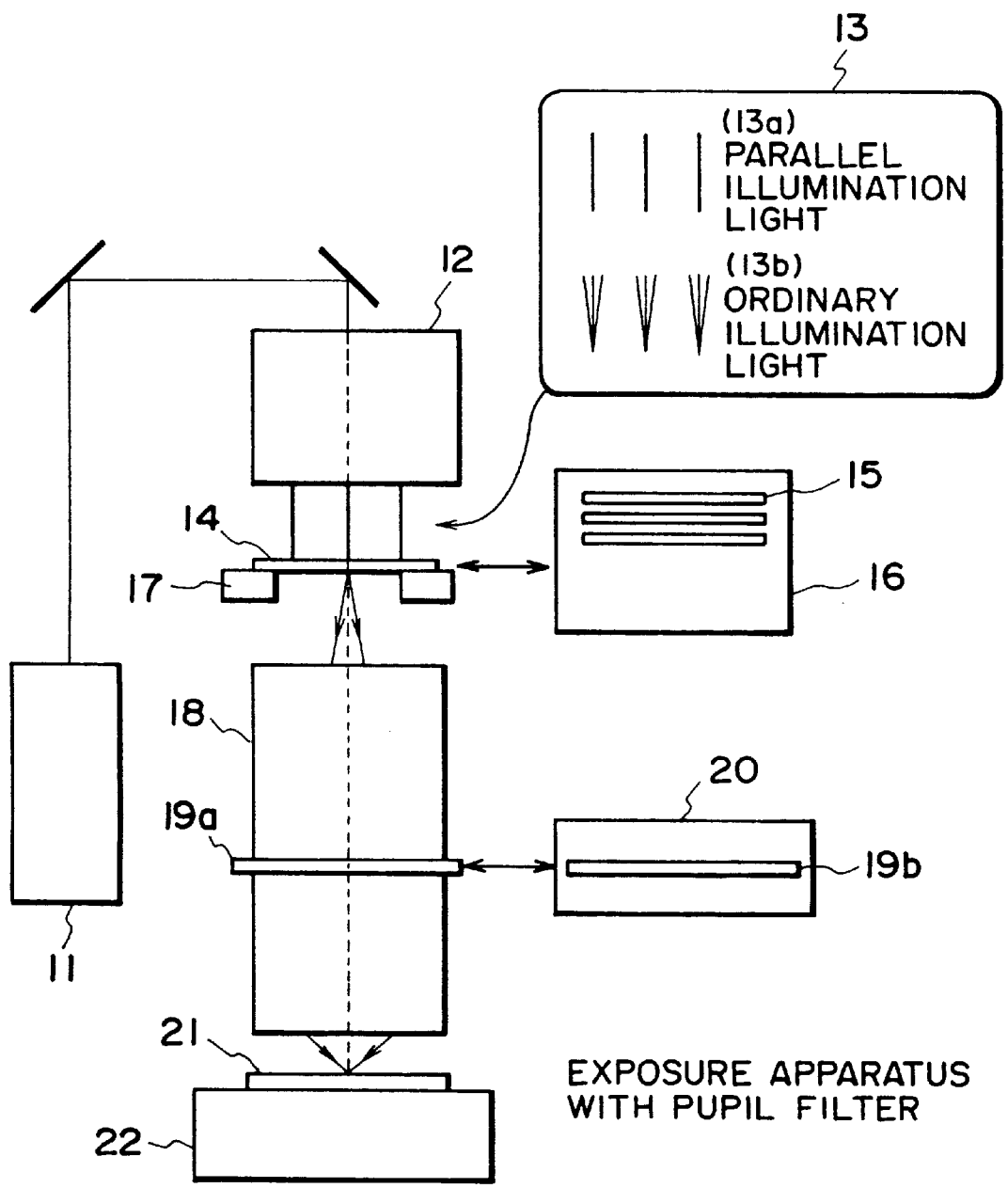
FIG. 90 is a schematic view of a main portion of an exposure apparatus according to an embodiment of the present invention.

Referring now to FIG. 90, an exposure apparatus according to another embodiment of the present invention for use with a chromium mask such as shown in FIG. 75, will be described.

FIG. 90 is a schematic view of an exposure apparatus according to an embodiment of the present invention. Denoted in the drawing at 11 is an exposure light source, and denoted at 12 is an illumination optical system. A schematic illustration at 13 shows illumination modes. Denoted at 14 is a chromium mask (FIG. 39) to be used in this embodiment. Denoted at are masks to be used interchangeably, and denoted at 16 is a mask changing mechanism. Denoted at 17 is a mask stage, and denoted at 18 is a projection optical system. Denoted at 19 is a pupil filter, and denoted at 20 is a filter changing mechanism. Denoted at 21 is a wafer, and denoted at 22 is a wafer stage.

Figure 94:
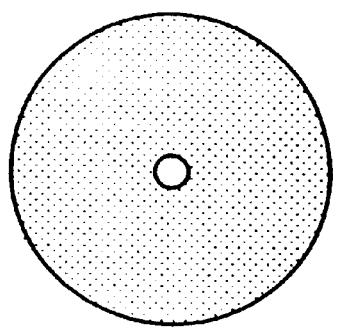
FIG. 94 is a schematic view of an effective light source, in FIG. 92.

In this exposure apparatus, for double-beam interference exposure, the illumination optical system 12 is set to define an effective light source such as shown in FIG. 94, so that as shown in FIG. 90 at 13a the illumination performs coherent illumination (small σ illumination using parallel or substantially parallel light impinging on the mask perpendicularly), while using a pupil filter 19a and while changing the mask to a double-beam interference mask 14 to be described later. For ordinary projection exposure, on the other hand, as shown in FIG. 90 at 13b, the illumination is appropriately changed to partial coherent illumination while changing the pupil filter by another or retracting the same, appropriately, and changing the mask appropriately.

Figure 92:
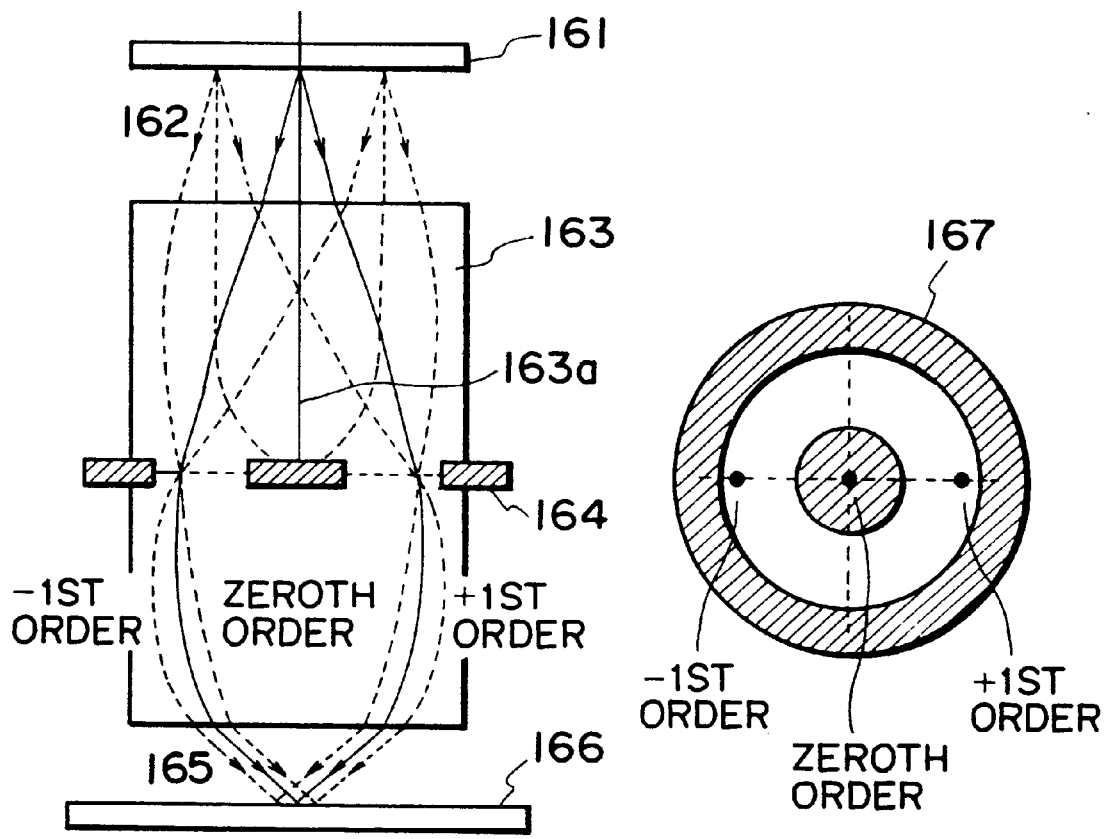
FIG. 92 is a schematic view for explaining the principle of double-beam interference in the present invention.
Figure 93:
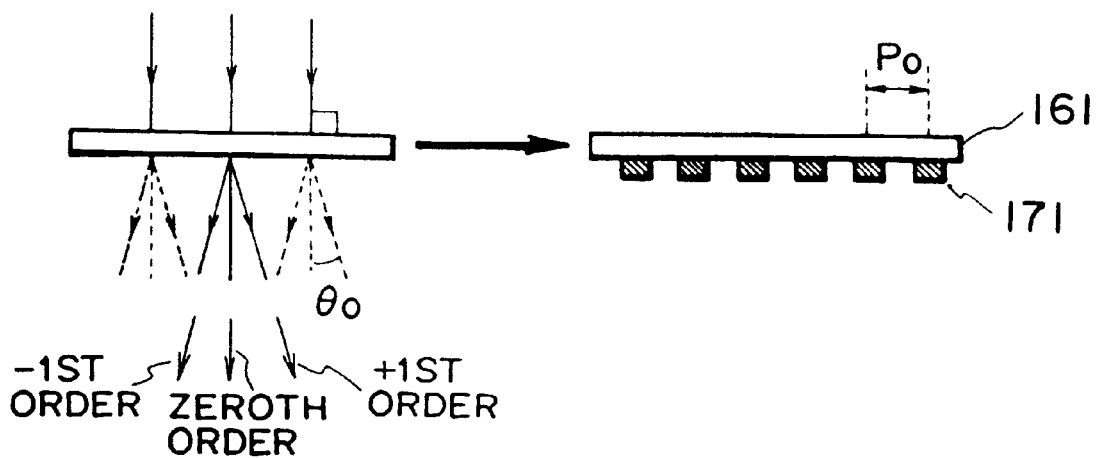
FIG. 93 is a schematic view for explaining a mask and an illumination method in the double-beam interference, according to the present invention.

Referring to FIGS. 92 and 93, the principle of double-beam interference exposure to be made in the exposure apparatus of FIG. 90 as well as the structure of a double-beam interference mask, will be explained.

Figure 91:
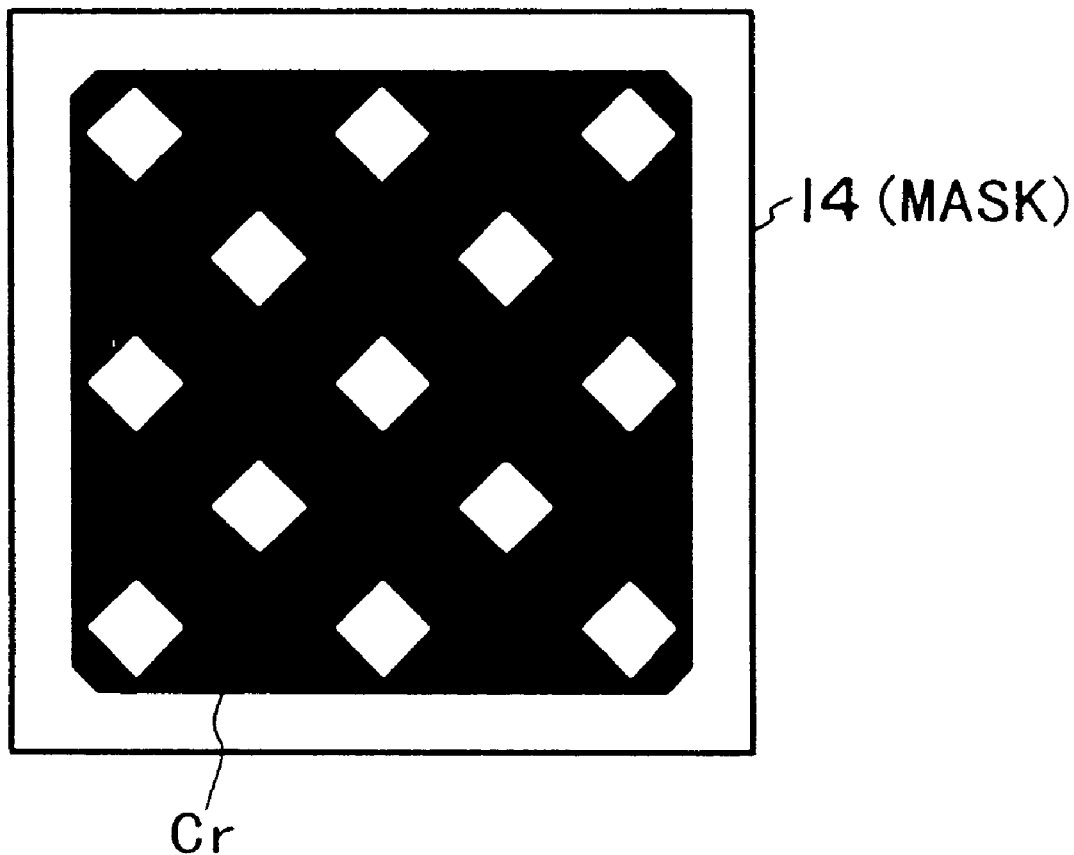
FIG. 91 is a schematic view of a mask usable in the FIG. 90 embodiment.

FIG. 92 illustrates an exposure apparatus which includes a projection optical system of a conventional type, consisting of an all refraction system, for example. A system of NA=0.6 or more with respect to a wavelength 248 nm, is currently available. Denoted in the drawing at 161 is a double beam interference mask having a pattern such as shown in FIG. 91, for example. Denoted at 162 is object-side exposure light. Denoted at 163 is a projection optical system, and denoted at 164 is an aperture stop. Denoted at 165 is image-side exposure light, and denoted at 166 is a photosensitive substrate (wafer). Denoted at 167 is the position of light upon the pupil Plane 164.

The drawing schematically shows double-beam interference exposure, and the object-side exposure light 162 and the image-side exposure light 165 each comprises two parallel light fluxes.

In this embodiment, in order to perform double-beam interference exposure with such an ordinary projection exposure apparatus, the double-beam interference mask 161 and the illumination method are set such as shown in FIG. 93. This will be described below, in detail.

FIG. 93 is a sectional view of an example of a double-beam interference mask having a two-dimensional periodic pattern with a chromium light blocking portion 171 of a pitch in the perpendicular direction and the horizontal direction being set in accordance with equation (b1) below.

$$P_o=4MR=M(\lambda/(NA)) \tag{b1}$$

where R is resolution, $P_o$ is pitch of the periodic pattern on the mask 161, P is pitch of the periodic pattern on the photosensitive substrate 166, M is magnification of the projection optical system 163, $\lambda$ is wavelength, and NA is the image-side numerical aperture NA of the projection optical system.

As shown in FIG. 92, this embodiment uses substantially coherent illumination using substantially perpendicular light. Under such illumination, usually, there are three lights passing through the mask 161, that is, zeroth order light advancing straight, negative first order light and positive first order light advancing at angles $-\theta_0$ and $+\theta_0$, respectively, about the zeroth order light symmetrically with respect to the optical axis 163a of the projection optical system. These lights go through the projection optical system 163, and they contribute to the imaging. In this embodiment, however, a mountable/demountable pupil filter (aperture stop) is disposed adjacent to the pupil of the projection optical system to remove the zeroth order light, such that the same does not contribute to the imaging. As regards the pupil filter 164, one having a function for controlling transmissive amplitude or the phase of transmitted light may be used.

Figure 105:
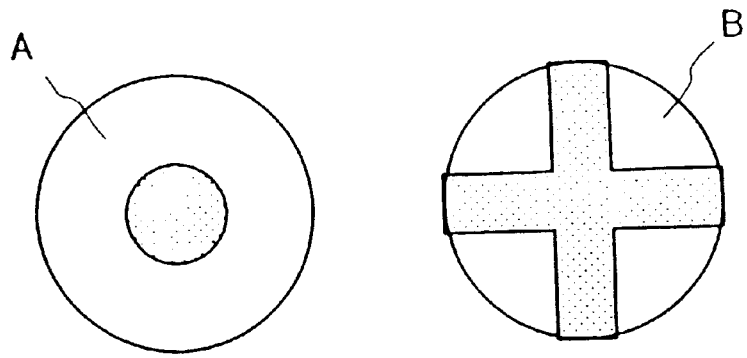
FIG. 105 is a schematic view for explaining pupil filters usable in the present invention.

An example of such a pupil filter 164 may be a filter A shown in FIG. 105, having a light blocking area at the optical axis central portion, or a filter B having a light blocking area of a cross-shape, though the filter B may be preferable.

Figure 106:
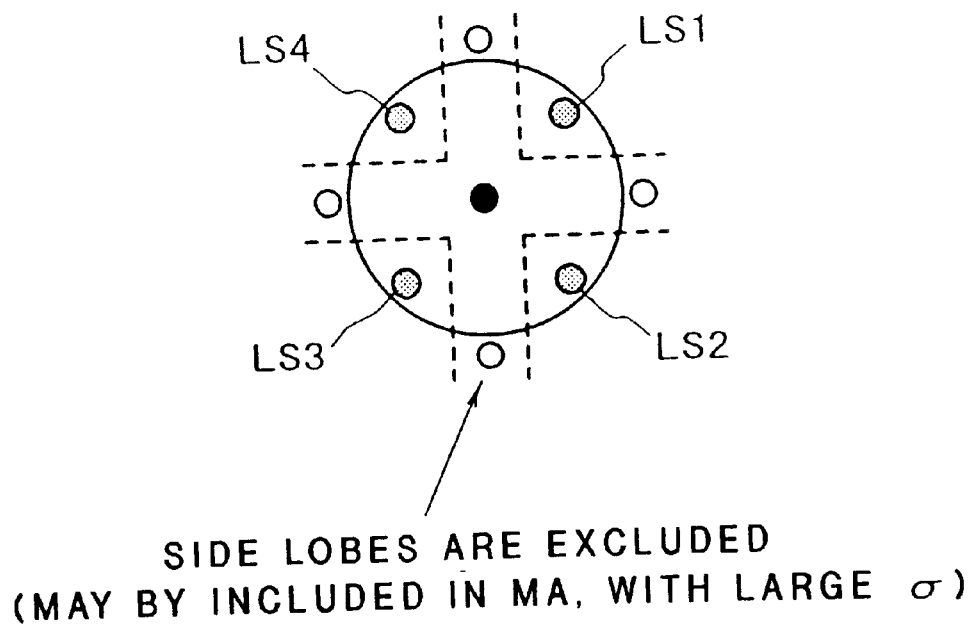
FIG. 106 is a schematic view for explaining a light intensity distribution upon a pupil plane, in the present invention.

An alternative is a filter such as shown in FIG. 106 wherein only four effective light sources LS1–LS4 can be transmitted.

FIG. 95 at (A) illustrates a light intensity distribution (object spectrum) on the pupil 167, wherein there are five lights distributed, that is, zeroth order light and positive and negative first order lights.

FIG. 95 at (B) shows the state in which zeroth order light is intercepted by using a zeroth order light blocking filter which may be the filter of FIG. 105.

Figures 107, 108:
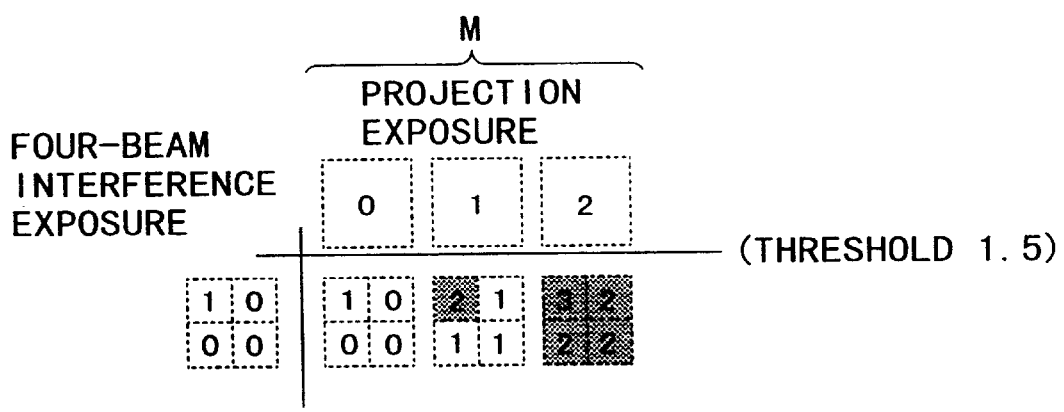
FIG. 107 is a schematic view of a light pattern on a photosensitive substrate, provided by four-beam interference in accordance with the present invention.
FIG. 108 is a schematic view for explaining multiple exposure based on four-beam interference and ordinary exposure, in accordance with the present invention.

FIG. 107 is a schematic view of an exposure pattern produced on a photosensitive substrate as a result of four-beam interference exposure using four effective light sources LS1–LS4 in FIG. 95, in accordance with this embodiment, wherein the exposure pattern is illustrated in terms of an exposure amount map. In the four-beam interference, the state of interference resulting when combined with the amplitude of light, will be treated.

In this embodiment, for an exposure pattern to be produced finally, the exposure amounts by lights from the light sources for the four-beam interference exposure are set at the same level.

In the exposure pattern shown in FIG. 107, as a result of four-beam interference exposure, the exposure amount ranges by two stages of 0 and 1. To this exposure pattern, through ordinary exposure, a rough pattern is superposed (dual exposure) with an exposure amount of three stages from 0 to 2.

The exposure threshold of the photosensitive substrate may be set to be larger than 1 (the largest exposure amount in the four-beam interference exposure) and smaller than 2 (the largest exposure amount in projection exposure of an ordinary pattern), as shown in FIG. 108, that is 1.5, for example.

FIG. 108 is a schematic view of an example of a pattern which is obtainable by dual exposure based on four-beam interference exposure and projection exposure of an ordinary pattern. FIG. 108 schematically shows a mask M with an ordinary pattern having three stages of transmission factor.

The bottom portion of FIG. 108 shows exposure amounts in the exposure pattern produced as a result of four-beam interference exposure of FIG. 107 and of projection exposure with the use of the mask M, applying exposure amounts of three stages (0, 1, and 2). The regions with hatching represent portions above the exposure threshold, and these regions define a final exposure pattern in multiple exposure.

Figure 109:
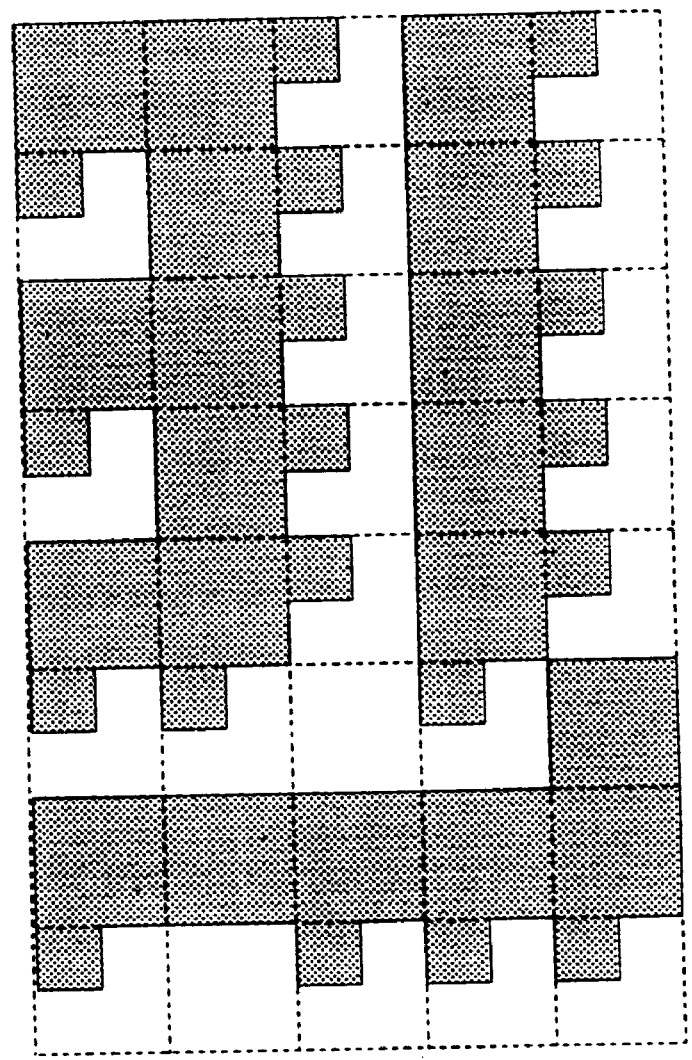
FIG. 109 is a schematic view of an example of a pattern, which can be produced by the four-beam interference and ordinary exposure in the present invention.

FIG. 109 is a schematic view of an example of an exposure pattern formed in accordance with this embodiment. By changing the exposure amount in projection exposure in a unit of a block shown in FIG. 108, a fine pattern can be produced in a wider area and in a complicated shape.

Projection exposure with exposure amounts of three stages (0, 1, and 2) such as described above may be performed in a single exposure by use of a halftone mask M having multiple values as shown in FIG. 108.

As shown in FIG. 108, it has three-stage transmission factors effective to provide three-stage exposure amounts. The values of the transmission factors are arbitrary, and, for example, it has transmission factors of 0%, 50%, and 100%. Among them, the 0% block may be defined by chromium light blocking. The 100% block may comprise a quartz substrate only.

The block having 50% in transmission factor, for example, may be formed by vacuum deposition of a material or materials having a refractive index n and an absorption coefficient c, satisfying the following relation:

$$n/c=(m\lambda/(-1nT))$$

where T is 0.50, m is an integer of 1, and $\lambda$ is the wavelength.

With the structure described above, at the boundary where the transmission factor changes, the quantity of phase shift becomes equal to a multiple of $2\pi$, and there occurs no change in exposure pattern due to the phase shift effect. Thus, by superposition with the double-beam interference exposure, a desired pattern such as shown in FIG. 109 can be produced.

While, in the foregoing examples, a description has been made of a transmission type halftone mask, the present invention is applicable to a reflection type halftone mask, with essentially the same structure.

In the manner described hereinbefore, a projection exposure apparatus basically for ordinary projection exposure is used also for double-beam interference exposure. Further, since this method uses positive and negative first order light, the pitch of the double-beam interference mask can be made twice larger than the normal pitch. Moreover, there is no necessity of providing the mask with a fine phase film, as in a Levenson-type mask. This is very advantageous in fabrication of the mask.

What is described above is an example of mask 161 and illumination therefor for performing double-beam interference exposure by use of an ordinary projection exposure apparatus. By setting the components such as described above, a largest region of the NA of a projection optical system can be used.

Figure 96:
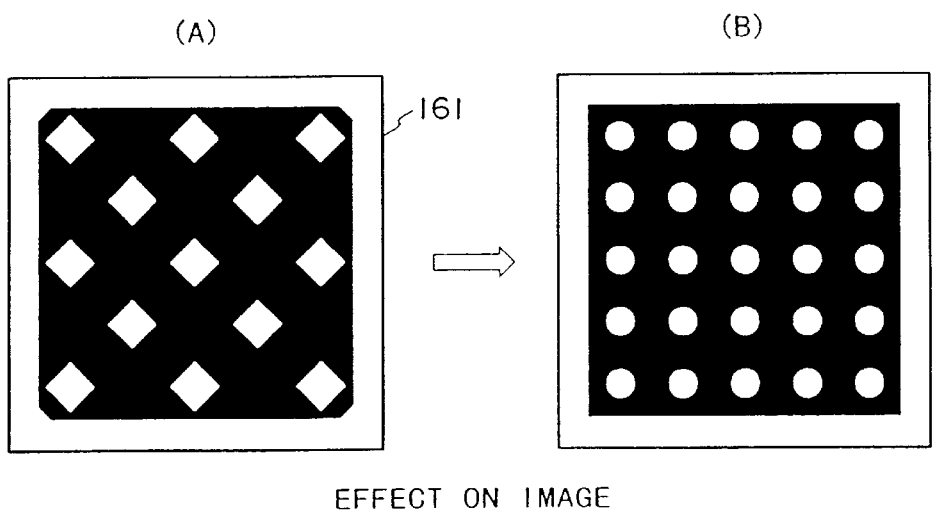
FIG. 96 is a schematic view for explaining a mask and a check pattern image, in FIG. 92.

FIG. 96 at (A) is a schematic view of an example of mask 161. FIG. 96 at (B) shows a check like pattern image to be formed on a photosensitive substrate 21 surface in accordance with this embodiment, by using the pupil filter 19a to intercept the zeroth order light and by performing double-beam interference with respect to two directions of horizontal and perpendicular directions.

In the state shown in FIG. 96, pattern images of a circular shape are formed two-dimensionally and periodically. About or less than the limit resolution, there is no spatially high frequency component and, depending on the resist threshold level, a rectangular shape of a check is rounded. Thus, a matrix distribution of fine circles can be produced.

In this embodiment, a check pattern produced by double-beam interference exposure, which would otherwise disappear only through high resolution pattern exposure because of the threshold of the photosensitive substrate, is superposed by multiple exposure with projection exposure of an ordinary circuit pattern. By this, based on a combined effect of these pattern exposures, the check pattern is selectively retrieved and, thus, a circuit pattern of a desired shape can be produced.

Figure 97:
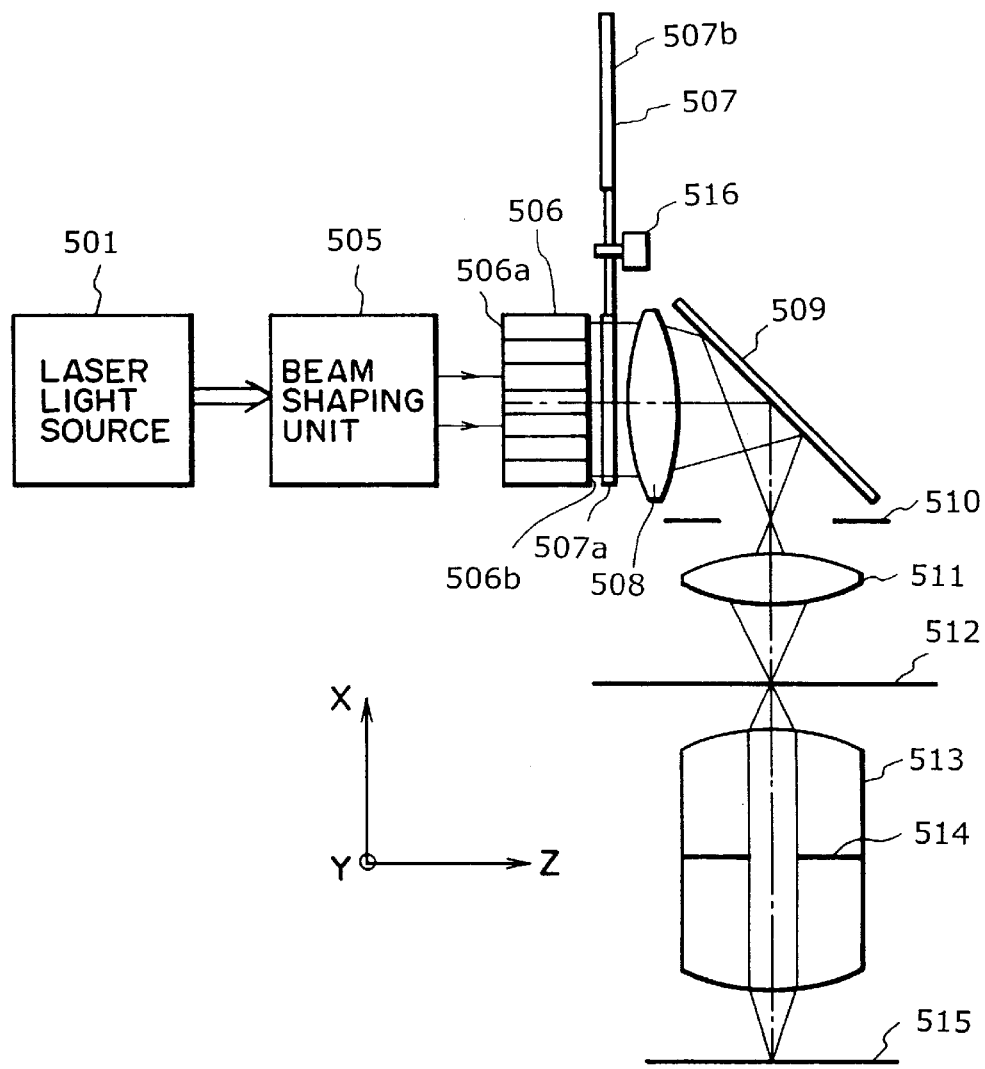
FIG. 97 is a schematic view of a main portion of an exposure apparatus according to another embodiment of the present invention.

FIG. 97 is a schematic view of a specific optical arrangement of an exposure apparatus, according to an embodiment of the present invention.

In this embodiment, the invention is applied to a step-and-repeat or step-and-scan type exposure apparatus, for lithography of a submicron order or quarter-micron order.

In the drawing, laser light from a laser light source 501 enters a beam shaping unit 505 by which its beam diameter is enlarged. The light then impinges on a light entrance surface 506a of an optical integrator 506. The optical integrator 506 comprises a plurality of small lenses (fly's eye lenses) $6_i$ (i=1 to N) having a rectangular or circular sectional shape, which are arrayed two-dimensionally at a predetermined pitch. It defines secondary light sources adjacent to the light exit surface 506b thereof.

Denoted at 507 is a stop which serves to determine the shape of the secondary light sources. The stop 507 is provided with a stop changing mechanism (actuator) 516 so that various stops such as 507a, 507b, for example, are interchangeably placed at the light path by this mechanism in accordance with the illumination condition. As an example, the stop 507 may include an ordinary stop with a circular opening, a ring-like illumination stop for changing a light intensity distribution on a pupil plane 514 of a projection lens 513, a quadruple illumination stop, and a small $\sigma$ illumination stop, for example, one of which may be selectively placed at the light path.

In this embodiment, by using various stops 507, the light impinging on a condensing lens 508 is changed in various ways to control the light intensity distribution on the pupil plane 514 of the projection optical system 513 appropriately. The condensing lens 508 functions to collect plural light fluxes, emitted from the secondary light sources adjacent to the light exit surface 506b of the optical integrator 506 and passed through the stop 507, so that, after reflection by a mirror 509, these light fluxes are superposed on the surface of a masking blade 510 to illuminate this surface uniformly. The masking blade 510 comprises a plurality of movable light blocking plates, for defining a desired aperture shape.

Denoted at 511 is an imaging lens which functions to transfer the aperture shape of the masking blade 510 onto the surface of a reticle (mask) 512, which is the surface to be illuminated, to thereby illuminate a required region on the reticle 512 surface uniformly.

Denoted at 513 is the projection optical system (projection lens) for projecting, in a reduced scale, a circuit pattern of the reticle 512 onto a wafer (substrate) 515 placed on a wafer chuck. Denoted at 514 is the pupil plane of this projection optical system 513. On this pupil plane 514, various aperture stops such as shown in FIG. 38 can be demountably disposed.

In the optical arrangement of this embodiment, the masking blade 510, the reticle 512, and the wafer 515 are placed in an optically conjugate relation with each other. Also, the stop 507a and the pupil plane 514 of the projection optical system 513 are placed substantially in conjugate relation with each other.

With the structure described above, in this embodiment, the pattern of the reticle 512 is projected on the wafer 515 surface in a reduced scale. Then, through a predetermined developing process, devices (semiconductor devices) are produced.

In this embodiment, as described above, stops having different aperture shapes are selectively used in accordance with the shape of the pattern of the reticle 512 which is going to be used, to thereby change the light intensity distribution to be formed on the pupil plane 514 of the projection optical system 513 in various ways.

As regards the illumination method in the illumination optical system, a KrF excimer laser, an ArF excimer laser, or a $F_2$ excimer laser may be used to illuminate the mask pattern with light from the laser.

The projection optical system of the exposure apparatus may comprise one of a dioptric system, a catadioptric system, and catoptric system, for projecting the mask pattern.

The exposure apparatus may be of a step-and-repeat type or step-and-scan type.

Next, an embodiment of a semiconductor device manufacturing method which uses a projection exposure apparatus according to any one of the preceding embodiments, will be explained.

Figure 113:
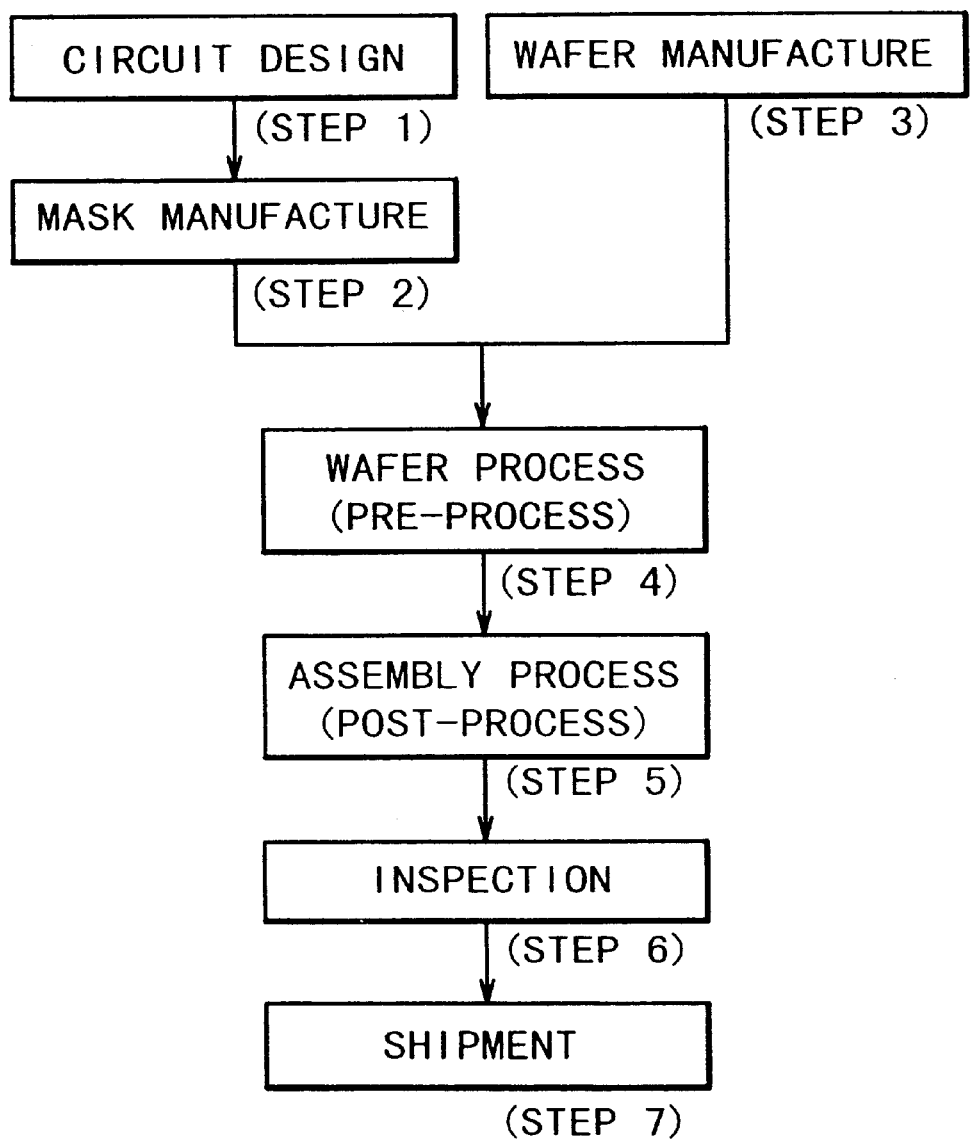
FIG. 113 is a flow chart of device manufacturing processes according to an embodiment of the present invention.

FIG. 113 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check, and so on, for the semiconductor devices provided by step 5, are carried out. With these processes, semiconductor devices are completed and they are shipped (step 7).

Figure 114:
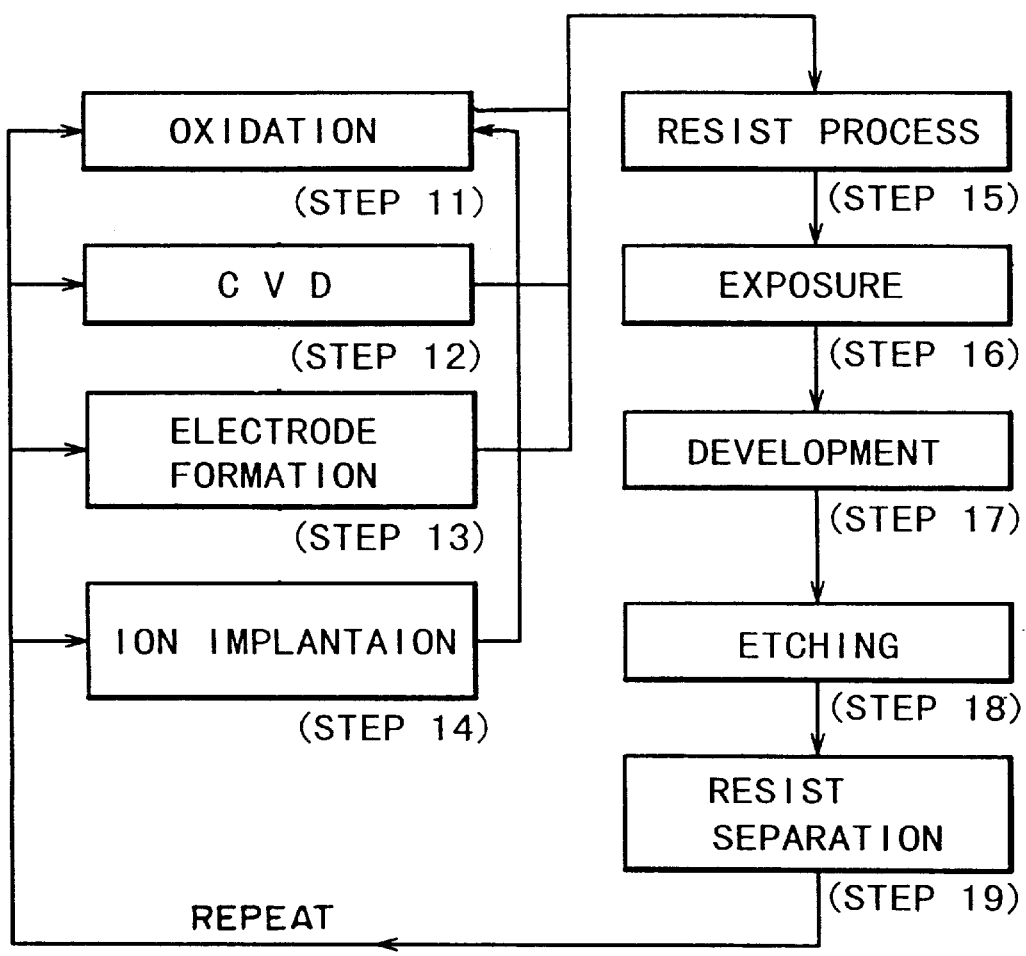
FIG. 114 is a flow chart of a wafer process, in the procedure of FIG. 113.

FIG. 114 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. step 14 is an ion implanting process for implanting ions to the wafer. Step 15 is a resist process for applying a resist (photosensitive material) to the wafer. Step 6 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

A further embodiment of the present invention will now be described with reference to FIGS. 115 and 116A–116 similar to FIGS. 110, 111A, 111B, 112A, and 112B, described hereinbefore. This embodiment relates to an example where a positive type resist is used in conjunction with a KrF exciter stepper of wavelength 248 nm.

Like the embodiment described hereinbefore, an optimum light quantity ratio is determined with respect to a positive type resist. In this positive type resist, through a development process, the portion having been irradiated with light transmitted through a reticle is removed while a portion blocked by the reticle remains. In order that a pattern corresponding to the reticle pattern remains after the development process, the exposure process may be performed by use of a reticle with a pattern made of a light blocking material, the light passing through the portion around the reticle pattern. In this type of reticle, the light intensity at the portion around the pattern may be 1 while the light intensity at the pattern portion is 0. Thus, after an ordinary exposure process, there is provided a light quantity distribution such as shown in FIG. 115, having a light intensity of 1 at the portion around the pattern.

In the case of a positive type resist, when the maximum level of an intensity distribution of an image of a periodic pattern is $I_0$. and the minimum level thereof is $I_1$, a combined image may have an intensity distribution:

$a'=k*a+I_1$
$a''=k*a+I_0$
$b'=k*a+I_1$
$c'=k*c+I_0$
$d'=k*d+I_0$

If the maximum intensity value around the pattern is $I_{2max}$ (corresponding to $I_2$ in FIG. 115(A)) and the minimum intensity value around the pattern is $I_{2min}$ (corresponding to $I_3$ in FIG. 115(C)), $I_{2max}=K*1+I_0=I_2$
$I_{2min}=K*1+I_1=I_3$ The exposure amount distribution provided by periodic pattern exposure (at the bottom of FIG. 115(A)) and an exposure amount distribution provided by ordinary projection exposure (best focus) (at the bottom of FIG. 115(B)), under different illumination conditions, are as follows:

Illumination Condition 1

Figure 116A:
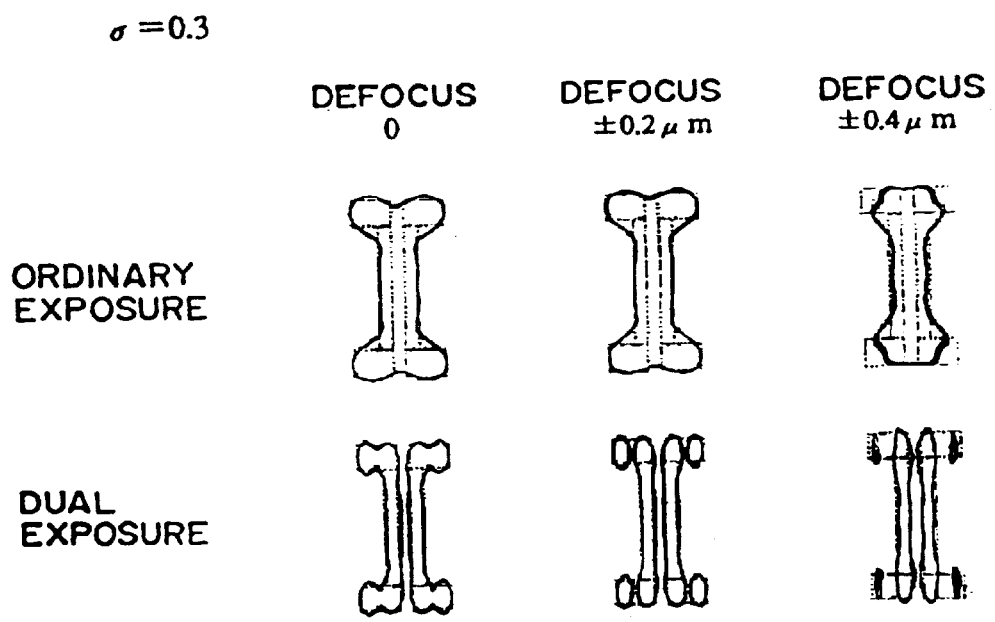
FIGS. 116A–116D are schematic views, respectively, for explaining a pattern defocus characteristic in the multiple exposure process, according to an embodiment of the present invention.

Periodic pattern exposure was made with σ=0.3, while ordinary pattern exposure was made with σ=0.3 (FIG. 116A).

$I_0=0.80$
$I_1=0.23$
$a=0.03$
$b=0.27$
$c=0.21$
$d=0.58$
When k=1.5,
$a'=0.28$
$a''=0.85$
$b'=0.64$
$c'=1 12$
$d'=1.67$
$I_{2min}=1.73$ are obtained. When standardized by division by (K*1+1) to define a peripheral intensity of 1, the following may result:

$a'=0.11$
$a''=0.34$
$b'=0.23$
$c'=0.45$
$d'=0.67$
$I_{2min}=0.69$

Since a standardized resist threshold value $I_c$ should be:
$a'=k*a+I_1<I_c$
$a''=k*a+I_0<I_c$
$b'=k*a+I_1<I_c$
$c'=k*c+I_0>I_c$
$I_{2min}=K*1+I_1>I_c$ it follows that 0–34<$I_c$ and 0.45>$I_c$.

Illumination Condition 2

Figure 116B:
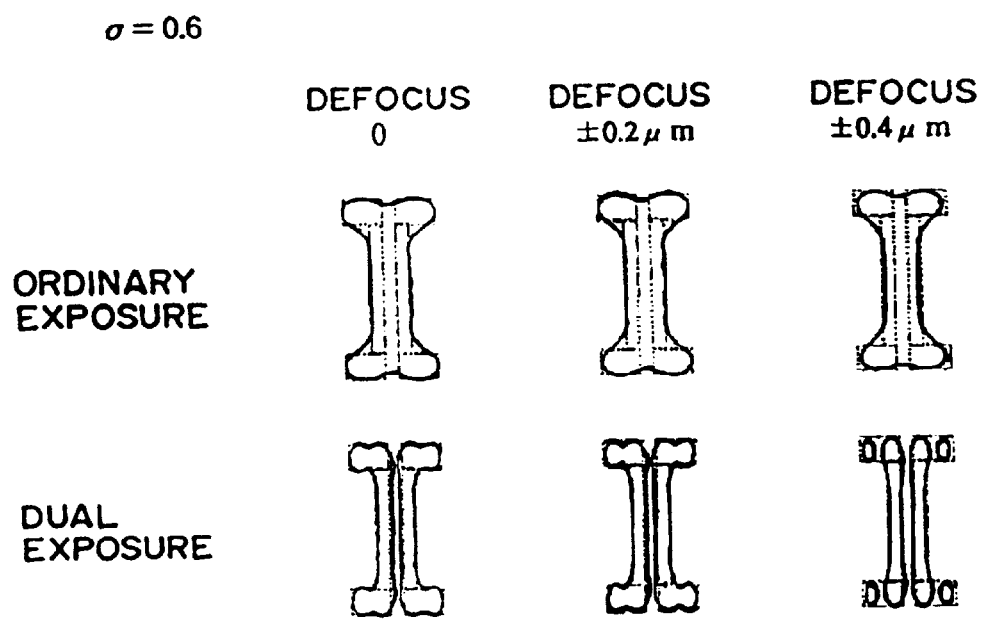

Periodic pattern exposure was made with σ=0.3, while ordinary pattern exposure was made with σ=0.6 (FIG. 116B).

$I_0=0.80$
$I_1=0.23$
$a=0.04$
$b=0.26$
$c=0.23$
$d=0.58$
when k=2.0
$a'=2.23$
$a''=0.88$
$b'=0.75$
$c'=1.26$ d'=1.96

$I_{2min}$=2.23 are obtained. When standardized by division by (K*1+1) to define a peripheral intensity of 1, the following may result:

a'=0.01
a"=0.29
b'=0.25
c'=0.42
d'=0.65
$I_{2min}$=074

The standardized resist threshold $I_c$ is 0.29<$I_c$ and 0.42>$I_c$.

Illumination Condition 3

Figure 116C:
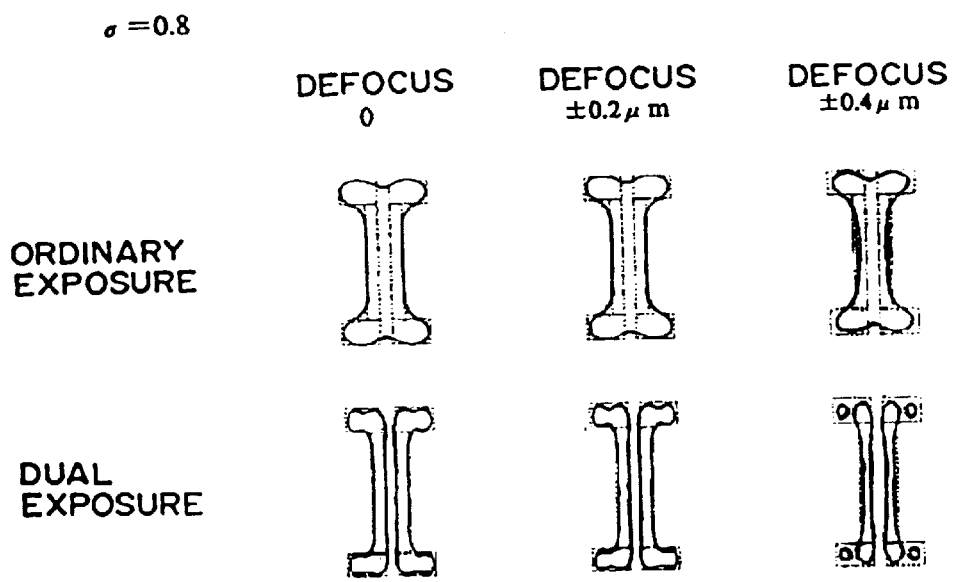

Periodic pattern exposure was made with σ=0.3, while ordinary pattern exposure was made with σ=0.8 (FIG. 116C).

$I_0$=0.80
$I_1$=0.23
a=0.05
b=0.26
c=0.27
d=0.59 when k=2.5 a'=0.36
a"=0.93
b'=0.88
c'=1.47
d'=2.28
$I_{2min}$=2.73 are obtained. When standardized by division by (K*1+1) to define a peripheral intensity of 1, the following may result:

a'=0.10
a"=0.26
b'=0.25
c'=0.42
d'=0.65
$I_{2min}$=0.78

Thus, the standardized resist threshold $I_c$ is 0.26<$I_c$>10.42.

Illumination Condition 4

Figure 116D:
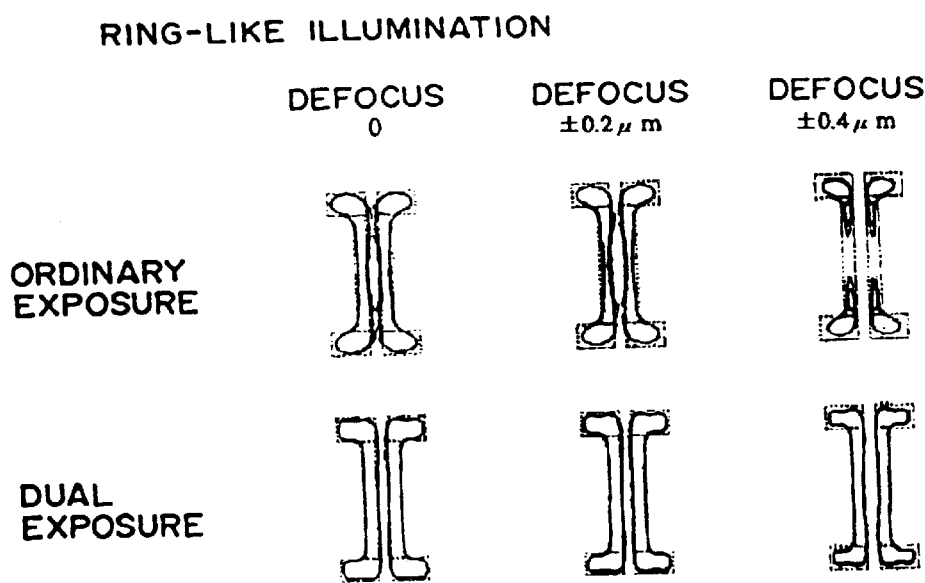

Periodic pattern exposure was made with σ=0.3, while ordinary pattern exposure was made with σ=0.8 in ring-like illumination. The illuminance distribution at the inside (ring inside) not greater than σ 0.6 was zero (FIG. 116D).

$I_0$=0.80
$I_1$=0.23
a=0.06
b=0.26
c=0.35
d=0.62 when k=3.0 a'=0.41
a"=0.98
b'=1.01
c=1.85
d'=2.66
$I_{2min}$=3–23 are obtained. When standardized by division by (K*1+1) to define a peripheral intensity of 1, the following may result:

a'=0.10
a"=0.25
b'=0.25
c'=0.46
d'=0.67
$I_{2min}$=0.81

Thus, the standardized resist threshold $I_c$ is 0.25<$I_c$>0.46.

When the standardized resist threshold is within the above-described range, the intensity of an exposure amount distribution with standardized a', a" and b' is lower than the threshold, and c', d' and $I_{2min}$ are larger than the threshold. Since only the portion with exposure amount less than the resist threshold remains after the development, only an exposure amount distribution of a', a", and b' remains as a pattern after the development. Thus, the gray portion at the bottom of FIG. 115(C) corresponds to the shape remaining after the developing process.

The intensity distribution described in this embodiment is standardized on an assumption that the light quantity applied to the reticle and the light quantity projected to the wafer are equal to each other. The light quantity ratio described is calculated on the basis of this intensity distribution, and an optimum light quantity ratio may be about the light quantity ratio mentioned above with reference to the illumination conditions described above.

Practically, the light quantity applied to the reticle may differ from the light quantity projected to the wafer surface. Also, depending on the illumination condition, the ratio of the received light quantity and the light quantity emitted therefrom may change. Therefore, in an exact sense, the optimum light quantity ratio may change. However, an optimum light quantity ratio may well be determined in accordance with calculations described above, on the basis of intensity distributions by the ordinary exposure and by the high-contrast periodic pattern exposure.

Namely, what is important is to adjust the exposure amounts in these exposure processes so that an optimum light quantity ratio is accomplished and, additionally, that the exposure amount distribution of a combined image satisfies the magnitude relation in calculation with respect to the resist threshold.

As has been described with reference to some foregoing embodiments, the exposure amount distribution varies with the illumination condition, and also the size of the pattern changes.

Further, a practical resist threshold may be a multiple of this standardized resist threshold, and a practical exposure amount distribution may be a multiple of this standardized exposure amount distribution. In practice, as regards the exposure amount distribution, the exposure amount may be adjusted in accordance with a resist threshold in practice so as to provide a proper accumulated exposure amount while maintaining an optimum light quantity ratio in the multiple exposure.

Namely, the pattern shape after a development process is determined by the magnitude relation between an accumulated exposure amount distribution in practice and a resist threshold in practice. In the case of a positive type resist, the portion with exposure amount distribution less than the resist threshold remains. Thus, the exposure amount distribution for a portion to be remained as a pattern may be adjusted to be less than the resist threshold.

While the invention has been described with reference to the structures disclosed herein, it is not confined to the details set forth and this application is intended to cover such modifications or changes as may come within the purposes of the improvements or the scope of the following claims.

We claim:

1. An exposure method for transferring a device pattern to a resist, wherein the device pattern includes a first element and a second element having a linewidth narrower than the first element, said method comprising:

a first exposure step for exposing the resist by use of an interference fringe, produced by interference of two light beams, through an exposure amount substantially not greater than a threshold of the resist; and a second exposure step for exposing the resist with a light pattern related to the first and second elements, wherein a light component, of the light pattern, related to the first element bears an exposure amount greater than the threshold, a light component, of the light pattern, related to the second element bears an exposure amount not greater than the threshold and is to be combined with light in a portion of the interference fringe, and a sum of the exposure amount of the light component related to the second element and an exposure amount provided by the light in the portion of the interference fringe is greater than the threshold.

2. A method according to claim 1, further comprising applying a multiplex exposure amount distribution in the second exposure step.

3. A method according to claim 2, further comprising performing the second exposure step by use of plural masks having different patterns.

4. A method according to claim 2, further comprising performing the second exposure step by use of a mask with plural transparent regions having different transmissivities.

5. A method according to claim 1, further comprising performing the first exposure step by use of a pattern of a phase shift mask and a projection exposure apparatus.

6. A method according to claim 1, further comprising performing the first exposure step by use of an interferometer.

7. A method according to claim 1, further comprising performing the first and second exposure steps by use of a projection exposure apparatus.

8. A method according to claim 7, further comprising performing the first exposure step by use of a phase shift mask.

9. A method according to claim 1, further comprising applying a multiplex exposure amount distribution in the first exposure step.

10. A device manufacturing method including a step of transferring a device pattern onto a workpiece by use of an exposure method as recited in any one of claims 1–9.

11. An exposure method for exposing a resist so that, with a development process, a first fine pattern and a second fine pattern having a linewidth larger than that of the first fine pattern are formed on the resist, said method comprising:

a first exposure step for exposing the resist in relation to the first fine pattern, with an interference fringe provided by interference of plural light beams, through an exposure amount with which the first fine pattern cannot be formed with the development process; and a second exposure step for exposing, with light, a portion of the resist in relation to the second fine pattern through an exposure amount with which the second fine pattern can be formed with the development process, and for exposing, with light, another portion of the resist in relation to the first fine pattern through an exposure amount with which the first fine pattern cannot be formed with the development process, such that the first fine pattern can be formed as a result of accumulation of the exposure amounts provided by said first and second exposure steps.

12. A method according to claim 11, wherein the first and second fine patterns are contiguous.

13. A method according to claim 11, wherein said first and second exposure steps are performed sequentially in the named order, sequentially in an order opposite to the named order, or simultaneously.

14. A method according to claim 12, wherein said first and second exposure steps are performed sequentially in the named order, sequentially in an order opposite to the named order, or simultaneously.

15. An exposure method for exposing a resist so that, with a development process, a first fine pattern and a second fine pattern having a linewidth larger than that of the first fine pattern are formed on the resist, said method comprising:

a first exposure step for exposing the resist in relation to the first fine pattern through an exposure amount with which the first fine pattern cannot be formed with the development process; and a second exposure step for exposing, with light, the resist in relation to the second fine pattern through an exposure amount with which the second fine pattern can be formed with the development process, and for exposing, with light, the resist in relation to the first fine pattern through an exposure amount with which the first fine pattern cannot be formed with the development process, such that the first fine pattern can be formed as a result of accumulation of the exposure amounts provided by said first and second exposure steps.

16. A method according to claim 15, wherein the first and second fine patterns are contiguous.

17. A method according to claim 15, wherein said first and second exposure steps are performed sequentially in the named order, sequentially in an order opposite to the named order, or simultaneously.

18. A method according to claim 16, wherein said first and second exposure steps are performed sequentially in the named order, sequentially in an order opposite to the named order, or simultaneously.

19. An exposure method for exposing a resist so that, with a development process, a first pattern and a second pattern are formed on the resist, said method comprising:

a first exposure step for exposing the resist in relation to the first pattern, with an interference fringe provided by interference of plural light beams through an exposure amount with which the first pattern cannot be formed with the development process; and a second exposure step for exposing, with light, a portion of the resist in relation to the second pattern through an exposure amount with which the second pattern can be formed with the development process, and for exposing, with light, another portion of the resist in relation to the first pattern through an exposure amount with which the first pattern cannot be formed with the development process, such that the first pattern can be formed as a result of accumulation of the exposure amounts provided by said first and second exposure steps.

20. A method according to claim 19, wherein the first and second patterns are contiguous.

21. A method according to claim 19, wherein said first and second exposure steps are performed sequentially in the named order, sequentially in an order opposite to the named order, or simultaneously.

22. A method according to claim 20, wherein said first and second exposure steps are performed sequentially in the named order, sequentially in an order opposite to the named order, or simultaneously.

23. An exposure method for exposing a resist so that, with a development process, a first pattern and a second pattern are formed on the resist, said method comprising:
   a first exposure step for exposing the resist in relation to the first pattern through an exposure amount with which the first pattern cannot be formed with the development process; and
   a second exposure step for exposing, with light, the resist in relation to the second pattern through an exposure amount with which the second pattern can be formed with the development process, and for exposing, with light, the resist in relation to the first pattern through an exposure amount with which the first pattern cannot be formed with the development process, such that the first pattern can be formed as a result of accumulation of the exposure amounts provided by said first and second exposure steps.

24. A method according to claim 23, wherein the first and second patterns are contiguous.

25. A method according to claim 23, wherein said first and second exposure steps are performed sequentially in the named order, sequentially in an order opposite to the named order, or simultaneously.

26. A method according to claim 24, wherein said first and second exposure steps are performed sequentially in the named order, sequentially in an order opposite to the named order, or simultaneously.

27. An exposure method for exposing a resist so that, with a development process, a first pattern and a second pattern are formed on the resist, said method comprising:
   a first exposure step for exposing the resist in relation to the first pattern, with an interference fringe provided by interference of plural light beams through an exposure amount with which the first pattern cannot be formed with the development process; and
   a second exposure step for exposing, with light, a portion of the resist in relation to the second pattern through an exposure amount with which the second pattern can be formed with the development process, and for exposing, with light, another portion of the resist in relation to the first pattern through an exposure amount with which the first pattern cannot be formed with the development process, such that the first pattern can be formed as a result of accumulation of the exposure amounts provided by said first and second exposure steps.

28. A method according to claim 27, wherein the first and second patterns are contiguous.

29. A method according to claim 27, wherein said first and second exposure steps are performed sequentially in the named order, sequentially in an order opposite to the named order, or simultaneously.

30. A method according to claim 28, wherein said first and second exposure steps are performed sequentially in the named order, sequentially in an order opposite to the named order, or simultaneously.

31. An exposure method for exposing a resist so that, with a development process, a first pattern and a second pattern are formed on the resist, said method comprising:
   a first exposure step for exposing the resist in relation to the first pattern through an exposure amount with which the first pattern cannot be formed with the development process; and
   a second exposure step for exposing, with light, the resist in relation to the second pattern through an exposure amount with which the second pattern can be formed with the development process, and for exposing, with light, the resist in relation to the first pattern through an exposure amount with which the first pattern cannot be formed with the development process, such that the first pattern can be formed as a result of accumulation of the exposure amounts provided by said first and second exposure steps.

32. A method according to claim 31, wherein the first and second patterns are contiguous.

33. A method according to claim 31, wherein said first and second exposure steps are performed sequentially in the named order, sequentially in an order opposite to the named order, or simultaneously.

34. A method according to claim 32, wherein said first and second exposure steps are performed sequentially in the named order, sequentially in an order opposite to the named order, or simultaneously.

35. A device manufacturing method including a step of transferring a device pattern onto a workpiece by use of an exposure method as recited in any one of claims 11 through 34.

36. An exposure method for performing exposure of a resist in relation to a pattern, said method comprising:
   a step of applying a first exposure amount distribution on the basis of a dual-beam interference exposure; and
   a step of applying a second exposure amount distribution including a first portion having a smaller exposure amount, not being zero, and a second portion having a larger exposure amount;
   performing the exposure of a first region of the pattern by superposing a portion of the first exposure amount distribution and the first portion of the second exposure amount distribution; and
   performing the exposure of a second region of the pattern through the second portion of the second exposure amount distribution as superposed with another portion of the first exposure amount distribution.

37. A method according to claim 36, further comprising performing the dual-beam interference exposure by illuminating a mask having an array of at least one of a phase shifter and a light blocking portion.

38. A method according to claim 36, wherein the step of applying the first exposure amount distribution is performed before the step of applying the second exposure amount distribution.

39. A method according to claim 37, wherein the step of applying the first exposure amount distribution is performed before the step of applying the second exposure amount distribution.

40. A method according to claim 36, wherein the step of applying the first exposure amount distribution is performed after the step of applying the second exposure amount distribution.

41. A method according to claim 37, wherein the step of applying the first exposure amount distribution is performed after the step of applying the second exposure amount distribution.

42. A method according to claim 36, wherein the first region of the pattern is a portion of the pattern wherein a smallest linewidth is included.

43. A method according to claim 37, wherein the first region of the pattern is a portion of the pattern wherein a smallest line width is included.

44. A method according to claim 36, wherein the pattern comprises a circuit pattern.

45. A method according to claim 37, wherein the pattern comprises a circuit pattern.

46. An exposure method for performing exposure of a resist in relation to a pattern, said method comprising:
   a step of applying a first exposure amount distribution having an exposure amount not greater than an exposure threshold value of the resist, on the basis of a dual-beam interference exposure using a first mask having an array of at least one of a phase shifter and a light blocking portion;
   a step of applying a second exposure amount distribution including a first portion having an exposure amount not being zero but being not greater than the exposure threshold value of the resist, and a second portion having an exposure amount not less than the exposure threshold value;
   performing the exposure of a first region of the pattern by superposing a portion of the first exposure amount distribution and the first portion of the second exposure amount distribution; and
   performing the exposure of a second region of the pattern through the second portion of the second exposure amount distribution as superposed with another portion of the first exposure amount distribution.

47. A method according to claim 46, wherein the step of applying the first exposure amount distribution is performed before the step of applying the second exposure amount distribution.

48. A method according to claim 46, wherein the step of applying the first exposure amount distribution is performed after the step of applying the second exposure amount distribution.

49. A method according to claim 46, wherein the first region of the pattern is a portion of the pattern wherein a smallest linewidth is included.

50. A method according to claim 46, wherein the first mask comprises one or two masks, and wherein the second mask comprises one or two masks.

51. A method according to claim 46, wherein the pattern comprises a circuit pattern.

52. A mask for producing the first exposure amount distribution in the exposure method as recited in any one of claims 36–51.

53. A mask for producing the second exposure amount distribution in the exposure method as recited in any one of claims 36–51.

54. An exposure apparatus for performing the exposure method as recited in any one of claims 36–51.

55. A pattern forming method including a process for exposing a resist and a process for developing the resist, said method comprising:
   a step of applying a first exposure amount distribution on the basis of a dual-beam interference exposure;
   a step of applying a second exposure amount distribution including a first portion having a smaller exposure amount, not being zero, and a second portion having a larger exposure amount;
   forming a first region of a pattern through a portion of the first exposure amount distribution as superposed with the first portion of the second exposure amount distribution; and
   forming a second region of the pattern through the second portion of the second exposure amount distribution as superposed with another portion of the first exposure amount distribution.

56. A method according to claim 55, further comprising performing the dual-beam interference exposure by illuminating a mask having an array of at least one of a phase shifter and a light blocking portion.

57. A method according to claim 55, wherein the step of applying the first exposure amount distribution is performed before the step of applying the second exposure amount distribution.

58. A method according to claim 56, wherein the step of applying the first exposure amount distribution is performed before the step of applying the second exposure amount distribution.

59. A method according to claim 55, wherein the step of applying the first exposure amount distribution is performed after the step of applying the second exposure amount distribution.

60. A method according to claim 56, wherein the step of applying the first exposure amount distribution is performed after the step of applying the second exposure amount distribution.

61. A method according to claim 55, wherein the first region of the pattern is a portion of the pattern wherein a smallest linewidth is included.

62. A method according to claim 56, wherein the first region of the pattern is a portion of the pattern wherein a smallest linewidth is included.

63. A method according to claim 55, wherein the pattern comprises a circuit pattern.

64. A method according to claim 56, wherein the pattern comprises a circuit pattern.

65. A pattern forming method including a process for exposing a resist and a process for developing the resist, said method comprising:
   a step of applying a first exposure amount distribution having an exposure amount not greater than an exposure threshold value of the resist, on the basis of a dual-beam interference exposure using a first mask having an array of at least one of a phase shifter and a light blocking portion;
   a step of applying a second exposure amount distribution including a first portion having an exposure amount not being zero but being not greater than the exposure threshold value of the resist, and a second portion having an exposure amount not less than the exposure threshold value;
   forming a first region of the pattern through a portion of the first exposure amount distribution as superposed with the first portion of the second exposure amount distribution; and
   forming a second region of the pattern through the second portion of the second exposure amount distribution as superposed with another portion of the first exposure amount distribution.

66. A method according to claim 65, wherein the step of applying the first exposure amount distribution is performed before the step of applying the second exposure amount distribution.

67. A method according to claim 65, wherein the step of applying the first exposure amount distribution is performed after the step of applying the second exposure amount distribution.

68. A method according to claim 65, wherein the first region of the pattern is a portion of the pattern wherein a smallest linewidth is included.

69. A method according to claim 65, wherein the first mask comprises one or two masks, and the second mask comprises one or two masks.

70. A method according to claim 65, wherein the pattern comprises a circuit pattern.

71. A device manufacturing method including a process for producing a device by use of the pattern forming method as recited in any one of claims 55–70.

72. An exposure method for printing a particular pattern on a resist, said method comprising:
   a first step for applying a first exposure amount distribution with an exposure amount not greater than an exposure threshold value of the resist, through a dual-beam interference exposure process using a first mask having an array of at least one of a phase shifter and a light blocking portion; and
   a second step for applying a second exposure amount distribution, including a first portion with an exposure amount not being equal to zero but being not greater than the exposure threshold value of the resist and a second portion with an exposure amount not less than the exposure threshold value of the resist, through an exposure process using a second mask having a pattern being analogous to the particular pattern to be printed on the resist,
      wherein (i) the printing of a certain portion of the particular pattern to be printed on the resist is accomplished by superposing a portion of the first exposure amount distribution and the first portion of the second exposure amount distribution, being not equal to zero but being not greater than the exposure threshold value, and (ii) the printing of another portion of the particular pattern is accomplished by use of the second portion of the second exposure amount distribution, being not less than the exposure threshold value and being superposed on another portion of the first exposure amount distribution.

73. An exposure method for exposing a resist in relation to a pattern, comprising:
   a first step for applying a first exposure amount distribution to the resist on the basis of dual-beam interference exposure; and
   a second step for applying, to the resist, a second exposure amount distribution including a first portion with a small exposure amount not being equal to zero and a second portion with a large exposure amount, by use of a mask having a pattern analogous to the pattern,
      wherein exposure in relation to a portion of the pattern is performed by superposing a portion of the first exposure amount distribution and the first portion of the second exposure amount distribution, and
      wherein exposure in relation to another portion of the pattern is performed on the basis of the second portion of the second exposure amount distribution to be superposed with another portion, of the first exposure amount distribution.

74. An exposure method for exposing a resist in relation to a pattern, comprising:
   a first step for applying, to the resist and by use of a first mask having at least one of a phase shifter and a light blocking portion, a first exposure amount distribution with an exposure amount not greater than an exposure threshold value of the resist, on the basis of dual-beam interference exposure; and
   a second step for applying, to the resist, a second exposure amount distribution including a first portion with an exposure amount not being equal to zero but being not greater than the exposure threshold value and a second portion with an exposure amount not less than the exposure threshold value, by use of a mask having a pattern analogous to the pattern,
      wherein exposure in relation to a portion of the pattern is performed by superposing a portion of the first exposure amount distribution and the first portion of the second exposure amount distribution, and
      wherein exposure in relation to another portion of the pattern is performed on the basis of the second portion of the second exposure amount distribution to be superposed with another portion of the first exposure amount distribution.

75. An exposure method for exposing a resist in relation to a pattern, comprising:
   a first step for applying a first exposure amount distribution to the resist on the basis of periodic pattern exposure; and
   a second step for applying, to the resist, a second exposure amount distribution including a first portion with a small exposure amount not being equal to zero and a second portion with a large exposure amount, by use of a mask having a pattern analogous to the pattern,
      wherein exposure in relation to a portion of the pattern is performed by superposing a portion of the first exposure amount distribution and the first portion of the second exposure amount distribution, and
      wherein exposure in relation to another portion of the pattern is performed on the basis of the second portion of the second exposure amount distribution to be superposed with another portion of the first exposure amount distribution.

76. An exposure method for exposing a resist in relation to a pattern, comprising:
   a first step for applying, to the resist and by use of a first mask having at least one of a phase shifter and a light blocking portion, a first exposure amount distribution with an exposure amount not greater than the exposure threshold value of the resist, on the basis of periodic pattern exposure; and
   a second step for applying, to the resist, a second exposure amount distribution including a first portion with an exposure amount not being equal to zero but being not greater than the exposure threshold value and a second portion with an exposure amount not less than the exposure threshold value, by use of a mask having a pattern analogous to the pattern,
      wherein exposure in relation to a portion of the pattern is performed by superposing a portion of the first exposure amount distribution and the first portion of the second exposure amount distribution, and
      wherein exposure in relation to another portion of the pattern is performed on the basis of the second portion of the second exposure amount distribution to be superposed with another portion of the first exposure amount distribution.

77. A method according to any one of claims 73–76, wherein the first and second steps are carried out in the named order, in the reverse order or simultaneously.

78. A method according to any one of claims 73–76, wherein the portion of the pattern is a portion having a smallest linewidth.

79. A method according to any one of claims 73–76, wherein the pattern is a circuit pattern.

80. A mask to be used in an exposure method as recited in any one of claims 73–76, for producing the first exposure amount distribution.

81. A mask to be used in an exposure method as recited in any one of claims 73–79, for producing the second exposure amount distribution.

82. An exposure apparatus for performing an exposure method as recited in any one of claims 73–76.

83. A pattern forming method including exposure of a resist and development of the same, said method comprising:

a first step for applying a first exposure amount distribution to the resist on the basis of dual-beam interference exposure; and a second step for applying, to the resist, a second exposure amount distribution including a first portion with a small exposure amount not being equal to zero and a second portion with a large exposure amount, by use of a mask having a pattern analogous to the pattern, wherein a portion of the pattern is formed on the basis of a portion of the first exposure amount distribution to be superposed with the first portion of the second exposure amount distribution, and wherein another portion of the pattern is formed on the basis of the second portion of the second exposure amount distribution to be superposed with another portion of the first exposure amount distribution.

84. A pattern forming method including exposure of a resist and development of the same, said method comprising:

a first step for applying, to the resist and by use of a first mask having at least one of a phase shifter and a light blocking portion, a first exposure amount distribution with an exposure amount not greater than an exposure threshold value of the resist, on the basis of dual-beam interference exposure: and a second step for applying, to the resist, a second exposure amount distribution including a first portion with an exposure amount not being equal to zero but being not greater than the exposure threshold value and a second portion with an exposure amount not less than the exposure threshold value by use of a mask having a pattern analogous to the pattern, wherein a portion of the pattern is formed on the basis of a portion of the first exposure amount distribution to be superposed with the first portion of the second exposure amount distribution, and wherein another portion of the pattern is formed on the basis of the second portion of the second exposure amount distribution to be superposed with another portion of the first exposure amount distribution.

85. A pattern forming method including exposure of a resist and development of the same, said method comprising:

a first step for applying a first exposure amount distribution to the resist on the basis of periodic pattern exposure; and a second step for applying, to the resist, a second exposure amount distribution including a first portion with a small exposure amount not being equal to zero and a second portion with a large exposure amount, by use of a mask having a pattern analogous to the pattern, wherein a portion of the pattern is formed on the basis of a portion of the first exposure amount distribution to be superposed with the first portion of the second exposure amount distribution, and wherein another portion of the pattern is formed on the basis of the second portion of the second exposure amount distribution to be superposed with another portion of the first exposure amount distribution.

86. A pattern forming method including exposure of a resist and development of the same, said method comprising:

a first step for applying, to the resist and by use of a first mask having at least one of a phase shifter and a light blocking portion, a first exposure amount distribution with an exposure amount not greater than an exposure threshold value of the resist, on the basis of periodic pattern exposure; and a second step for applying, to the resist, a second exposure amount distribution including a first portion with an exposure amount not being equal to zero but being not greater than the exposure threshold value and a second portion with an exposure amount not less than the exposure threshold value, by use of a mask having a pattern analogous to the pattern, wherein a portion of the pattern is formed on the basis of a portion of the first exposure amount distribution to be superposed with the first portion of the second exposure amount distribution, and wherein another portion of the pattern is formed an the basis of the second portion of the second exposure amount distribution to be superposed with another portion of the first exposure amount distribution.

87. A method according to any one of claims 83–86, wherein the first and second steps are carried out in the named order, in the reverse order or simultaneously.

88. A method according to any one of claims 83–86, wherein the portion of the pattern is a portion having a smallest linewidth.

89. A method according to any one of claims 83–86, wherein the pattern is a circuit pattern.

90. A mask to be used in an exposure method as recited in any one of claims 83–86, for producing the first exposure amount distribution.

91. An exposure method for performing, to a workpiece to be exposed, a dual exposure having a first exposure based an a periodic pattern and a second exposure based on a pattern different from the periodic pattern, wherein:

a mask to be used in the second exposure has a pattern with a portion including a pair of lines having the same linewidth and being disposed with a spacing similar to the linewidth of the paired lines, wherein $I_0$ is a largest value in one period of a light intensity distribution upon the workpiece in the first exposure, $I_1$ is a smallest value of the same, b is an intensity value, at positions corresponding to the paired lines, of a light intensity distribution on the workpiece in the second exposure, c is an intensity value at a position corresponding to a region between the paired lines, Is is a light intensity, at a region other than the pattern, of the light intensity distribution on the workpiece in the second exposure, and Ic is a sensitization threshold value of a resist on the workpiece, the light quantity ratio between the first and second exposures is 1:k, and relations $I_0<Ic$, $I_1<Ic$, $k\times c<Ic$, and $k\times b<Ic$ are satisfied, when the resist is a negative type, the mask to be used for the second exposure has its pattern defined by a light transmitting portion, and the positions corresponding to the paired lines, in the light intensity distribution in the second exposure, are superposed with positions of adjacent largest values of the light intensity distribution in the first exposure, and additionally, relations $k\times b+I_0>Ic$, $k\times c+I_1<Ic$, and $k\times Is+I_0<Ic$ are satisfied, and when the resist is a positive type, the mask to be used for the second exposure has its pattern defined by a light blocking portion, and the positions corresponding to the paired lines, in the light intensity distribution in the second exposure, are superposed with positions of adjacent smallest values of the light intensity distribution in the first exposure, and additionally, relations $k\times b+I_1<Ic$, $k\times c+I_0>Ic$, and $k\times Is+I_1>Ic$ are satisfied.

92. An exposure method for performing, to a workpiece to be exposed, a dual exposure having a first exposure based on a periodic pattern and a second exposure based on a pattern different from the periodic pattern, wherein:

a mask to be used in the second exposure has a pattern including a first portion with a pair of lines having the same linewidth and being disposed with a spacing similar to the linewidth of the paired lines, and a second portion having a linewidth larger than the linewidth of the paired lines, the second portion of the pattern of the mask to be used for the second exposure is printed on the workpiece so as to stretch over more than one pattern of the periodic pattern in the first exposure, wherein $I_0$ is a largest value in one period of a light intensity distribution upon the workpiece in the first exposure, $I_1$ is a smallest value of the same, "a" is an intensity value at a position corresponding to the second portion, of a light intensity distribution on the workpiece in the second exposure, b is an intensity value, at positions corresponding to the paired lines, of a light intensity distribution upon the workpiece in the second exposure, c is an intensity value at a position corresponding to a region between the paired lines, Is is a light intensity, at a region other than the pattern, of the light intensity distribution on the workpiece in the second exposure, and Ic is a sensitization threshold value of a resist on the workpiece, and when the light quantity ratio between the first and second exposures is 1:k, (i) when the resist is a negative type, the mask to be used for the second exposure has its pattern defined by a light transmitting portion, and the positions corresponding to the paired lines, in the light intensity distribution in the second exposure, are superposed with positions of adjacent largest values of the light intensity distribution in the first exposure, and additionally, relations $I_0$<Ic, $I_1$<Ic, k×c<Ic, k×b<Ic, and k×a>Ic as well as relations k×b+$I_0$>Ic, k×c+$I_1$<Ic, k×a+$I_0$>Ic, k×a+$I_1$>Ic and k×Is+$I_0$<Ic are satisfied, and (ii) when the resist is a positive type, the mask to be used for the second exposure has its pattern defined by a light blocking portion, and the positions corresponding to the paired lines, in the light intensity distribution in the second exposure, are superposed with positions of adjacent smallest values of the light intensity distribution in the first exposure, and additionally, relations $I_0$<Ic, $I_1$<Ic, k×a<Ic, k×b<Ic, and k×a<Ic as well as relations k×b+$I_1$<Ic, k×c+$I_0$>Ic, k×a+$I_0$<Ic, k×a+$I_0$<Ic and k×Is+$I_1$>Ic are satisfied.

93. A method according to claim 91 or 92, wherein the first and second exposures are performed under different illumination modes.

94. A method according to claim 93, wherein, in the first exposure, sigma is not greater than 0.3.

95. A method according to claim 93, wherein, in the second exposure, sigma is not less than 0.6.

96. A method according to claim 93, wherein the second exposure is performed with ring-like illumination having an illuminance distribution being lower at an inside portion than at an outside portion thereof.

97. A method according to claim 91 or 92, wherein, in each exposure, the exposure amount is changed so that the light quantity ratio between the first and second exposures is kept at 1:k.

98. A method according to claim 97, wherein the second exposure is performed with an exposure amount approximately twice the exposure amount in the first exposure.

99. A method according to claim 97, wherein, when the first exposure is performed with a sigma of 0.3 and the second exposure is performed with a sigma of 0.8 or less, the exposure amount in the second exposure is made not greater than twice that of the first exposure.

100. A method according to claim 97, wherein, when the first exposure is performed with a sigma of 0.3 and the second exposure is performed with a ring-like illumination and with a small ring width, the exposure amount in the second exposure is made not less than twice that of the first exposure.

101. A method according to claim 97, wherein, when the first exposure is performed with a sigma of 0.3 or less, the exposure amount in the second exposure is made not less than twice that of the first exposure.

102. A method according to claim 91 or 92, wherein, in the first exposure, a rotational position of the mask is adjusted so that patterns of the periodic pattern become parallel to a direction of a fine pattern to be printed by the second exposure.

103. An exposure apparatus for transferring a pattern onto a photosensitive substrate by use of an exposure method as recited in claim 91 or 92.

104. A device manufacturing method, comprising the steps of:

exposing a wafer to a circuit pattern in accordance with an exposure method as recited in claim 91 or 92; and developing the exposed wafer.

* * * * *

UNITED STATES PATENT AND TRADEMARK OFFICE
CERTIFICATE OF CORRECTION

PATENT NO.     : 6,534,242 B2
DATED          : March 18, 2003
INVENTOR(S)    : Mitsuro Sugita et al.

It is certified that error appears in the above-identified patent and that said Letters Patent is hereby corrected as shown below:

Title page,
Item [56], References Cited, U.S. PATENT DOCUMENTS, please insert
-- 6,239, 861    5/2001  Nara et al. ….355/53 --.

Drawings,
SHEET 25, "AMOUNTE" should read -- AMOUNT     E --.
SHEET 54, "RINEARITY" (all occurrences) should read -- LINEARITY --.
SHEET 55, "RINEARITY" (all occurrences) should read -- LINEARITY --.
SHEET 76, "PRINCPLE" should read -- PRINCIPLE --.
SHEET 86, "BY" should read -- BE --.

Column 3,
Line 47, "(AS" should read -- (As --.

Column 6,
Lines 26 and 42, "mm" should read -- nm --.

Column 7,
Line 65, "where a" should read -- where σ --.

Column 14,
Line 6, "characteristics" should read -- characteristics of --.

Column 18,
Line 24, "n" should read -- π --.

Column 20,
Line 48, "in regard" should read -- with regard --.

Column 21,
Line 8, "to" should read -- with --.

Column 26,
Line 35, "patterns" should read -- pattern --; and
Line 66, "as" should read -- to --.

Column 27,
Line 15, "duel" should read -- dual --.

Column 28,
Line 33, "$P_{os}; = 2P_o = \lambda/(M \cdot NA)$" should read -- $P_{os} = 2P_o = \lambda/(M \cdot NA)$ --; and
Line 63, "n" should read -- π --.

UNITED STATES PATENT AND TRADEMARK OFFICE
CERTIFICATE OF CORRECTION

PATENT NO. : 6,534,242 B2
DATED : March 18, 2003
INVENTOR(S) : Mitsuro Sugita et al.

It is certified that error appears in the above-identified patent and that said Letters Patent is hereby corrected as shown below:

Column 30,
Line 5, "is" (second occurrence) should read -- of --; and
Line 51, "oi" should read -- of --.

Column 31,
Line 31, "the-illumination" should read -- the illumination --; and
Line 46, "exposures" should read -- exposure --.

Column 34,
Lines 61 and 66, "in dependence" should read -- depending --.

Column 35,
Line 7, "above described" should read -- above-described --; and
Line 20, "IC" should read -- $I_c$ --.

Column 39,
Lines 20 and 30, "condition a" should read -- condition σ --.

Column 40,
Line 67, "Pattern" should read -- pattern --.

Column 43,
Lines 8 and 10, "to produce" should read -- in producing --; and
Line 29, "Ly" should read -- Ly• --.

Column 47,
Line 22, "1 + 1" should read -- 1 + i --; and
Line 66, "function" should read -- function of --.

Column 50,
Line 36, "$I_o$ = 095" should read -- $I_o$ = 0.95 --; and
Line 65, "set" should read -- set. --.

Column 51,
Line 30, "in regard" should read -- with regard --.

Column 53,
Line 38, "in regard" should read -- with regard --.

Column 55,
Lines 24 and 57, "effective to" should read -- effective with --.

UNITED STATES PATENT AND TRADEMARK OFFICE
CERTIFICATE OF CORRECTION

PATENT NO. : 6,534,242 B2
DATED : March 18, 2003
INVENTOR(S) : Mitsuro Sugita et al.

It is certified that error appears in the above-identified patent and that said Letters Patent is hereby corrected as shown below:

Column 61,
Line 20, "Plane" should read -- plane --.

Column 62,
Line 47, "factor." should read -- factors. --.

Column 65,
Line 21, "step" should read -- Step --;
Line 24, "6 is" should read -- 16 is --;
Line 35, "116A-116" should read -- 116A-116D --;
Line 46, "remains" should read -- remain --; and
Line 58, "$I_0$." should read -- $I_0$ --.

Column 66,
Line 28, "c' = 1 12" should read -- c' = 1.12 --.

Column 67,
Line 11, "$I_{2min}$ = 074" should read -- $I_{2min}$ = 0.74 --;
Line 43, "0.26 <$I_c$> 10.42." should read -- 0.26 < $I_C$ < 0.42. --;
Line 50, " σ0.6" should read -- σ = 0.6 --; and
Line 65, "$I_{2min}$ = 3-23" should read -- $I_{2min}$ = 3.23 --.

Column 68,
Line 7, "0.25 < $I_C$ > 0.46" should read -- 0.25 < $I_C$ < 0.46 --; and
Line 61, "be remained" should read -- remain --.

Column 72,
Line 30, "performing" should read -- wherein --, and "by" should read -- is performed by --;
Line 33, "distribution;" should read -- distribution, --;
Line 34, "performing" should read -- wherein --; and
Line 35, "through" should read -- is performed through --.

Column 73,
Line 8, "portion;" should read -- portion; and --;
Line 14, "value;" should read -- value, --;
Line 15, "performing" should read -- wherein--, and "by" should read -- is performed by --;
Line 16, "distribution;" should read -- distribution, --;
Line 17, "performing" should read -- wherein --;
Line 20, "through" should read -- is performed through --;
Line 51, "exposure;" should read -- exposure; and --;
Line 56, "forming" should read -- wherein --, and "through" should read -- is formed through --;

UNITED STATES PATENT AND TRADEMARK OFFICE
CERTIFICATE OF CORRECTION

PATENT NO. : 6,534,242 B2
DATED : March 18, 2003
INVENTOR(S) : Mitsuro Sugita et al.

It is certified that error appears in the above-identified patent and that said Letters Patent is hereby corrected as shown below:

Column 73 (cont'd),
Line 59, "bution;" should read -- bution, --; and
Line 60, "forming" should read -- wherein --, and "through" should read -- is formed through --.

Column 74,
Line 34, "portion;" should read -- portion, --;
Line 40, "value;" should read -- value, --;
Line 41, "forming" should read -- wherein --; and
Line 44, "distribution;" should read -- distribution, --; and
Line 45, "forming" should read -- wherein --, and "through" should read -- is formed through --.

Column 78,
Lines 14 and 29, "an" should read -- on --.

Column 79,
Line 48, "kxacI$_c$", second occurrence, should read -- kxc < I$_c$ --; and
Line 49, "kxa + I$_o$ < L$_c$," should read -- Kxa + I$_1$ < I$_c$ --.

Signed and Sealed this

Eighth Day of February, 2005

JON W. DUDAS
*Director of the United States Patent and Trademark Office*